US012278237B2

(12) United States Patent
Xie et al.

(10) Patent No.: US 12,278,237 B2
(45) Date of Patent: Apr. 15, 2025

(54) STACKED FETS WITH NON-SHARED WORK FUNCTION METALS

(71) Applicant: International Business Machines Corporation, Armonk, NY (US)

(72) Inventors: Ruilong Xie, Niskayuna, NY (US); Julien Frougier, Albany, NY (US); Junli Wang, Slingerlands, NY (US); Dechao Guo, Niskayuna, NY (US); Ruqiang Bao, Niskayuna, NY (US); Rishikesh Krishnan, Cohoes, NY (US); Balasubramanian S. Pranatharthiharan, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 569 days.

(21) Appl. No.: 17/545,610

(22) Filed: Dec. 8, 2021

(65) Prior Publication Data

US 2023/0178553 A1 Jun. 8, 2023

(51) Int. Cl.
*H01L 27/092* (2006.01)
*H01L 21/02* (2006.01)
(Continued)

(52) U.S. Cl.
CPC ...... *H01L 27/0922* (2013.01); *H01L 21/0259* (2013.01); *H01L 21/28088* (2013.01); *H01L 21/8221* (2013.01); *H01L 21/823807* (2013.01); *H01L 21/823814* (2013.01); *H01L 21/823842* (2013.01); *H01L 21/823871* (2013.01); *H01L 23/5286* (2013.01); *H01L 29/0665* (2013.01); *H01L 29/41733* (2013.01);
(Continued)

(58) Field of Classification Search
None
See application file for complete search history.

(56) References Cited

U.S. PATENT DOCUMENTS 8,093,659 B2 1/2012 Nuttinck
10,192,819 B1 1/2019 Chanemougame et al.
(Continued)

FOREIGN PATENT DOCUMENTS

CN 112687626 A 4/2021

OTHER PUBLICATIONS

John Robertson, Robert M. Wallace, "High-K materials and metal gates for CMOS applications," Materials Science and Engineering : R: Reports, vol. 88, 2015 (Year: 2015).*
(Continued)

*Primary Examiner* — Joseph C. Nicely
*Assistant Examiner* — Alvin L Lee
(74) *Attorney, Agent, or Firm* — Scully, Scott, Murphy & Presser, P.C.; Samuel Waldbaum

(57) ABSTRACT

A semiconductor structure is provided that includes a first FET device stacked over a second FET device, wherein the first FET device contains a first functional gate structure containing a first work function metal and the second FET device contains a second functional gate structure containing a second work function metal. In the structure, the first work function metal is absent from an area including the second work function metal, and vice versa. Thus, no shared work functional metal is present in the semiconductor structure.

24 Claims, 106 Drawing Sheets

(51) Int. Cl.

| | |
|---|---|
| ***H01L 21/28*** | (2006.01) |
| ***H01L 21/822*** | (2006.01) |
| ***H01L 21/8238*** | (2006.01) |
| ***H01L 23/528*** | (2006.01) |
| ***H01L 29/06*** | (2006.01) |
| ***H01L 29/417*** | (2006.01) |
| ***H01L 29/423*** | (2006.01) |
| ***H01L 29/49*** | (2006.01) |
| ***H01L 29/66*** | (2006.01) |
| ***H01L 29/786*** | (2006.01) |

(52) U.S. Cl.

CPC .... *H01L 29/42392* (2013.01); *H01L 29/4908* (2013.01); *H01L 29/66545* (2013.01); *H01L 29/66553* (2013.01); *H01L 29/66742* (2013.01); *H01L 29/78696* (2013.01)

(56) References Cited

U.S. PATENT DOCUMENTS

| | | | | |
|---|---|---|---|---|
| 10,192,867 | B1 | 1/2019 | Frougier et al. | |
| 10,332,803 | B1 | 6/2019 | Xie et al. | |
| 10,510,622 | B1 | 12/2019 | Frougier et al. | |
| 10,944,012 | B2 | 3/2021 | Reznicek et al. | |
| 10,985,064 | B2 | 4/2021 | Zhang et al. | |
| 10,991,711 | B2 | 4/2021 | Reznicek et al. | |
| 2019/0172828 | A1* | 6/2019 | Smith | H01L 21/28088 |
| 2020/0006331 | A1 | 1/2020 | Lilak et al. | |
| 2020/0105891 | A1 | 4/2020 | Lilak et al. | |
| 2020/0212226 | A1* | 7/2020 | Reznicek | H01L 29/42392 |
| 2020/0235013 | A1* | 7/2020 | Lilak | H01L 27/0688 |
| 2020/0402984 | A1* | 12/2020 | Reznicek | H01L 29/7831 |
| 2021/0043522 | A1* | 2/2021 | Chanemougame | H01L 27/0688 |
| 2021/0091079 | A1 | 3/2021 | Wu et al. | |
| 2021/0265345 | A1 | 8/2021 | Xie et al. | |
| 2021/0320035 | A1 | 10/2021 | Xie et al. | |
| 2023/0402519 | A1* | 12/2023 | Anderson | H01L 21/8221 |

OTHER PUBLICATIONS

Jones, "IEDM 2017—Controlling Threshold Voltage with Work Function Metals," SEMIwiki tech insights, 2018 (Year: 2018).*

International Search Report dated Feb. 28, 2023, received in a corresponding foreign application, 6 pages.

Zhang, J., et al., "High-k metal gate fundamental learning and multi-Vt options for stacked nanosheet gate-all-around transistor," 2017 IEEE International Electron Devices Meeting (IEDM), Date of Conference: Dec. 2-6, 2017, p. 22.1.1-22.1.4.

IMEC, "Imec Presents Complementary FET (CFET) as Scaling Contender for Nodes Beyond N3" IMEC Reading Room, Jun. 20, 2018, 26 pages https://www.imec-int.com/en/articles/imec-presents-complementary-fet-cfet-as-scaling-contender-for-nodes-beyond-n3.

* cited by examiner

STACKED FETS WITH NON-SHARED WORK FUNCTION METALS

BACKGROUND

The present application relates to semiconductor technology, and more particularly to stacked field effect transistors (FETs), and methods of forming the same.

A stacked FET includes a first FET device vertically stacked on top of a second FET device. Stacking can permit smaller scaled devices, but it is very difficult to achieve independent gates for stacked devices.

SUMMARY

A semiconductor structure is provided that includes a first FET device stacked over a second FET device, wherein the first FET device contains a first functional gate structure containing a first work function metal and the second FET device contains a second functional gate structure containing a second work function metal. In the structure, the first work function metal is absent from an area including the second work function metal, and vice versa. Thus, no shared work functional metal is present in the semiconductor structure.

In one aspect of the present application, a semiconductor structure is provided. In one embodiment, the semiconductor structure includes a first FET device stacked over a second FET device, wherein the first FET device includes a first functional gate structure containing a first work function metal and the second FET device includes a second functional gate structure containing a second work function metal. A stacked device separating dielectric material layer is located between the first FET device and the second FET device. A first gate cut dielectric structure is located laterally adjacent to the first FET device, and a second gate cut dielectric structure is located laterally adjacent to the second FET device. In the present application, a portion of the first gate cut dielectric structure passes through an opening in the stacked device separating dielectric material layer and is present laterally adjacent to the second FET device.

In embodiments, the portion of the first gate cut dielectric structure that passes through the opening has an enlarged width as compared to a width of a remaining portion of the first gate cut dielectric structure that does not pass through the opening and is present laterally adjacent to the first FET device. This enlarged width ensures that the first FET device and the second FET device do not contain a shared work function metal. In embodiments, the portion of the first gate cut dielectric structure that passes through the opening directly contacts a surface of the second gate cut dielectric structure.

In embodiments, the first FET device includes at least one semiconductor nanosheet, and the second FET device includes at least one semiconductor fin. In other embodiments, the first FET device includes at least one semiconductor nanosheet, and the second FET device includes at least one semiconductor nanosheet.

In embodiments, another first FET device is located laterally adjacent to the first FET device and separated by the first gate cut dielectric structure, wherein the another first FET device comprises a third functional gate structure having a third work function metal. In embodiments, another second FET device is located laterally adjacent to the second FET device and separated by the second gate cut dielectric structure and the portion of the first gate cut dielectric structure that passes through the opening, wherein the another second FET device comprises a fourth functional gate structure having a fourth work function metal. The third and fourth work function metals are not shared in the different device regions.

In embodiments, the first gate cut dielectric structure contacts a first surface of a first conductive contact containing interlayer dielectric (ILD) material layer, wherein the first conductive contact containing ILD material layer contains a first source/drain contact structure contacting a source/drain region of the first FET device. In embodiments, a backside power delivery network is located on a second surface of the first conductive contact containing ILD material layer that is opposite the first surface of the conductive contact containing ILD material layer.

In embodiments, the second gate cut dielectric structure contacts a first surface of a second conductive contact containing ILD material layer, wherein the second conductive contact containing ILD material layer contains a second source/drain contact structure contacting a source/drain region of the second FET device, a second gate contact structure contacting the second functional gate structure, a shared gate contact structure contacting both the first functional gate structure and the second functional gate structure, and a second gate contact structure contacting the first functional gate structure, but not the second functional gate structure.

In embodiments, a back-end-of-the-line structure is located on a second surface of the second conductive contact containing ILD material layer that is opposite the first surface of the second conductive contact containing ILD material layer.

In embodiments, the stacked device separating dielectric material layer is located laterally adjacent to a dielectric isolation layer that is located between the first FET device and the second FET device. In embodiments, the dielectric isolation layer is spaced apart from the spacer dielectric material by a sacrificial dielectric liner portion. In embodiments, another dielectric isolation layer is positioned above the first FET device.

In embodiments, a first source/drain region of the first FET device is spaced apart from a second source/drain region of second FET device by an inner spacer dielectric material and a dielectric material structure.

In addition to providing a semiconductor structure, the present application also provides methods of forming the same. The methods of the present application will become more apparent be the drawings and detailed discussion section to follow.

DETAILED DESCRIPTION

Figure 1:
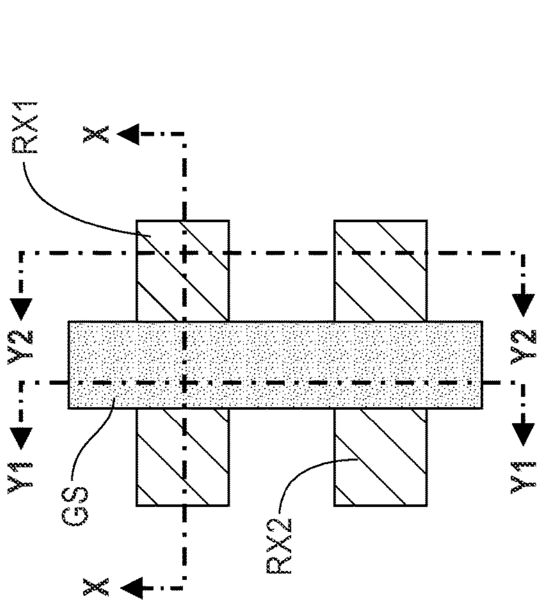
FIG. 1 is a diagram showing a layout including a pair of spaced apart active device regions in which a gate structure lies perpendicular and is present in each of the active device regions; cut X-X (which is a cross section through one of the active device regions), cut Y1-Y1 (which is a cross section through the gate structure) and cut Y2-Y2 (which is a cross section through a source/drain region) are shown in FIG. 1.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It is noted that the terms "first", "second", "third", "fourth", . . . etc., are used throughout the present application as a way to identify like elements, e.g., first FET device and second FET device, and in no ways imply any order in which those like elements are formed.

Referring first to FIG. 1, there is provided a diagram showing a layout including a pair of spaced apart active device regions, RX1 and RX2 in which a gate structure GS lies perpendicular to and is present in each of the active device regions that will be used in the present application in describing the exemplary structure of the present application. The layout includes cut X-X which is a cross section through one of the active device regions (i.e., the first active device region RX1), cut Y1-Y1 which is a cross section through the gate structure GS, and cut Y2-Y2 which is a cross section through a source/drain region. In the present application, the active device regions, e.g., RX1 and RX2, include stacked semiconductor devices (i.e., stacked FETs) that contain semiconductor channel material structures including, for example, semiconductor nanosheets, semiconductor fins, semiconductor nanowires or any combination thereof. In one example, the stacked FET of the present application includes a nanosheet FET device stacked with a semiconductor fin FET (or just finFET) device. Such a stacked FET is described in FIGS. 2A-26C. In yet another example, the stacked FET of the present application includes a first nanosheet FET device stacked with a second nanosheet FET device. Such a stacked FET is described in FIGS. 27A-61C. In the present application, the first FET device will be stacked above the second FET device.

In each of the exemplified stacked FETs, there is present a first FET device stacked over a second FET device, wherein the first FET device contains a first functional gate structure containing a first work function metal and the second FET device contains a second functional gate structure containing a second work function metal that can be different from the first work functional metal. Also, each stacked FET includes a stacked device separating dielectric material layer located between the first FET device and the second FET device. A first gate cut dielectric structure is located laterally adjacent to the first FET device, and a second gate cut dielectric structure is located laterally adjacent to the second FET device. In the present application, the first gate cut dielectric structure passes through an opening in the stacked device separating dielectric material layer and is also present laterally adjacent to the second FET device. The first gate cut dielectric structure that is present laterally adjacent to the second FET device has an enlarged portion that seals the opening and thus ensures that no shared work functional metal is used. These and other aspect of the present application will become apparent from the drawings and the detailed description that follow.

Figure 2A:
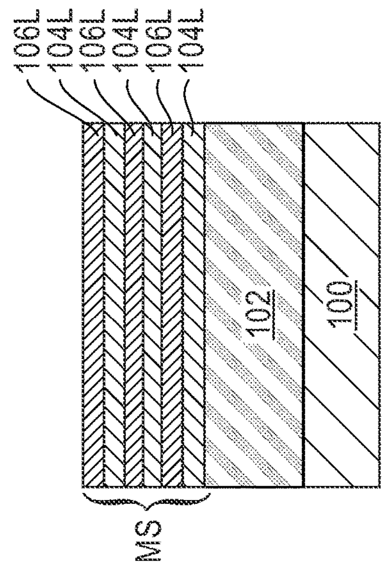
FIGS. 2A, 2B and 2C are cross sectional views through X-X, Y1-Y1, and Y2-Y2, respectively of an exemplary structure that can be employed in the present application, the exemplary structure including a pair of spaced apart nanosheet material stacks located on a surface of a dielectric material layer that is present on a surface of a semiconductor substrate, each nanosheet material stack including alternating sacrificial semiconductor material layers and semiconductor channel material layers stacked one atop the other.
Figure 2B:
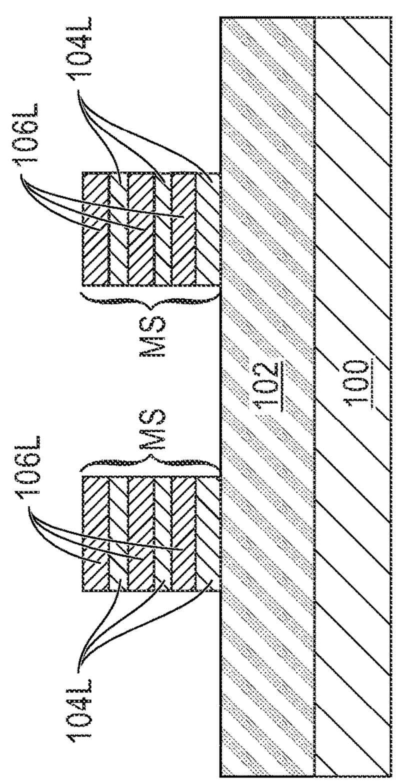
Figure 2C:
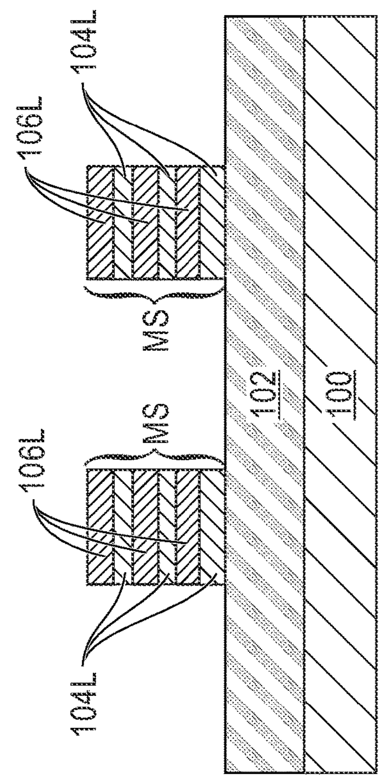

Referring first to FIGS. 2A, 2B and 2C, there are illustrated various views through X-X, Y1-Y1, and Y2-Y2, respectively of an exemplary structure that can be employed in the present application. The exemplary structure includes a pair of spaced apart nanosheet material stacks MS located on a surface of a dielectric material layer 102 that is present on a surface of a semiconductor substrate 100. In accordance with the present application, each nanosheet material stack MS is located in a different active device region (e.g., RX1 and RX2 mentioned above in FIG. 1) including alternating sacrificial semiconductor material layers 104L and semiconductor channel material layers 106L stacked one atop the other.

Semiconductor substrate 100 can be composed of at least one semiconductor material having semiconductor properties. Illustrative examples of semiconductor materials that can be used in the present application include, but are not limited to, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe). In one embodiment (depicted in the drawings of the present application), the semiconductor substrate 10 is entirely composed of at least one semiconductor material.

The dielectric material layer 102 is composed of any dielectric material having electrical insulating properties. Illustrative examples of dielectric materials that can be employed in providing the dielectric material layer 102 include, but are not limited to, silicon dioxide, silicon nitride, silicon oxynitride, or boron nitride. In some embodiments, the dielectric material layer 102 can be formed on a surface of the semiconductor substrate 100 utilizing a deposition process such as, for example, chemical vapor deposition (CVD), plasma enhanced chemical vapor deposition (PECVD), physical vapor deposition (PVD) or atomic layer deposition (ALD). In yet other embodiments, the dielectric material layer 102 can be formed on a surface of the semiconductor substrate 100 utilizing a thermal process such as, for example, thermal oxidation and/or thermal nitridation. The dielectric material layer 102 can have a thickness from 5 nm to 50 nm; although other thicknesses are contemplated and can be employed as the thickness of the dielectric material. In some embodiments, the dielectric material layer 102 is component of a SOI substrate, in which semiconductor substrate 100 is the first semiconductor material layer of the SOI substrate, the dielectric material layer 102 is the buried insulator layer of the SOI substrate, and the second semiconductor material layer is thinned down and converted to the first sacrificial semiconductor material layer 104L, such as SiGe by SiGe condensation process.

As mentioned above, each nanosheet material stack MS includes alternating sacrificial semiconductor material layers 104L and semiconductor channel material layers 106L. In this embodiment of the present application, there is an equal number of semiconductor material layers 104L and semiconductor channel material layers 106L. That is, each nanosheet material stack MS for this embodiment of the present application includes 'n' number of semiconductor channel material layers 106L and 'n' number of sacrificial semiconductor material layers, wherein n is an integer starting from one. By way of one example, the nanosheet material stack MS includes three sacrificial semiconductor material layers 104L and three semiconductor channel material layers 106L. Each sacrificial semiconductor material layer 104L is composed of a first semiconductor material, while each semiconductor channel material layer 106L is composed of a second semiconductor material that is compositionally different from the first semiconductor material. In some embodiments, the second semiconductor material that provides each semiconductor channel material layer 106L is a semiconductor material that is capable of providing high channel mobility for n-type FET devices. In other embodiments, the second semiconductor material that provides each semiconductor channel material layer 106L is a semiconductor material that is capable of providing high channel mobility for p-type FET devices.

The first semiconductor material that provides each sacrificial semiconductor material layer 104L, and the second semiconductor material that provides each semiconductor channel material layer 106L can include one of the semiconductor materials mentioned above for the semiconductor substrate 100. In the present application, the first semiconductor material that provides each sacrificial semiconductor material layer 104L can be compositionally the same as, or compositionally different from, at least an uppermost semiconductor material portion of the semiconductor substrate 100. The second semiconductor material that provides each semiconductor channel material layer 106L can be compositionally the same as, or compositionally different from, at least an uppermost semiconductor material portion of the semiconductor substrate 100. Typically, the second semiconductor material that provides each semiconductor channel material layer 106L is compositionally the same as at least the uppermost semiconductor material portion of the semiconductor substrate 100. In one example, the semiconductor substrate 100 is composed silicon, the first semiconductor material that provides each sacrificial semiconductor material layer 104L is composed of a silicon germanium alloy, and the second semiconductor material that provides each semiconductor channel material layer 106L is composed of silicon. Other combinations of semiconductor materials are possible as long as the first semiconductor material that provides each sacrificial semiconductor material layer 104L is compositionally different from the second semiconductor material that provides each semiconductor channel material layer 106L.

The material stack MS can be formed by growing alternating blanket layers of semiconductor channel material and sacrificial semiconductor material over the first sacrificial semiconductor material. The alternating blanket layers of semiconductor channel material and sacrificial semiconductor material can be deposited utilizing epitaxial growth. The alternating blanket layers of sacrificial semiconductor material and semiconductor channel material are then patterned by lithography and etching to form the nanosheet material stack MS.

Figure 3B:
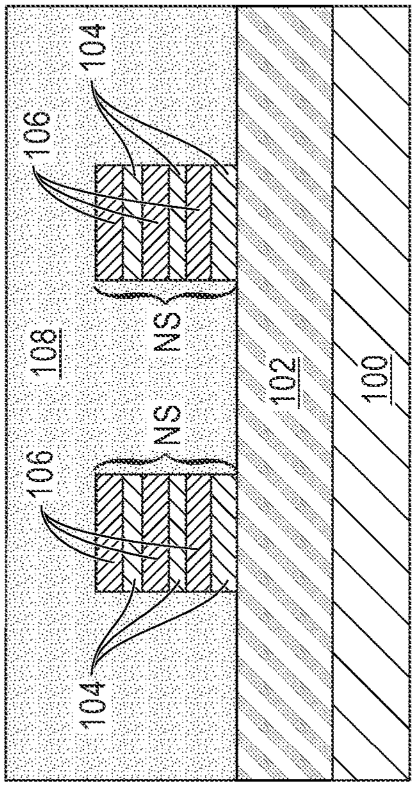
FIGS. 3A, 3B and 3C are cross sectional views of the exemplary structure shown in FIGS. 2A, 2B and 2C, respectively, after forming a first sacrificial gate structure, a first dielectric spacer, patterning each nanosheet material stack utilizing the first sacrificial gate structure and the second dielectric spacer as an etch mask to provide a nanosheet stack of alternating sacrificial semiconductor material nanosheets and semiconductor channel material nanosheets stacked one atop the other, recessing each sacrificial semiconductor material nanosheet, forming an inner spacer in the gap created by the recessing, forming a first source/drain region, and forming a first interlayer dielectric (ILD) material layer.
Figure 3A:
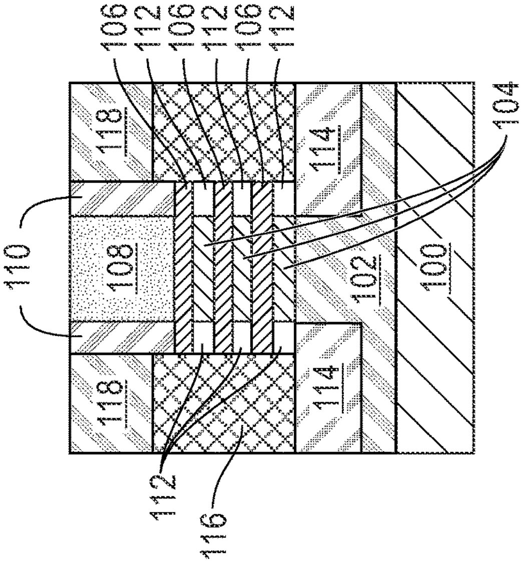
Figure 3C:
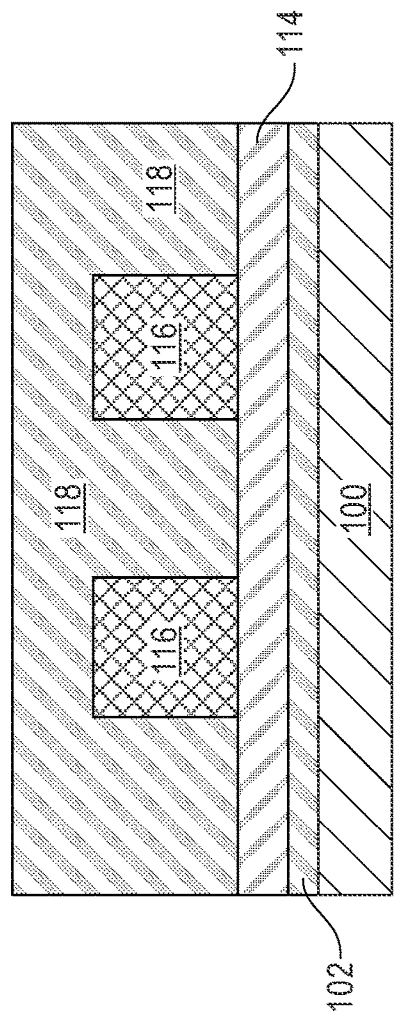

Referring now to FIGS. 3A, 3B and 3C, there are illustrated the exemplary structure shown in FIGS. 2A, 2B and 2C, respectively, after forming a first sacrificial gate structure 108, a first dielectric spacer 110, patterning each nanosheet material stack MS utilizing the first sacrificial gate structure 108 and the second dielectric spacer 110 as an etch mask to provide a nanosheet stack NS of alternating sacrificial semiconductor material nanosheets 104 and semiconductor channel material nanosheets 106 stacked one atop the other, recessing each sacrificial semiconductor material nanosheet 104, forming an inner spacer 112 in the gap created by the recessing, forming a first source/drain region 116, and forming a first ILD material layer 118.

The first sacrificial gate structure 108 includes at least a sacrificial gate material. In some embodiments, the first sacrificial gate structure 108 can include a sacrificial gate dielectric material located beneath the sacrificial gate material. A sacrificial gate cap can be located on the sacrificial gate material. The first sacrificial gate structure 108 can be formed by depositing blanket layers of a sacrificial gate dielectric material (such as, for example, silicon dioxide), a sacrificial gate material (such as, for example, polysilicon or a metal), and a dielectric hard mask material (such as, for example, silicon nitride); note that the dielectric hard mask material provides a sacrificial gate cap. In some embodiments, the depositing of a blanket layer of the sacrificial gate dielectric material and/or the dielectric hard mask material can be omitted. The depositing of the blanket layers of the dielectric hard mask material, sacrificial gate material, and sacrificial gate dielectric material includes, but is not limited to, CVD, PECVD, PVD, ALD or any combination of such deposition processes. After forming the blanket layers of sacrificial gate dielectric material, sacrificial gate material, and hard mask material, a patterning process (including lithography and etching) is used to convert the blanket layer of hard mask material into a sacrificial gate cap and the blanket layers of the sacrificial gate dielectric material and the sacrificial gate dielectric material into the first sacrificial gate structure 108.

After forming the first sacrificial gate structure 108, the first dielectric spacer 110 is formed by deposition of a dielectric spacer material, followed by a spacer etch. The dielectric spacer material that provides the first dielectric spacer 110 can include silicon dioxide, silicon nitride, SiBCN, SiOCN, etc. The first dielectric spacer 110 is present along a sidewall of the first sacrificial gate structure 108 and along a sidewall of the nanosheet material stack MS. In embodiments, the first dielectric spacer 110 can be I-shaped, and have a topmost surface that is coplanar with a topmost surface of the first sacrificial gate structure 108.

After forming the first sacrificial gate structure 108 and first dielectric spacer 110, the nanosheet material stack is patterned. The patterning process, which uses the first sacrificial gate structure 108 and the first dielectric spacer 110 as a combined etch mask, converts the nanosheet material stack MS into a nanosheet stack NS containing alternating sacrificial semiconductor material nanosheets 104 and semiconductor channel material nanosheets 106. Each sacrificial semiconductor material nanosheet 104 and semiconductor channel material nanosheets 106 can have a width from 5 nm to 100 nm, and a vertical thickness from 1 nm to 15 nm; this vertical thickness is the same as the as deposited thickness of the sacrificial semiconductor material layers 104L and semiconductor channel material layers 106L. The patterning process includes an etch which removes physically exposed portions of the nanosheet material stack MS not protected by the etch mask, while maintaining a portion of the nanosheet material stack MS beneath each etch mask. The maintained portion of the nanosheet material stack MS is the nanosheet stack NS of alternating sacrificial semiconductor material nanosheets 104 (i.e., remaining portions of each sacrificial semiconductor material layers 104L) and semiconductor channel material nanosheets 106 (remaining portions of the semiconductor channel material layers 106L). The etch can include a dry etching process such as, for example, reactive ion etching (RIE). The nanosheet stack NS has an outermost sidewall that is vertically aligned to and an outermost sidewall of the first dielectric spacer 110. At this point of the present application, each sacrificial semiconductor material nanosheets 104 has an outermost sidewall that is vertically aligned to an outermost sidewall of each semiconductor channel material nanosheet 106.

Next, each sacrificial semiconductor material nanosheet 104 to recessed to form gaps. Each gap is formed above and below one of the semiconductor channel material nanosheets 106. After this recessing step, the remaining (i.e., recessed) sacrificial semiconductor material nanosheets 104 have a reduced width as compared to the width of the original sacrificial semiconductor material nanosheets 104. The recessing includes a lateral etching process that is selective in removing the sacrificial semiconductor material nanosheets 104 relative to the semiconductor channel material nanosheets 106. Inner spacer 112 is then formed in each gap that is created during the recessing of each sacrificial semiconductor material nanosheet 104. The forming of the inner spacer 112 includes conformal deposition of another dielectric spacer material, followed by an isotropic etching. The another dielectric spacer material can be compositionally the same as, or compositionally, different from the dielectric spacer material that provides first dielectric spacer 110. After that, an isotropic etch process can be applied to the exposed dielectric material layer 102 to form a recess which extends under the bottommost inner spacer 112 as well. A dielectric material 114 can be deposited and recessed to fill the recess. The dielectric material 114 is different than the dielectric material layer 102, such as SiC, SiCO, etc.

The first source/drain region 116 is of a first conductivity type (i.e., n-type or p-type) and is formed by an epitaxial growth process as defined below. The first source/drain region 116 grows outward from the physically exposed sidewalls of each semiconductor channel material nanosheet 106. A dopant, as defined below, is typically present during the epitaxial growth process or afterwards implant. A recess etch can be optionally employed so as to reduce the height of the first source/drain region 116. The terms "epitaxial growth" or "epitaxially growing" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

As used herein, a "source/drain" region can be a source region or a drain region depending on subsequent wiring and application of voltages during operation of the FET. The first source/drain region 116 is composed of a semiconductor material and a dopant. The semiconductor material that provides the first source/drain region 116 can include one of the semiconductor materials mentioned above for the semiconductor substrate 100. The semiconductor material that provides the first source/drain region 116 can be compositionally the same, or compositionally different from each semiconductor channel material nanosheet 106. The semiconductor material that provides the first source/drain region 116 is however compositionally different from each recessed sacrificial semiconductor material nanosheet 104. The dopant that is present in the first source/drain region 116 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the first source/drain region 116 can have a dopant concentration of from $4\times10^{20}$ atoms/$cm^3$ to $3\times10^{21}$ atoms/$cm^3$. In one example, the first source/drain region 116 is composed of phosphorus doped silicon.

The first ILD material layer 118 is then formed on the first source/drain region 116. The first ILD material layer 118 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). Although not shown, the first ILD material layer 118 can include a multilayered structure that includes at least two different dielectric materials stacked one atop the other such as, for example, silicon nitride and silicon dioxide. The first ILD material layer 118 can be formed by a deposition process such as, for example, CVD, PECVD, or spin-on coating. A planarization process (including, for example, chemical mechanical polishing (CMP) can be performed after the deposition of the dielectric material that provides first ILD material layer 118. The first ILD material layer 118 typically has a topmost surface that is coplanar with a topmost surface of the first sacrificial gate structure 108 and a topmost surface of first dielectric spacer 110. Note that if a sacrificial gate cap is present, the aforementioned planarization step can remove the sacrificial gate cap and reveal the sacrificial gate material of the first sacrificial gate structure 108. An upper portion of first dielectric spacer 110 can also be removed by this planarization step.

Figure 4B:
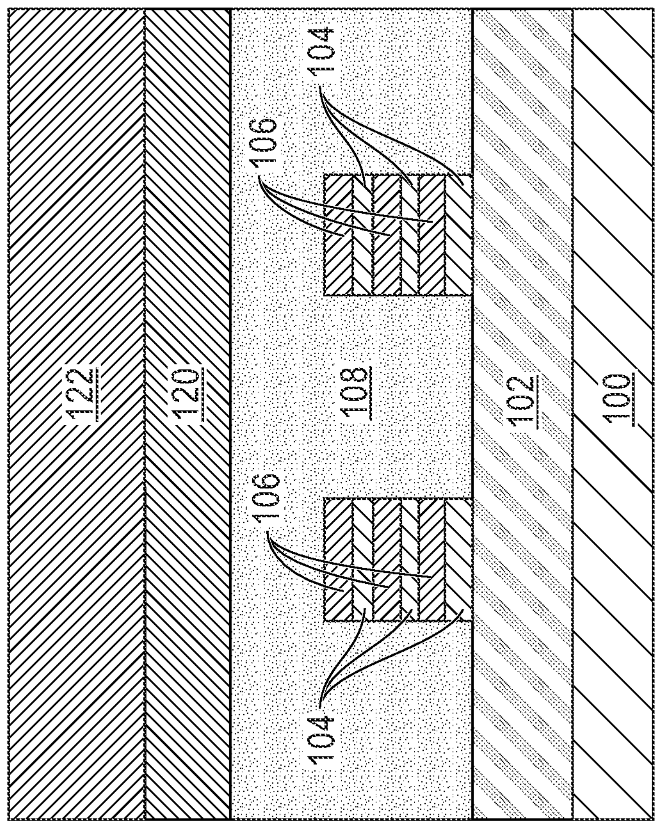
FIGS. 4A, 4B and 4C are cross sectional views of the exemplary structure shown in FIGS. 3A, 3B and 3C, respectively, after bonding a top semiconductor channel layer using a dielectric-to-dielectric bonding process.
Figure 4A:
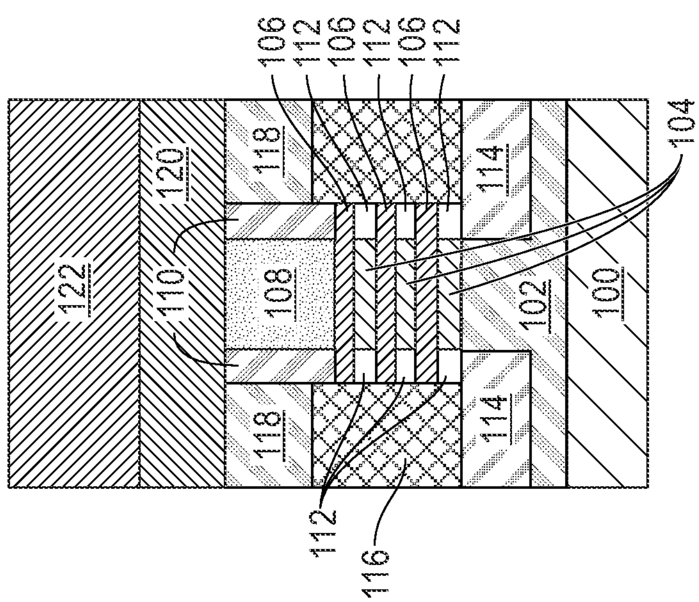
Figure 4C:
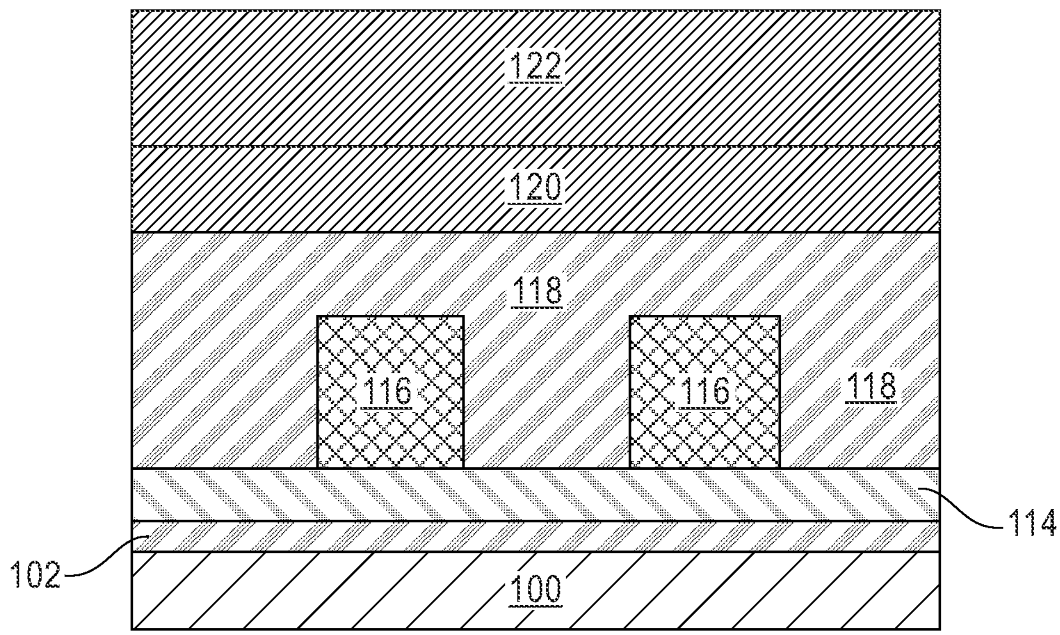

Referring now to FIGS. 4A, 4B and 4C, there are illustrated the exemplary structure shown in FIGS. 3A, 3B and 3C, respectively, after bonding a top semiconductor channel layer 122 using a dielectric-to-dielectric bonding process. This forms a multilayered structure including a stacked device separating dielectric material (hereinafter SDSDM) layer 120 and a semiconductor channel material layer 122. The SDSDM layer 120 can be composed of any dielectric material including, for example, silicon dioxide, silicon nitride or a combination thereof. In one embodiment, the SDSDM layer 120 is composed entirely of silicon dioxide. The SDSDM layer 120 can have a thickness from 20 nm to 100 nm; although other thicknesses for the SDSDM layer 120 are contemplating and thus can be used as the thickness of the SDSDM layer 120. The semiconductor channel material layer 122 is composed of one of the semiconductor materials mentioned above for the semiconductor substrate 10. Typically, but not necessarily always, the semiconductor channel material layer 122 is composed of single semiconductor material such as, for example, silicon. The semiconductor channel material layer 122 can have a thickness from 10 nm to 100 nm; although other thicknesses for the semiconductor channel material layer 122 are contemplating and thus can be used as the thickness of semiconductor channel material layer 122. The bonding oxides which form the multilayered structure including the SDSDM layer 120 is typically formed first over the exposed surfaces of the exemplary structure shown in FIGS. 3A, 3B and 3C and another semiconductor wafer. After that, the another wafer is flipped and bonded to the device wafer shown in FIGS. 3A, 3B and 3C, followed by semiconductor material wafter thinning to form the semiconductor channel material layer.

Figure 5B:
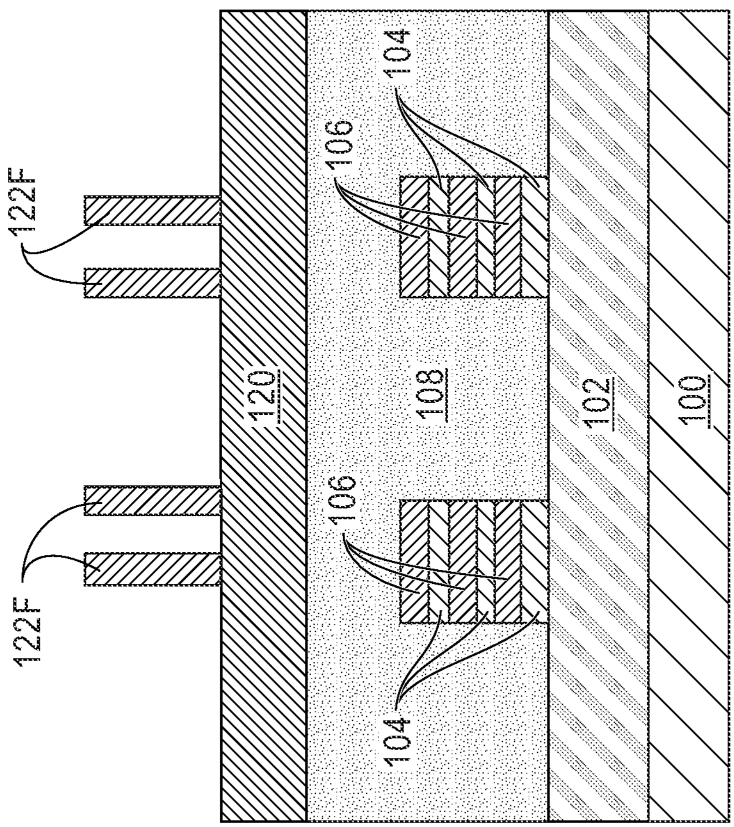
FIGS. 5A, 5B and 5C are cross sectional views of the exemplary structure shown in FIGS. 4A, 4B and 4C, respectively, after patterning the semiconductor channel material layer to form semiconductor fins above each nanosheet stack of alternating sacrificial semiconductor material nanosheets and semiconductor channel material nanosheets.
Figure 5A:
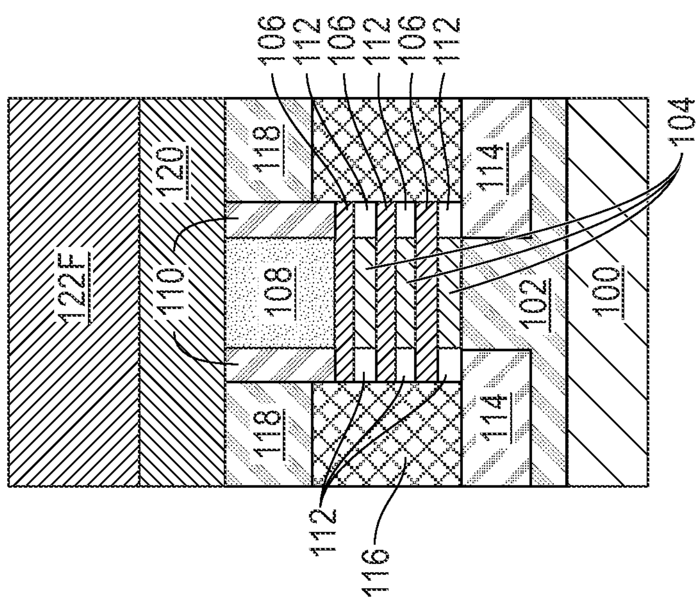
Figure 5C:
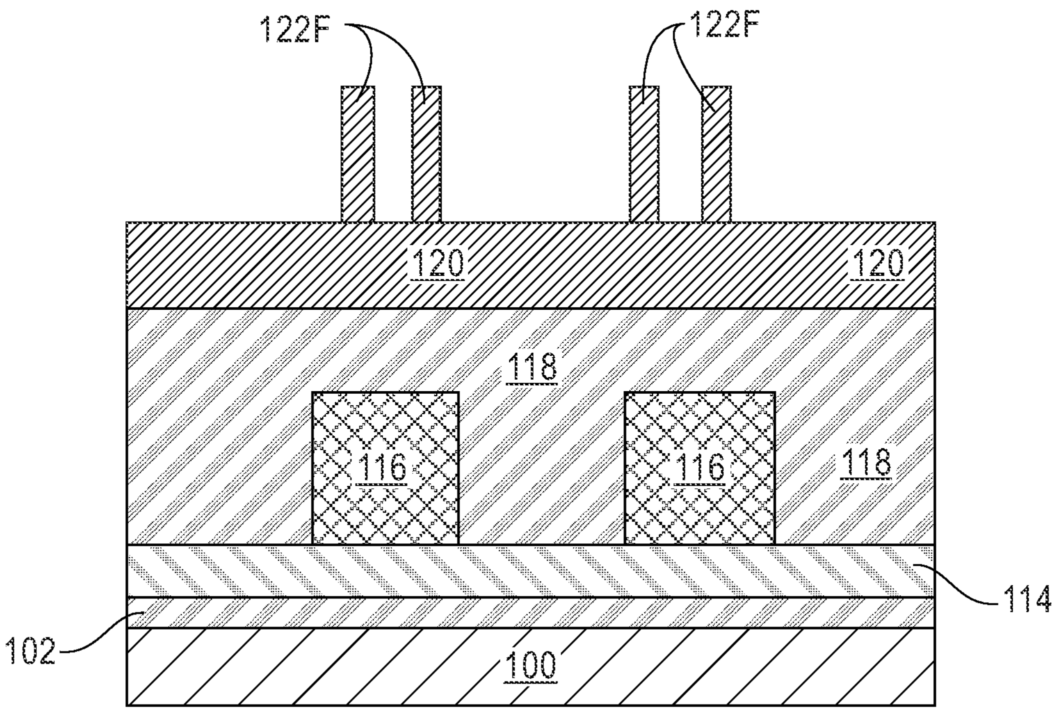

Referring now to FIGS. 5A, 5B and 5C, there are illustrated the exemplary structure shown in FIGS. 4A, 4B and 4C, respectively, after patterning the semiconductor channel material layer 122 to form semiconductor fins 122F above each nanosheet stack NS of alternating sacrificial semiconductor material nanosheets 104 and semiconductor channel material nanosheets 106. Although the drawings illustrate a pair of semiconductor fins 122F formed above each nanosheet material stack NS, the present application works when only a single semiconductor fin or more that two semiconductor fins 112F are formed above each nanosheet stack NS.

The semiconductor fins 122F can be formed by lithography and etching, a sidewall image transfer (SIT) process or a direct self-assembly (DSA) patterning process in which a copolymer that is capable of self-assembly is used. Each semiconductor fin 122F that is formed includes a pair of vertical sidewalls that are parallel to each other. As used herein, a surface is "vertical" if there exists a vertical plane from which the surface does not deviate by more than three times the root mean square roughness of the surface. Each semiconductor fin 122F that is formed includes a pair of sidewalls that are parallel to each other. Each semiconductor fin 122F has a width from 5 nm to 30 nm and a length from 100 nm to 2000 nm. Other widths and lengths are possible and can be used in the present application for each semiconductor fin 122F.

Figure 6B:
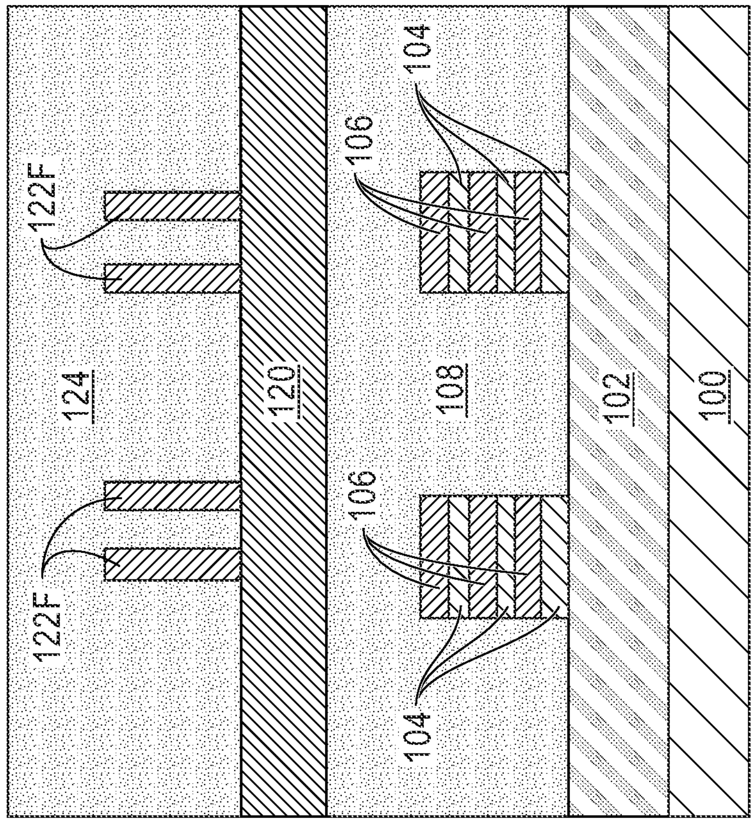
FIGS. 6A, 6B and 6C are cross sectional views of the exemplary structure shown in FIGS. 5A, 5B and 5C, respectively, after forming a second sacrificial gate structure and a second dielectric spacer on a portion of each semiconductor fin, forming a second source/drain region, and forming a second ILD material layer.
Figure 6A:
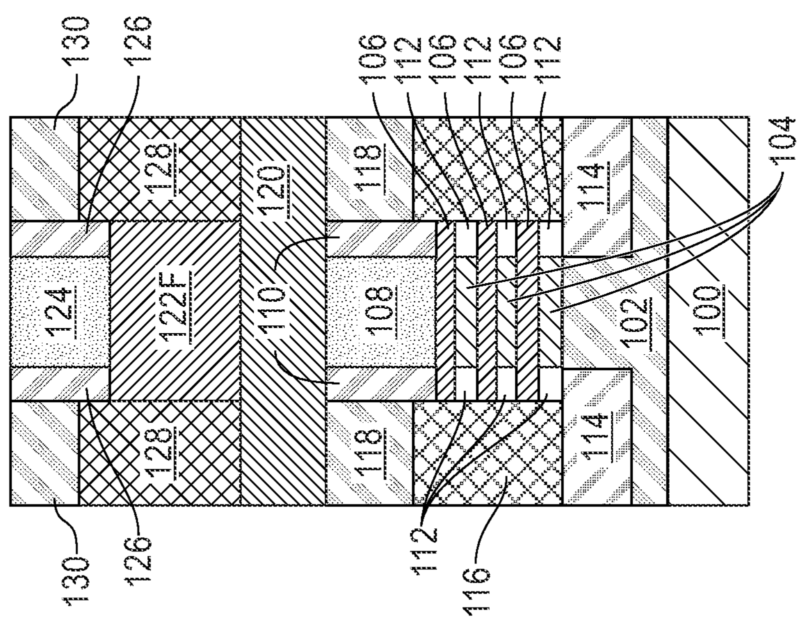
Figure 6C:
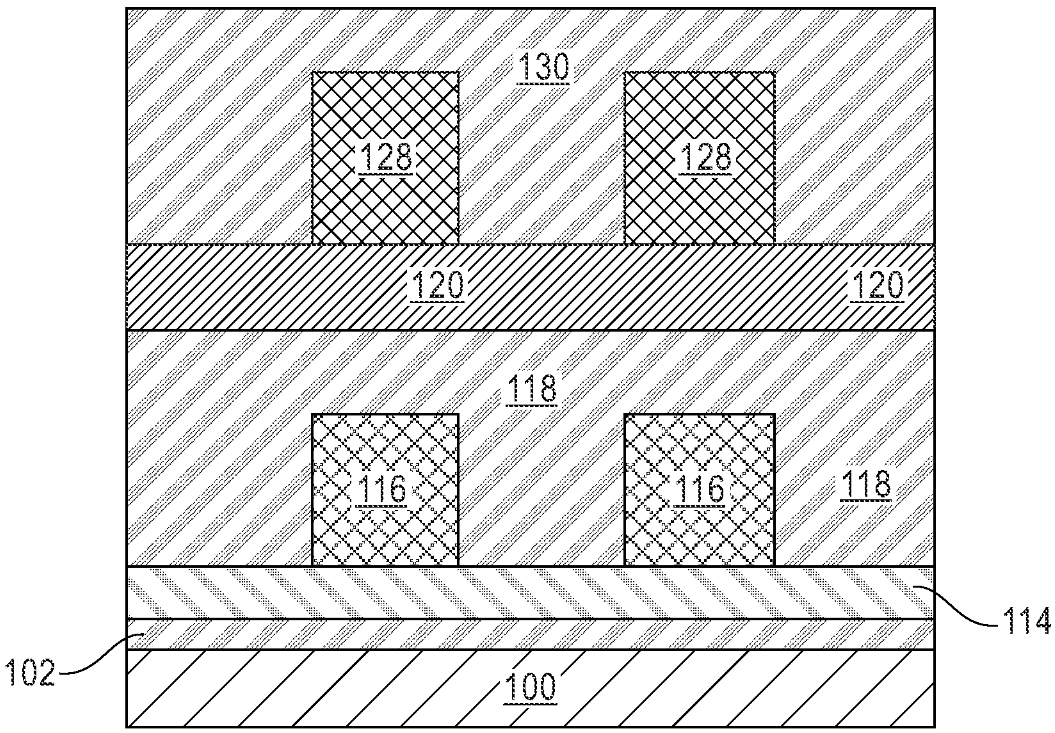

Referring now to FIGS. 6A, 6B and 6C, there are illustrated the exemplary structure shown in FIGS. 5A, 5B and 5C, respectively, after forming a second sacrificial gate structure 124 and a second dielectric spacer 126 on a portion of each semiconductor fin 112F, forming a second source/drain region 128, and forming a second ILD material layer 130. The second sacrificial gate structure 124 straddles overs each of the semiconductor fin 112F as is shown in FIG. 6B, and thus it is located on a topmost surface and along the vertical sidewalls of the semiconductor fins 122F. The second sacrificial gate structure 124 can include an optional sacrificial gate dielectric material and a sacrificial gate material as defined above for the first sacrificial gate structure 108. A sacrificial gate cap can be present on the second sacrificial gate structure 108. The second sacrificial gate structure 124 with or without the sacrificial gate cap can be formed utilizing the processing techniques mentioned above in forming the first sacrificial gate structure 108 with or without a sacrificial gate cap.

The second dielectric spacer 126 can include one of dielectric spacer materials mentioned above for the first dielectric spacer 110. The dielectric spacer material that provides the second dielectric spacer 126 can be compositionally the same as, or compositionally different from, the dielectric spacer that provides the first dielectric spacer 110. The second dielectric spacer 126 can be formed utilizing the technique mentioned above in forming the first dielectric spacer 110.

The second source/drain region 128 is formed on exposed surfaces of the semiconductor fins 112F not including the second dielectric spacer 126 and the second sacrificial gate dielectric material; the second source/drain region 128 is also formed on a surface of SDSDM layer 120. The second source/drain region 128 can be composed of a semiconductor material and a dopant that can be opposite (or the same) in conductivity as compared to the dopant present in the first source/drain region 116. In embodiments, the second source/drain region 128 can be formed by in-situ doped epitaxial growth.

The second ILD material layer 130 can include one of the dielectric materials mentioned above for the first ILD material layer 118. The dielectric material that provides the second ILD material layer130 can be compositionally the same as, or compositionally different from, the dielectric material that provides the first ILD material layer 118. The second ILD material layer 130 can be formed utilizing one of the deposition processes mentioned above for forming the first ILD material layer 118. A planarization process can follow the deposition step. This planarization process can remove the sacrificial cap from above the second sacrificial gate structure 124 and reduce the height of the second dielectric spacer 126. As is illustrated, the second ILD material layer 130 has a topmost surface that is coplanar with a topmost surface of each of the second dielectric spacer 126 and the second sacrificial gate structure 124.

Figure 7B:
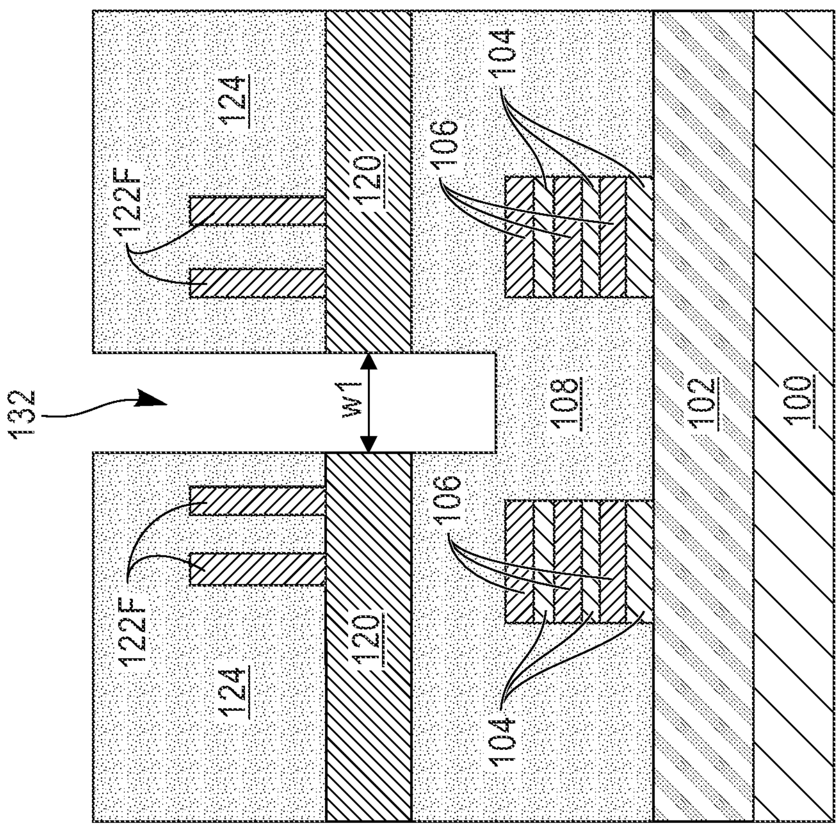
FIGS. 7A, 7B and 7C are cross sectional views of the exemplary structure shown in FIGS. 6A, 6B and 6C, respectively, after forming an opening entirely though the second sacrificial gate structure and the stacked device separating dielectric material layer, and partially into the first sacrificial gate structure.
Figure 7A:
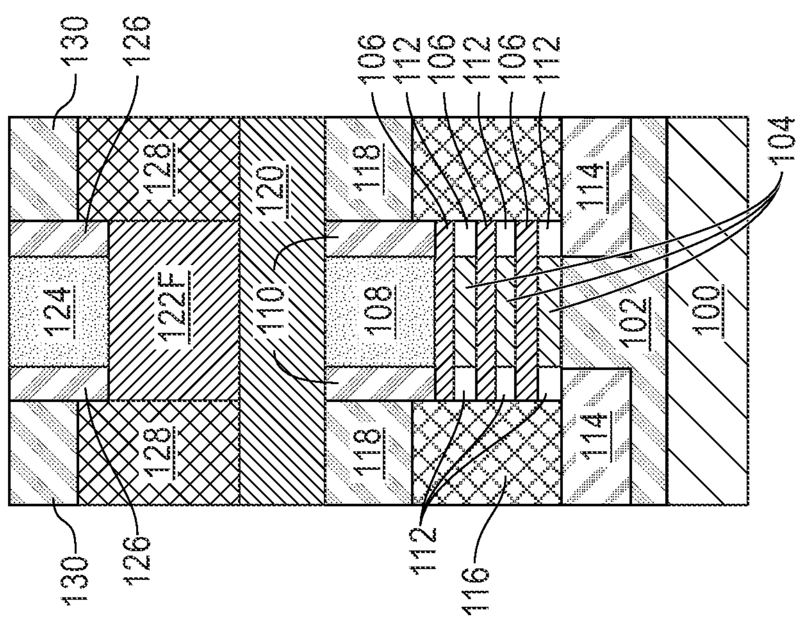
Figure 7C:
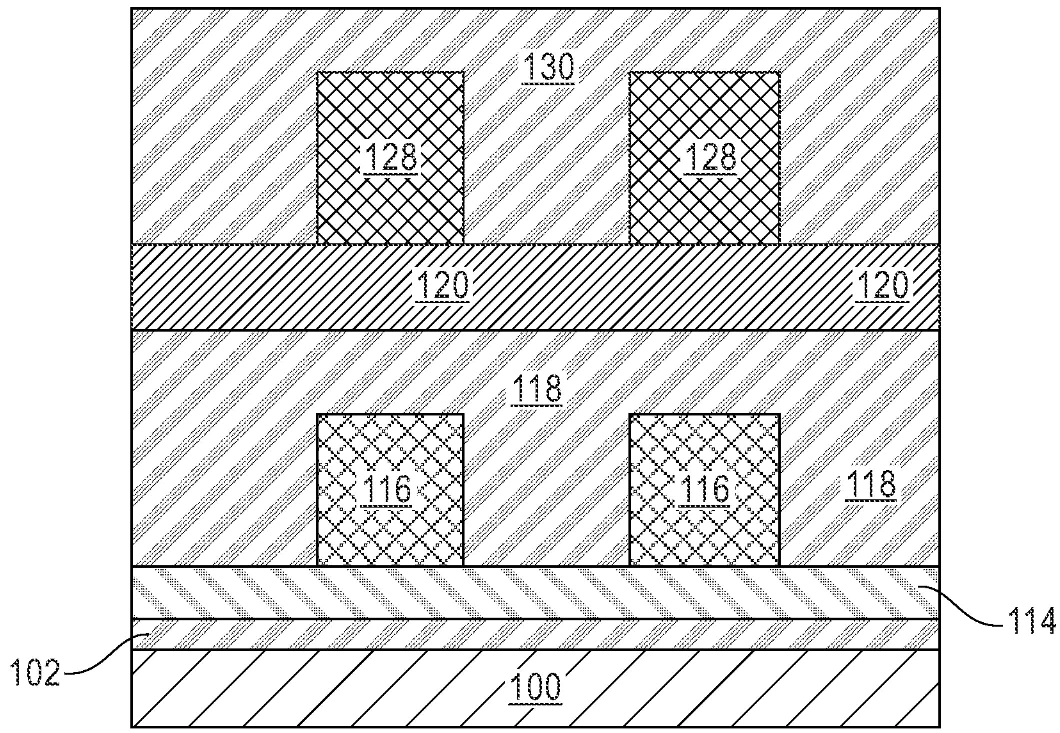

Referring now to FIGS. 7A, 7B and 7C, there are illustrated the exemplary structure shown in FIGS. 6A, 6B and 6C, respectively, after forming an opening 132 entirely though the second sacrificial gate structure 124 and the SDSDM layer 120, and partially into the first sacrificial gate structure 108. Opening 132 defines the location in which the a gate cut trench will be subsequently formed. Opening 132 can be formed by lithography and etching. It is noted that opening 132 has a first width w1 (i.e., critical dimension) that is larger than a gate opening to facilitate subsequent high-k gate dielectric material layer and a-Si fill. Opening 132 passes through the SDSDM layer 120; see FIG. 7B.

Figure 8A:
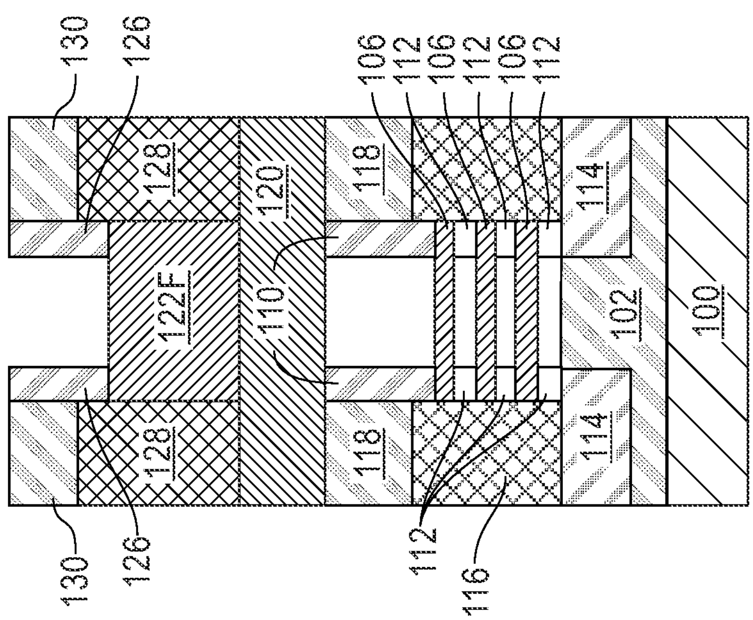
FIGS. 8A, 8B and 8C are cross sectional views of the exemplary structure shown in FIGS. 7A, 7B and 7C, respectively, after removing the first sacrificial gate structure and the second sacrificial gate structure, wherein the removing of the second sacrificial gate structure reveals each semiconductor fin and the removing of the first sacrificial gate structure reveals each sacrificial semiconductor material nanosheet, and thereafter removing the revealed sacrificial semiconductor material nanosheets.
Figure 8B:
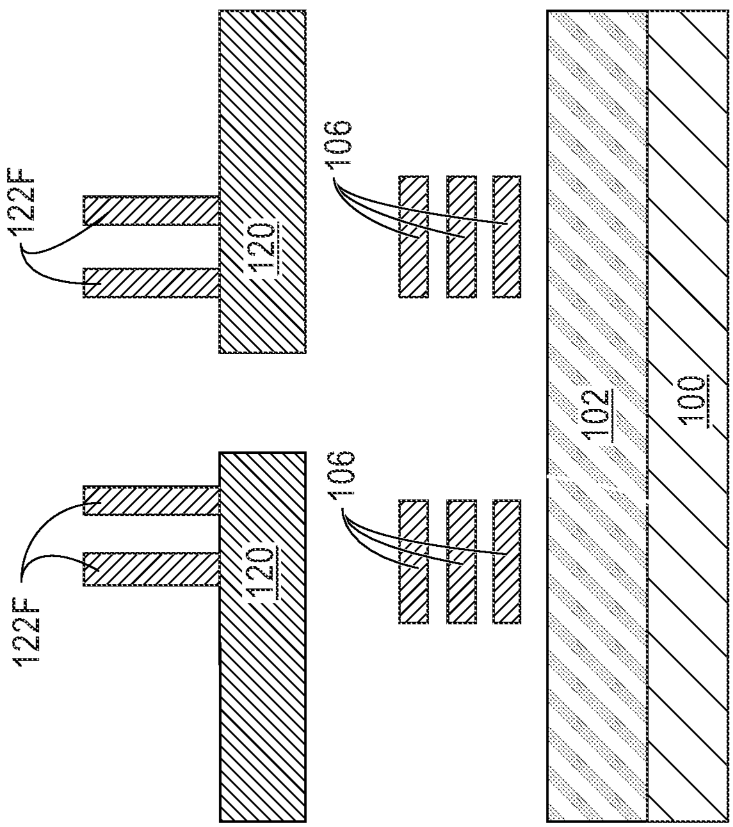
Figure 8C:
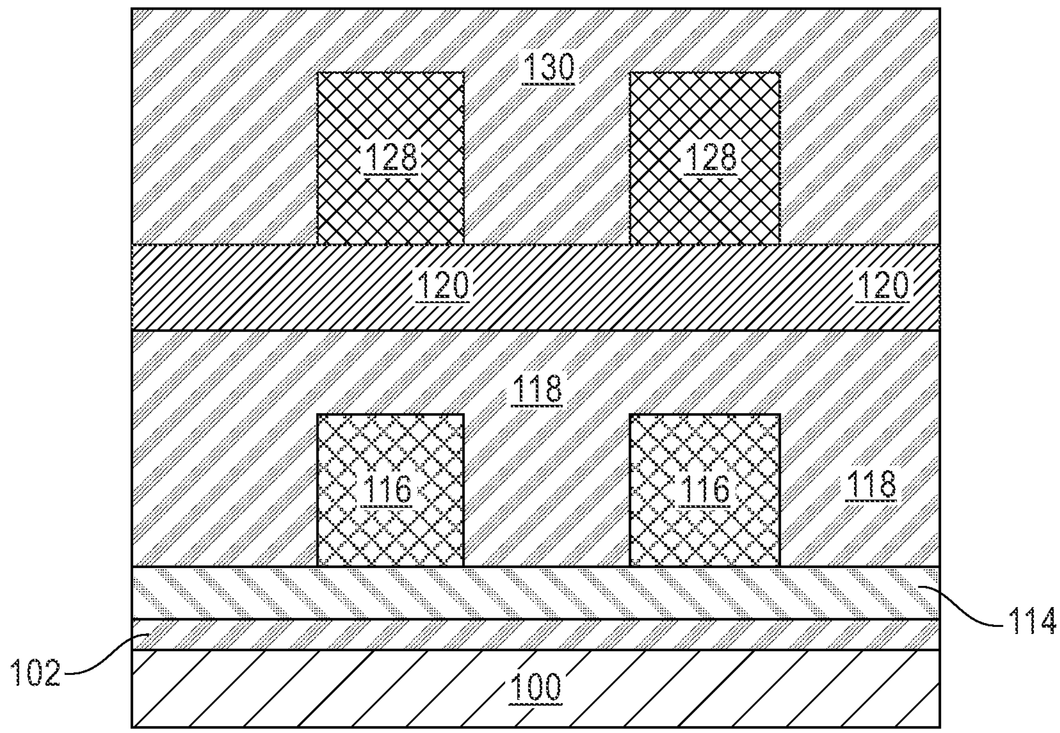

Referring now to FIGS. 8A, 8B and 8C, there are illustrated the exemplary structure shown in FIGS. 7A, 7B and 7C, respectively, after removing the first sacrificial gate structure 108 and the second sacrificial gate structure 124, wherein the removing of the second sacrificial gate structure 124 reveals each semiconductor fin 112F and the removing of the first sacrificial gate structure 108 reveals each sacrificial semiconductor material nanosheet 104, and thereafter removing the revealed sacrificial semiconductor material nanosheets 104. The removal of the sacrificial semiconductor material nanosheets 104 provides a nanosheet stack containing at least one suspended semiconductor channel material nanosheet 106. The removal of the first sacrificial gate structure 108 and the second sacrificial gate structure 124 can include one or more etching processes (dry and/or wet) that is(are) selective in removing the first sacrificial gate structure 108 and the second sacrificial gate structure 124. The removal of the sacrificial semiconductor material nanosheets 104 includes an etch that is selective in removing the sacrificial semiconductor material nanosheets 104 relative to the semiconductor channel material nanosheets 106.

Figure 9B:
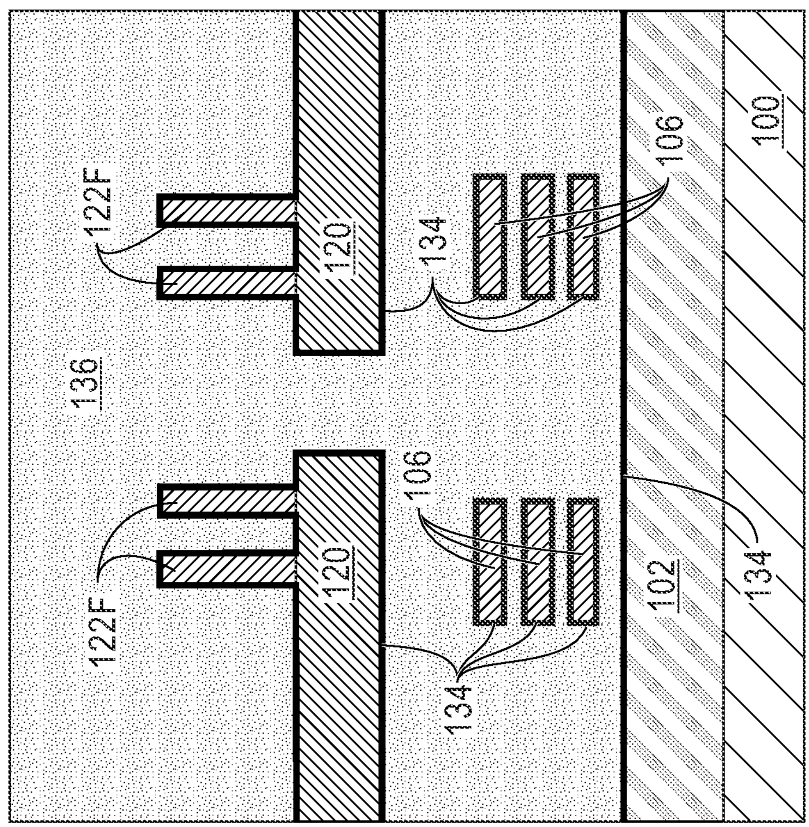
FIGS. 9A, 9B and 9C are cross sectional views of the exemplary structure shown in FIGS. 8A, 8B and 8C, respectively, after forming a high-k dielectric material layer on physically exposed surfaces of each semiconductor fin and physically exposed surfaces of each semiconductor channel material nanosheet, and then forming an amorphous silicon (a-Si) layer.
Figure 9A:
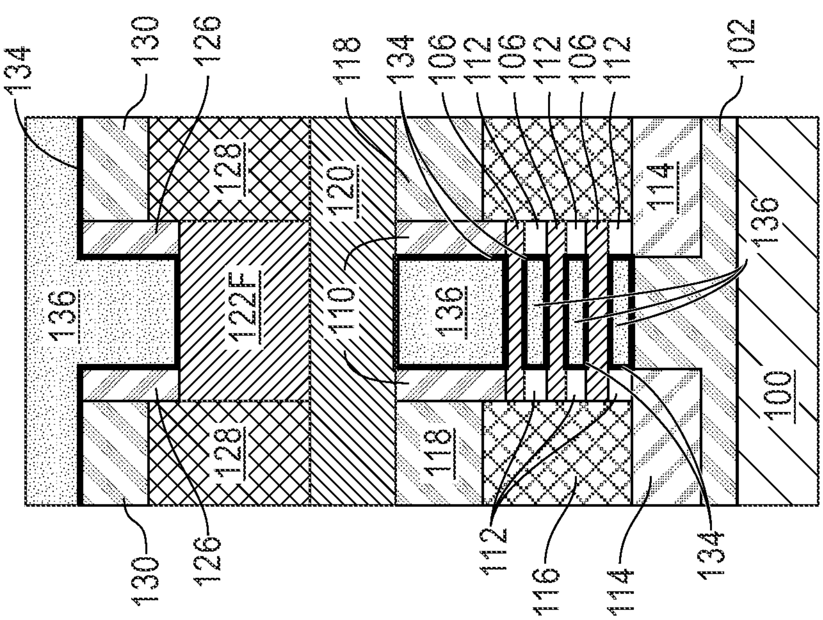
Figure 9C:
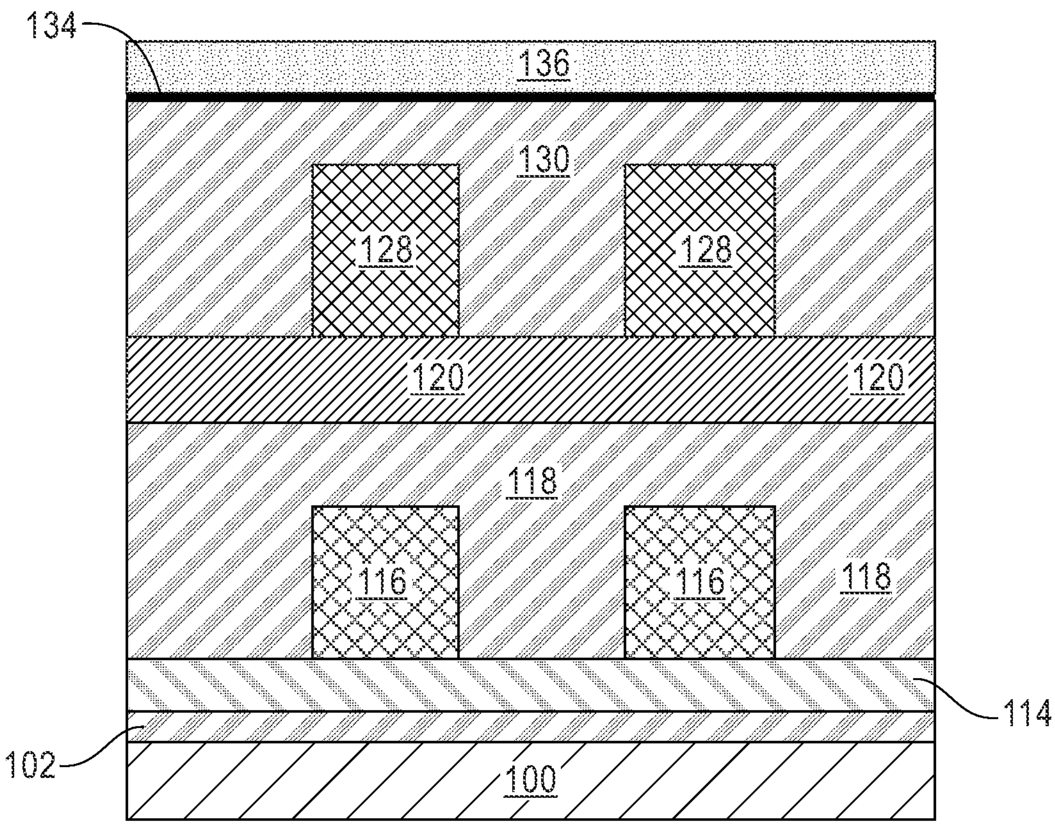

Referring now to FIGS. 9A, 9B and 9C, there are shown the exemplary structure shown in FIGS. 8A, 8B and 8C, respectively, after forming a high-k dielectric material layer 134 on physically exposed surfaces of each semiconductor fin 112F and physically exposed surfaces of each semiconductor channel material nanosheet 106, and then forming an a-Si layer 136. Although not shown, a thin oxygen-scavenging layer (i.e., a TiN layer) can be formed (by a deposition process such as, for example, ALD, CVD, PECVD,) on the high-k dielectric material layer 134 prior to forming the a-Si layer 136. In addition to being formed on physically exposed surfaces of the semiconductor fins 112F and the semiconductor channel material nanosheets 106, the high-k gate dielectric material layer 134 is also formed on a topmost surface, a bottommost surface and a sidewall of the SDSDM layer 120, on a topmost surface of dielectric material 102, on a topmost surface of the second ILD material layer 130 and on a topmost surface and sidewall of the second dielectric spacer 126.

The term "high-k dielectric material" denotes a dielectric material having a dielectric constant greater than 4.0. Illustrative examples of high-k gate dielectric materials that can provide the high-k dielectric material layer 134 include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb (Zn,Nb)O). The high-k gate dielectric material that provides the high-k dielectric material layer 134 can further include dopants such as lanthanum (La), aluminum (Al) and/or magnesium (Mg). The high-k dielectric material layer 134 can be formed utilizing a deposition process such as, for example, ALD, CVD, PECVD, or PVD. The high-k dielectric material layer 134 is a conformal layer having a thickness which can range from 1 nm to 10 nm.

The a-Si layer 136 can be formed by a deposition process including, but not limited to, ALD, CVD, or PECVD. An anneal can follow the deposition of the a-Si layer 136. The anneal can be a rapid thermal anneal that is performed at a temperature from 700° C. to 1200° C. for a duration of from a few nano seconds to about 1 minute. The anneal is performed to ensure the defects inside the high-k dielectric is repaired and to improve the gate dielectric reliability.

Figure 10B:
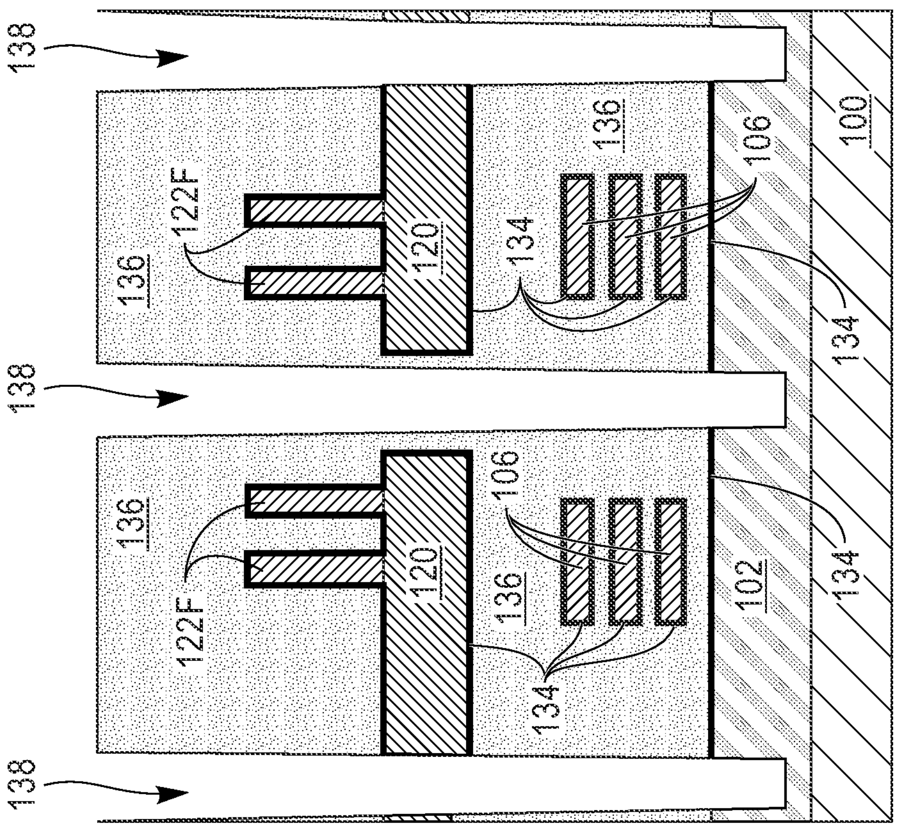
FIGS. 10A, 10B and 10C are cross sectional views of the exemplary structure shown in FIGS. 9A, 9B and 9C, respectively, after forming a gate cut trench (CT) entirely through the a-Si layer and partially into a portion of the dielectric material layer.
Figure 10A:
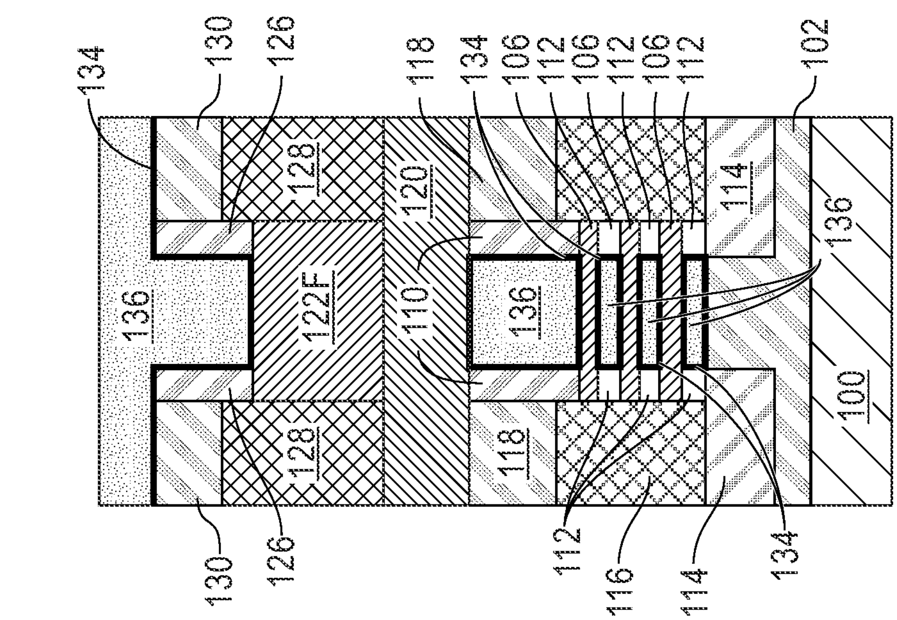
Figure 10C:
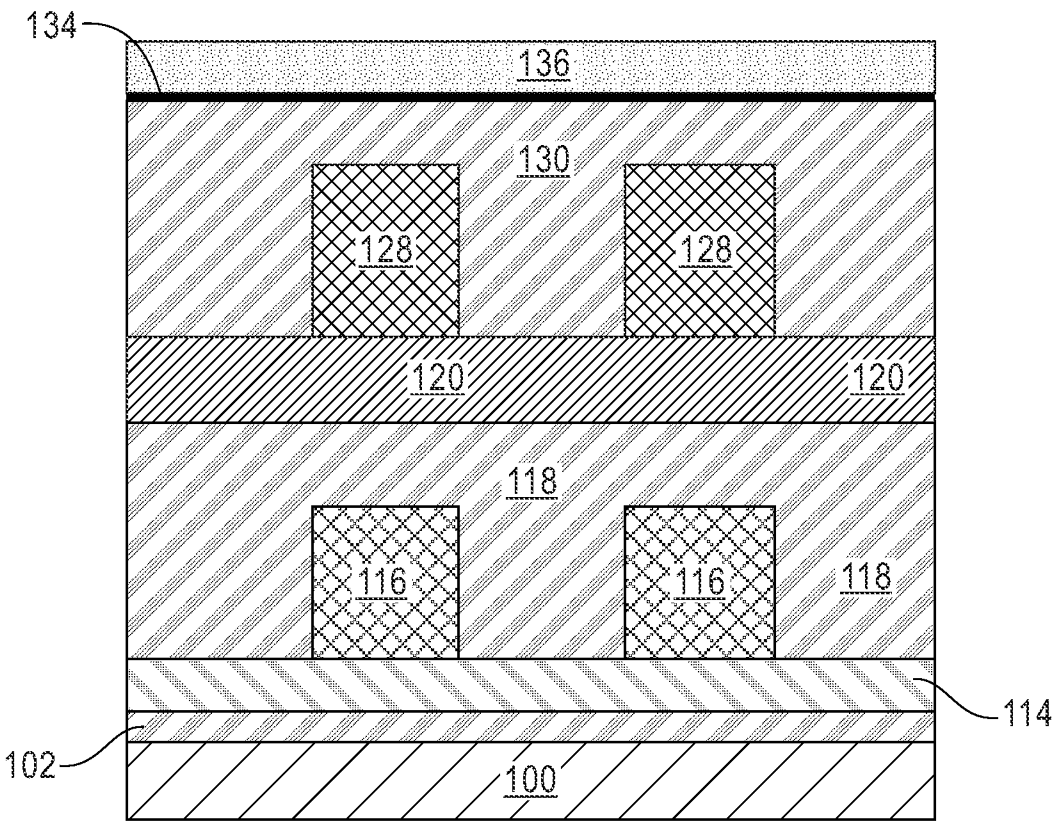

Referring now to FIGS. 10A, 10B and 10C, there are illustrated the exemplary structure shown in FIGS. 9A, 9B and 9C, respectively, after forming a gate cut trench (CT) 138 entirely through the a-Si layer 136 and partially into a portion of the dielectric material layer 102. At the bottom of gate cut trench 138, a sub-surface of dielectric material layer 102 is physically exposed. The term "sub-surface" is used throughout the present application to denote a surface of a material/structure that is located between a topmost surface of the material/structure and a bottommost surface of the material/structure. Some of the gate cut trench 138 is formed in the same region as opening 132 was formed. The gate cut trench 138 can be formed by lithography and etching. The etch is selective in removing physically exposed portions of the a-Si layer 136 stopping on a sub-surface of the dielectric material layer 102.

Figure 11B:
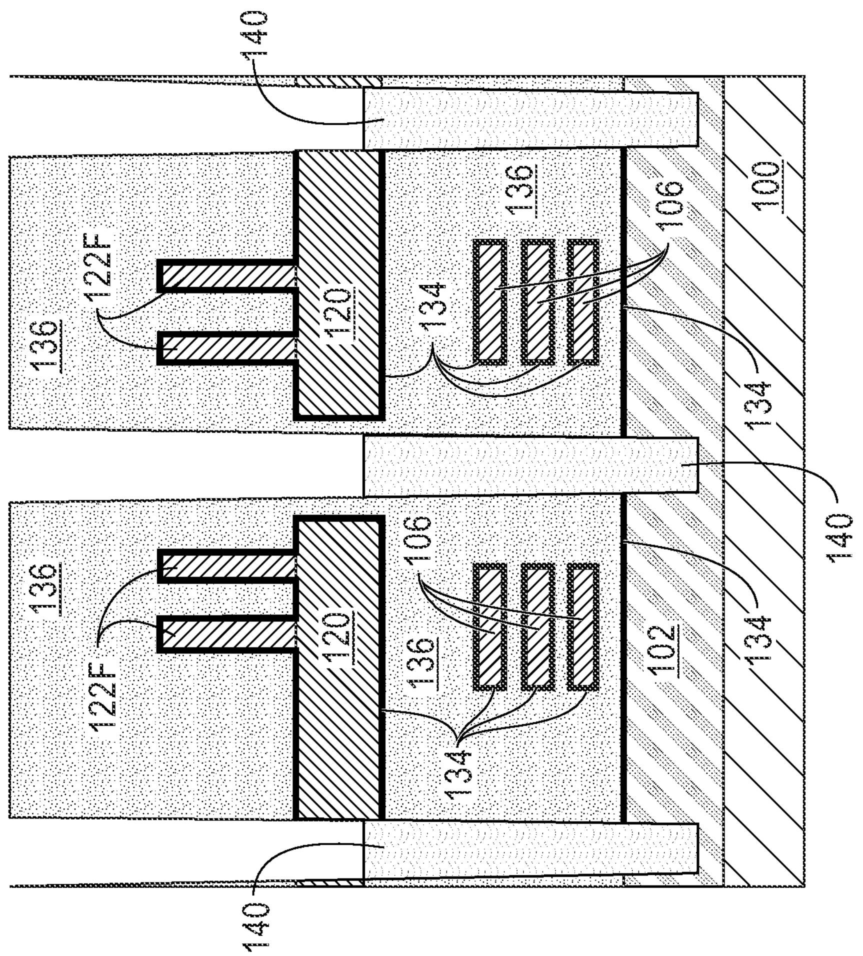
FIGS. 11A, 11B and 11C are cross sectional views of the exemplary structure shown in FIGS. 10A, 10B and 10C, respectively, after forming a protective material within a lower portion of the gate cut trench, wherein the protective material has a topmost surface that is located between a topmost surface and a bottommost surface of the stacked device separating dielectric material layer.
Figure 11A:
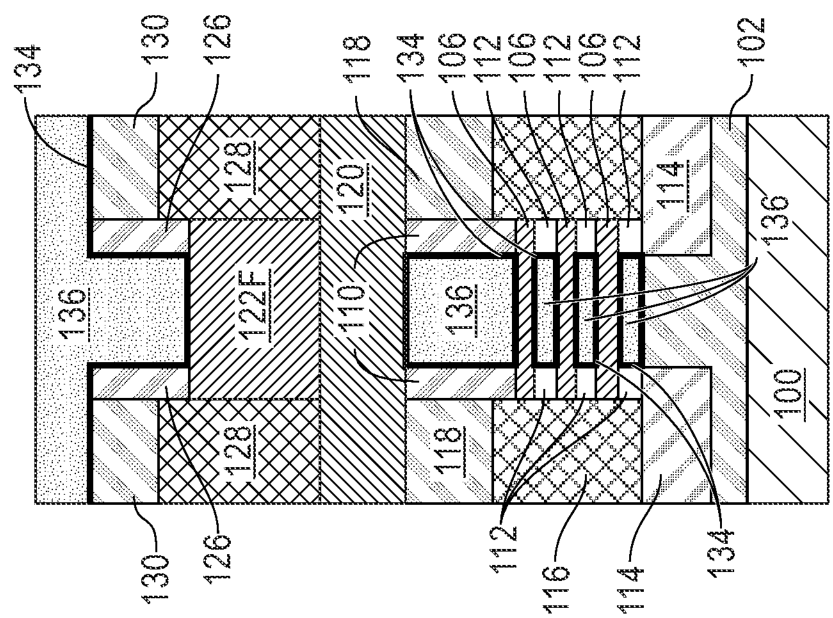
Figure 11C:
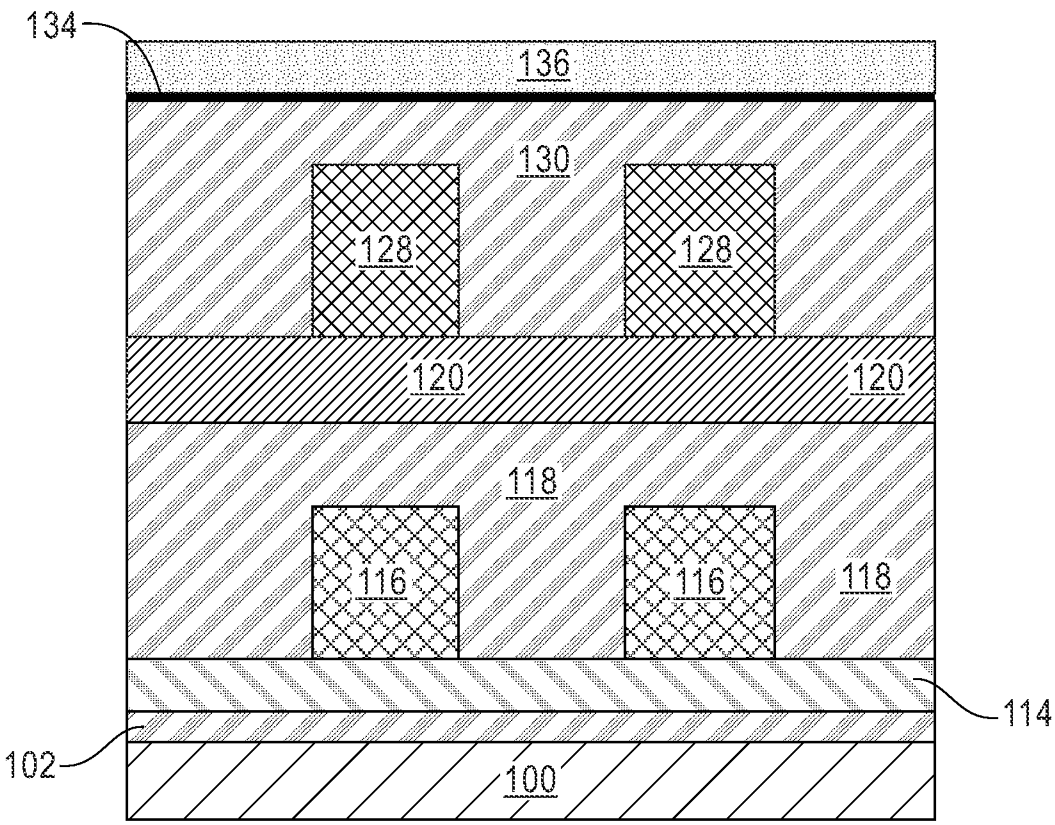

Referring now to FIGS. 11A, 11B and 11C, there are illustrated the exemplary structure shown in FIGS. 10A, 10B and 10C, respectively, after forming a protective material 140 within a lower portion of the gate cut trench 138, wherein the protective material 140 has a topmost surface that is located between a topmost surface and a bottommost surface of the SDSDM layer 120. In one embodiment, protective material 140 is composed of an organic planarization layer (OPL). The protective material 140 can be formed by a deposition process (such as, for example, CVD, PECVD or PVD), followed by a recess etch. Note that the recess etch does not need to be accurate as long as the recess etch stops somewhere between the topmost and bottom surfaces of the SDSDM layer 120.

Figure 12A:
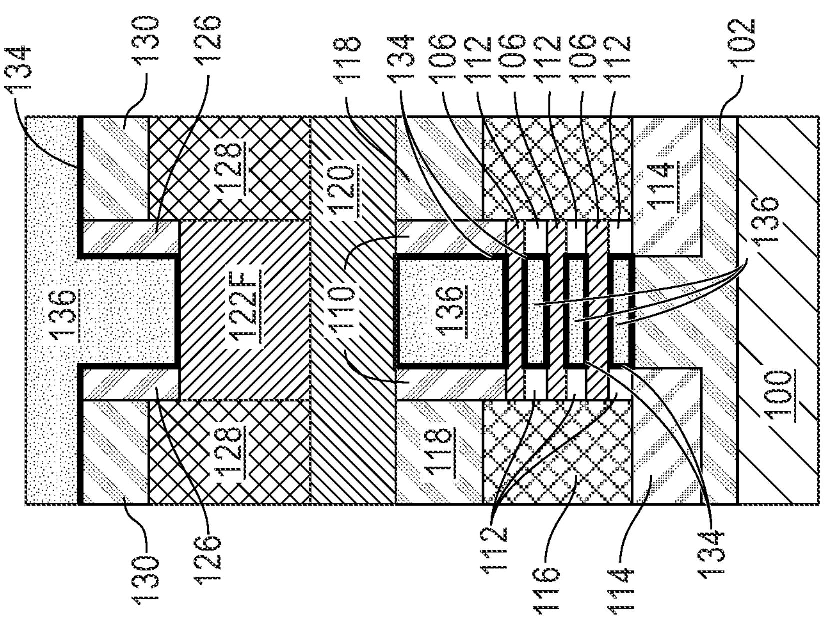
FIGS. 12A, 12B and 12C are cross sectional views of the exemplary structure shown in FIGS. 11A, 11B and 11C, respectively, after trimming the a-Si layer that is located along sidewalls of an upper portion of the gate cut trench so as to increase the width of the upper portion of the gate cut trench relative to a lower portion of the gate cut trench.
Figure 12B:
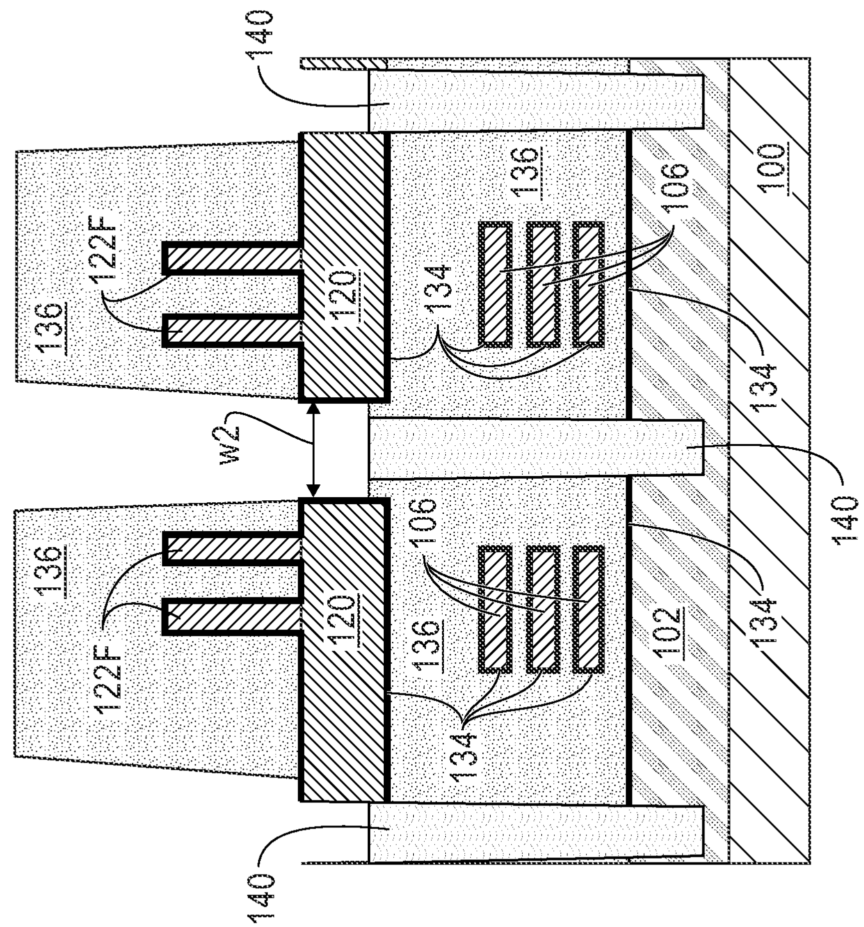
Figure 12C:
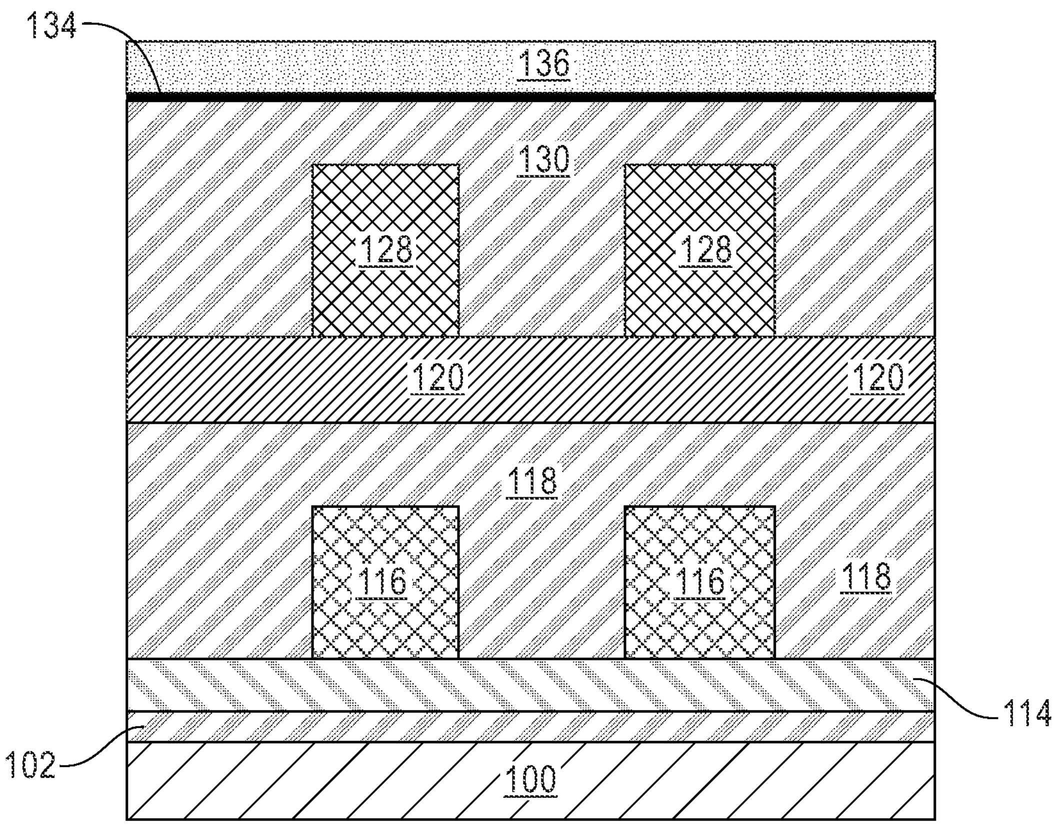

Referring now to FIGS. 12A, 12B and 12C, there are illustrated the exemplary structure shown in FIGS. 11A, 11B and 11C, respectively, after trimming the a-Si layer 136 that is located along sidewalls of an upper portion of the gate cut trench 138 so as to increase the width of the upper portion of the gate cut trench 138 relative to a lower portion of the gate cut trench 138. The increased width has a second width w2 that is greater than an original width w0 of the gate cut trench 138. The trimming blows up the critical dimension, i.e., width, of the original gate cut trench 138 that is not protected by the protective material 140. This trimming step can reveal the high-k gate dielectric material layer 134 that is present along the sidewall of the previously cut SDSDM layer 120. This trimming step can be performed by an isotropic Si/TiN etch.

Figure 13B:
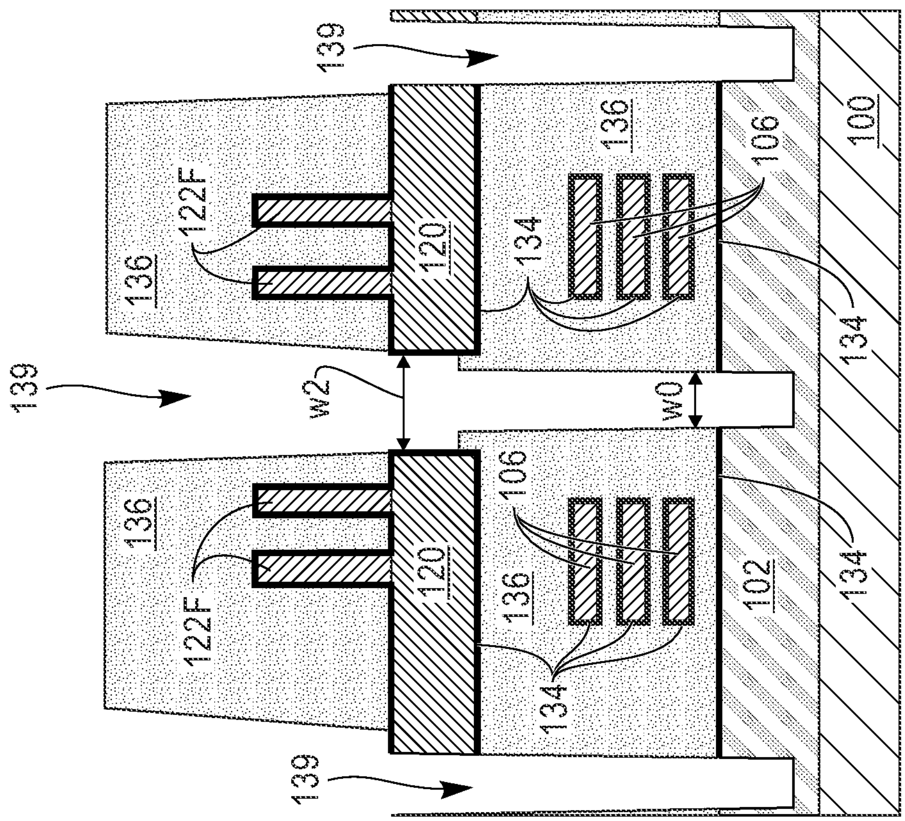
FIGS. 13A, 13B and 13C are cross sectional views of the exemplary structure shown in FIGS. 12A, 12B and 12C, respectively, after removing the protective material from the lower portion of the gate cut trench to reveal a modified gate cut trench having a first portion with the width of the original gate cut trench and a second portion with the increased width.
Figure 13A:
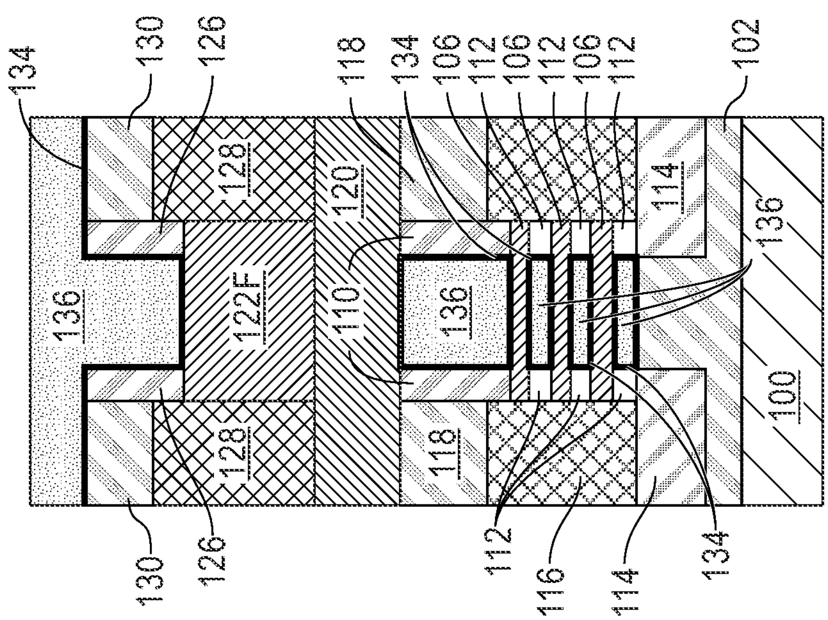
Figure 13C:
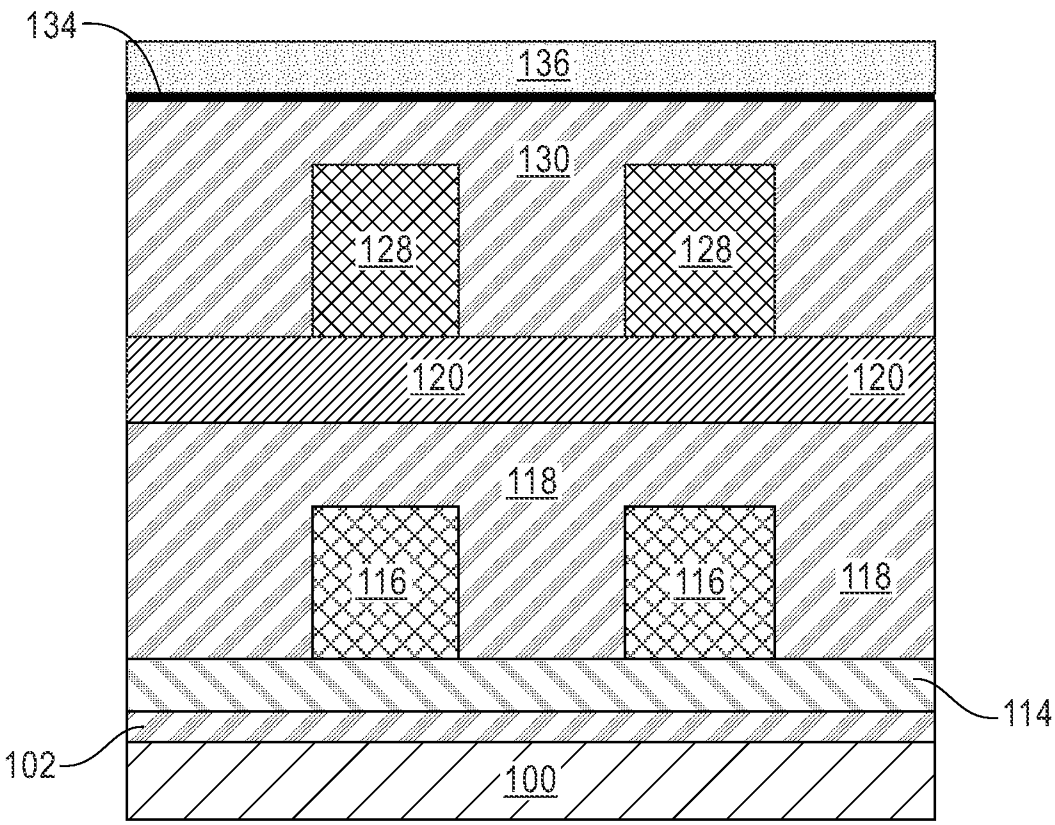

Referring now to FIGS. 13A, 13B and 13C, there are illustrated the exemplary structure shown in FIGS. 12A, 12B and 12C, respectively, after removing the protective material 140 from the lower portion of the gate cut trench 138 to reveal a modified gate cut trench 139 having a first portion with the width of the original gate gut trench (this width is labeled as w0 in FIG. 13B) and a second portion with the increased width (i.e., second width w2). The protective material 140 can be removed utilizing an etch that is selective in removing the protective material 140 from the modified gate cut trench 139, such as $N_2/H_2$ ash.

Figure 14B:
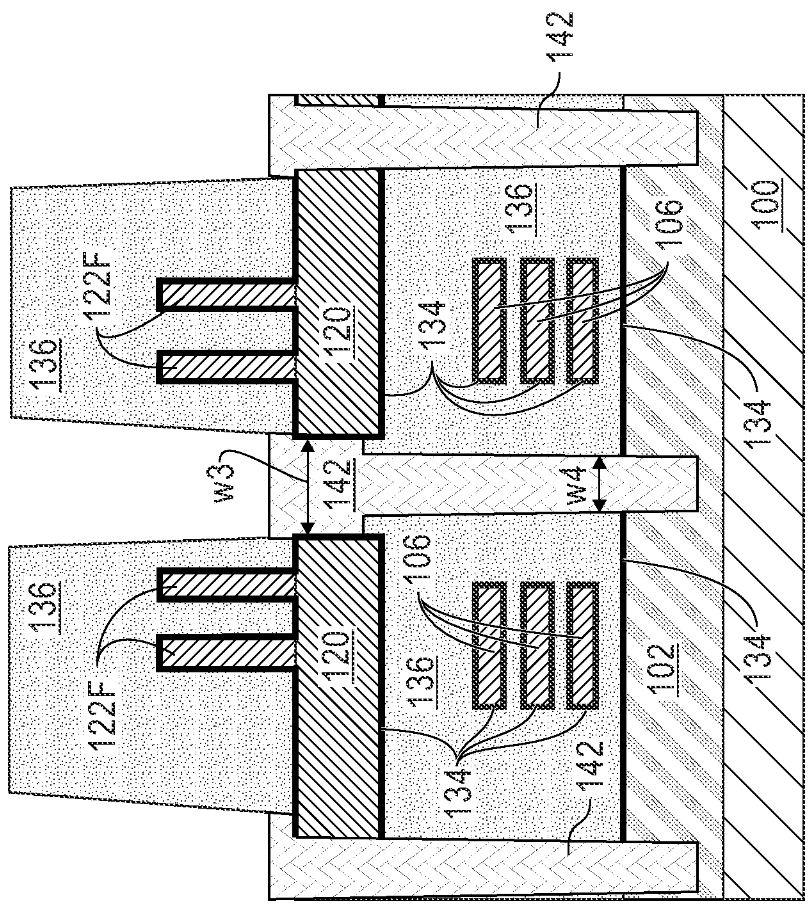
FIGS. 14A, 14B and 14C are cross sectional views of the exemplary structure shown in FIGS. 13A, 13B and 13C, respectively, after forming a first gate cut dielectric structure in the first portion of the modified gate cut trench and partially into the second portion of the modified gate trench.
Figure 14A:
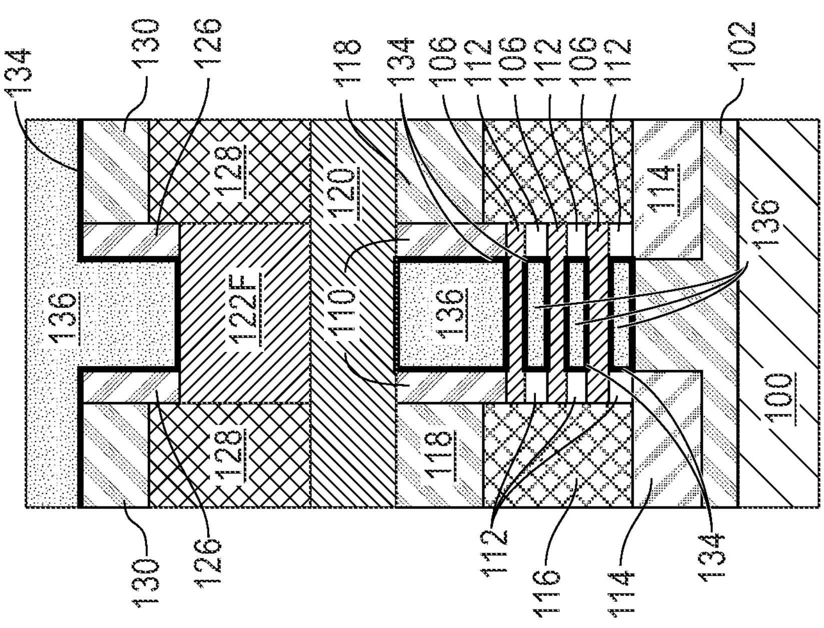
Figure 14C:
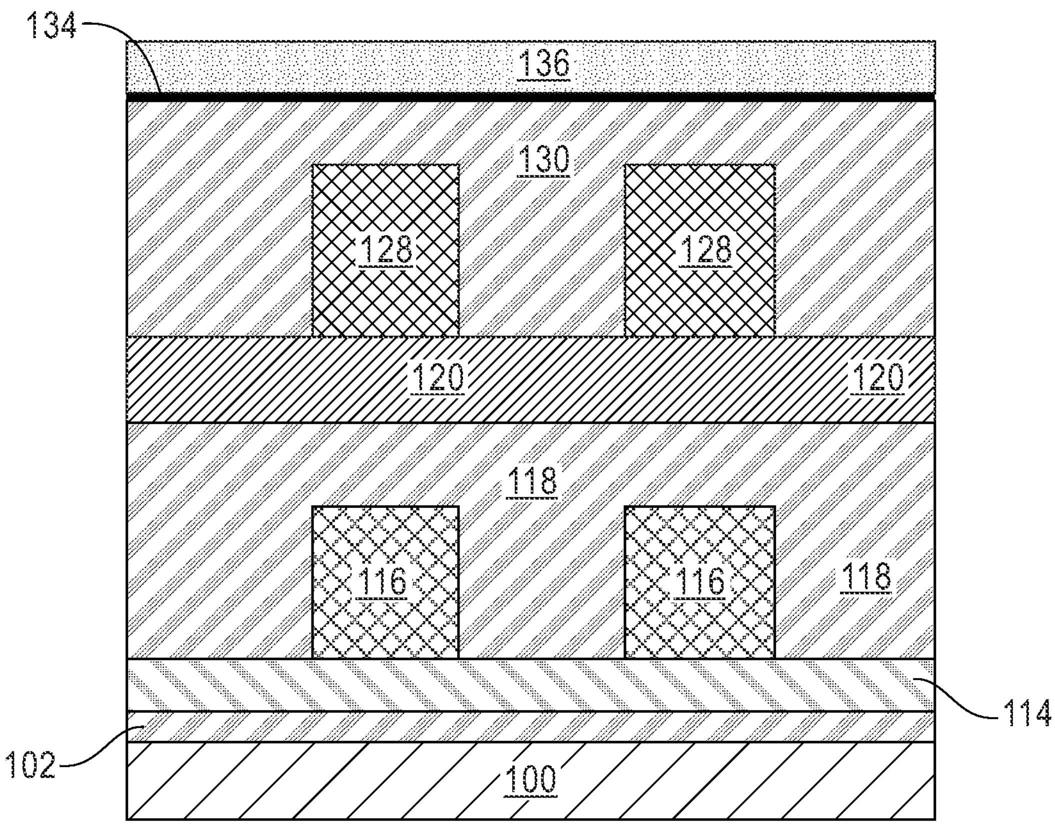

Referring now to FIGS. 14A, 14B and 14C, there are illustrated the exemplary structure shown in FIGS. 13A, 13B and 13C, respectively, after forming a first gate cut dielectric structure 142 in the first portion of the modified gate cut trench 139 and partially into the second portion of the modified gate trench 139. As is shown, the first gate cut dielectric structure 142 has a surface that directly contacts the sub-surface of dielectric material layer 102 and has a portion that passes through the opening that is present in the SDSDM layer 120 which has an enlarged width, i.e., w3, as compared to a width, w4, of a portion of the first gate cut dielectric structure 142 that does not pass though the opening and is present in the lower portion of modified gate cut trench 139. In the present application, w4 is equal to w0 mentioned above, and w3 is equal to w2 mentioned above. The first gate cut dielectric structure 142 has a topmost surface that extends above a topmost surface of the SDSDM layer 120 and thus is present in the region (i.e., second device region) including the semiconductor fins 122F. The first gate cut dielectric structure 142 can be composed of a dielectric material that is compositionally different from the dielectric material that provides the dielectric material layer 102. In one embodiment, the first gate cut dielectric structure 142 is composed of silicon nitride. The first gate cut dielectric structure 142 can be formed by a deposition process such, for example, CVD or PECVD, followed by a recess etch.

Figure 15B:
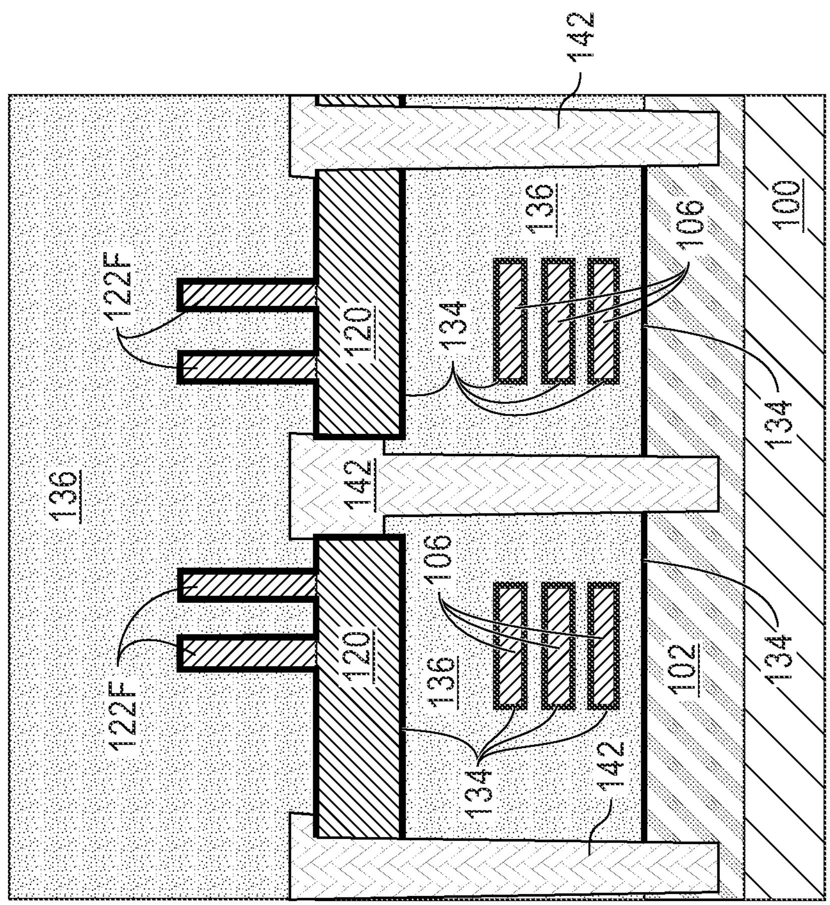
FIGS. 15A, 15B and 15C are cross sectional views of the exemplary structure shown in FIGS. 14A, 14B and 14C, respectively, after forming additional a-Si on top of the first gate cut dielectric structure and completely filling the remaining second portion of the modified gate cut trench.
Figure 15A:
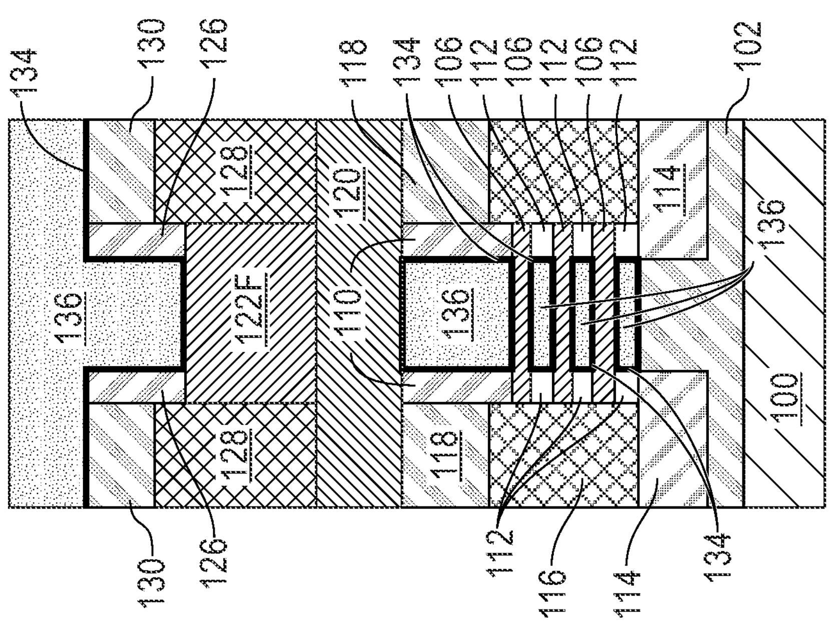
Figure 15C:
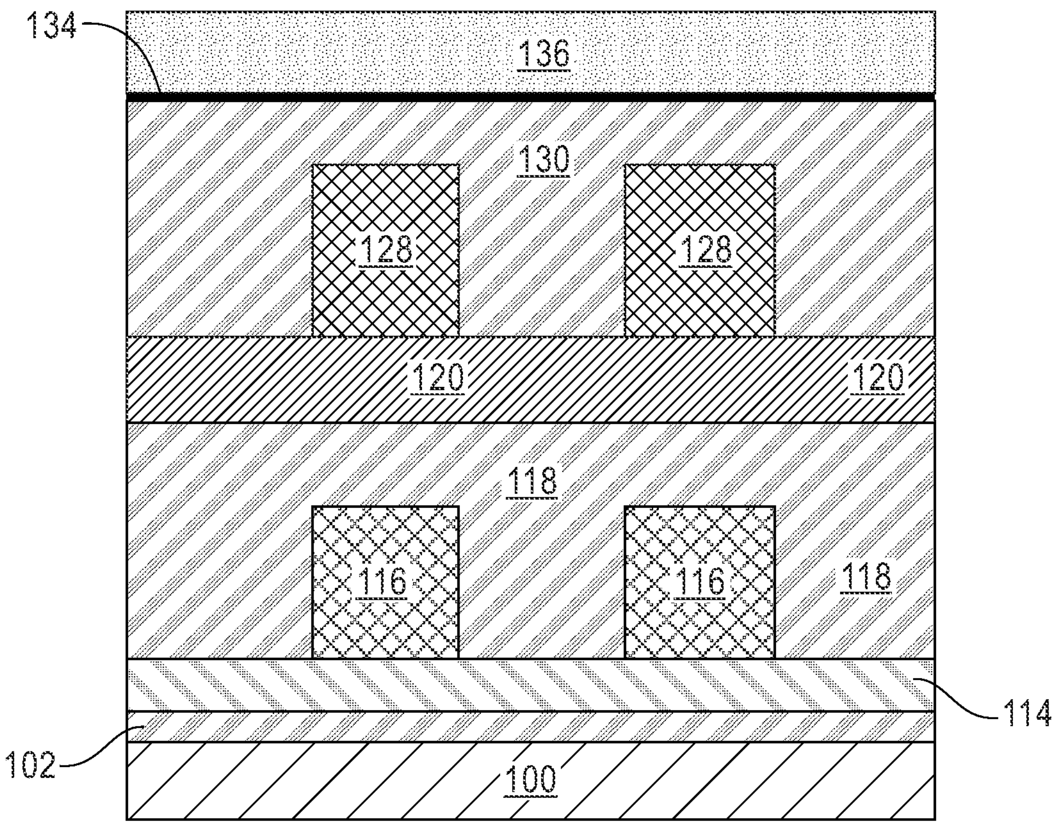

Referring now to FIGS. 15A, 15B and 15C, there are illustrated the exemplary structure shown in FIGS. 14A, 14B and 14C, respectively, after forming additional a-Si on top of the first gate cut dielectric structure 142 and completely filling the remaining second portion of the modified gate cut trench 139. The additional a-Si reestablish the integrity of the original a-Si layer 136. The additional a-Si can be formed by deposition and planarization. The additional a-Si layer is not separately shown in the drawings of the present application.

Figure 16B:
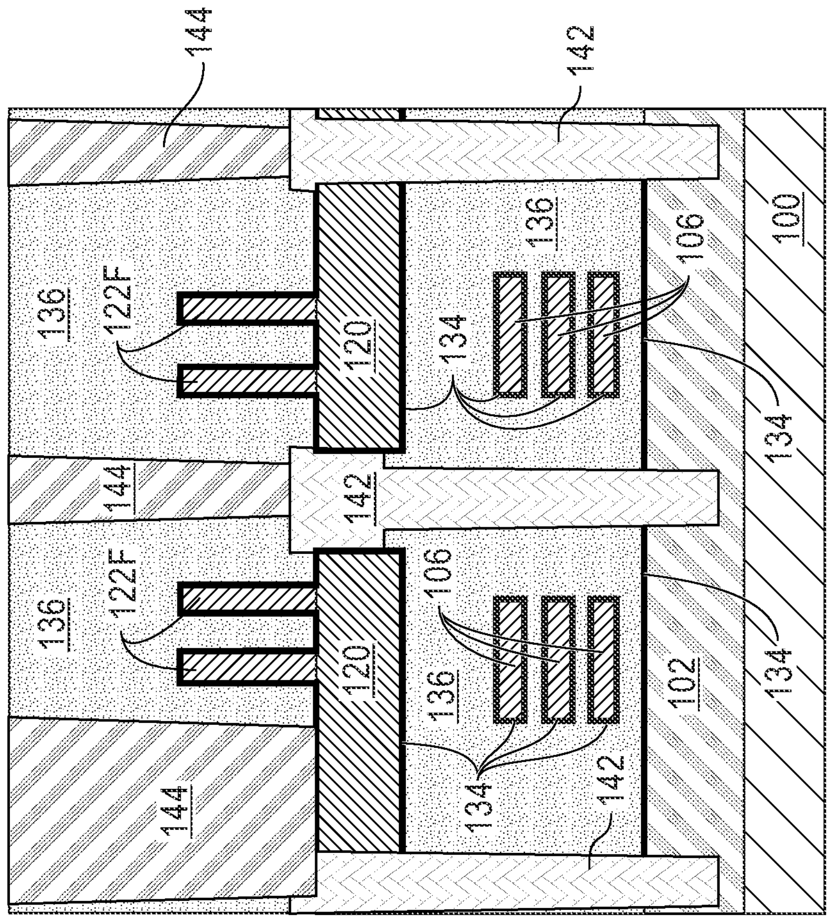
FIGS. 16A, 16B and 16C are cross sectional views of the exemplary structure shown in FIGS. 15A, 15B and 15C, respectively, after forming a second gate cut dielectric structure in the a-Si layer and contacting a surface of the first gate cut dielectric structure.
Figure 16A:
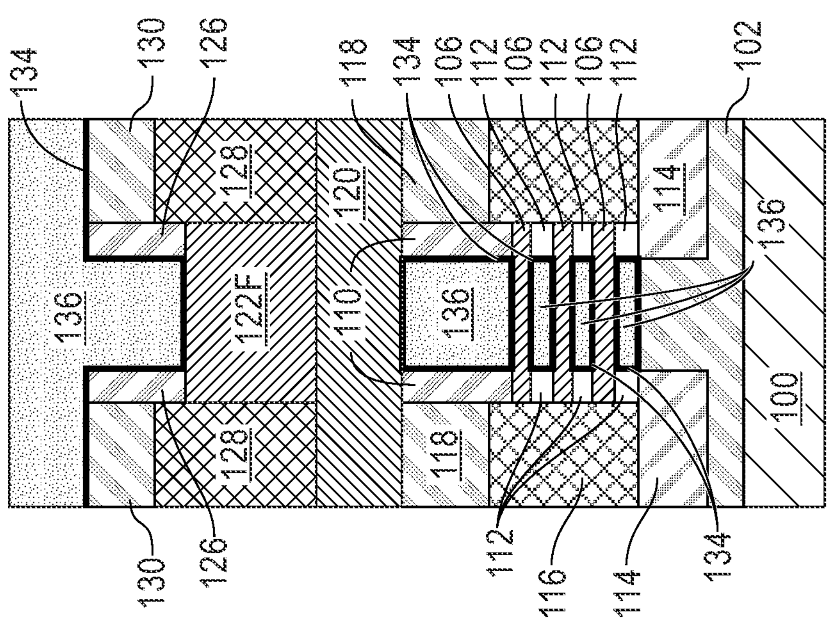
Figure 16C:
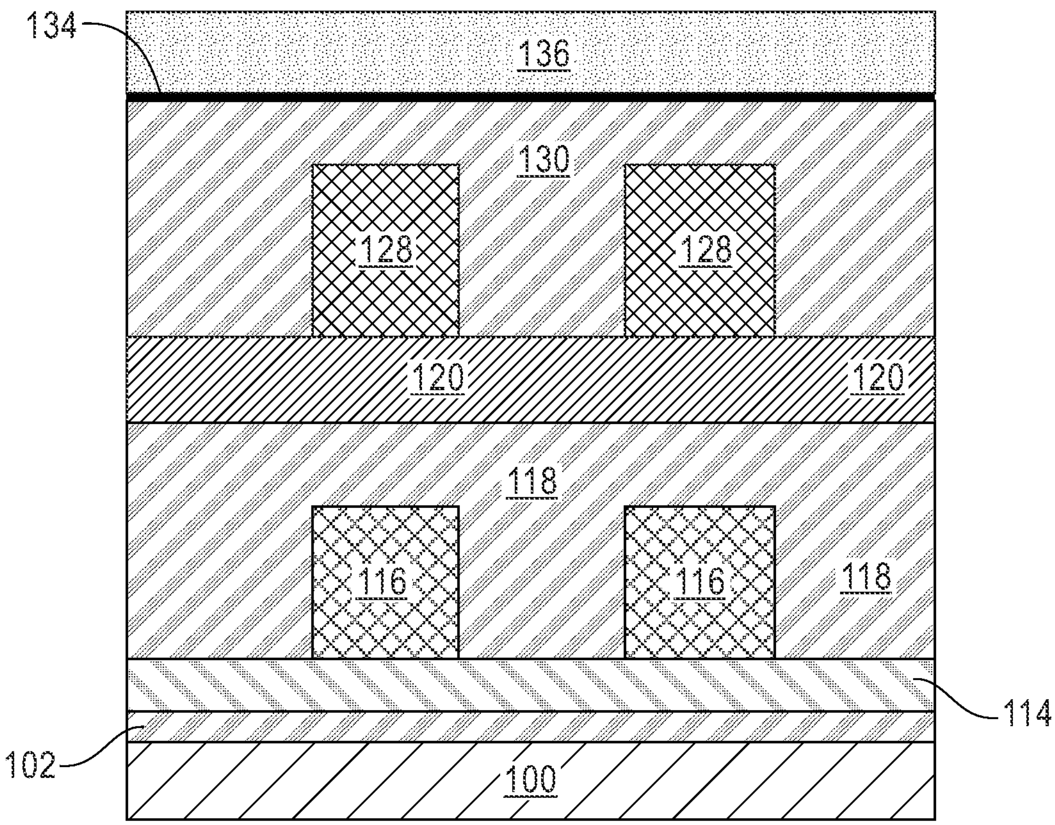

Referring now to FIGS. 16A, 16B and 16C, there are illustrated the exemplary structure shown in FIGS. 15A, 15B and 15C, respectively, after forming a second gate cut dielectric structure 144 in the a-Si layer 136 and contacting a surface of the first gate cut dielectric structure 142. The second gate cut dielectric structure 144 can be composed of a compositionally same, or compositionally different, dielectric material as the first gate cut dielectric structure 142. The second gate cut dielectric structure 144 can be formed by lithography, etching, deposition and a planarization process.

Figure 17B:
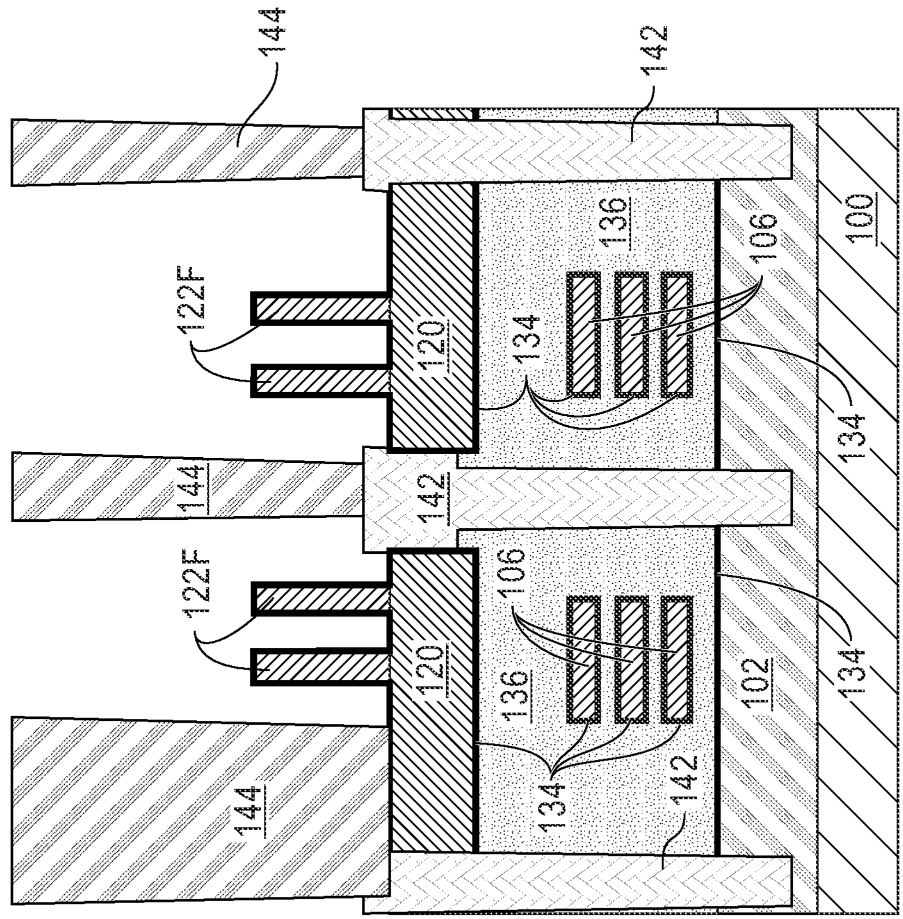
FIGS. 17A, 17B and 17C are cross sectional views of the exemplary structure shown in FIGS. 16A, 16B and 16C, respectively, after removing the upper portion of the a-Si layer to reveal the high-k gate dielectric material that is located on each semiconductor fin.
Figure 17A:
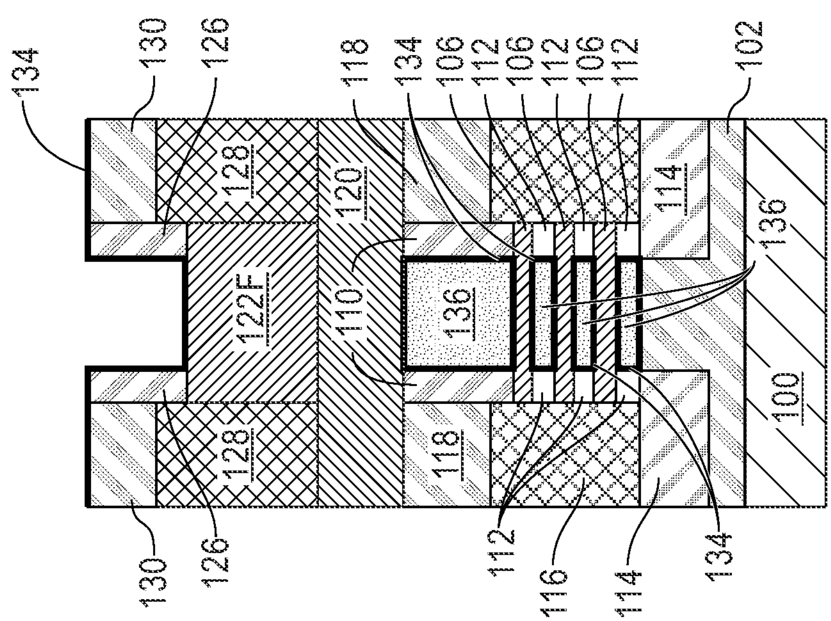
Figure 17C:
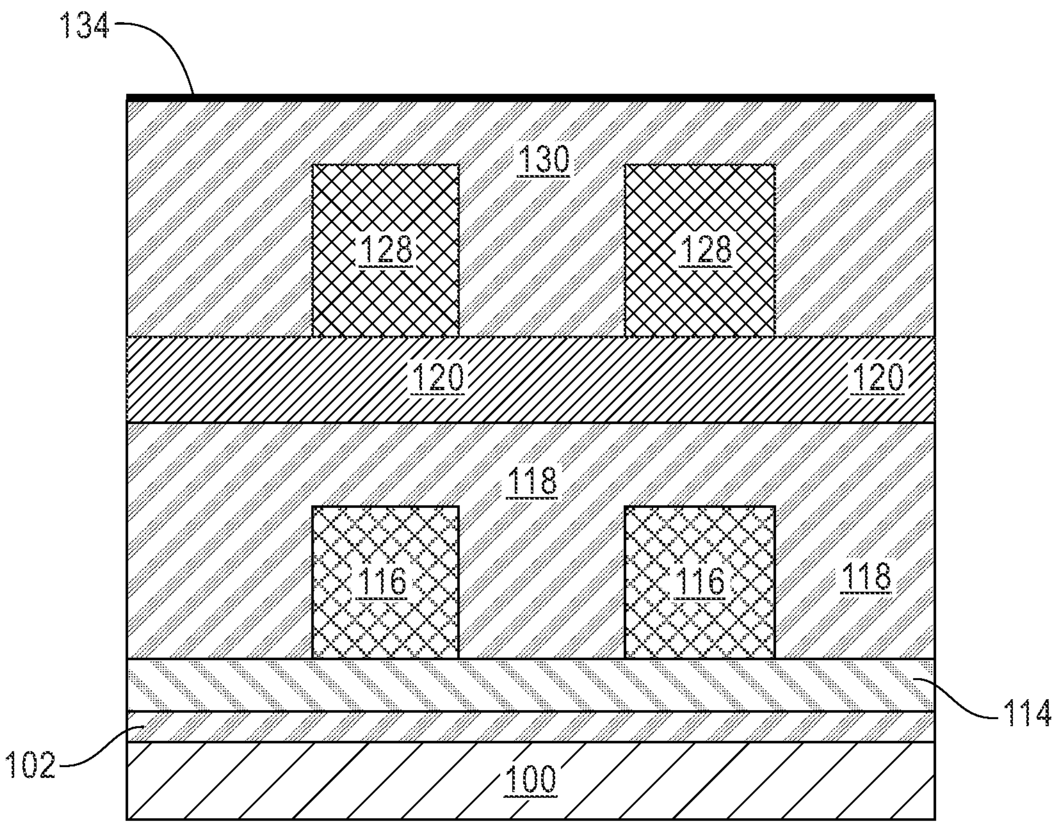

Referring now to FIGS. 17A, 17B and 17C, there are illustrated the exemplary structure shown in FIGS. 16A, 16B and 16C, respectively, after removing the upper portion of the a-Si layer 136 to reveal the high-k gate dielectric material layer 134 that is located on each semiconductor fin 122F and on a topmost surface of the SDSDM layer 120. This step also includes removing the oxygen-scavenging layer that can be present on the high-k gate dielectric material layer 134. The removal of the upper portion of the a-Si layer 136 can include an etch that is selective in removing a-Si, while the removal of the oxygen-scavenging layer can include another etch that is selective in removing the oxygen-scavenging layer.

Figure 18B:
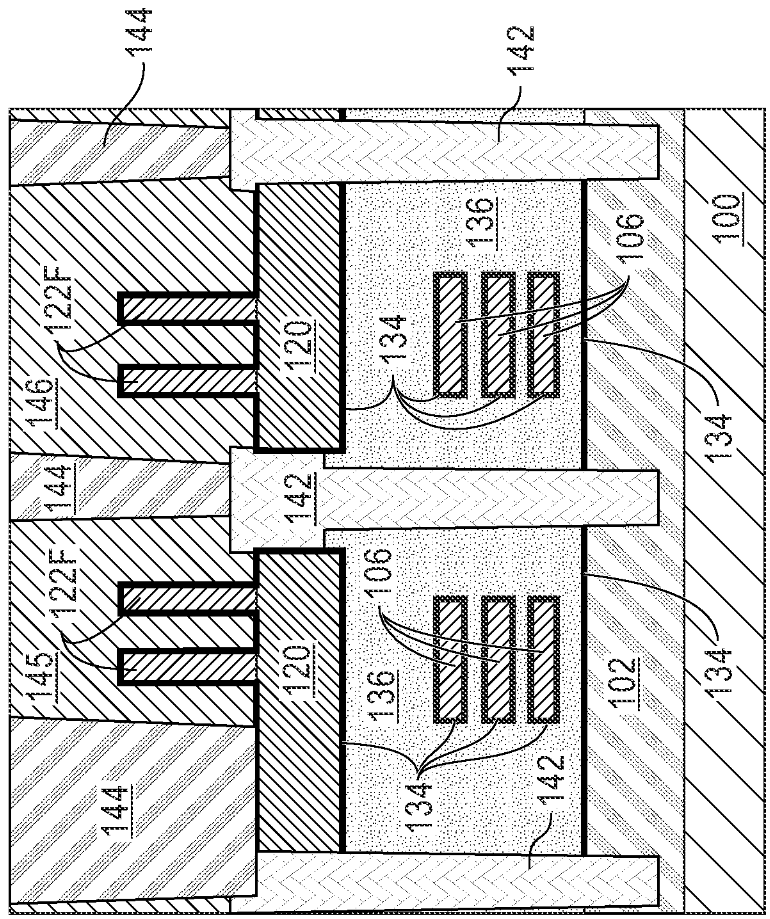
FIGS. 18A, 18B and 18C are cross sectional views of the exemplary structure shown in FIGS. 17A, 17B and 17C, respectively, after forming a second gate electrode on a physically exposed surface of the high-k gate dielectric material layer that is located on a first set of semiconductor fins, and another second gate electrode on a physically exposed surface of the high-k gate dielectric material layer that is located on a second set of semiconductor fins, wherein the first and second set of semiconductor fins are separated by the second gate cut dielectric structure and the enlarged width portion of the first gate cut dielectric structure that passes through the opening that is present in the stacked device separating dielectric material layer.
Figure 18A:
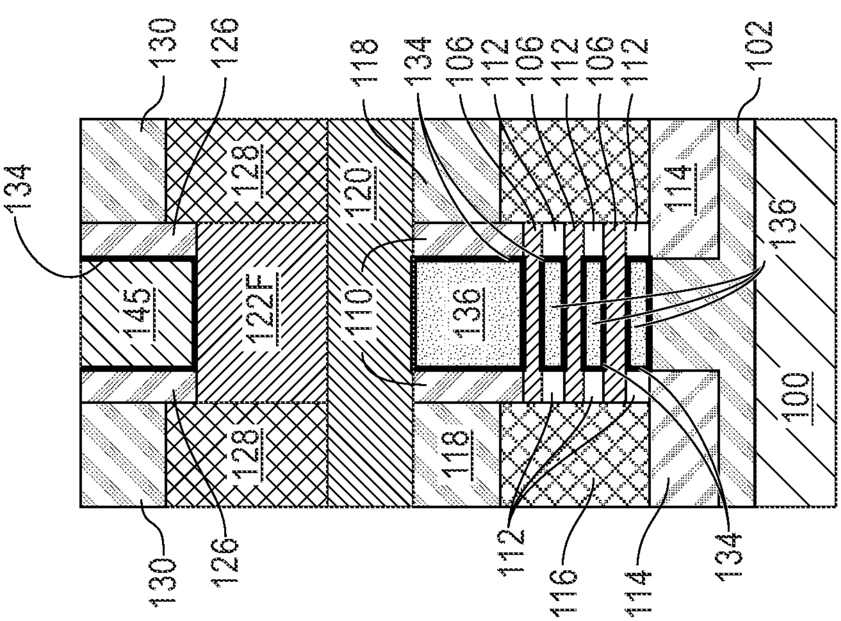
Figure 18C:
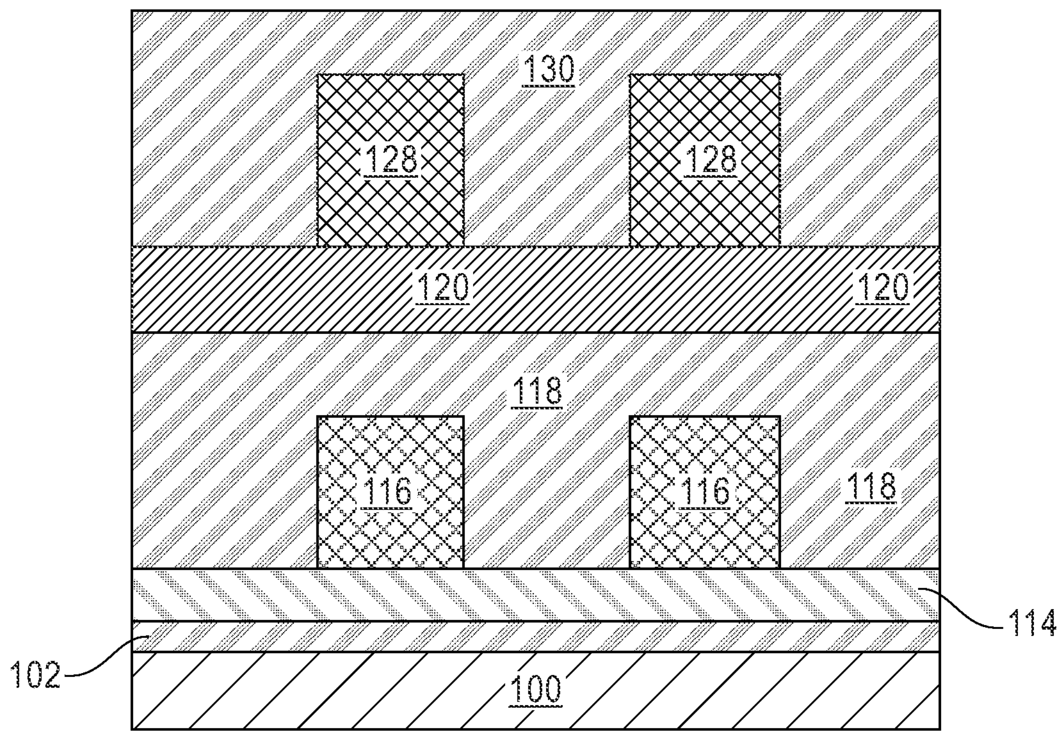

Referring now to FIGS. 18A, 18B and 18C, there are illustrated the exemplary structure shown in FIGS. 17A, 17B and 17C, respectively, after forming a second gate electrode 145 on a physically exposed surface of the high-k gate dielectric material layer 134 that is located on a first set of semiconductor fins 122F (left hand side of FIG. 18B), and another second gate electrode 146 on a physically exposed surface of the high-k gate dielectric material layer 134 that is located on a second set of semiconductor fins 122F (right hand side of FIG. 18B), wherein the first and second sets of semiconductor fins are separated by the second gate cut dielectric structure 144 and the enlarged width portion of the first gate cut dielectric structure 142 that passes through the opening that is present in the SDSDM layer 120. It is noted that a first gate electrode will be formed in a subsequent processing step of the present application.

In accordance with the present application, the second gate electrode 145 and the gate dielectric material layer 134 formed on the first set of semiconductor fins 122F provide a second functional gate structure of a second FET device, while the another gate electrode 146 and the gate dielectric material layer 134 formed on the second set of semiconductor fins 122F provides another second FET device. In some embodiments, the second FET device and the another second FET device can have a same threshold voltage Vt. In other embodiments, the second FET device can have a Vt that differs from the Vt of the another second FET device. In the illustrated embodiment, the second FET device and the another second FET device are finFET devices. The second FET device and the another second FET device can be of a same conductivity type (p-FET devices or n-FET devices). The second FET device and the another second FET device can also be of different conductivity types.

The second gate electrode 145 and the another second gate electrode 146 include at least a work function metal (WFM) and an optional gate electrode material. Depending on the technique used to form the second gate electrode 145 and the another second gate electrode 146, the second gate electrode 145 and the another second gate electrode 146 can include WFMs that are compositionally the same, or WFMs that are compositionally different. In embodiments, the gate electrode 145 and the another second gate electrode 146, can include gate electrode materials that are compositionally the same, or gate electrode materials that are compositionally different. When the optional gate electrode material is present, the WFM is located between the gate electrode material and the high-k gate dielectric material layer. The WFM is used in the present application used to set a threshold voltage of the FET device to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The WFM can be formed by a deposition process such as, for example, ALD, CVD or PECVD.

The optional gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_X$), titanium carbide (TiC), titanium aluminum carbide, tungsten silicide ($WSi_2$), tungsten nitride (WN), ruthenium oxide ($RuO_2$), cobalt silicide, or nickel silicide. The optional gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

The second gate electrode 145 and the another second gate electrode 146 can be formed simultaneously or at different times using block mask technology. In either embodiment, the second gate electrode 145 and the another second gate electrode 146 are formed by deposition, followed by a planarization process. The planarization process removes the optional gate electrode material, WFM and high-k dielectric material 134 that is present on the second dielectric spacer 126 and second ILD material layer 130 providing the planar structure shown in FIGS. 18A, 18B and 18C.

Figure 19B:
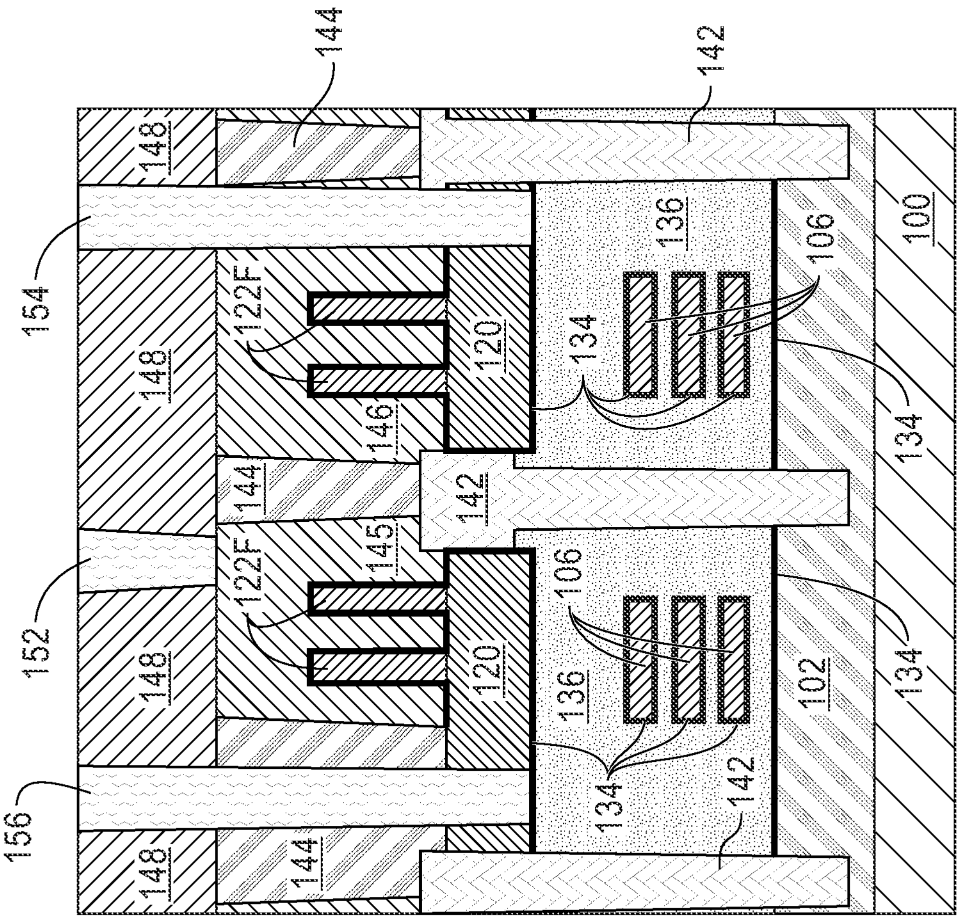
FIGS. 19A, 19B and 19C are cross sectional views of the exemplary structure shown in FIGS. 18A, 18B and 18C, respectively, after forming a second conductive contact-containing ILD material layer, wherein the second conductive contact containing ILD material layer includes a second source/drain contact structure contacting the second source/drain region, a second gate contact structure contacting the second gate electrode, a first gate contact structure, a shared gate contact structure, and a first source/drain contact structure dielectric cap embedded therein.
Figure 19A:
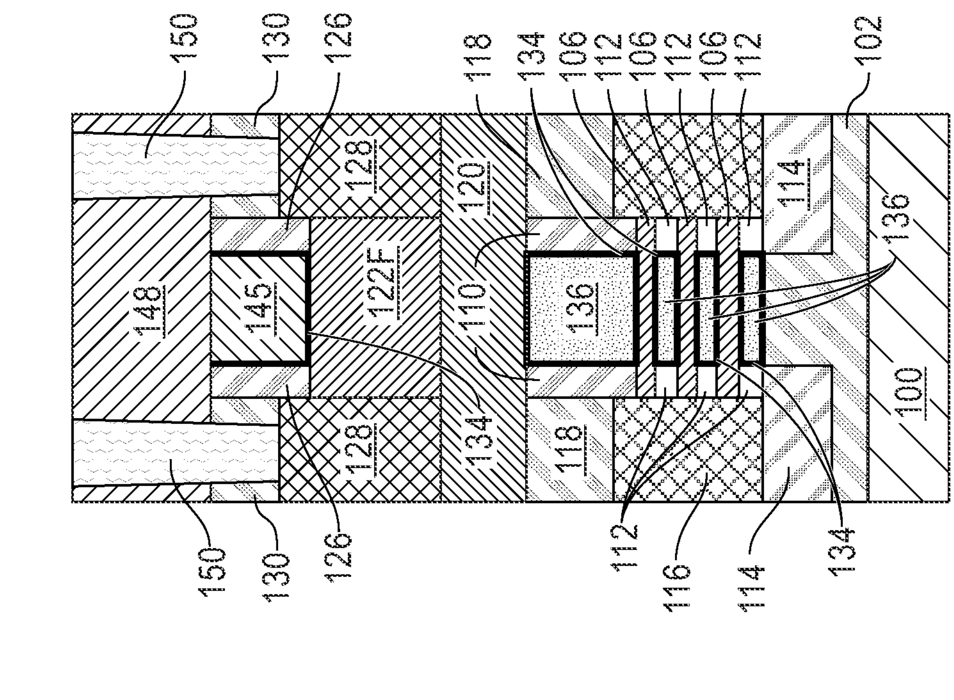
Figure 19C:
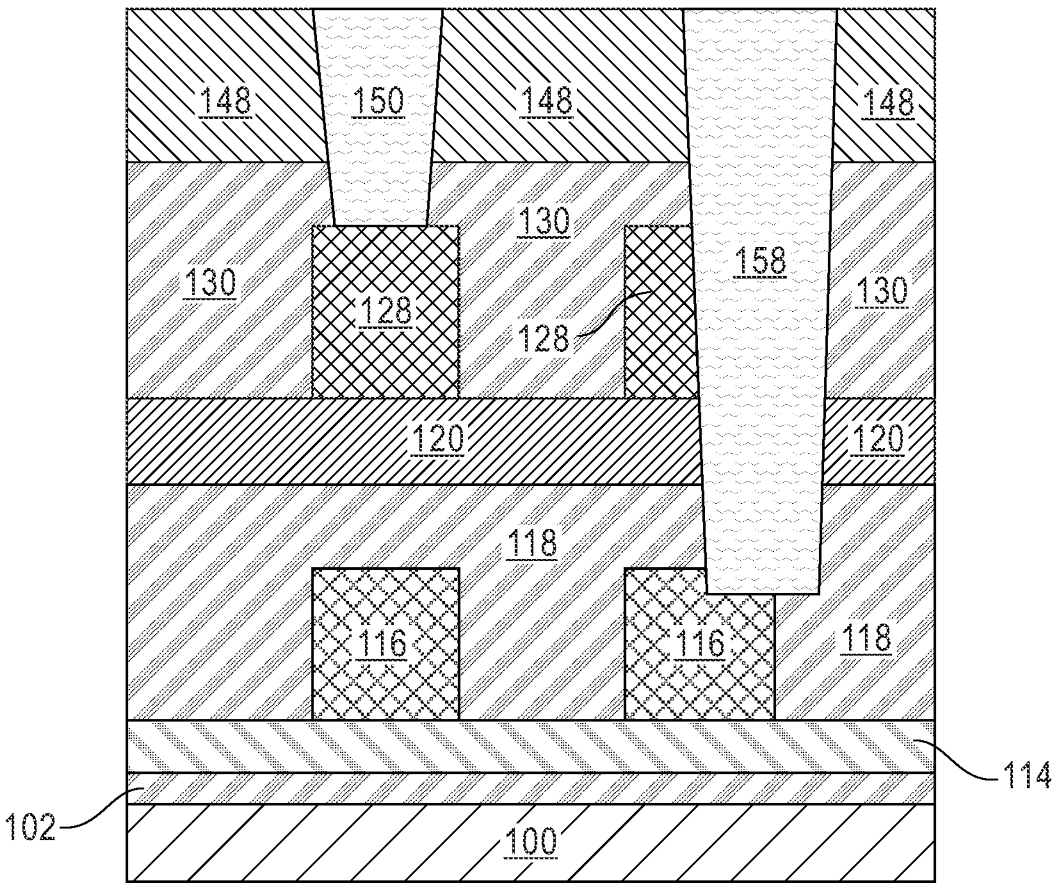

Referring now to FIGS. 19A, 19B and 19C, there are illustrated the exemplary structure shown in FIGS. 18A, 18B and 18C, respectively, after forming a second conductive contact-containing ILD material layer 148 (a first conductive contact-containing ILD material layer will be formed in a subsequent processing step of the present application). The second conductive contact containing ILD material layer 148 includes a second source/drain contact structure 150 contacting the second source/drain region 128, a second gate contact structure 152 contacting the second gate electrode 145, a first gate contact structure 156 (this contact structure will subsequently contact a first gate electrode of a first FET device), a shared gate contact structure 154 (this contact structure contacts the another second gate electrode 146 of the another second FET device and will subsequently contact an another first gate electrode of the another first FET device). During the formation of the aforementioned contact structures, a shared source/drain contact structure 158 can be formed. The shared source/drain contact structure 158 contacts both the second source/drain region 116 and the first source/drain region 116 of one pair of stacked FET devices of the present application.

The second conductive contact-containing ILD material layer 148 is composed of one of the dielectric materials mentioned above for the first ILD material layer 118. The second conductive contact-containing ILD material layer 148 can be composed of a dielectric material that is compositionally the same as, or compositionally different from, the dielectric material that provides the second ILD material layer 130. The second conductive contact-containing ILD material layer 148 can be formed using one of the deposition processes mentioned above for forming the first ILD material layer 118.

Each contact structure, i.e., the second source/drain contact structure 150, the second gate contact structure 152, the first gate contact structure 156, the shared gate contact structure 154, and the shared source/drain contact structure 158 can be formed by forming contact openings into at least the second conductive contact-containing ILD material layer 148 (some of these openings will extend down through various other material layers of the exemplary structure so as to be able contact a surface of a desired structure/region). The contact openings are formed by lithography and etching. An optional diffusion barrier material and a conductive contact material are (is) then formed (i.e., deposited) into each of the contact openings. A planarization can follow the deposition of the optional diffusion barrier material and a conductive contact material. In one or more embodiments in which a contact liner is present, the contact liner (not shown) can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including PVD, RFPVD, CVD or ALD. The contact liner that is formed can have a thickness ranging from 1 nm to 8 nm, although lesser and greater thicknesses can also be employed. The contact conductor material that provides each contact structure can include, but is not limited to, W, Cu, Al, Co, Ru, Mo, Os, Jr, Rh or an alloy thereof. The contact conductor material can be formed by any suitable deposition method such as, for example, ALD, CVD, PVD or plating. Each contact structure has a topmost surface that is coplanar with at least the second conductive contact-containing ILD material layer 148 after contact metal planarization.

Figure 20B:
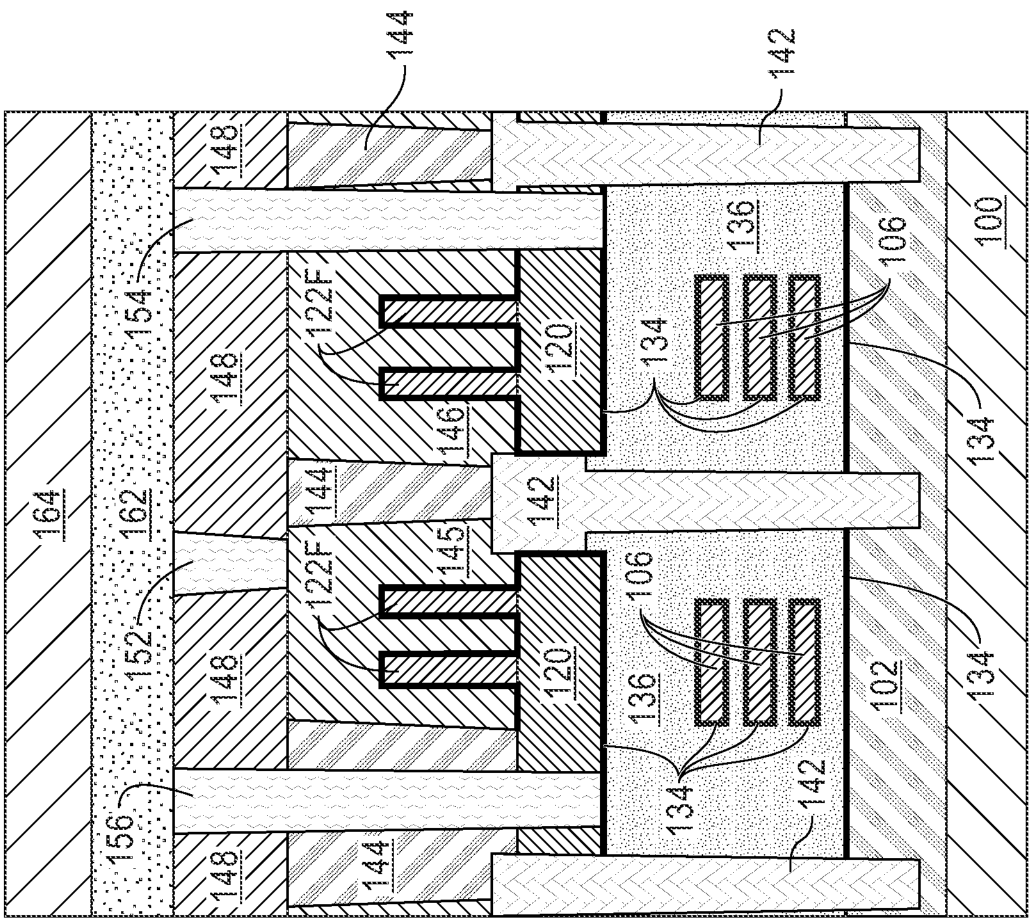
FIGS. 20A, 20B and 20C are cross sectional views of the exemplary structure shown in FIGS. 19A, 19B and 19C, respectively, after forming a back-end-of-line (BEOL) structure and a carrier wafer on the second conductive contact containing ILD material layer.
Figure 20A:
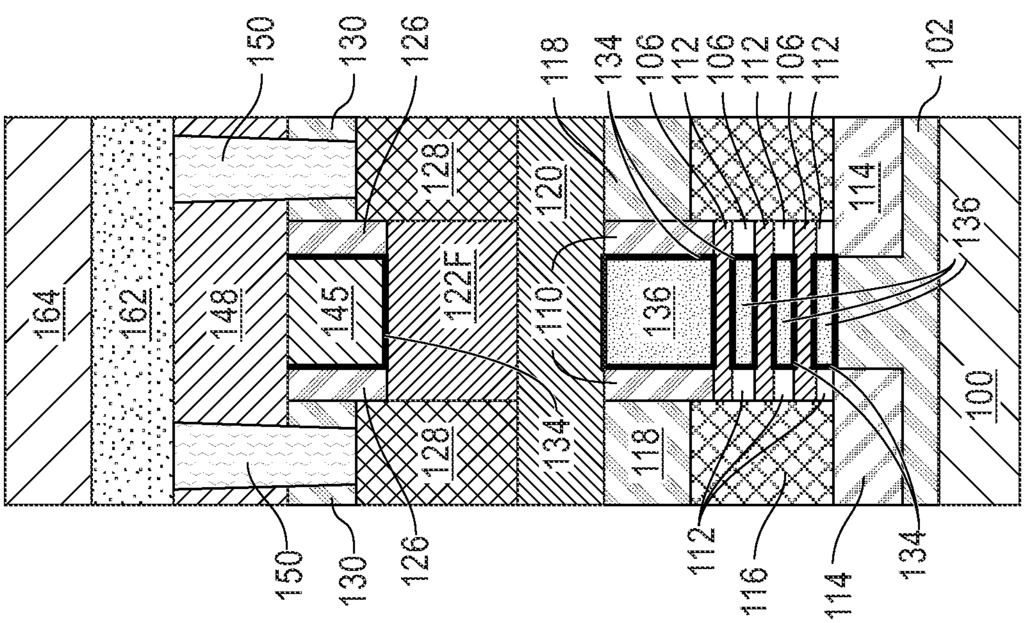
Figure 20C:
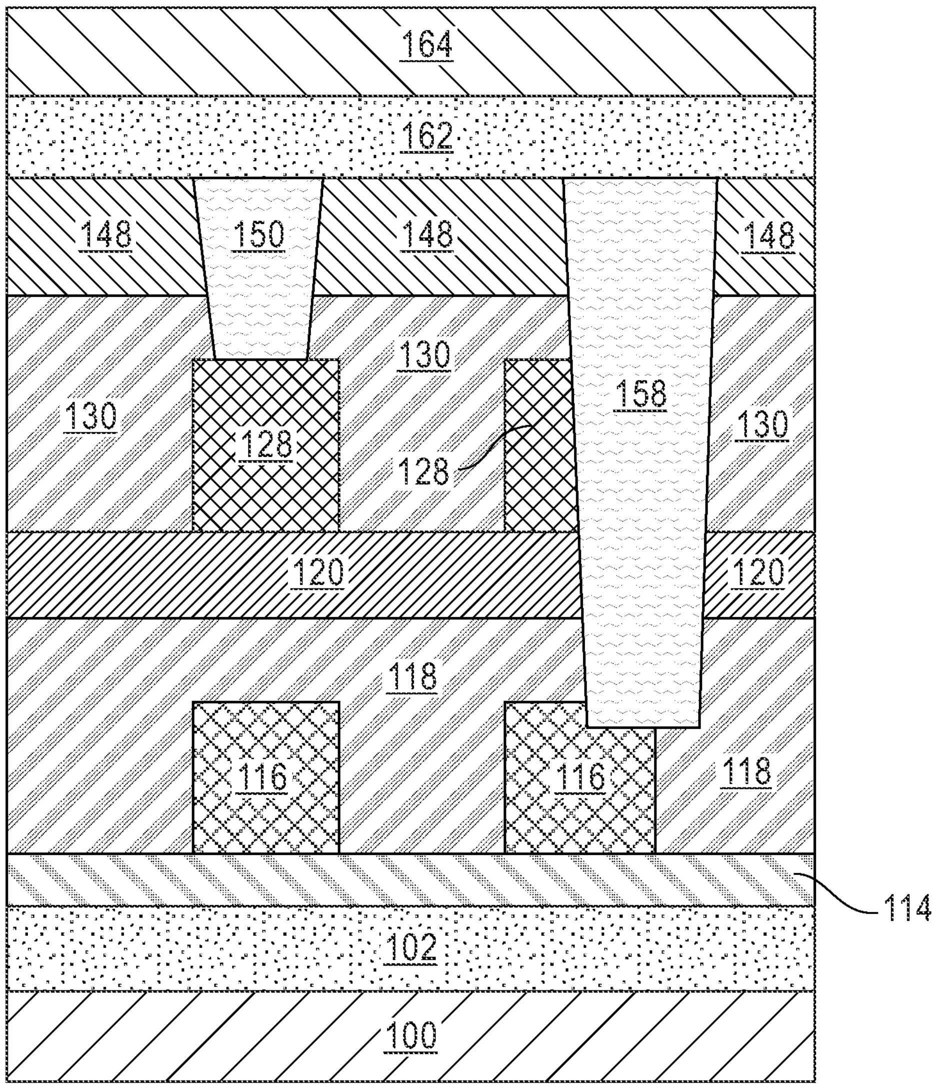

Referring now to FIGS. 20A, 20B and 20C, there are illustrated the exemplary structure shown in FIGS. 19A, 19B and 19C, respectively, after forming a BEOL structure 162 and a carrier wafer 164 on the second conductive contact containing ILD material layer 148. Notably, the BEOL structure 162 has a first surface that forms and interface with the second conductive contact-containing ILD material layer 148 and a second surface, opposite the first surface, that forms and interface with the carrier wafer 164. The BEOL structure 162 includes electrically conductive structures (i.e., interconnect lines and/or via) that are embedded in one or more interconnect dielectric material layers. The electrically conductive structures can include Cu, Al, W or any combination thereof. The BEOL structure 162 can be formed utilizing techniques that are well known to those skilled in the art including, for example, damascene processing techniques. The carrier wafer 164, which is located on a topmost level of the BEOL structure 162, can include one of the semiconductor materials mentioned above for the semiconductor substrate 100. The carrier wafer 164 is bonded to the BEOL structure 162 after the BEOL structure 162 is formed on the second conductive contact containing ILD material layer 148.

Figure 21B:
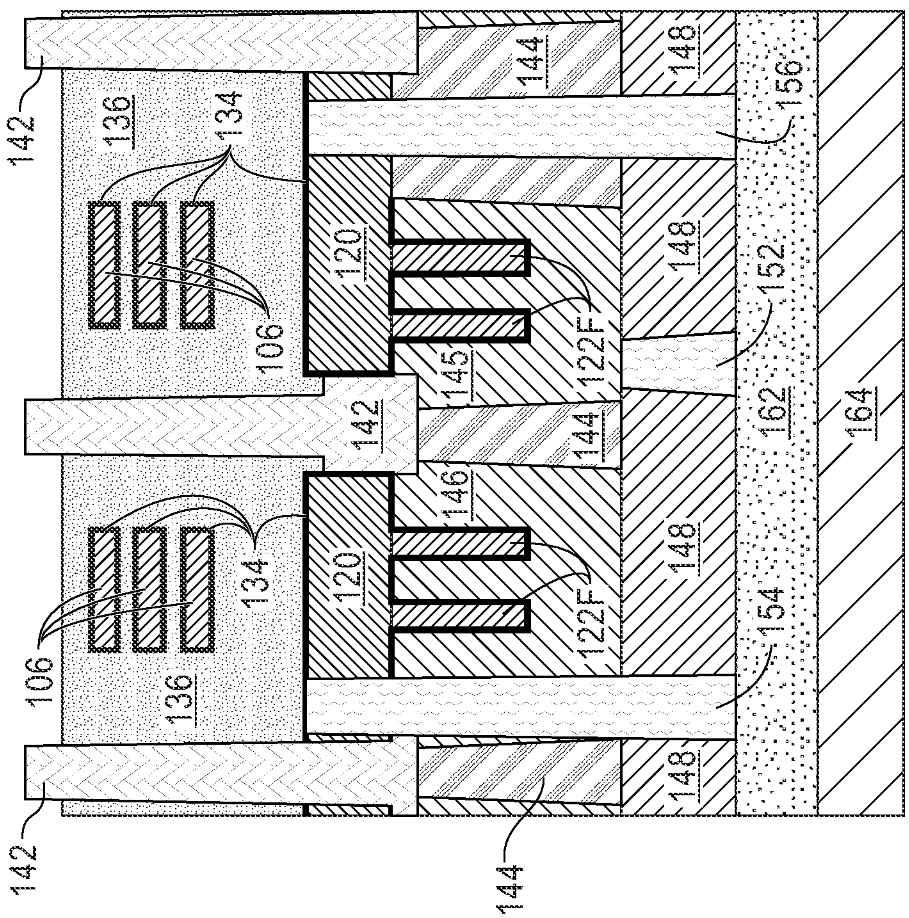
FIGS. 21A, 21B and 21C are cross sectional views of the exemplary structure shown in FIGS. 20A, 20B and 20C, respectively, after flipping the exemplary structure 180°, removing the semiconductor substrate, removing the dielectric material layer, and removing physically exposed portions of the high-k gate dielectric material that were previously located on the dielectric material layer.
Figure 21A:
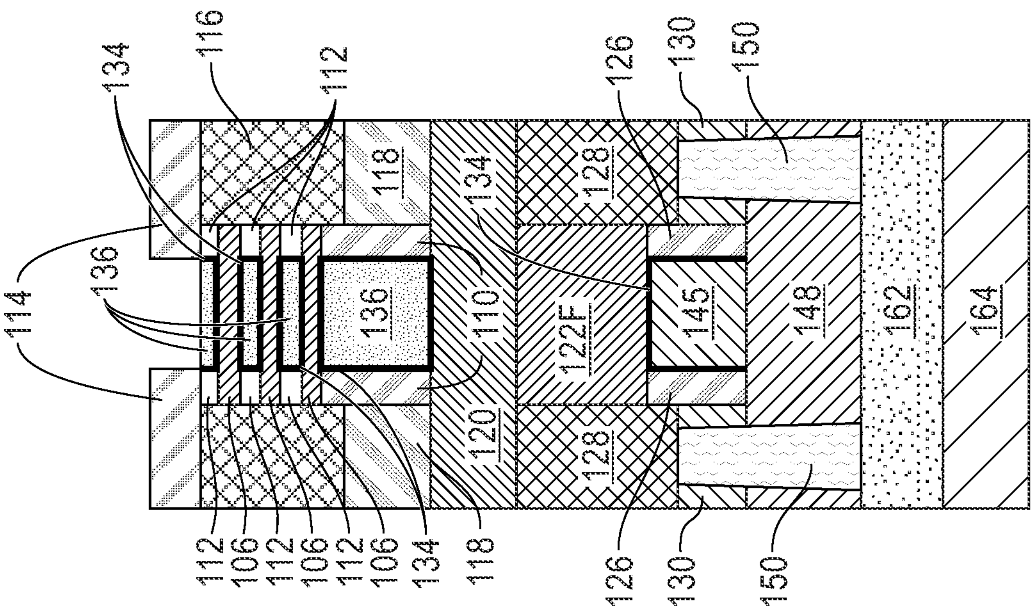
Figure 21C:
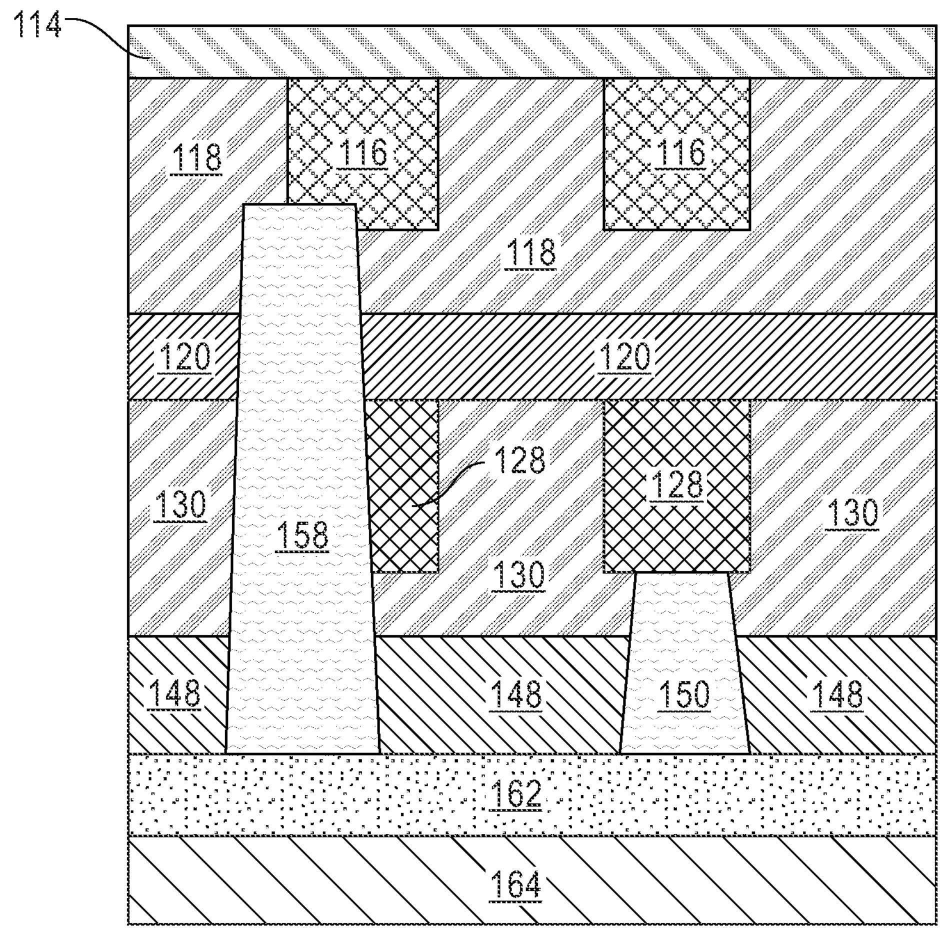

Referring now to FIGS. 21A, 21B and 21C, there are illustrated the exemplary structure shown in FIGS. 20A, 20B and 20C, respectively, after flipping the exemplary structure 180°, removing the semiconductor substrate 100, removing the dielectric material layer 102, and removing physically exposed portions of the high-k gate dielectric material 134 that was previously located on the dielectric material layer 102. The flipping can be performed by conventional means that are well known to those skilled in the art. For example, flipping can be performed by hand or mechanical means (i.e., a robot arm). The flipping physically exposes a surface of the semiconductor substrate 100 for further processing. The removal of the semiconductor substrate 100 includes an etch that stops on a surface of dielectric material layer 102. The etch used in removing the semiconductor substrate 100 is typically a combination of wafer grinding process, CMP, followed by dry or chemical wet etch processes. The removal of the dielectric material layer 102 includes an etch is selective in removing the dielectric material that provides the dielectric material layer 102. This etch does not remove the first gate cut structure 142, the bottom dielectric insulation structure 114 or the high-k gate dielectric material 134. Is noted that after the etch a portion of the first gate cut dielectric structure 142 is physically exposed, and a portion of the bottom dielectric insulation structure 114 is also physically exposed. The removal of the physically exposed portions of the high-k gate dielectric material 134 includes an etch that stops of the underlying a-Si layer 136. This etch does not etch any portion of the bottom dielectric insulation structure 114 and the first gate cut dielectric structure 142.

Figure 22B:
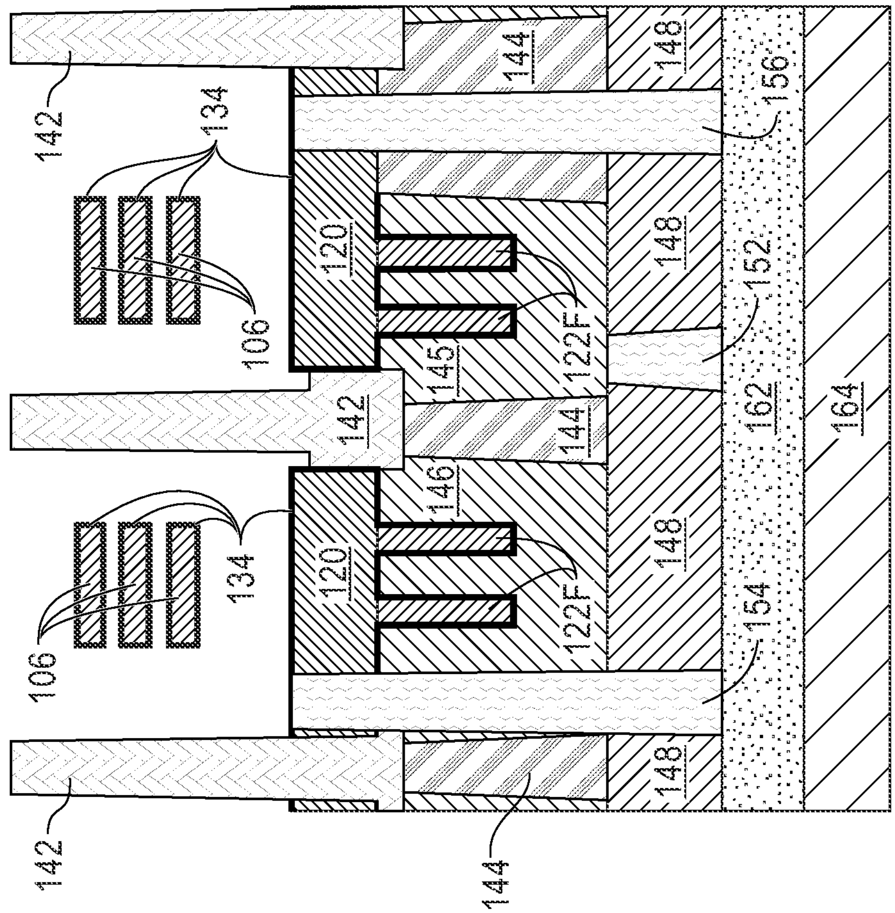
FIGS. 22A, 22B and 22C are cross sectional views of the exemplary structure shown in FIGS. 21A, 21B and 21C, respectively, after removing physically exposed portions of the a-Si layer.
Figure 22A:
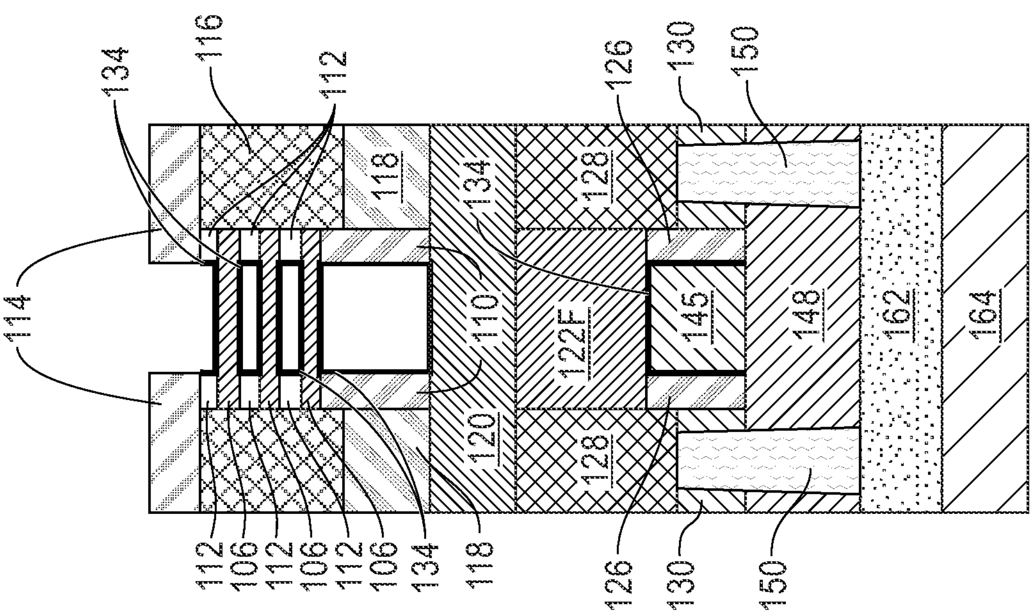
Figure 22C:
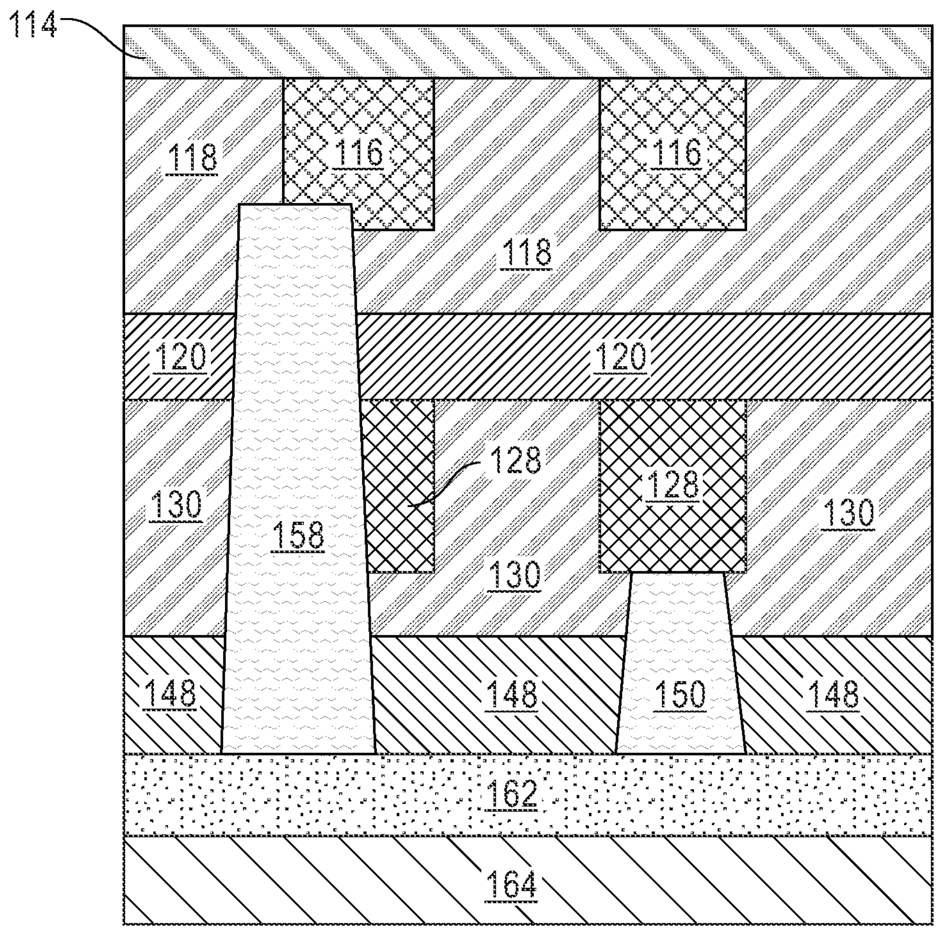

Referring now to FIGS. 22A, 22B and 22C, there are illustrated the exemplary structure shown in FIGS. 21A, 21B and 21C, respectively, after removing physically exposed portions of the a-Si layer 136. The removal of the a-Si layer 136 includes an etch that is selective in removing a-Si. This etch does not etch any portion of the bottom dielectric insulation structure 114, the oxygen-scavenging layer that is present on the high-k gate dielectric material 134 that is formed on the semiconductor channel material nanosheets 106, and the first gate cut dielectric structure 142. After removing the a-Si layer 136, another etch can be used to remove the oxygen-scavenging layer from the high-k gate dielectric material 134 that is present on the semiconductor material nanosheets 106.

Figure 23B:
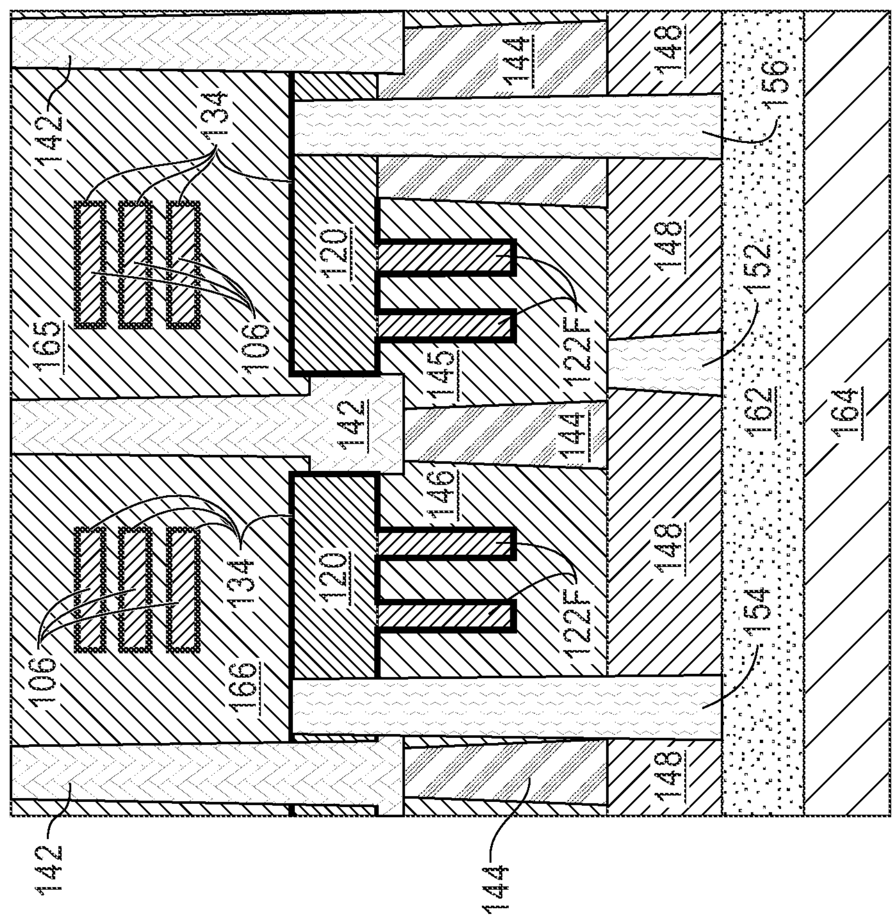
FIGS. 23A, 23B and 23C are cross sectional views of the exemplary structure shown in FIGS. 22A, 22B and 22C, respectively, after forming a first gate electrode on a physically exposed surface of the high-k gate dielectric material layer that is located on a first set of suspended semiconductor channel material nanosheets, and another first gate electrode on a physically exposed surface of the high-k gate dielectric material layer that is located on a second set of suspended semiconductor channel material nanosheets.
Figure 23A:
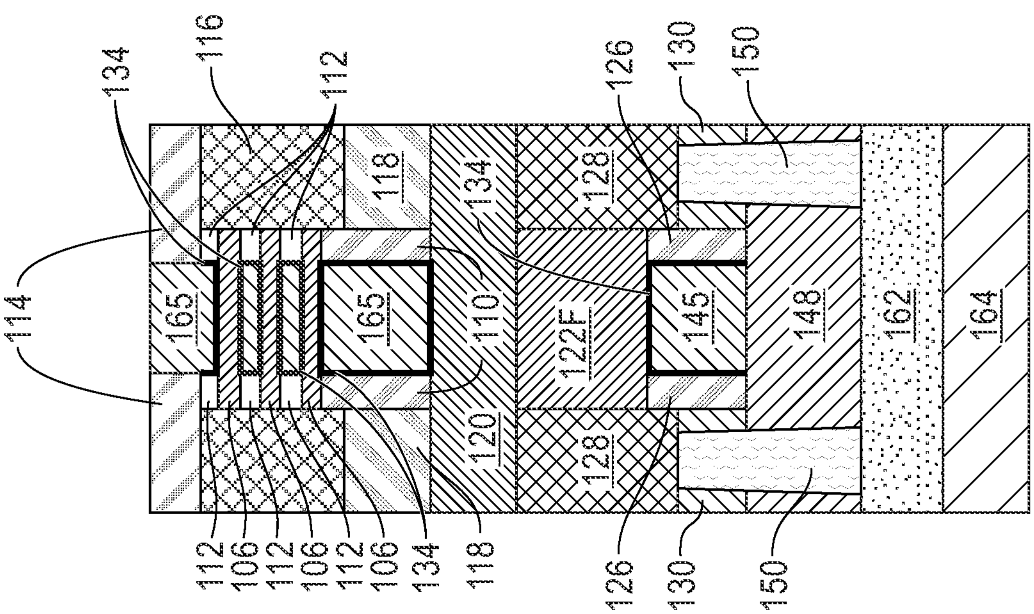
Figure 23C:
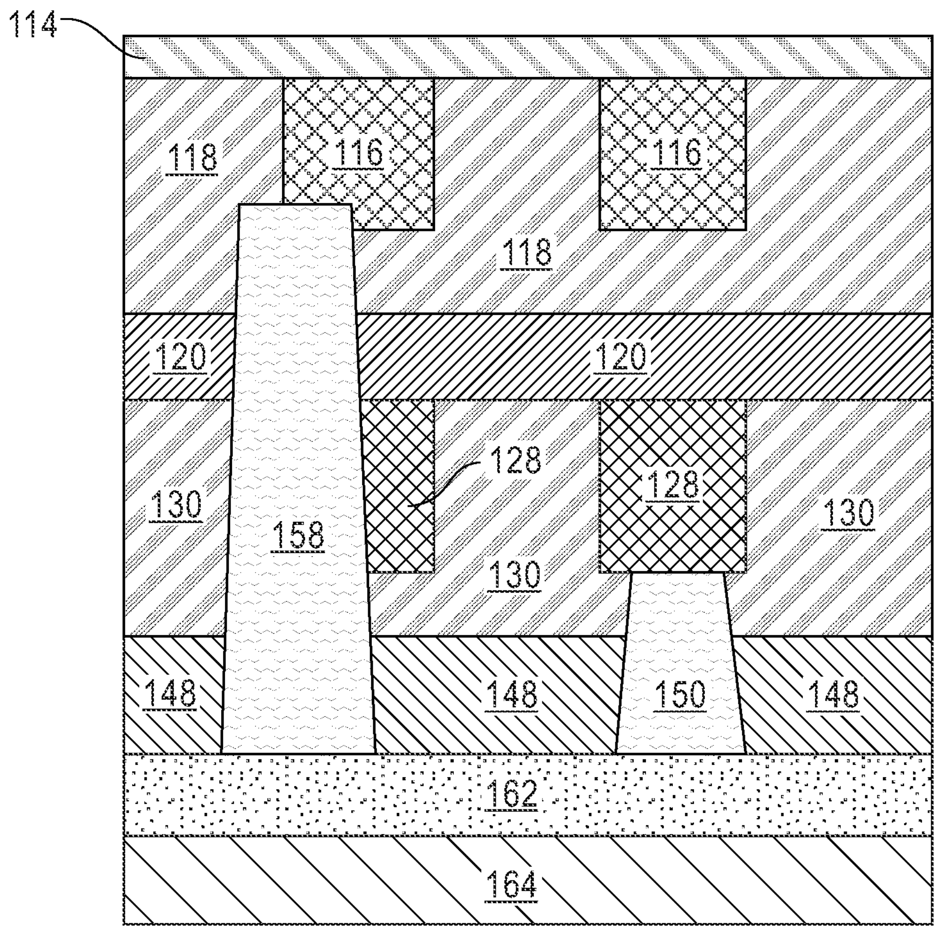

Referring now to FIGS. 23A, 23B and 23C, there are illustrated the exemplary structure shown in FIGS. 22A, 22B and 22C, respectively, after forming a first gate electrode 165 on a physically exposed surface of the high-k gate dielectric material layer 134 that is located on a first set of suspended semiconductor channel material nanosheets 106 (see, for example, the right hand side of FIG. 23B), and another first gate electrode 166 on a physically exposed surface of the high-k gate dielectric material layer that is located on a second set of suspended semiconductor channel material nanosheets 106 (see, for example, the left hand side of FIG. 23B). In accordance with the present application, the first gate electrode 165 and the gate dielectric material layer 134 formed on the first set of semiconductor channel material nanosheets 106 provide a first functional gate structure of a first FET device, while the another first gate electrode 166 and the gate dielectric material layer 134 formed on the second set of semiconductor channel material nanosheets 106 provides another first FET device. In some embodiments, the first FET device and the another first FET device can have a same threshold voltage Vt. In other embodiments, the first FET device can have a Vt that differs from the Vt of the another first FET device. The Vt of the first FET device can be the same or different from the Vt of the second FET device, and the Vt of the another first FET device can be the same or different from the VT of the another second FET device. In the illustrated embodiment, the first FET device and the another first FET device are nanosheet FET devices. In embodiments, the first FET device and the another first FET device are of a same conductivity type (p-FET devices or n-FET devices), yet the conductivity of the first FET device and the another first FET device is different from the second FET device and the another second FET device. Thus, and in the present application, a first FET device is stacked above the second FET device, and the another first FET device is stacked above the another second FET device; the devices are vertically separated by the SDSDM layer 120. The first FET device and the another first FET device are separated by the first gate cut dielectric structure 142 as shown in FIG. 26B, while the second FET device and the another second FET device are separated by the second gate cut dielectric structure 144.

The first gate electrode 165 and the another second gate electrode 166 include at least a work function metal (WFM) and an optional gate electrode material. Depending on the technique used to form the first gate electrode 165 and the another first gate electrode 166, the first gate electrode 165 and the another first gate electrode 166 can include WFMs that are compositionally the same, or WFMs that are compositionally different. It is noted that the WFM that provides the first gate electrode 165 is not present in the area of the exemplary structure that includes the second gate electrode 145 due to the presence of the first gate cut dielectric structure 142 plugging the opening between the SDSDM layer 120. Likewise, and for the same reason, the WFM that provides the another first gate electrode 166 is not present in the area of the exemplary structure that includes the another second gate electrode 146. In embodiments, the first gate electrode 165 and the another first gate electrode 166 can include gate electrode materials that are compositionally the same, or gate electrode materials that are compositionally different. The WFM that provides the first gate electrode 165 and the another second gate electrode 166 includes one of the WFMs mentioned above for the second gate electrode 145 and the another second gate electrode 146. The optional gate electrode material that can also be used in providing the first gate electrode 165 and the another first gate electrode 166 includes one of the gate electrode materials mentioned above for the second gate electrode 145 and the another second gate electrode 146. The first gate electrode 165 and the another second gate electrode 166 can be formed utilizing the technique mentioned above for forming the second gate electrode 145 and the another second gate electrode 146.

Figure 24B:
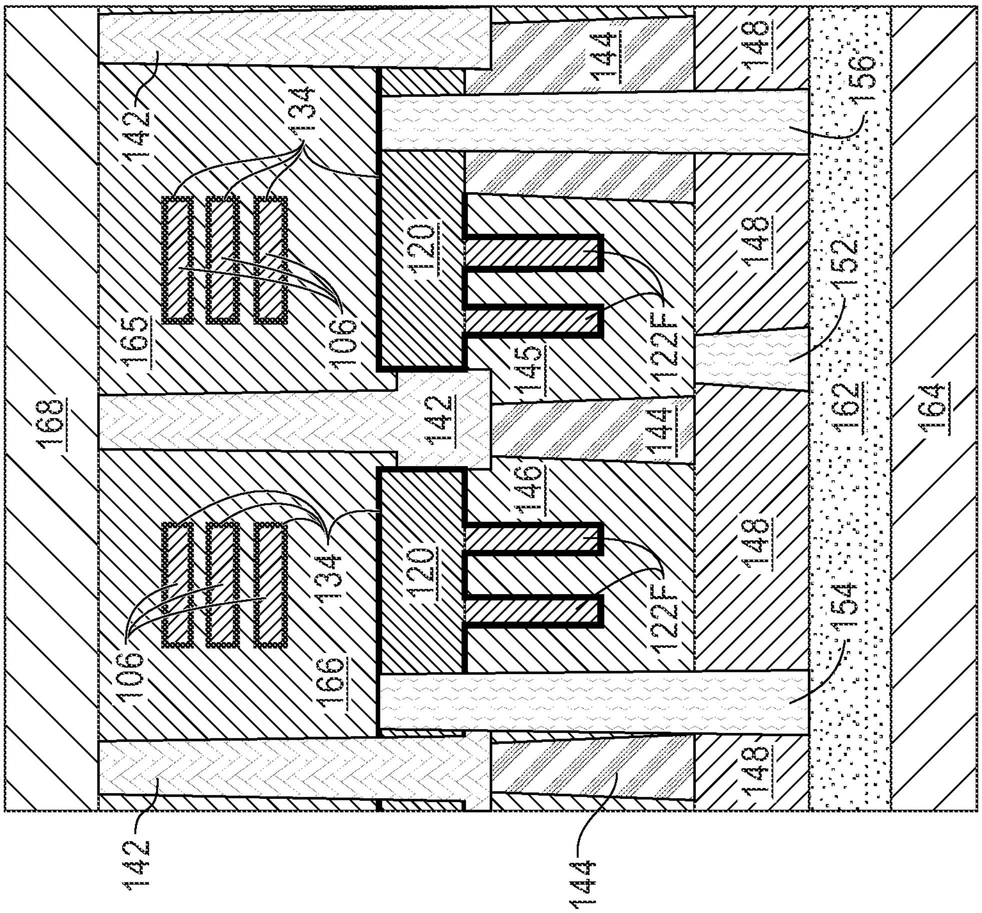
FIGS. 24A, 24B and 24C are cross sectional views of the exemplary structure shown in FIGS. 23A, 23B and 23C, respectively, after forming a first conductive contact-containing ILD material layer, wherein the first conductive contact containing ILD material layer includes a first source/drain contact structure contacting the first source/drain region.
Figure 24A:
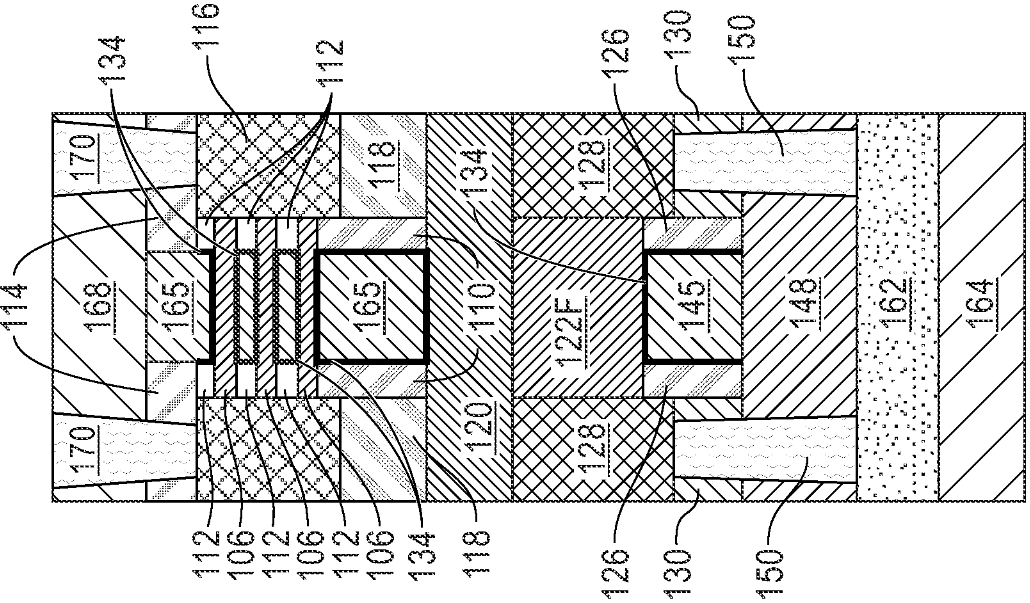
Figure 24C:
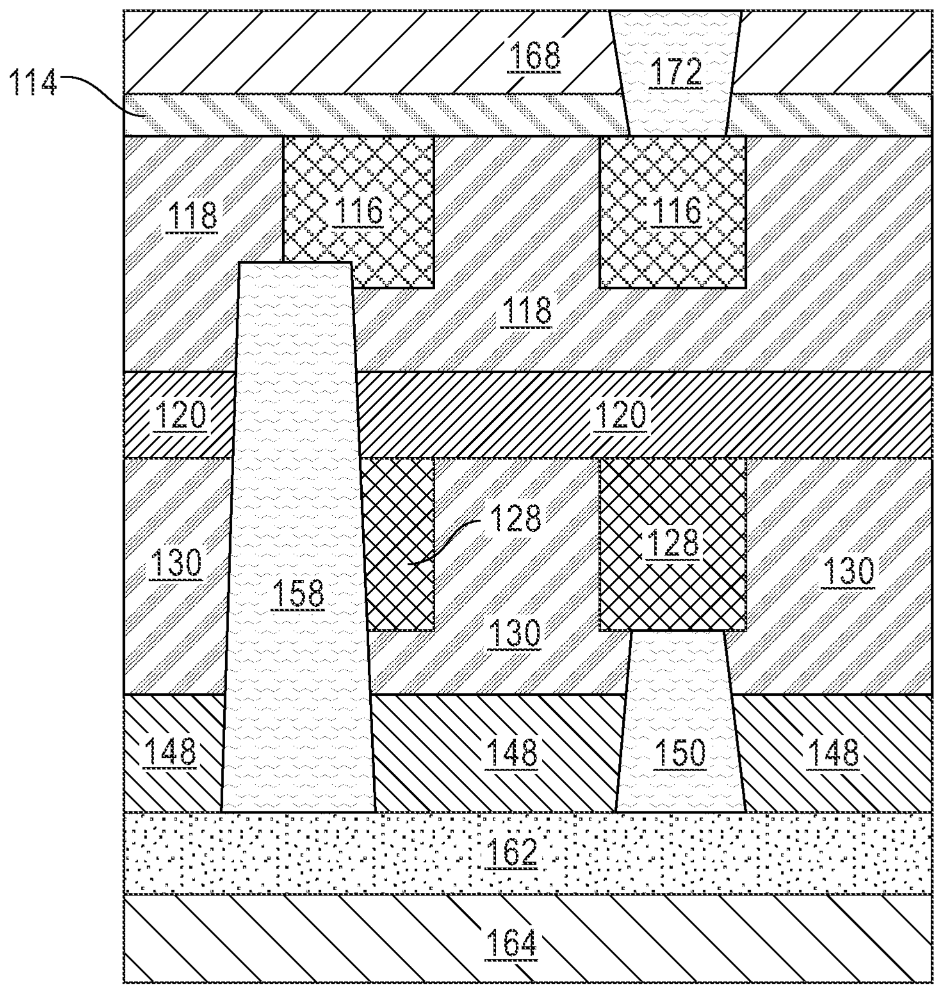

Referring now to FIGS. 24A, 24B and 24C, there are illustrated the exemplary structure shown in FIGS. 23A, 23B and 23C, respectively, after forming a first conductive contact-containing ILD material layer 168, wherein the first conductive contact containing ILD material layer 168 includes a first source/drain contact structure 170 contacting the first source/drain region 116 of one of the first FET devices (in the illustrated example, it contacts the first source/drain region 116 of the first FET device). The first conductive contact-containing ILD material layer 168 includes one of the dielectric materials mentioned above for the first ILD material layer 118. The first conductive contact-containing ILD material layer 168 can be formed utilizing one of the deposition processed mentioned above for forming the first ILD material layer 118. The first source/drain contact structure 116 can include materials and can be formed as described above for the other contact structures.

Figure 25B:
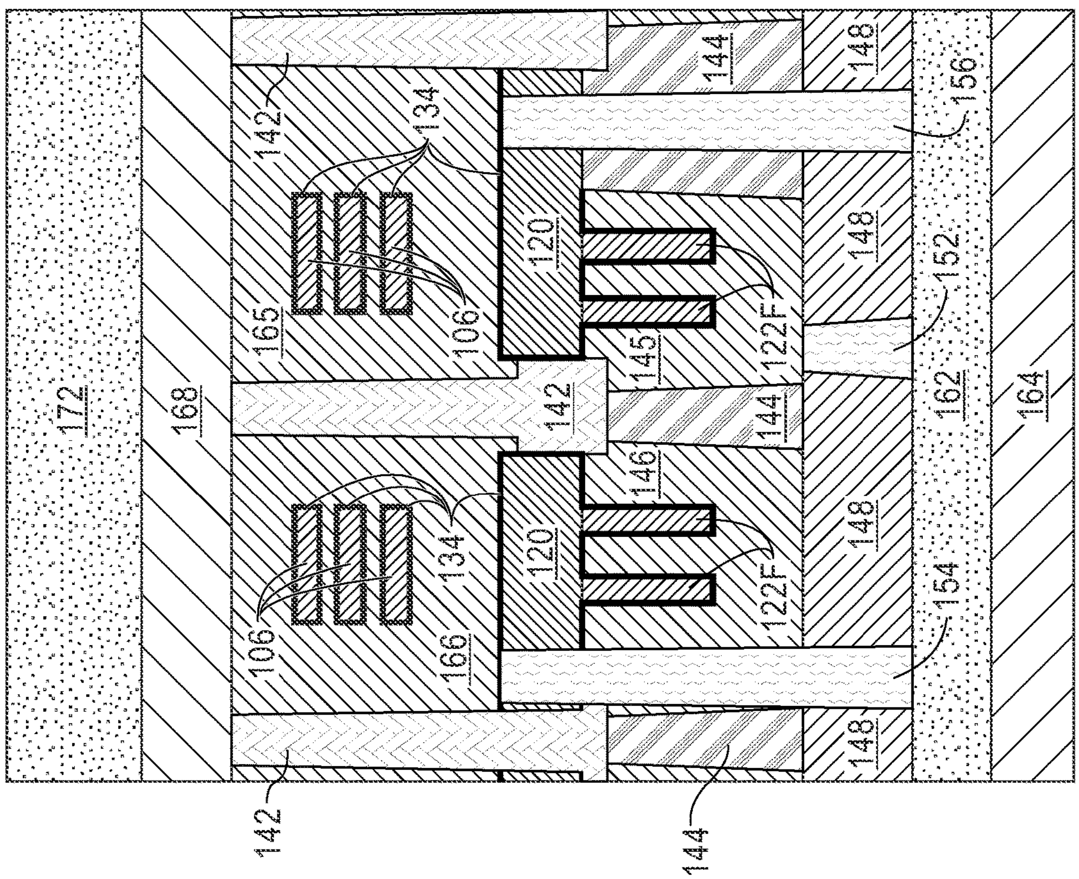
FIGS. 25A, 25B and 25C are cross sectional views of the exemplary structure shown in FIGS. 24A, 24B and 24C, respectively, after forming a backside power delivery network (BSPDN) structure on the first conductive contact containing ILD material layer.
Figure 25A:
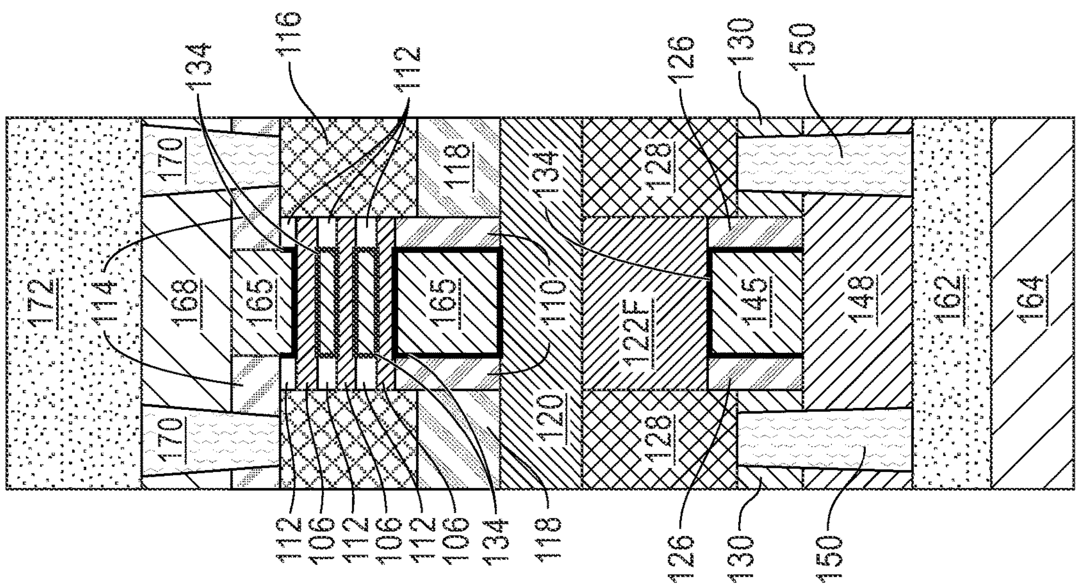
Figure 25C:
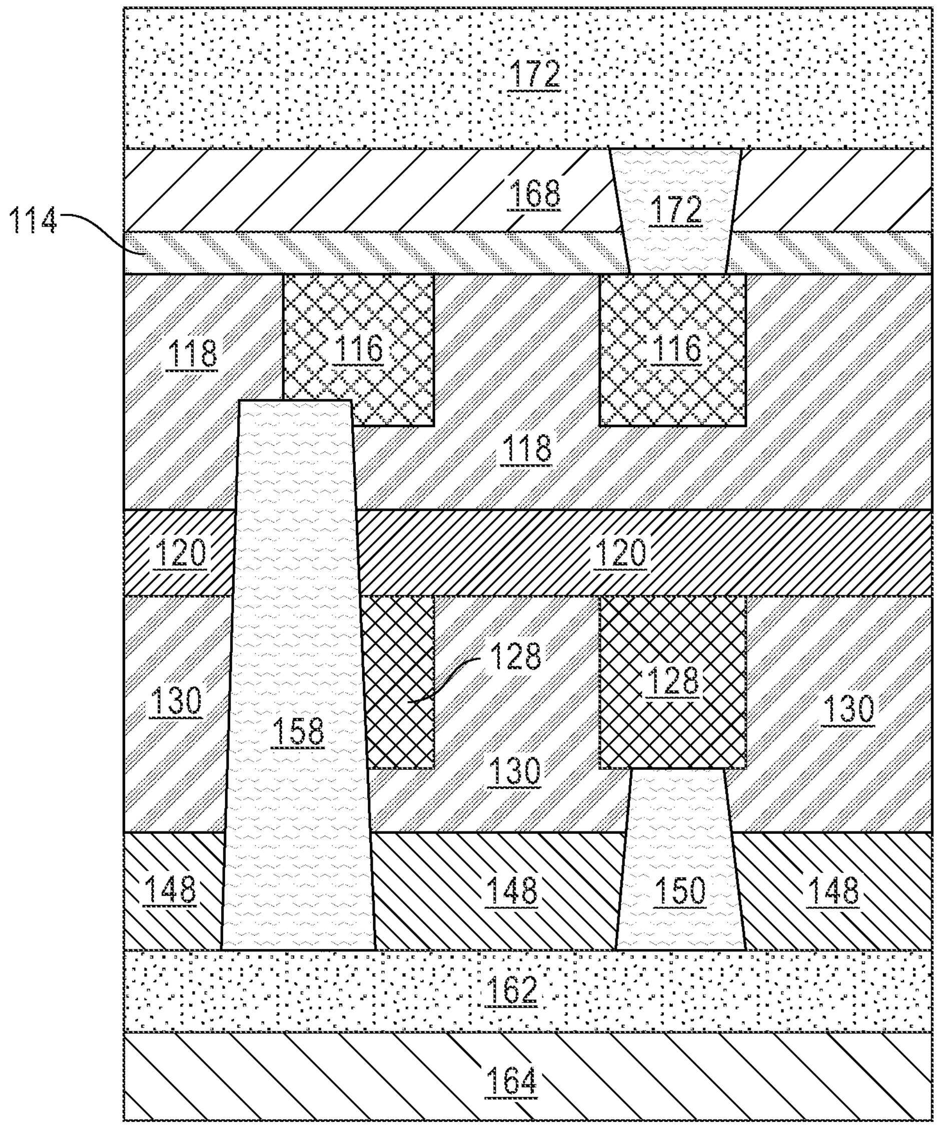

Referring now to FIGS. 25A, 25B and 25C, there are illustrated the exemplary structure shown in FIGS. 24A, 24B and 24C, respectively, after forming a BSPDN structure 122 on the first conductive contact containing ILD material layer 168. The BSPDN includes materials/components that are well known to those skilled in the art.

In the example illustrated in FIGS. 2A-25C, a semiconductor structure including a nanosheet FET device stacked over finFET device was described and illustrated. It is noted that the processing steps shown in FIGS. 2A-25C can be modified by one skilled art to form a semiconductor structure including a finFET device stacked over a nanosheet FET device, a finFET device stacked over another finFET device, or a nanosheet FET device stacked over another nanosheet FET device. In the following example (which will reference FIGS. 26A-61C, a semiconductor structure is described in which a first nanosheet FET device is stacked with a second nanosheet FET device. The processing steps used in this embodiment can be readily alternated by one skilled in the art to form other types of stacked FET devices.

Figure 26A:
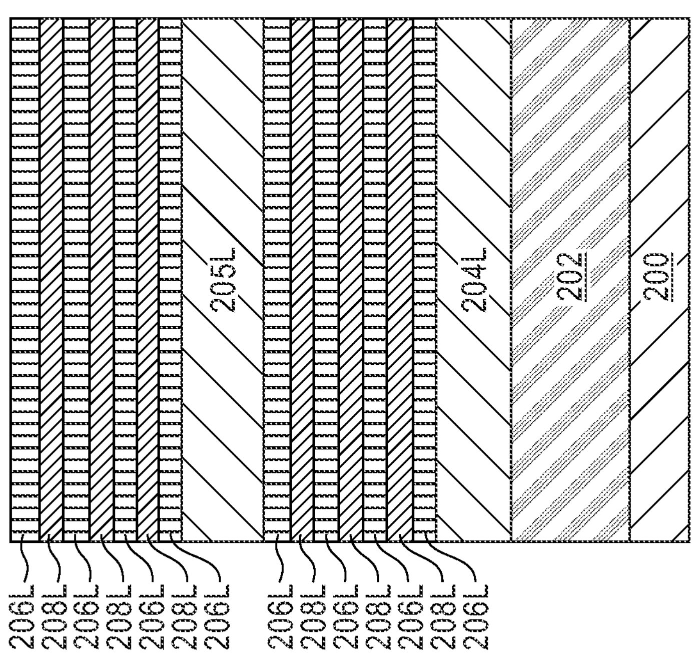
FIGS. 26A and 26B are cross sectional views of an exemplary structure through X-X and Y1-Y1, shown in FIG. 1 that can be employed in another embodiment of the present application, the exemplary structure includes a semiconductor substrate, a dielectric material layer, a first sacrificial semiconductor material layer, a first nanosheet material stack, a second sacrificial semiconductor material layer, and a second nanosheet material stack, each nanosheet material stack including alternating sacrificial semiconductor material layers and semiconductor channel material layers.
Figure 26B:
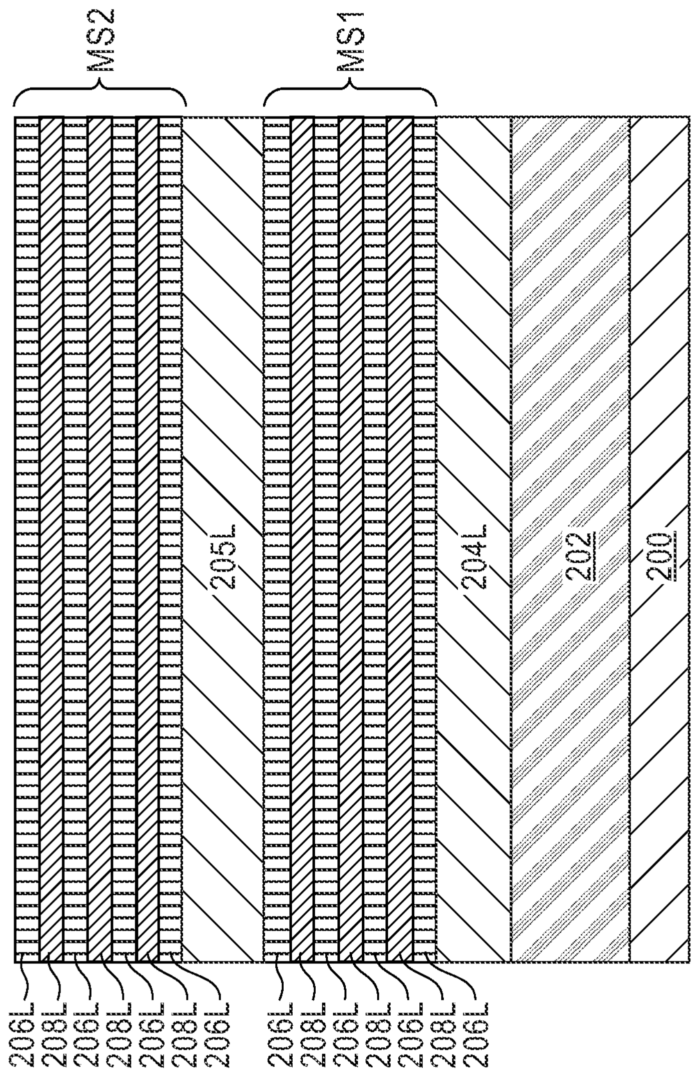

Referring now to FIGS. 26A and 26B, there are illustrated an exemplary structure through X-X and Y1-Y1, shown in FIG. 1 that can be employed in another embodiment of the present application. The exemplary structure of this another embodiment includes a semiconductor substrate 200, a dielectric material layer 202, a first sacrificial semiconductor material layer 204L, a first nanosheet material stack MS1, a second sacrificial semiconductor material layer 205L, and a second nanosheet material stack MS2. Each nanosheet material stack includes alternating sacrificial semiconductor material layers 206L and semiconductor channel material layers 208L.

Semiconductor substrate 200 includes one of the semiconductor materials mentioned above for semiconductor substrate 100. Dielectric material layer 202 includes one of the dielectric materials mentioned above for dielectric material layer 102. Dielectric material layer 202 can be formed utilizing one of the deposition processes mentioned above for dielectric material layer 102. Alternatively, dielectric material layer 202 and semiconductor substrate 200 are components of a SOI substrate in which the top semiconductor layer is the first sacrificial semiconductor material layer 204L. In some embodiments, the initial semiconductor layer over the dielectric material layer 202 is Si, and it can be converted to SiGe by growing SiGe epitaxy and performing SiGe condensation. Dielectric material layer 202 can have a thickness in the thickness range mentioned above for dielectric material layer 102.

The sacrificial semiconductor material layers 206L of the first and second nanosheet material stacks MS1 and MS2, respectively, include a first semiconductor material as mentioned above for the sacrificial semiconductor material layers 104L. The semiconductor channel material layers 208L of the first and second nanosheet material stacks MS1 and MS2, respectively, include a second semiconductor material as mentioned above for the semiconductor channel material layers 106L. The first and second sacrificial semiconductor material layers 204L and 205L, respectively, are composed of a third semiconductor material that is compositionally different from both the first semiconductor material that provides each sacrificial semiconductor material layers 206L and the second semiconductor material that provides each semiconductor channel material layer 208L. In one example, the sacrificial semiconductor material layers 206L are composed of a silicon germanium alloy having 30 atomic percent germanium, the semiconductor channel material layers 208L are composed of silicon, and the first and second sacrificial semiconductor material layers 204L and 205L are composed of a silicon germanium alloy that has a germanium content of 55 atomic percent. Each of the first and second sacrificial semiconductor material layers 204L and 205L, respectively, can have a thickness in a range from 10 nm to 40 nm; although other thicknesses are contemplated and can be used as the thickness of the first and second sacrificial semiconductor material layers 204L and 205L, respectively.

In this embodiment, the first nanosheet material stack MS1 and the second nanosheet material stack MS2 include ‘n’ semiconductor channel material layers 208L and ‘n+1’ sacrificial semiconductor material layers 206L, wherein n is at least 1. Thus, each semiconductor channel material layer 208L within the first nanosheet material stack MS1 and the second nanosheet material stack MS2 is sandwiched between a bottom sacrificial semiconductor material layer 206L and a top sacrificial semiconductor material layer 206L. By way of one example, each of the first nanosheet material stack MS1 and the second nanosheet material stack MS2 includes three semiconductor channel material layers 208L and four sacrificial semiconductor material layers 206L. Although the present application illustrates that the first nanosheet material stack MS1 and the second nanosheet material stack MS2 contain a same number of sacrificial semiconductor material layers 206L and semiconductor channel material layers 208L, the present application contemplates embodiments when the first nanosheet material stack MS1 includes a different number of sacrificial semiconductor material layers 206L and semiconductor channel material layers 208L than the second nanosheet material stack MS2. For example, the first nanosheet material stack MS1 can contain two semiconductor channel material layers 208L and three sacrificial semiconductor material layers 206L, while the second nanosheet material stack MS2 can contain three semiconductor channel material layers 208L and four sacrificial semiconductor material layers 206L. Typically, but not necessary always, the sacrificial semiconductor material layers 206L in the first nanosheet material stack MS1 are compositionally the same as the sacrificial semiconductor material layers 206L in the second nanosheet material stack MS2. Also typically, but not necessary always, the semiconductor channel material layers 208L in the first nanosheet material stack MS1 are compositionally the same as the semiconductor channel material layers 208L in the second nanosheet material stack MS2. In some embodiments for example, the semiconductor channel material layers 208L present in the first nanosheet stack MS1 are composed of a second semiconductor material capable of providing high channel mobility for NFET devices, while the semiconductor channel material layers 208L present in the second nanosheet stack MS2 are composed of a second semiconductor material capable of providing high channel mobility for PFET devices, or vice versa. The first nanosheet material stack MS1, the second sacrificial semiconductor material layer 205L, and the second nanosheet material stack MS2 can be formed by depositing (by, for example, epitaxial growth) the appropriate semiconductor materials over the first sacrificial semiconductor material layer 204L.

Figure 27B:
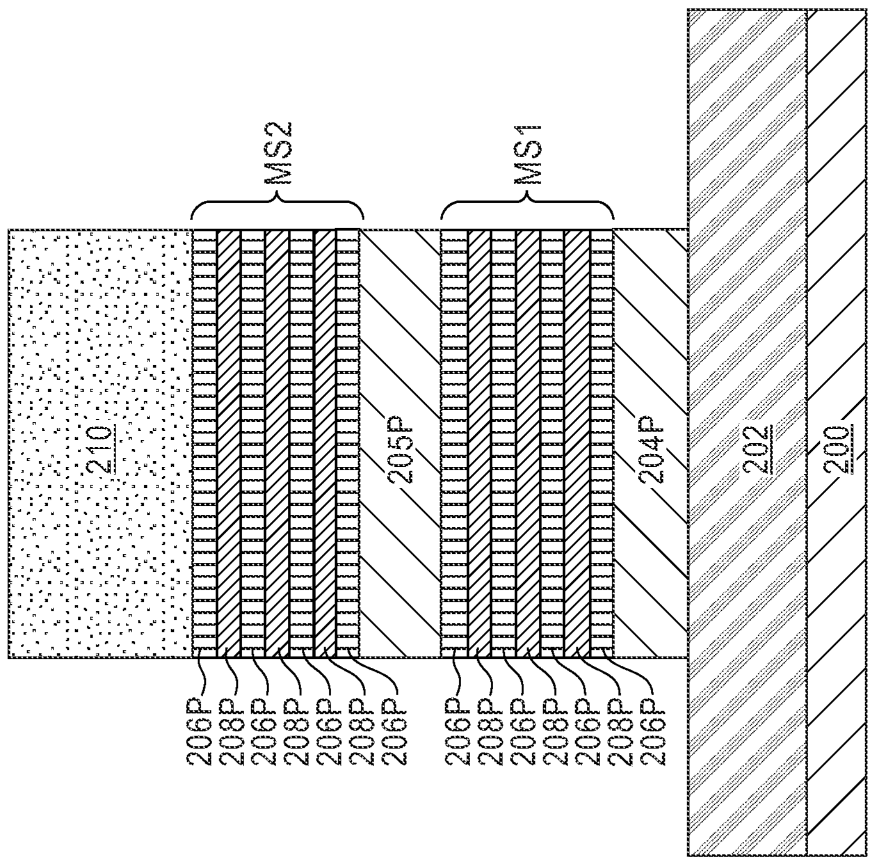
FIGS. 27A and 27B are cross sectional views of the exemplary structure shown in FIGS. 26A and 26B, respectively, after first patterning the first sacrificial semiconductor material layer, the first nanosheet material stack, the second sacrificial semiconductor material layer, and the second nanosheet material stack to provide a patterned structure.
Figure 27A:
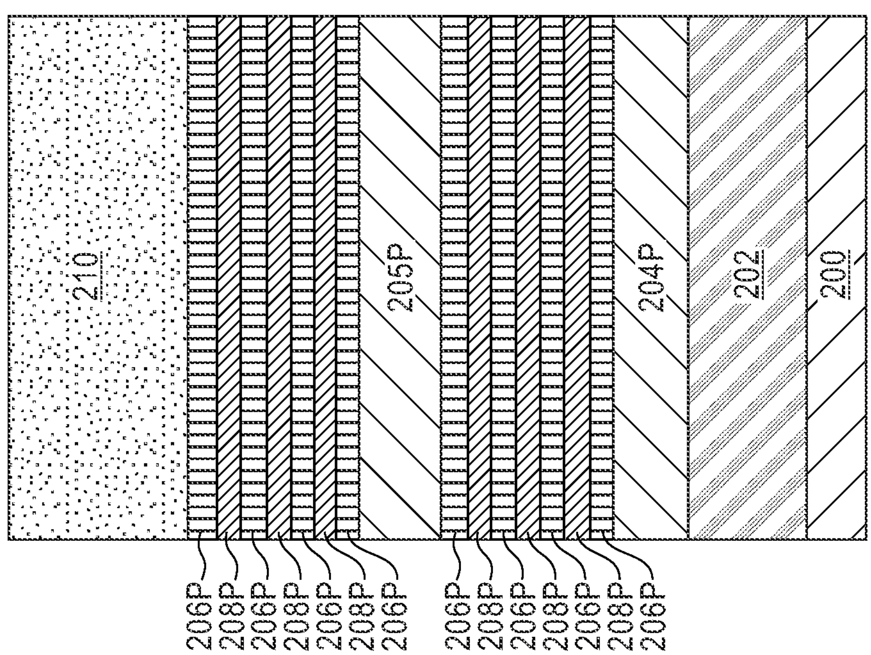

Referring now to FIGS. 27A and 27B, there are illustrated the exemplary structure shown in FIGS. 26A and 26B, respectively, after first patterning the first sacrificial semiconductor material layer 204L, the first nanosheet material stack MS1, the second sacrificial semiconductor material layer 205L, and the second nanosheet material stack MS2. The patterning includes depositing a layer of hard mask material on the topmost surface of the second nanosheet material stack MS2. The depositing of the layer of hard material can include, CVD, PECVD or PVD, and the hard mask material can include, for example, silicon dioxide, silicon nitride or silicon oxynitride. The layer of hard mask material is then patterned by lithography and etching to form a patterned hard mask 210 on the topmost surface of the second nanosheet material stack MS2. With the patterned hard mask 210 in place, a second etch is used to etch through the second nanosheet material stack MS2, the second sacrificial semiconductor material layer 205L, the first nanosheet material stack MS1, and the first sacrificial semiconductor material layer 204L. This etch stops of the surface of dielectric material layer 202, and provides a patterned structure as shown in FIGS. 27A and 27B. The patterned structure includes a patterned (i.e., unremoved) portion of the first sacrificial semiconductor material layer 204L (hereinafter patterned sacrificial semiconductor material layer portion 204P), a patterned (i.e., unremoved) portion of the first nanosheet material stack MS1, a patterned (i.e., unremoved) portion of the second sacrificial semiconductor material layer 205L (hereinafter second semiconductor material layer portion 205P) and a patterned (i.e., unremoved) portion of the second nanosheet material stack MS2. The patterned portion of the first and second nano sheet material stacks MS1 and MS2, respectively, include), a patterned (i.e., unremoved) portion of each sacrificial semiconductor material layer 206L (hereinafter sacrificial semiconductor material layer portion 206P) and a patterned (i.e., unremoved) portion of each semiconductor channel material layer 208L (hereinafter semiconductor channel material layer portion 208P).

Within the exemplary structure shown in FIGS. 27A and 27B, the patterned first nanosheet material stack MS1 typically has outermost sidewalls that are vertically aligned with outermost sidewalls of each of the first and second sacrificial semiconductor material layer portions 204P and 205P, respectively, and the patterned second nanosheet material stack MS2; vertical aligned is also made with the outermost sidewalls of the patterned hard mask 210. Within the exemplary structure shown in FIGS. 27A and 27B, each sacrificial semiconductor material layer portion 206P and each semiconductor channel material layer portion 208P can have a width from 6 nm to 100 nm, and a height (i.e., vertical thickness) from 5 nm to 20 nm. The first and second sacrificial semiconductor material layer portions 204P and 205P, respectively, have the same width as mentioned above for the width of the sacrificial semiconductor material layer portions 206P and the semiconductor channel material layer portions 208P.

Figure 28B:
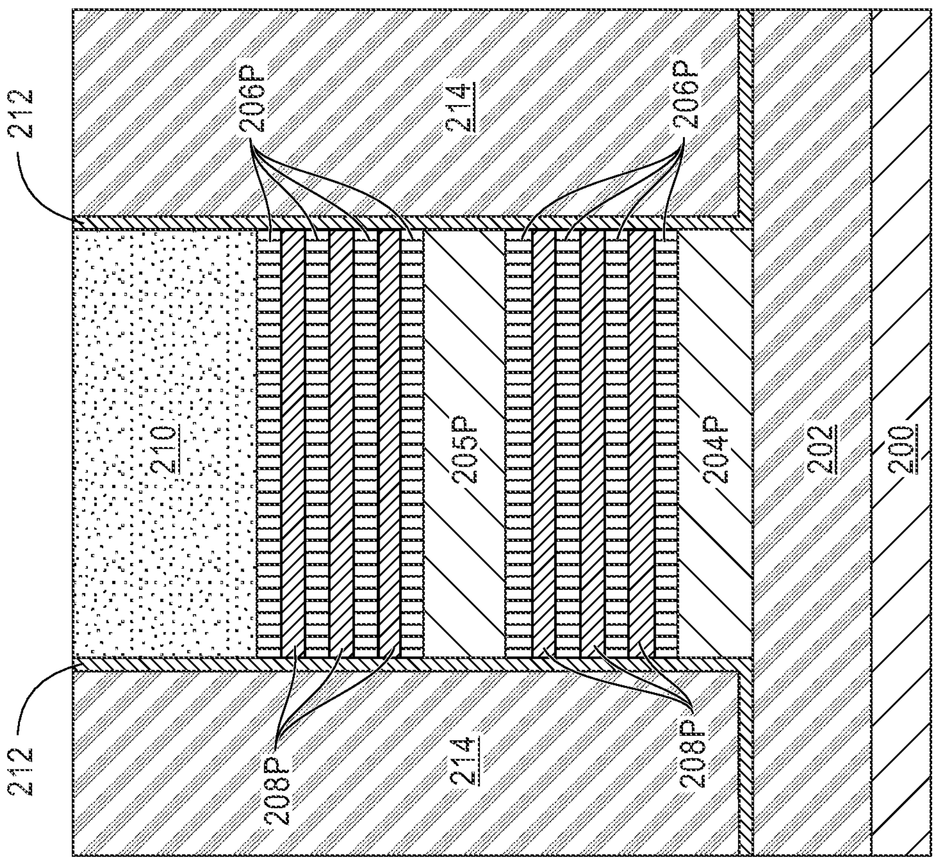
FIGS. 28A and 28B are cross sectional views of the exemplary structure shown in FIGS. 27A and 27B, respectively, after forming a dielectric liner along the sidewalls of the patterned structure and a dielectric fill material laterally adjacent to the dielectric liner.
Figure 28A:
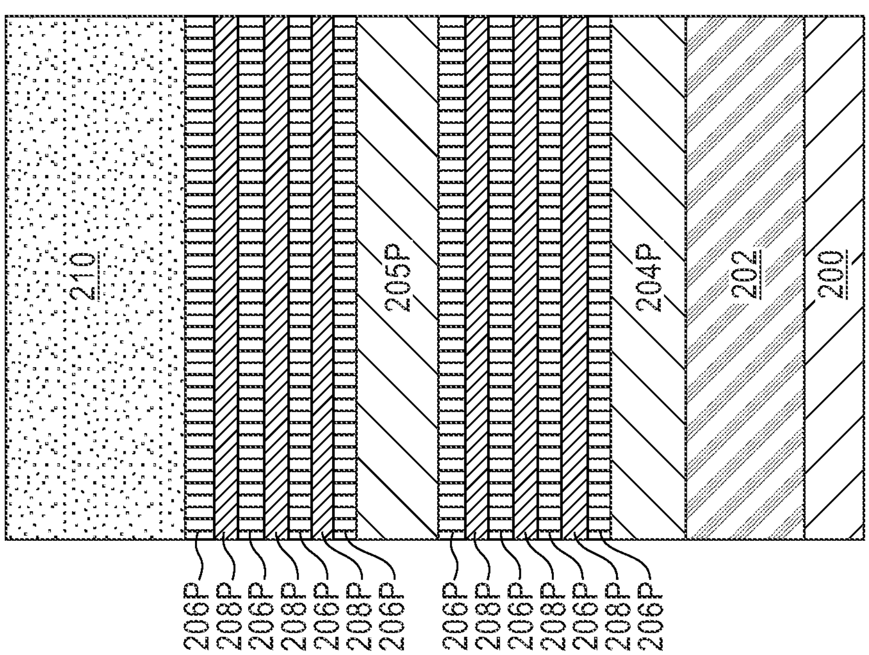

Referring now to FIGS. 28A and 28B. there are illustrated the exemplary structure shown in FIGS. 27A and 27B, respectively, after forming a dielectric liner 212 along the sidewalls of the patterned structure and a dielectric fill material 214 laterally adjacent to the dielectric liner 212. The dielectric liner 212 includes a dielectric material that is compositionally different from the dielectric fill material 214. In one example, the dielectric liner 212 is composed of silicon nitride, while the dielectric fill material 214 is composed of silicon dioxide. The dielectric liner 212 and the dielectric fill material 214 are formed by first depositing a continuous layer of dielectric liner material on the patterned structure shown in FIGS. 27A and 27B. The depositing of the continuous layer of dielectric liner material can include, but is not limited to, CVD, PECVD, ALD or PVD. The continuous layer of dielectric liner material is a conformal layer and can have a thickness from 5 nm to 20 nm; although other thicknesses are contemplated and can be used as the thickness of the continuous layer of dielectric liner material. By "conformal layer" it is meant that a material layer has a thickness along horizontal surfaces that is the same as a thickness of the same material layer along vertical surfaces. A dielectric fill material 214 is then formed by a deposition process (e.g., CVD or PECVD) and then a planarization process is used to remove the continuous layer of dielectric liner material and any dielectric fill material that is located above a topmost surface of the patterned hard mask 210. The remaining continuous layer of dielectric liner material forms the dielectric liner 212.

In addition to being located on the sidewalls of the patterned structure, dielectric liner 212 is also located on a physically exposed surface of the dielectric material layer 202 not containing the patterned structure. Along the sidewalls of the patterned structure, the dielectric liner 212 is present on sidewalls of the patterned hard mask 210, the patterned second nanosheet material stack MS2 (including each sacrificial semiconductor material layer portion 206P and each semiconductor channel material layer portion 208P), the second sacrificial semiconductor layer portion 206, patterned first nanosheet material stack MS1 (including each sacrificial semiconductor material layer portion 206P and each semiconductor channel material layer portion 208P), and the first sacrificial semiconductor layer portion 206. As is illustrated in FIG. 28B, the dielectric liner 214 has a topmost surface that is coplanar with a topmost surface of both the dielectric fill material 214 and the patterned hard mask 210.

Figure 29B:
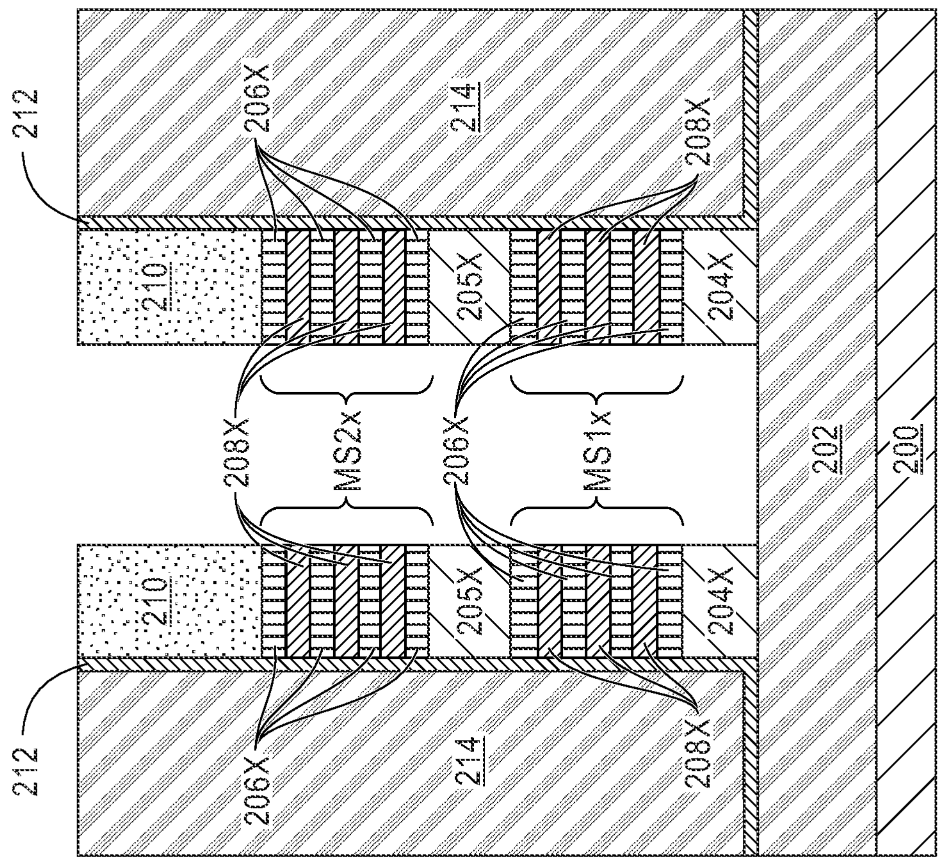
FIGS. 29A and 29B are cross sectional views of the exemplary structure shown in FIGS. 28A and 28B, respectively, after patterning the patterned structure to provide a pair of patterned vertical stacked structures.
Figure 29A:
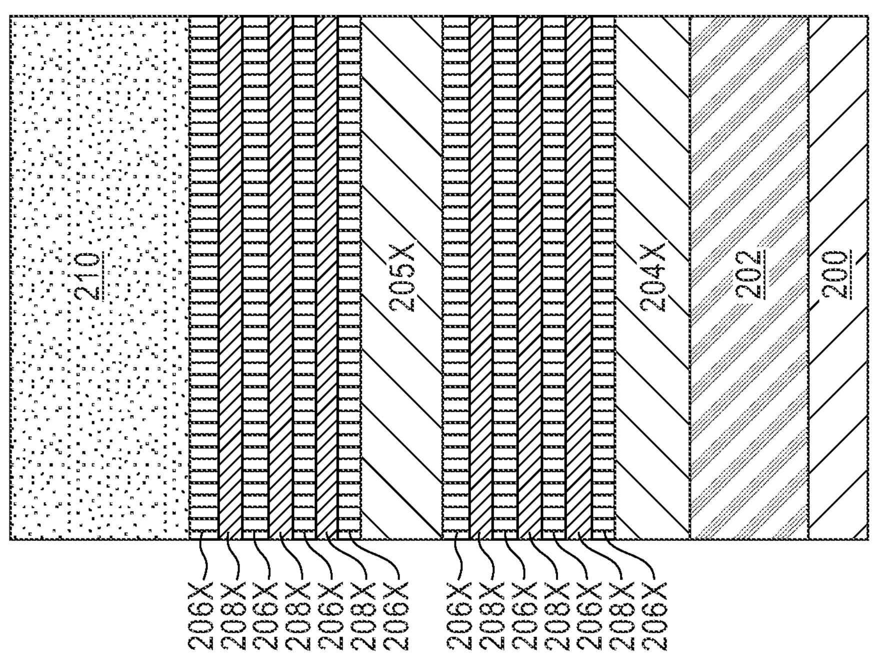

Referring now to FIGS. 29A and 29B, there are illustrated the exemplary structure shown in FIGS. 28A and 28B, respectively, after patterning the patterned structure to a pair of patterned vertical stacked structures. A gap exists between the pair of patterned vertical stacked structure. Each patterned vertical stacked structure includes a remaining (i.e., non-etched) portion of the first sacrificial semiconductor material layer portion 204P (hereinafter first sacrificial semiconductor material portion 204X), a remaining (i.e., non-etched) portion of the first nanosheet material stack MS1 (hereinafter pitch adjusted first nanosheet material stack MS1*x*), a remaining (i.e., non-etched) portion of the second sacrificial semiconductor material layer portion 205P (hereinafter second sacrificial semiconductor material portion 205X), and a remaining (i.e., non-etched) portion of the second nanosheet material stack MS2 (hereinafter pitch adjusted second nanosheet material stack MS2*x*). A portion of the patterned hard mask 210 also remains atop each patterned vertical stacked structure. Within each pitch adjusted first and second nanosheet material stacks MS1*x* and MS2*x*, respectively, there remains a non-etched portion of each sacrificial semiconductor material layer portion 206P (hereinafter sacrificial semiconductor material portion 206*x*) and a non-etched portion of each semiconductor channel material layer portion 208P (hereinafter semiconductor channel material portion 208X).

Figure 30B:
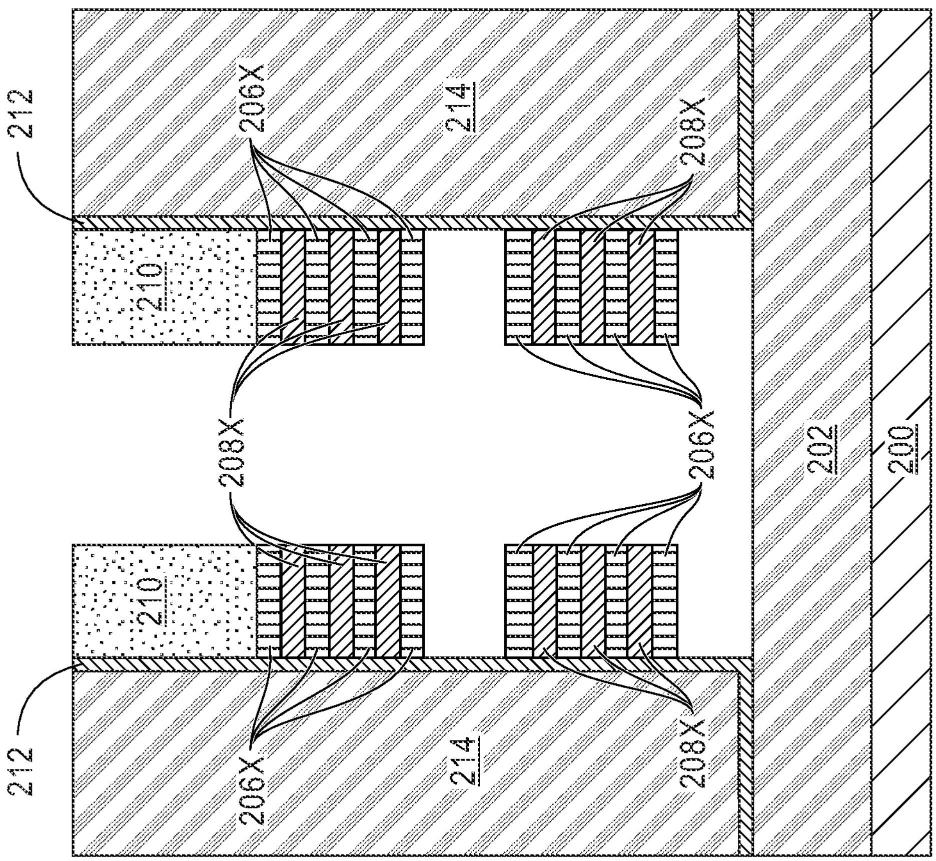
FIGS. 30A and 30B are cross sectional views of the exemplary structure shown in FIGS. 29A and 29B, respectively, after removing remaining portions of the first and second sacrificial semiconductor material layer from each patterned vertical stack structure.
Figure 30A:
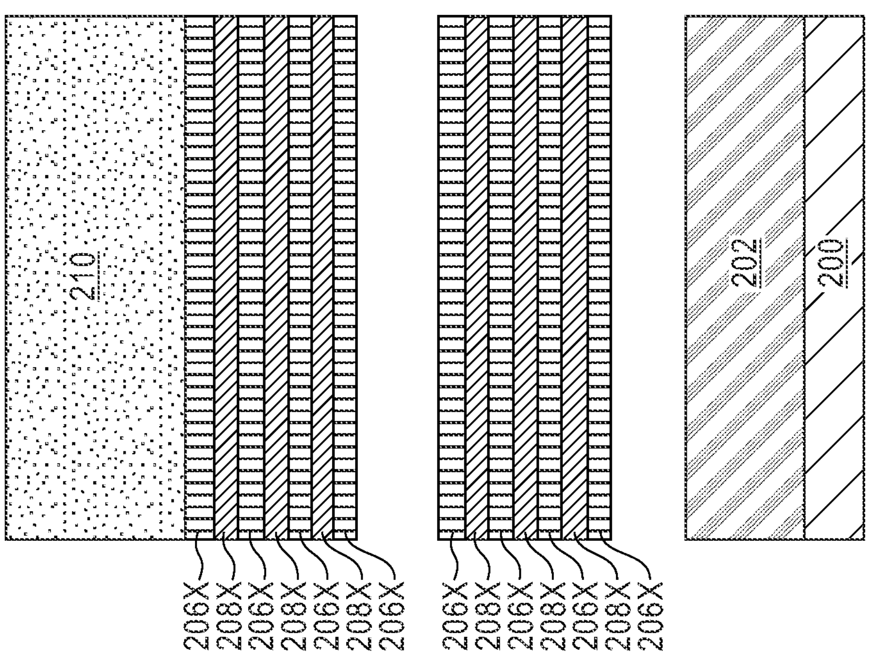

Referring now to FIGS. 30A and 30B, there are illustrated the exemplary structure shown in FIGS. 29A and 29B, respectively, after removing remaining portions of the first and second sacrificial semiconductor material layers (i.e., the first sacrificial semiconductor material portion 204X and the second sacrificial semiconductor material portion 205X) from each patterned vertical stacked structure. The removal of the first sacrificial semiconductor material portion 204X and the second sacrificial semiconductor material portion 205X includes an etching process that is selective in removing the third semiconductor material that provides the first sacrificial semiconductor material portion 204X and the second sacrificial semiconductor material portion 205X relative to the first and second semiconductor materials that provide each sacrificial semiconductor material portion 206X and semiconductor channel material portion 208X of the pitch adjusted first and second nanosheet material stacks MS1*x* and MS2*x*.

Figure 31B:
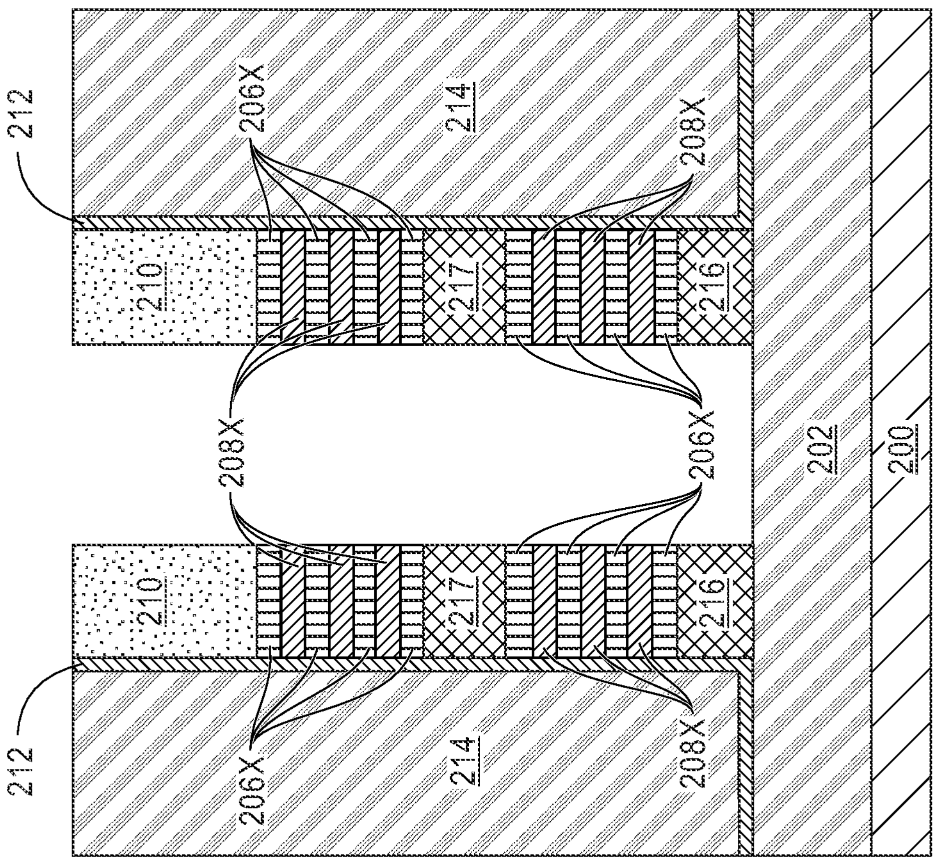
FIGS. 31A and 31B are cross sectional views of the exemplary structure shown in FIGS. 30A and 30B, respectively, after forming a dielectric material within the volume previously including the remaining portions of the first and second sacrificial semiconductor material layers.
Figure 31A:
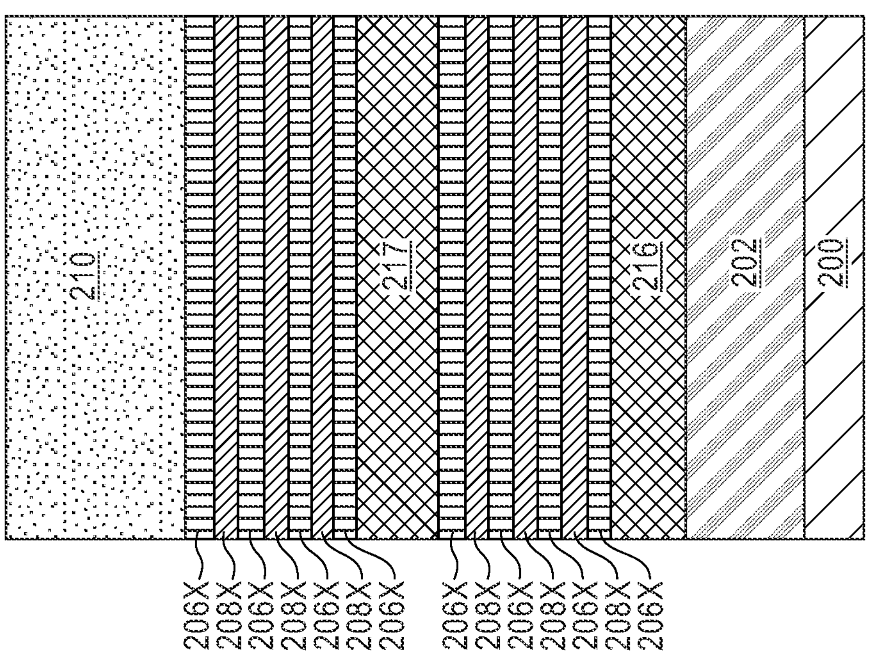

Referring now to FIGS. 31A and 31B, there are illustrated the exemplary structure shown in FIGS. 30A and 30B, respectively, after forming a dielectric material within the volume previously including the remaining portions of the first and second sacrificial semiconductor material layers (i.e., first sacrificial semiconductor material portion 204X and the second sacrificial semiconductor material portion 205X). As is shown, a first dielectric isolation layer 216 is formed between the pitch adjusted first second nanosheet material stack MS1*x* and dielectric material layer 102, a second dielectric isolation layer 217 is formed between the pitch adjusted first nanosheet material stack MS1*x* and the pitch adjusted second nanosheet material stack MS2*x*. The dielectric material that provides the first dielectric isolation layer 216 and the second dielectric isolation layer 217 can include any divot fill dielectric material such as, for example, SiN, SiOC, SiC, SiBCN, SiOCN, or $SiO_2$. The dielectric material that provides the first dielectric isolation layer 216 and the second dielectric isolation layer 217 can be formed by a deposition process such as, for example, ALD, CVD or PECVD. An isotropic etch may be employed to remove and divot fill dielectric material that is present in the gate between the pair of vertical stacks.

Figure 32B:
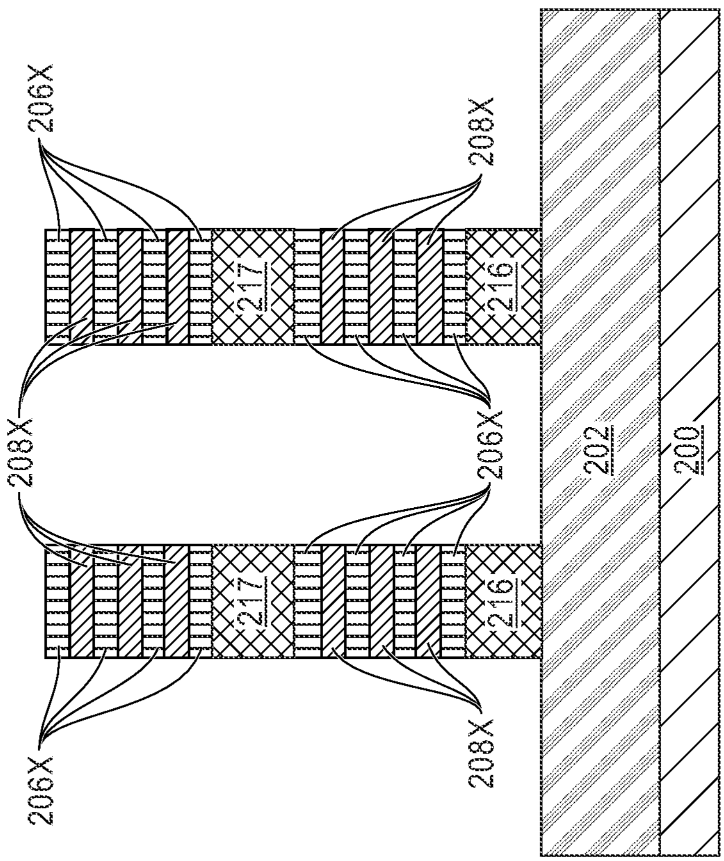
FIGS. 32A and 32B are cross sectional views of the exemplary structure shown in FIGS. 31A and 31B, respectively, after removing the dielectric fill material and the dielectric liner.
Figure 32A:
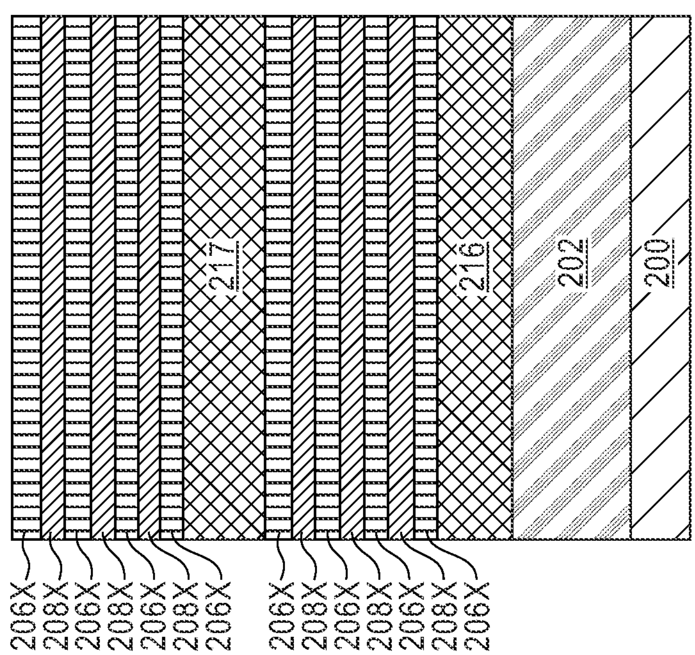

Referring now to FIGS. 32A and 32B, there are illustrated the exemplary structure shown in FIGS. 31A and 31B, respectively, after removing the dielectric fill material 214 and the dielectric liner 212. Firstly, dielectric liner 212 and dielectric fill material 214 are deposited to fill the gap between two nanosheet stacks, then a planarization process is used to polish the dielectric fill 214 stopping on hard mask 210. After that, the dielectric fill material is selectively removed, stopping on the dielectric liner 212 and the patterned hard mask 210, followed by removal of the patterned hard mask 210 and dielectric liner 212. Both sidewalls of the pair of patterned vertical stacked structures are now revealed as is shown in FIG. 32B.

Figure 33A:
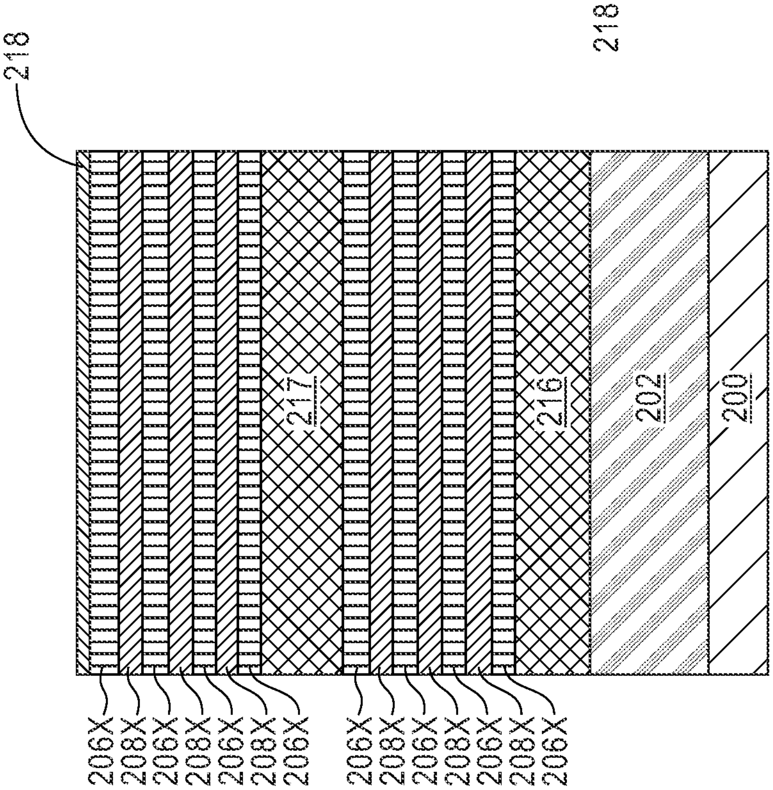
FIGS. 33A and 33B are cross sectional views of the exemplary structure shown in FIGS. 32A and 32B, respectively, after forming a sacrificial dielectric liner.
Figure 33B:
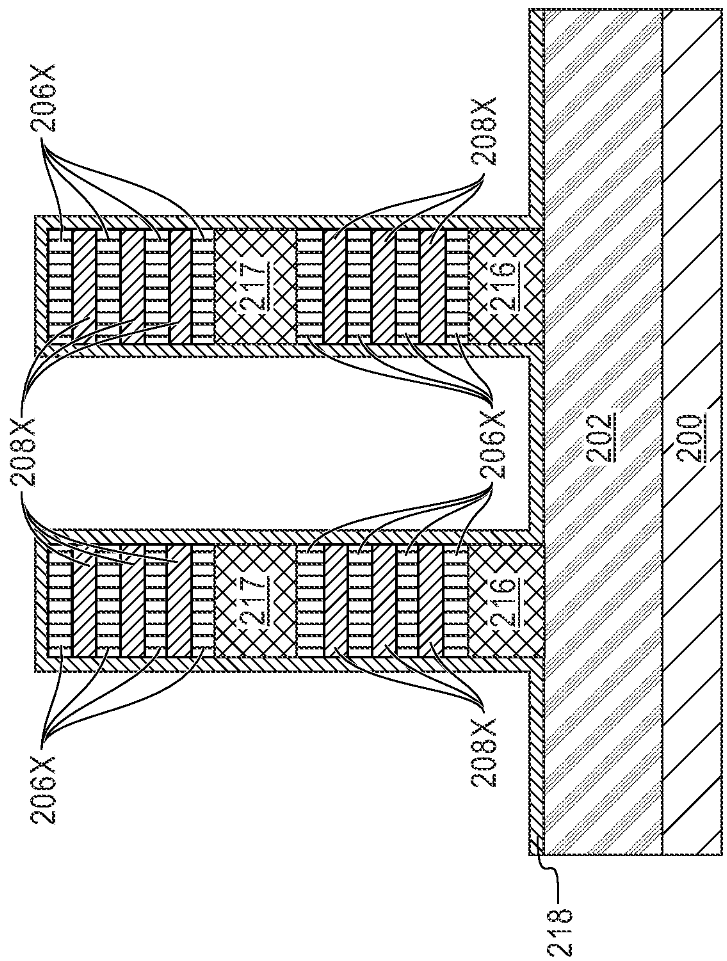

Referring now to FIGS. 33A and 33B, there are illustrated the exemplary structure shown in FIGS. 32A and 32B, respectively, after forming a sacrificial dielectric liner 218. The sacrificial dielectric liner 218 is formed along sidewalls and a topmost surface of each patterned vertical stacked structure. The sacrificial dielectric liner 218 is composed of a dielectric material such as, for example, silicon oxide and the sacrificial dielectric liner 218 is a conformal layer. The sacrificial dielectric liner 218 can be formed by a deposition process such as, for example, CVD, PECVD, ALD or PVD.

Figure 34B:
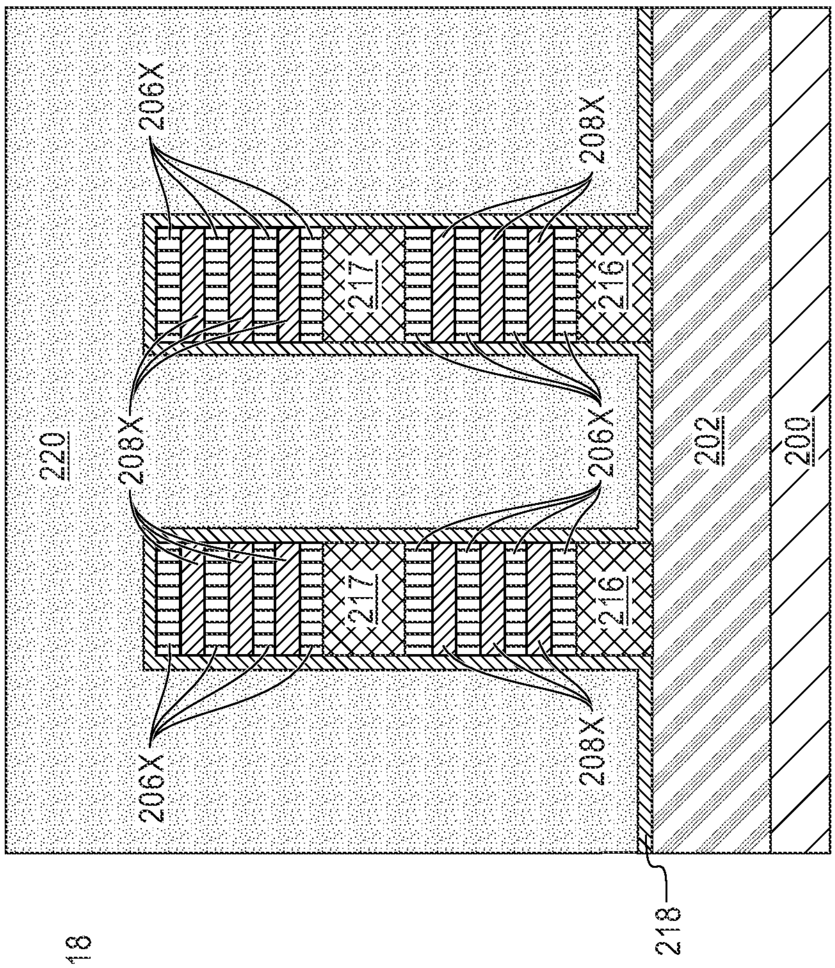
FIGS. 34A and 34B are cross sectional views of the exemplary structure shown in FIGS. 33A and 33B, respectively, after forming a first sacrificial gate material.
Figure 34A:
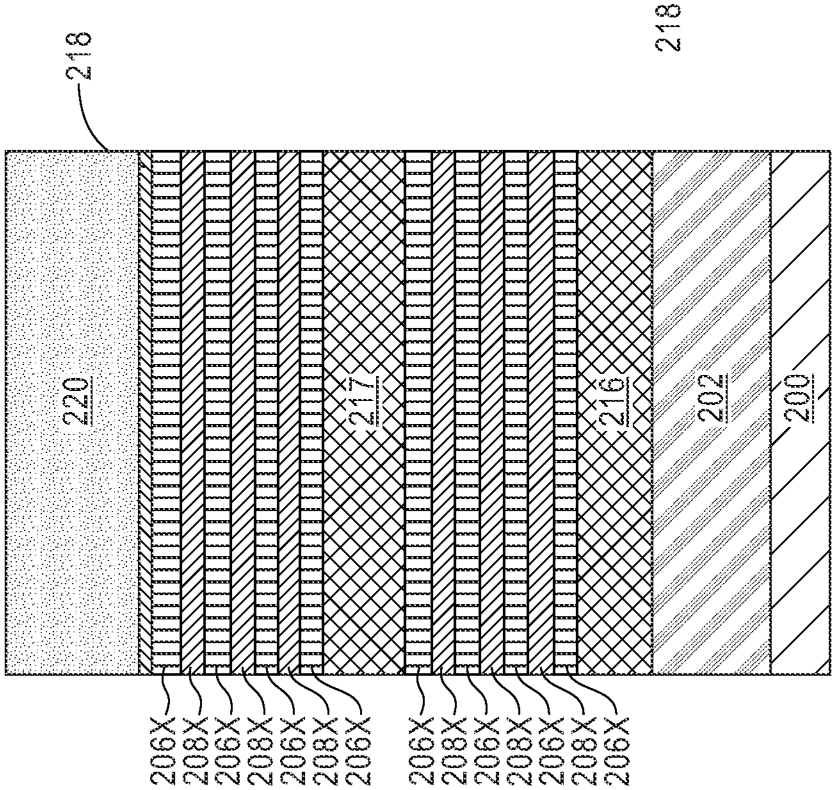

Referring now to FIGS. 34A and 34B, there are illustrated the exemplary structure shown in FIGS. 33A and 33B, respectively, after forming a first sacrificial gate material 220. The first sacrificial gate material 220 can including any sacrificial gate material such as those mentioned above for the sacrificial gate materials presents in the first sacrificial gate structure 108. In one embodiment, the first sacrificial gate material 220 is composed of a-Si. The first sacrificial gate material 220 can be formed by a deposition process such as, for example, CVD, PECVD or PVD. At this point of the present application, the first sacrificial gate material 220 is formed laterally adjacent to pair of patterned vertical stacked structures and above the exposed topmost surface of each patterned vertical stacked structures.

Figure 35B:
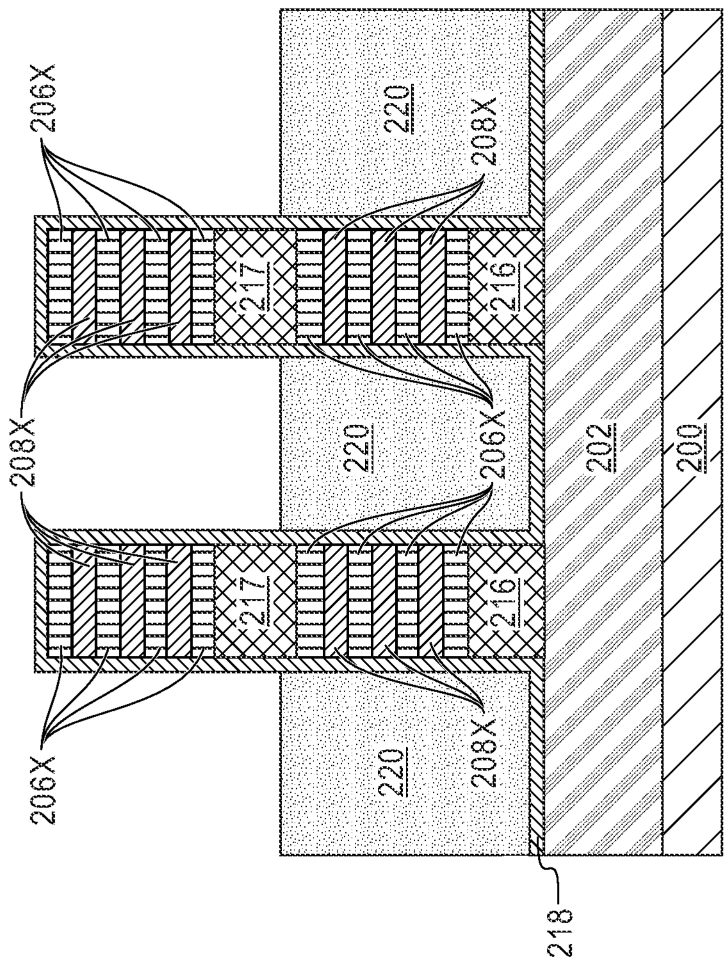
FIGS. 35A and 35B are cross sectional views of the exemplary structure shown in FIGS. 34A and 34B, respectively, after recessing the first sacrificial gate material.
Figure 35A:
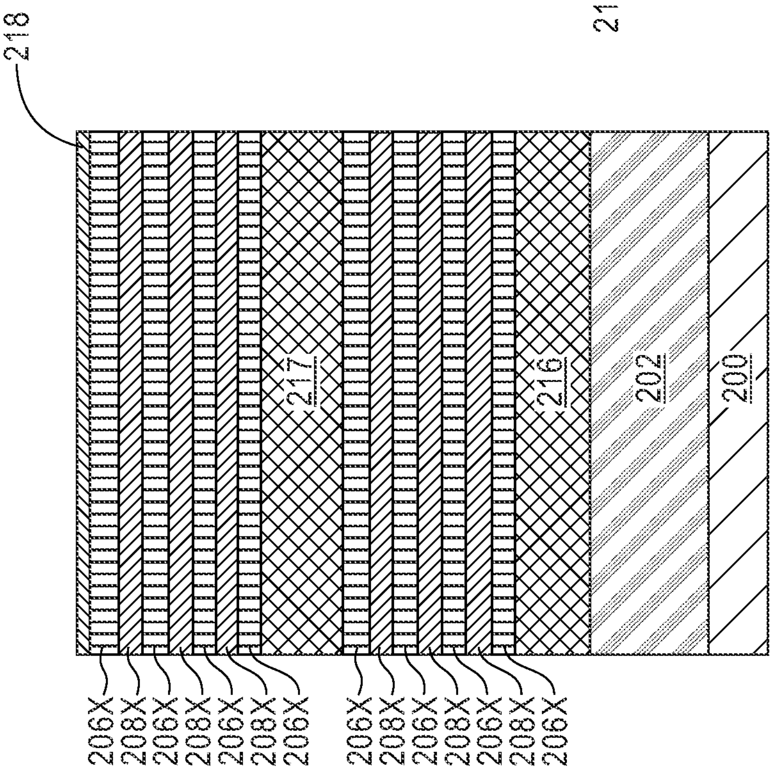

Referring now to FIGS. 35A and 35B, there are illustrated the exemplary structure shown in FIGS. 34A and 34B, respectively, after recessing the first sacrificial gate material 220. The recessing includes a recess etch and provides a recessed first sacrificial gate material 220 have a topmost surface that somewhere between a topmost surface and a bottom surface of the second dielectric isolation layer 217.

Figure 36B:
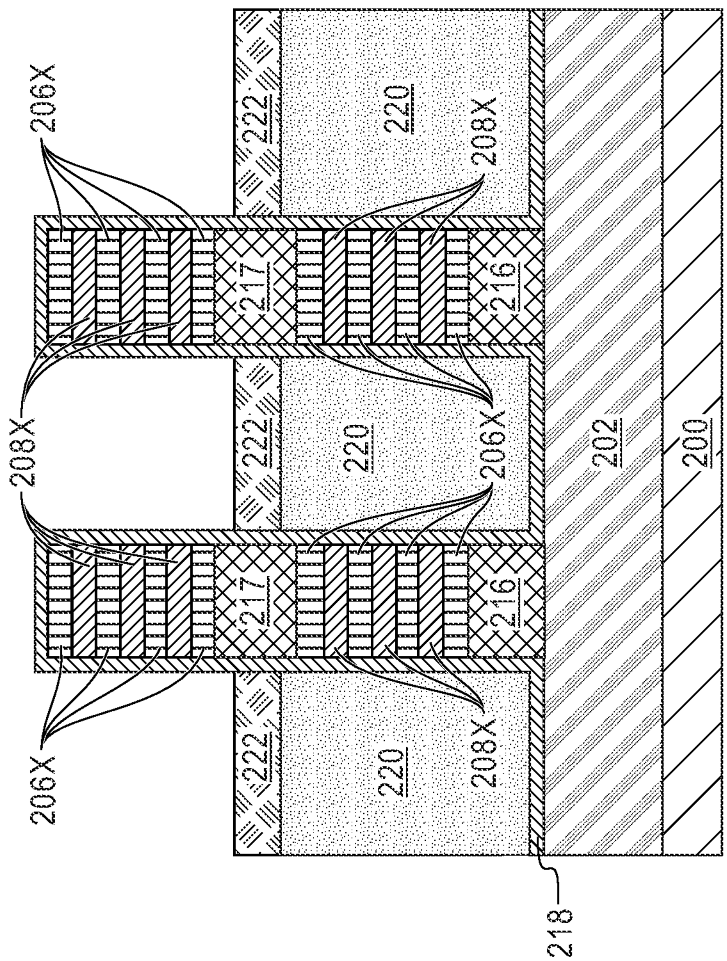
FIGS. 36A and 36B are cross sectional views of the exemplary structure shown in FIGS. 35A and 35B, respectively after forming a sacrificial material over the recessed sacrificial gate material.
Figure 36A:
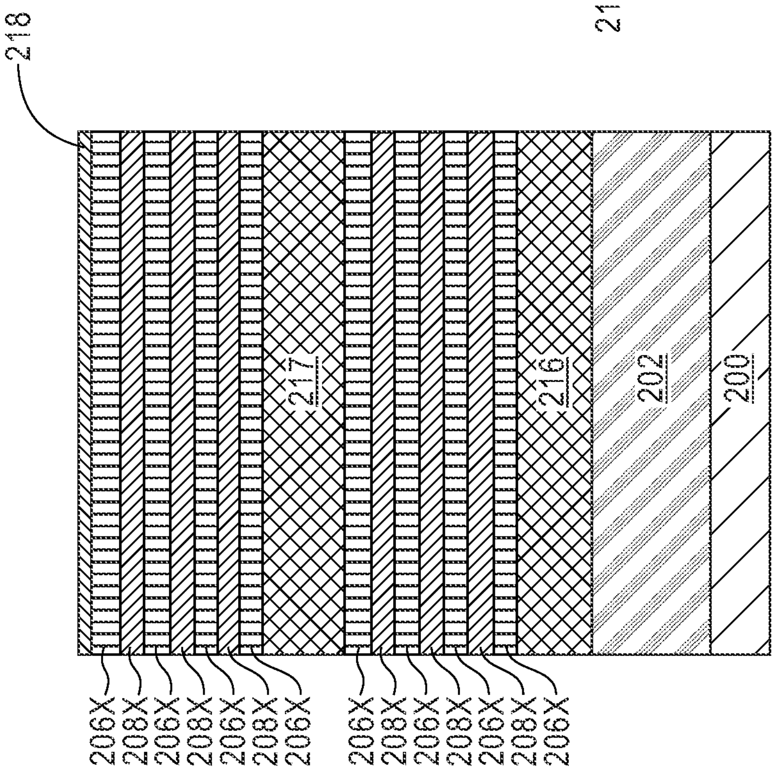

Referring now to FIGS. 36A and 36B, there are illustrated the exemplary structure shown in FIGS. 35A and 35B, respectively after forming a sacrificial material 222 over the recessed sacrificial gate material 220. The sacrificial material 222 includes a material that differs from the first sacrificial gate material 220 and the second sacrificial gate material 224 to be subsequently formed. Illustrative examples of materials that can be used as the sacrificial material 222 include, but are not limited to, a silicon germanium alloy, aluminum oxide, titanium oxide or titanium nitride. The sacrificial material 222 can be formed by directional deposition followed by an etch that removes the sacrificial material 222 sidewalls of each patterned vertical stacked structure. Alternatively, the sacrificial material 222 can be formed by deposition (such as, for example, CVD, PECVD or PVD) which overfills the gap that is located between the pair of patterned vertical stacks, followed by a recess etch. The sacrificial material 222 that is formed has a topmost surface that does not exceed the topmost surface of the second dielectric isolation layer 217. See, for example, FIG. 36B.

Figure 37B:
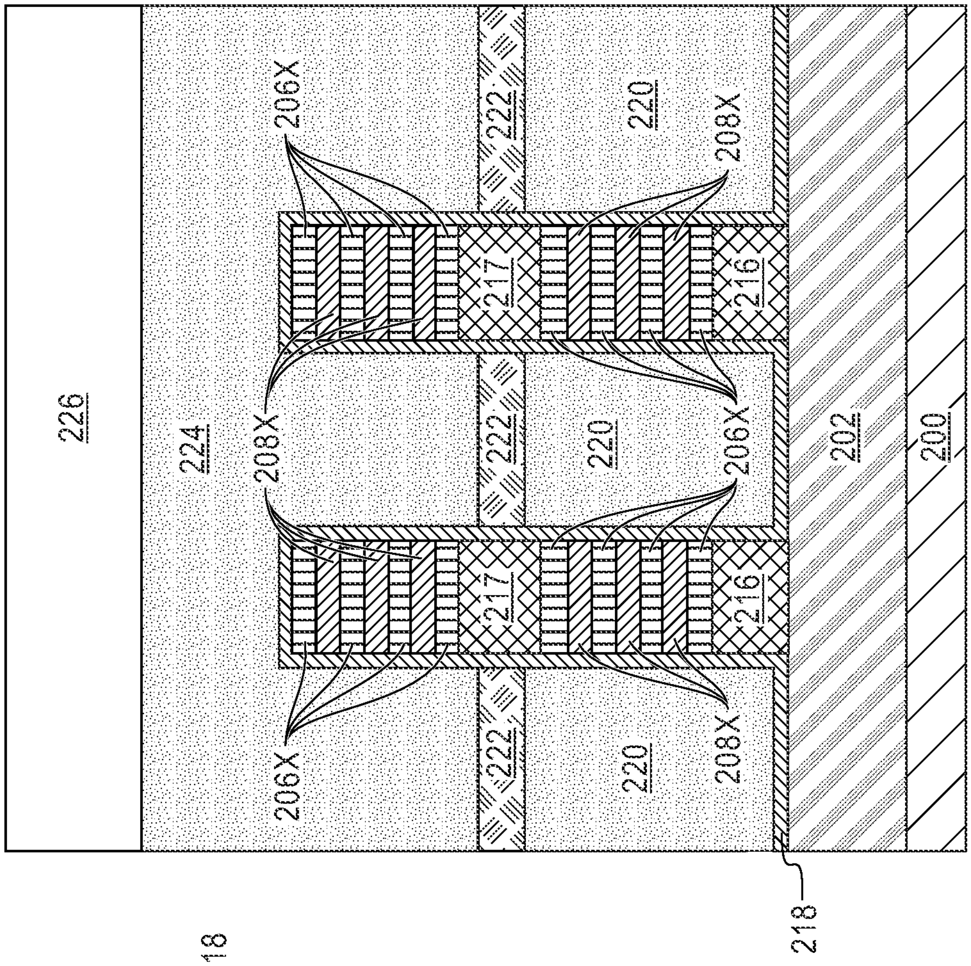
FIGS. 37A and 37B are cross sectional views of the exemplary structure shown in FIGS. 36A and 36B, respectively, after forming a second sacrificial gate material and a hard mask layer.
Figure 37A:
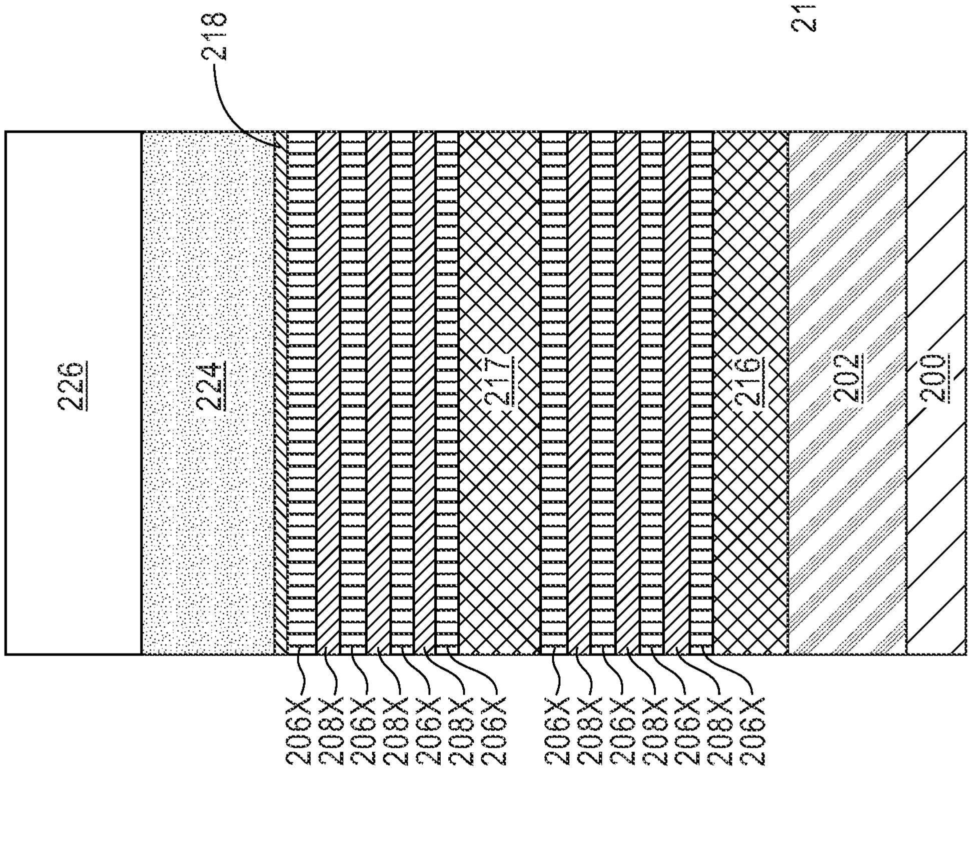

Referring now to FIGS. 37A and 37B, there are illustrated the exemplary structure shown in FIGS. 36A and 36B, respectively, after forming a second sacrificial gate material 224 and a hard mask layer 226. The second sacrificial gate material 224 which is formed on the sacrificial material 222 and laterally adjacent to, and above, an upper portion of each patterned vertical stacked structure includes any sacrificial gate material such as those mentioned above for the sacrificial gate materials presents in the first sacrificial gate structure 108. In one embodiment, the second sacrificial gate material 224 is composed of a-Si. The second sacrificial gate material 224 can be formed by a deposition process such as, for example, CVD, PECVD or PVD. Hard mask layer 226, which is formed on the second sacrificial gate material 224, includes any hard mask material including those mentioned above for patterned hard mask 210. The hard mask layer 22 can be formed by a deposition process including, but not limited to, CVD, PECVD or PVD.

Figure 38B:
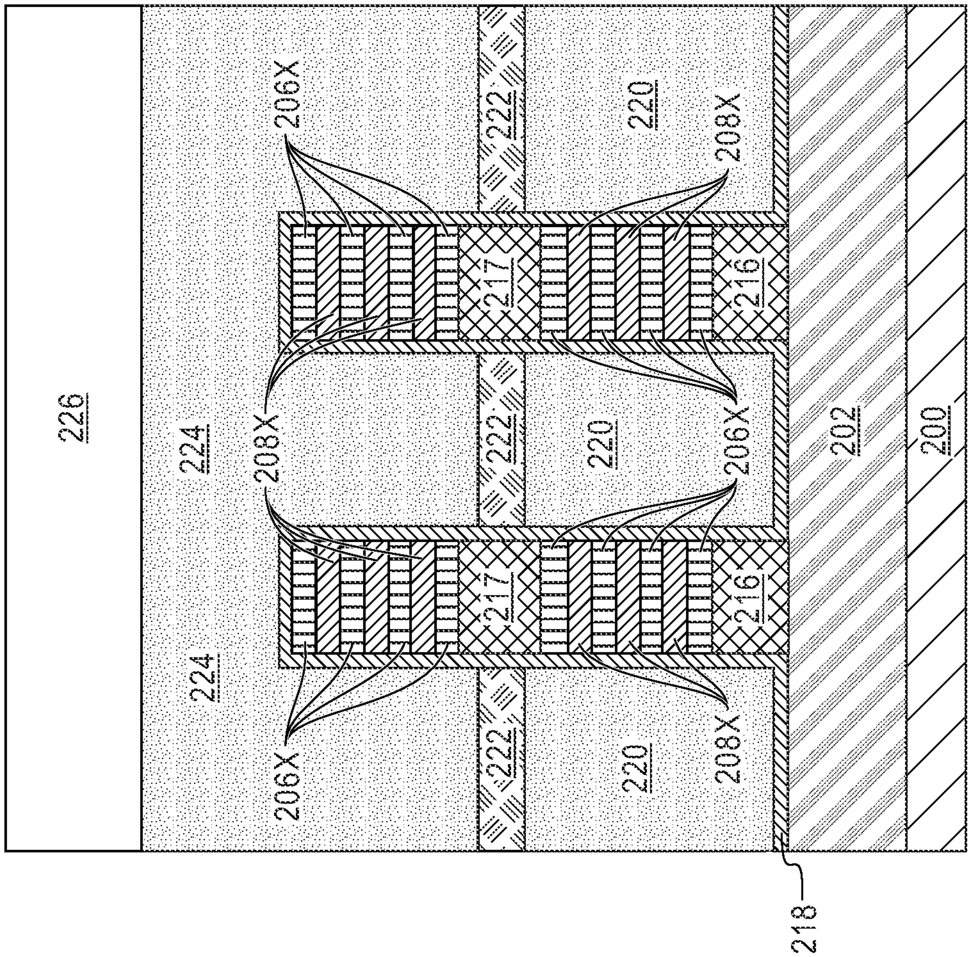
FIGS. 38A and 38B are cross sectional views of the exemplary structure shown in FIGS. 37A and 37B, respectively, after patterning the hard mask layer, the second sacrificial gate material, the sacrificial dielectric liner, the sacrificial material and the sacrificial first gate material to provide at least on sacrificial gate structure that is capped with a remaining portion of the hard mask layer.
Figure 38A:
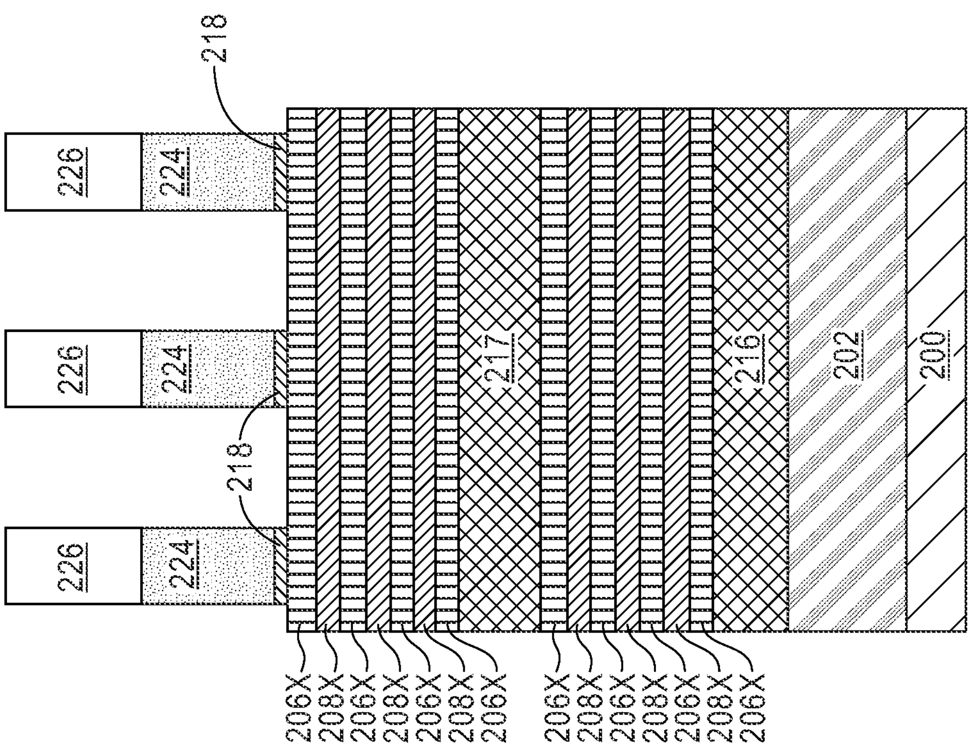
Figure 38C:
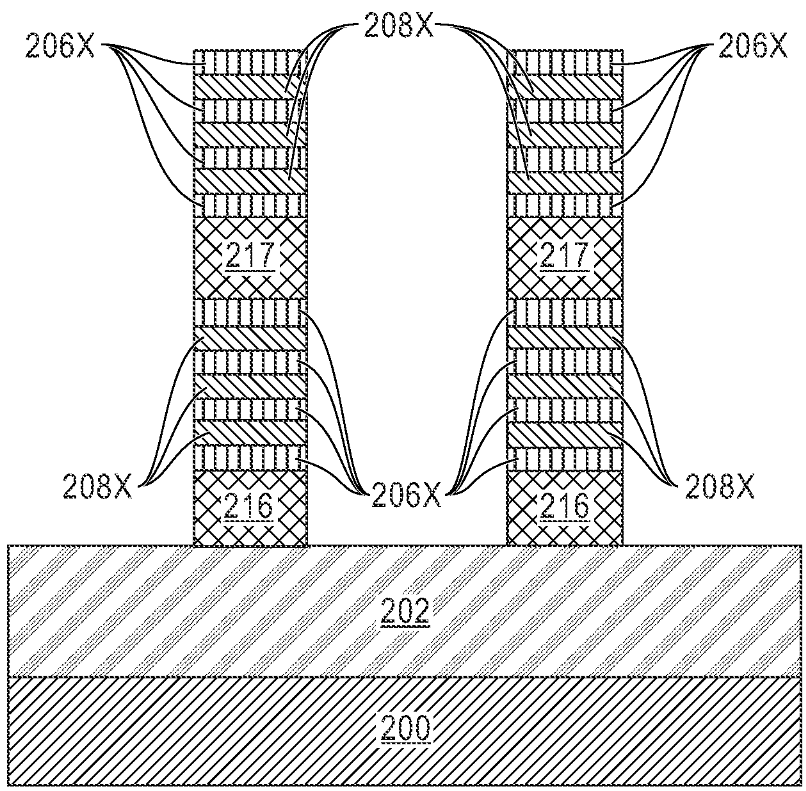
FIG. 38C is a cross sectional view of the exemplary structure shown in FIGS. 38A and 38B and through cut Y2-Y2 shown in FIG. 1.

Referring now to FIGS. 38A and 38B, there are illustrated the exemplary structure shown in FIGS. 37A and 37B, respectively, after patterning the hard mask layer 226, the second sacrificial gate material 224, the sacrificial dielectric liner 218, the sacrificial material 222 and the sacrificial first gate material 220 to provide least one (three are shown by way of one example in FIG. 38A) sacrificial gate structure that is capped with a remaining portion of the hard mask layer 216. FIG. 38C is provided that shows the source/drain regions of the exemplary structure shown in FIGS. 38A and 38B (i.e., cut Y2-Y2 shown in FIG. 1). This patterning process includes lithography and etching. Each sacrificial gate structure, which is capped with a remaining portion of the hard mask layer 226, includes a remaining portion of the sacrificial second material 224, a remaining portion of the sacrificial dielectric liner 218, a remaining portion of the sacrificial material layer 222 and a remaining portion of the first sacrificial gate material 220. It is noted that the remaining portion of the sacrificial second material 224, the remaining portion of the sacrificial dielectric liner 218, the remaining portion of the sacrificial material layer 222 and the remaining portion of the first sacrificial gate material 220 are present along sidewalls of each patterned vertical stacked structure.

Figure 39B:
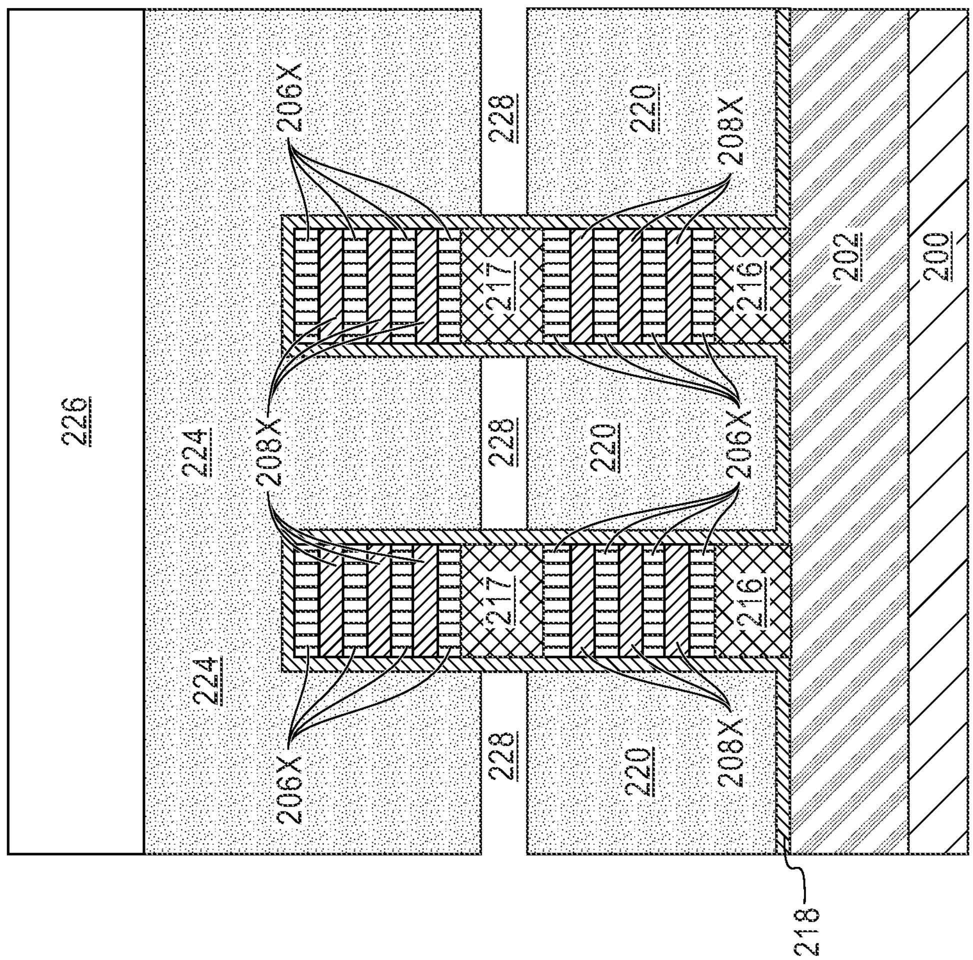
FIGS. 39A, 39B and 39C are cross sectional views of the exemplary structure shown in FIGS. 38A, 38B and 38C, respectively, after removing the remaining portion of the sacrificial material to form a gap laterally adjacent to the second dielectric isolation layer and between the remaining portions of the first and second sacrificial gate materials.
Figure 39A:
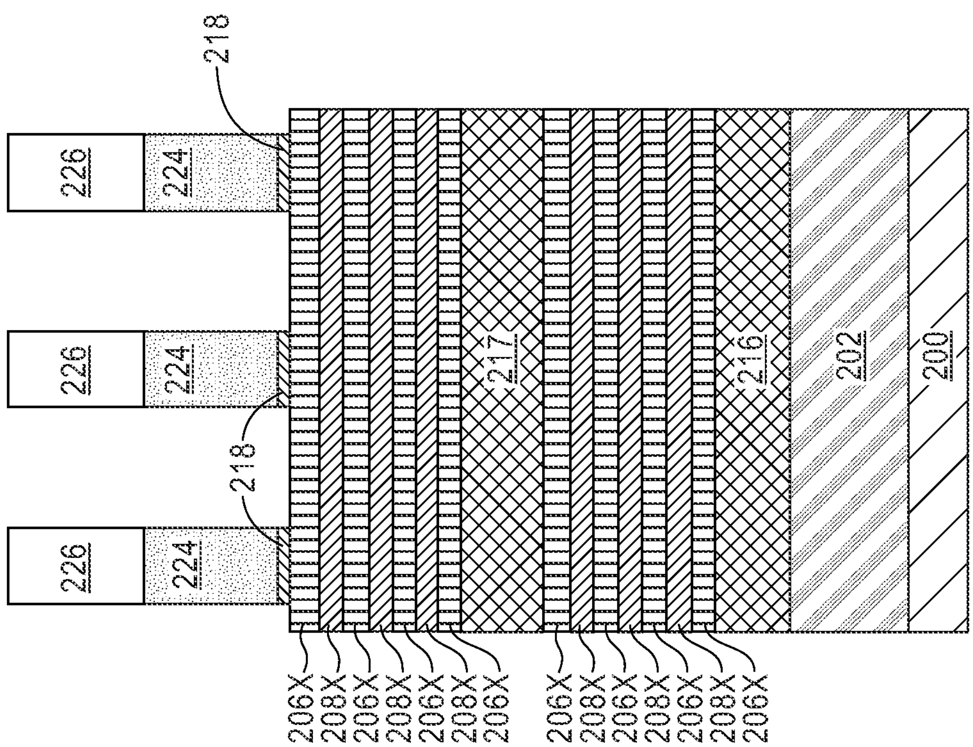
Figure 39C:
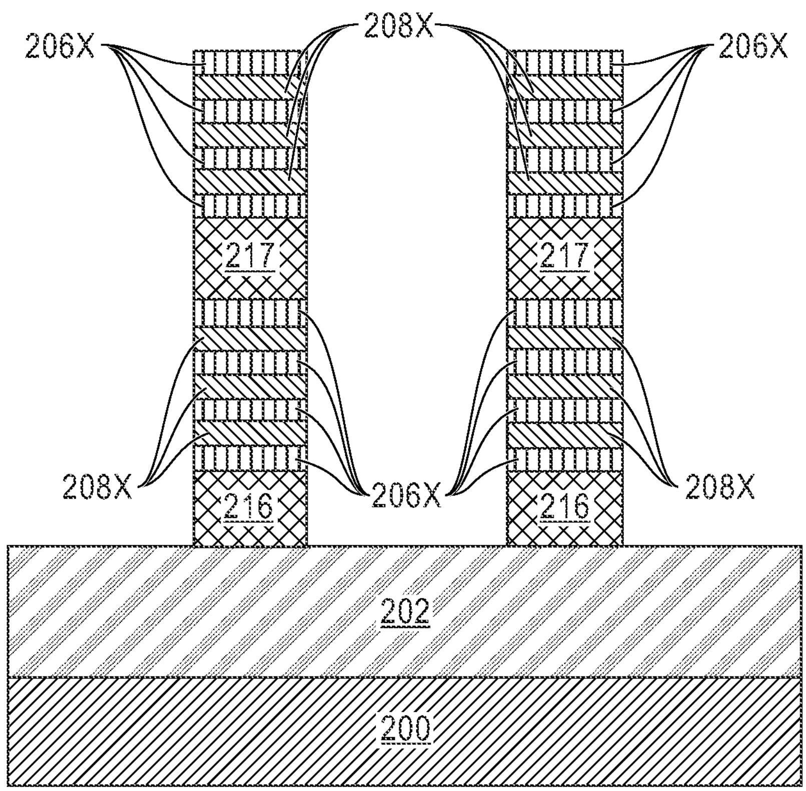

Referring now to FIGS. 39A, 39B and 39C, there are illustrated the exemplary structure shown in FIGS. 38A, 38B and 38C, respectively, after removing the remaining portion the sacrificial material 222 to form a gap 228 laterally adjacent to, the second dielectric isolation layer 217 and between the remaining portions of the first and second sacrificial gate materials 220 and 224, respectively. The removal of the remaining portion the sacrificial material 222 includes an etching process that is selective in removing sacrificial material 222.

Figure 40B:
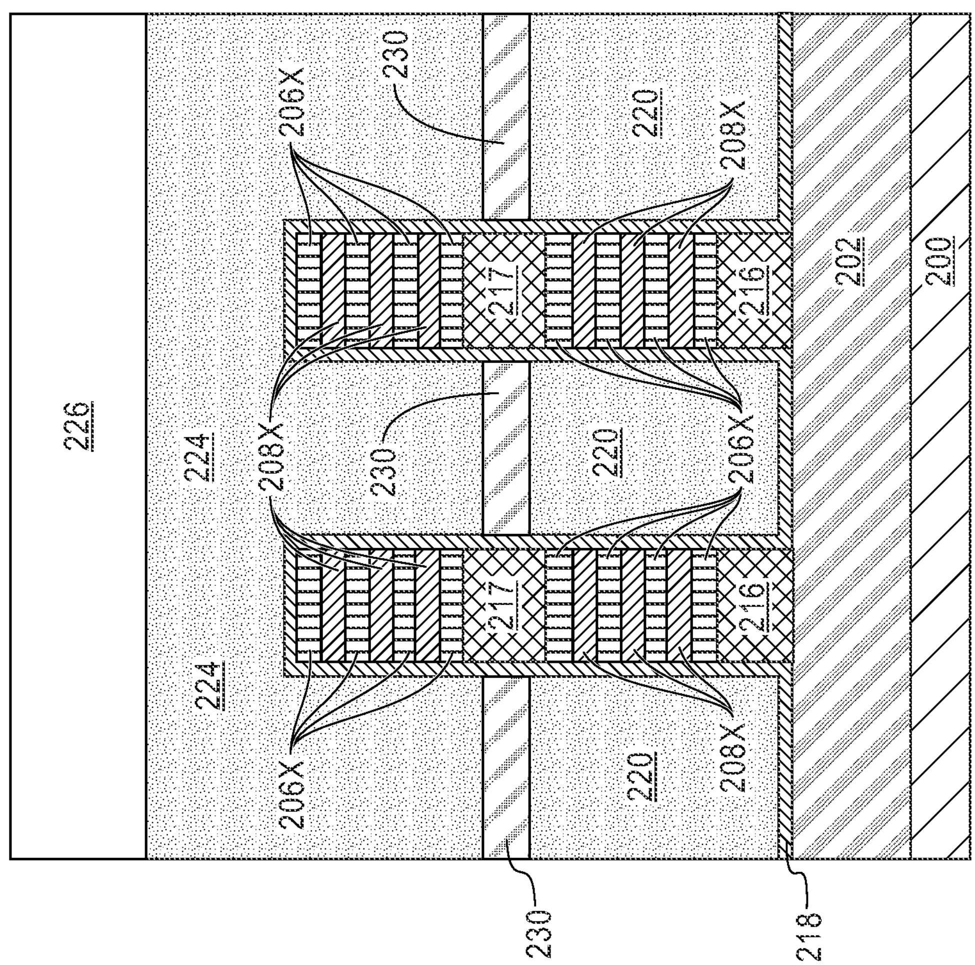
FIGS. 40A, 40B and 40C are cross sectional views of the exemplary structure shown in FIGS. 39A, 39B and 39C, respectively, after forming a dielectric spacer along the sidewalls of each sacrificial structure, wherein during the forming of the dielectric spacer the gap is filled with a dielectric spacer material to provide a layer of spacer dielectric material between the remaining portions of the first and second sacrificial gate materials.
Figure 40A:
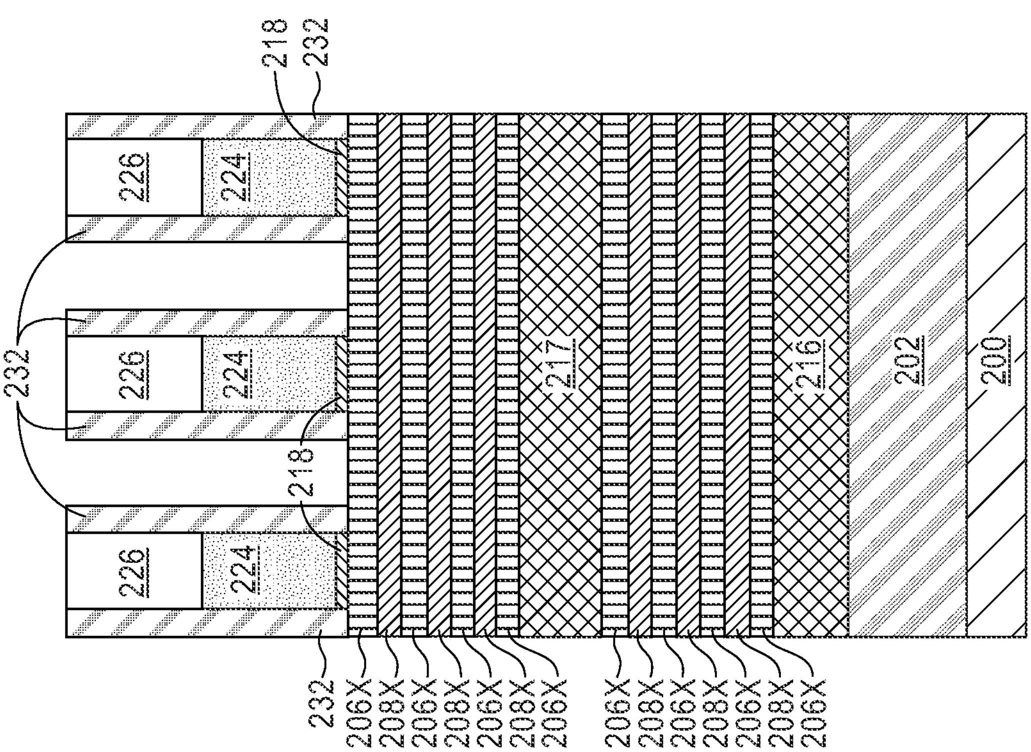
Figure 40C:
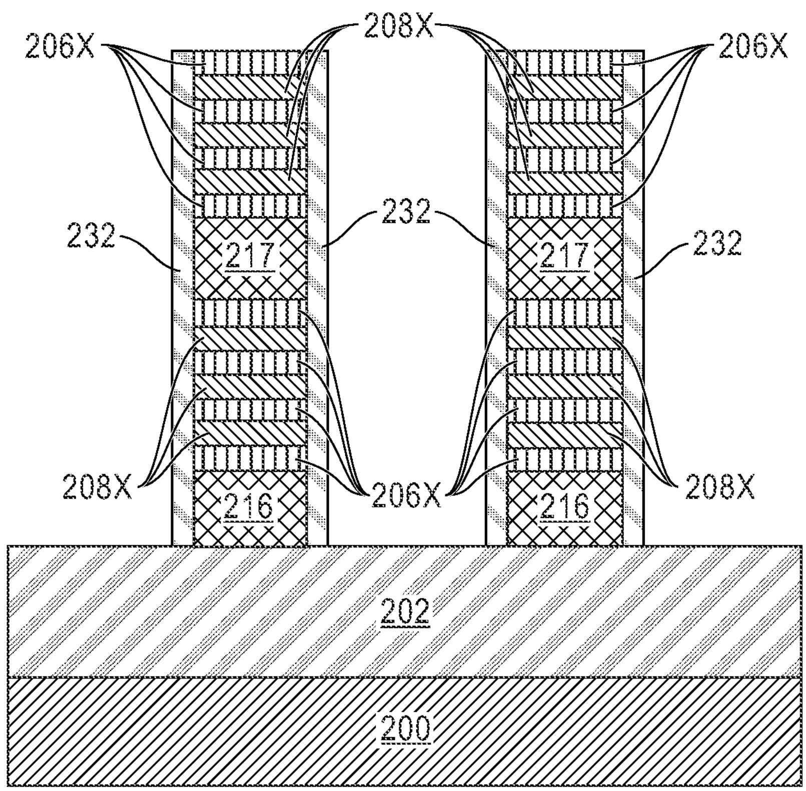

Referring now to FIGS. 40A, 40B and 40C, there are illustrated the exemplary structure shown in FIGS. 39A, 39B and 39C, respectively, after forming a dielectric spacer 232 along the sidewalls of each sacrificial structure, wherein during the forming of the dielectric spacer 232 the gap 228 is filled with a dielectric spacer material to provide a layer of spacer dielectric material 230 between the remaining portions of the first and second sacrificial gate materials 220 and 224, respectively. The dielectric spacer 232 and the layer of spacer dielectric material 230 are composed of a same dielectric spacer material. The dielectric spacer material used in providing the dielectric spacer 232 and the layer of spacer dielectric material 230 includes one of the dielectric spacer materials mentioned above for first dielectric spacer 110. The dielectric spacer 232 and thus the layer of spacer dielectric material 230 can be formed by deposition of the spacer dielectric material, followed by a spacer etch such as, for example, reactive ion etching (RIE). It is noted that the layer of spacer dielectric material 230 will serve as a SDSDM layer in this embodiment of the present application.

Figure 41A:
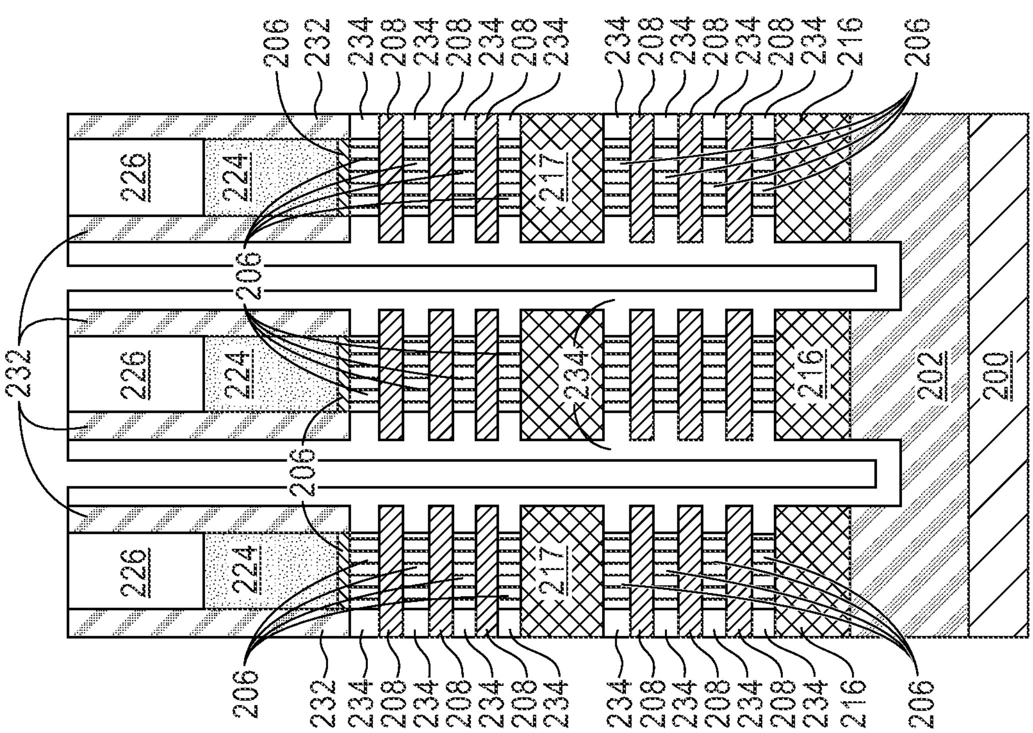
FIGS. 41A, 41B and 41C are cross sectional views of the exemplary structure shown in FIGS. 40A, 40B and 40C, respectively, after patterning each patterned vertical stack structure utilizing the at least one hard mask capped sacrificial gate structure and dielectric spacer as a combined etch mask to provide a vertical nanosheet stacked structure containing at least a first nanosheet stack and a second nanosheet stack, wherein each of the first and second nanosheet stacks including alternating sacrificial semiconductor material nanosheets and semiconductor channel material nanosheets, recessing each sacrificial semiconductor material nanosheet of the first and second nanosheets stacks to provide a gap, and forming an inner spacer dielectric material that fills each gap and is present along the sidewalls of each vertical nanosheet stacked structure and along the sidewalls of the at least one hard mask capped sacrificial gate structure.
Figure 41B:
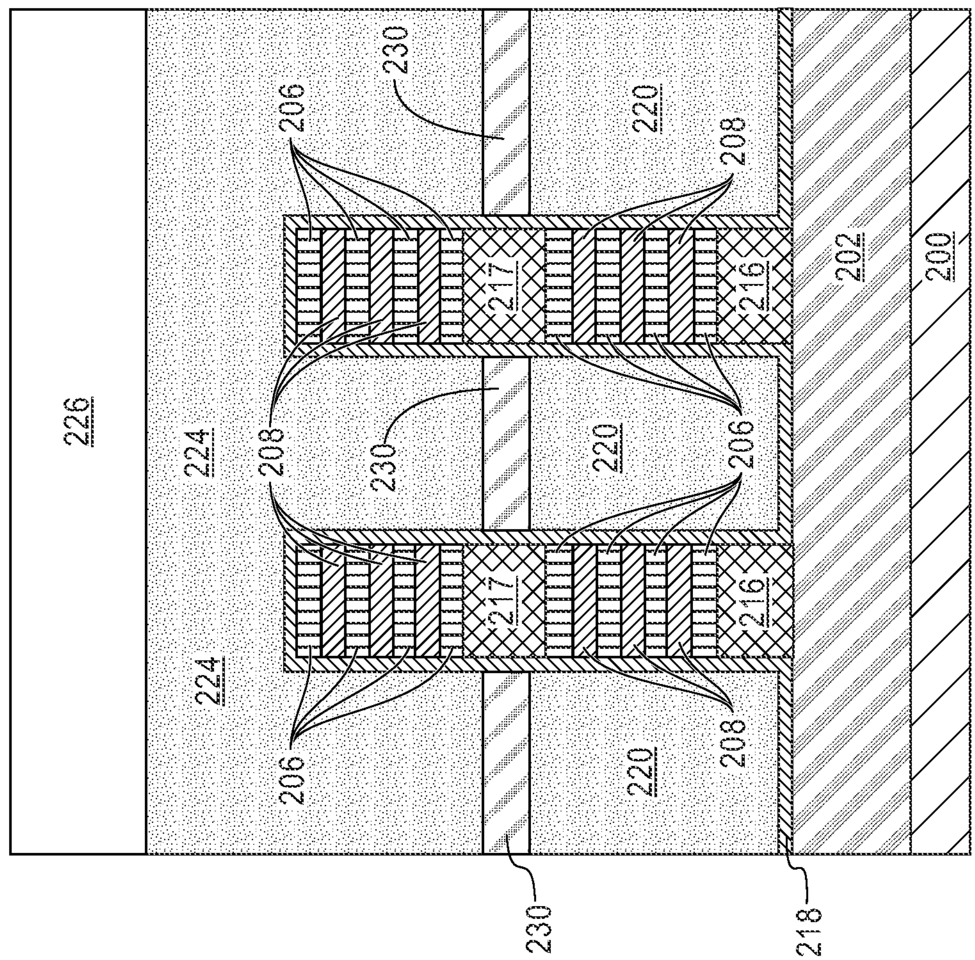
Figure 41C:
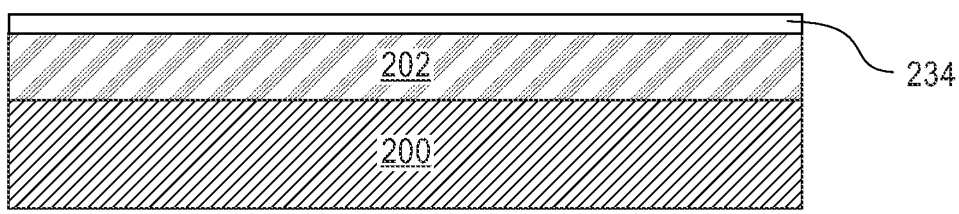

Referring now to FIGS. 41A, 41B and 41C, there are illustrated the exemplary structure shown in FIGS. 39A, 39B and 39C, respectively, after patterning each patterned vertical stacked structure utilizing the at least one hard mask capped sacrificial gate structure (214/224/226) and dielectric spacer 232 as a combined etch mask to provide a vertical nanosheet stacked structure containing at least a first nanosheet stack and a second nanosheet stack, wherein each of the first and second nanosheet stacks including alternating sacrificial semiconductor material nanosheets 206 and semiconductor channel material nanosheets 208, recessing each sacrificial semiconductor material nanosheet 206 of the first and second nanosheets stacks to provide a gap, and forming an inner spacer dielectric material 234 that fills each gap and is present along the sidewalls of the at vertical nanosheet stacked structure and along the sidewalls of the at least one hard mask capped sacrificial gate structure (214/224/226).

The etching removes all portions of the patterned vertical stacked structure not protected by the combined etch mask. It is noted that this etch removes each patterned vertical stacked structure from the source/drain region as is shown in FIG. 41C. The etching includes one or more etching (dry and/or chemical wet) processes. It is noted that this etch physically exposes a sub-surface of dielectric material layer 202 as is shown in FIG. 41A. A portion of each patterned vertical stacked structure remains beneath the combined etch mask forming the nanosheet stack mentioned above. Each nanosheet stack includes, from bottom to top, a remaining portion of the first dielectric isolation layer 216, a remaining portion of the pitch adjusted first nanosheet material stack MS1$x$ (hereinafter first nanosheet stack, a remaining portion of the second dielectric isolation layer 216, and a remaining portion of the pitch adjusted second nanosheet material stack MS2$x$ (hereinafter second nanosheet stack). Within each first and second nanosheet stacks, respectively, there remains a non-etched portion of each sacrificial semiconductor material portion 206X (hereinafter sacrificial semiconductor material nanosheet 206) and a non-etched portion of each semiconductor channel material portion 208X (hereinafter semiconductor channel material nanosheet 208).

Each sacrificial semiconductor material nanosheet 206 is then recessed utilizing a lateral etching process so that the recessed sacrificial nanosheets 206 has a reduced width as compared to the semiconductor channel material nanosheets. A gap (not specifically shown) is formed at each of the ends of the recessed sacrificial semiconductor material nanosheets 206.

The inner spacer dielectric material 234 is then formed utilizing a deposition process such as, for example, ALD, CVD, PECVD or PVD. The inner spacer dielectric material 234 includes one of the dielectric spacer materials mentioned above for first dielectric spacer 110. The dielectric spacer material that provides the inner spacer dielectric material 234 is compositionally different from the spacer dielectric material that provides dielectric spacer 232. As is shown in FIG. 41A, the inner dielectric spacer material 234 fills each gap and is present along the sidewalls of the at vertical nanosheet stacked structure and along the sidewalls of the at least one hard mask capped sacrificial gate structure (214/224/226). It is noted the inner dielectric spacer material 234 also forms on a physically exposed sub-surface of the dielectric material layer 202 as is shown in FIGS. 41A and 41C.

Figure 42B:
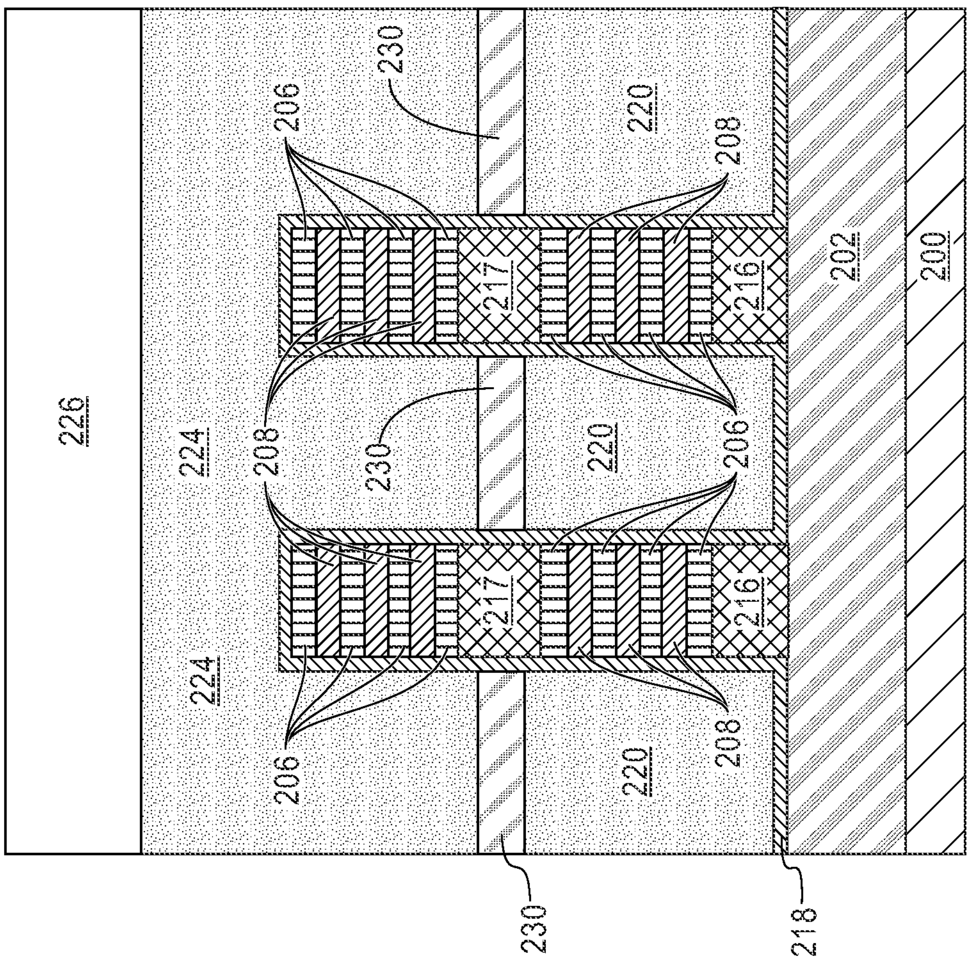
FIGS. 42A, 42B and 42C are cross sectional views of the exemplary structure shown in FIGS. 41A, 41B and 41C, respectively, after forming a dielectric material structure within the gaps located between each vertical nanosheet stacked structure and on a lower portion of the inner spacer dielectric material that is present along the sidewalls of each vertical nanosheet.
Figure 42A:
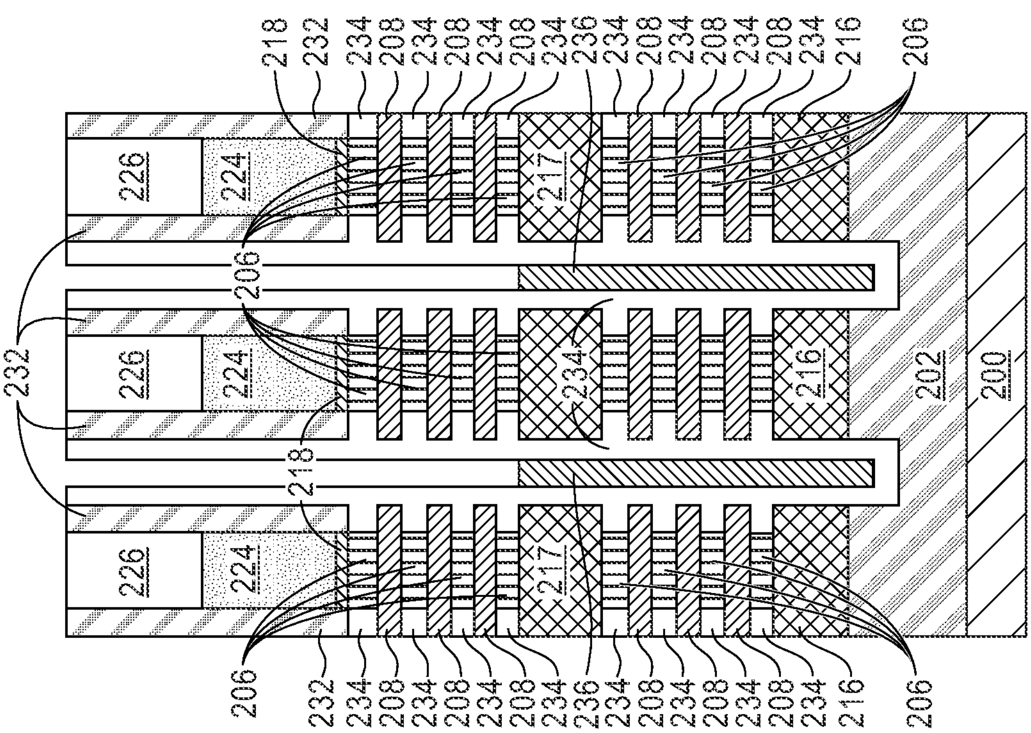
Figure 42C:
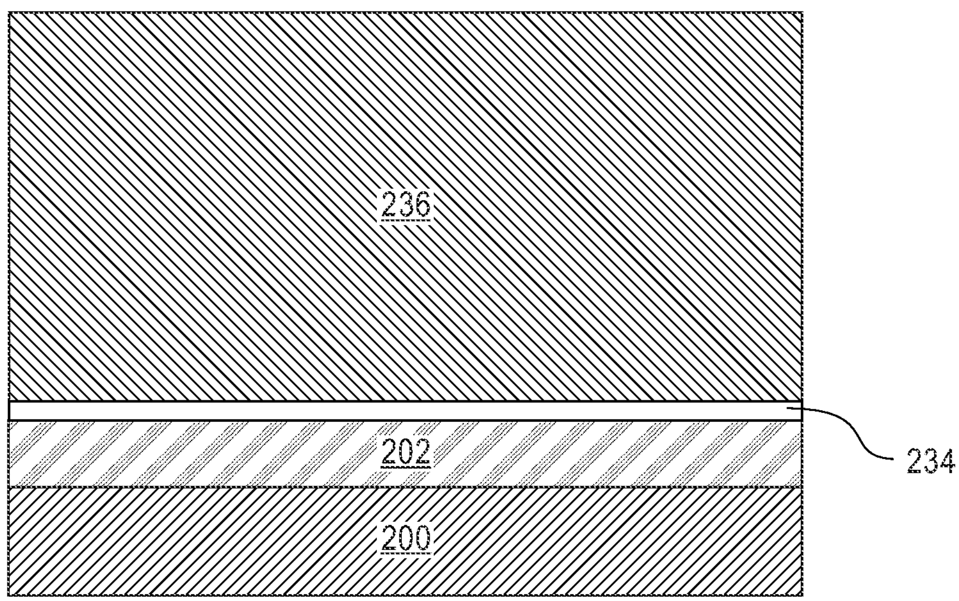

Referring now to FIGS. 42A, 42B and 42C, there are illustrated the exemplary structure shown in FIGS. 41A, 41B and 41C, respectively, after forming a dielectric material structure 236 within the gaps located between each vertical nanosheet stacked structure and on a lower portion of the inner spacer dielectric material 234 that is present along the sidewalls of each vertical nanosheet. The dielectric material structure 236 is present laterally adjacent to the first nanosheet stack of each vertical nanosheet stacked structure and has a topmost surface that is located substantially coplanar with a topmost surface of the remaining portion of the second dielectric isolation layer 217. Dielectric material structure 234 is composed of a flowable dielectric material such as, for example, a flowable dielectric oxide, and the dielectric material structure 234 can be formed by deposition of the flowable dielectric material, followed by a recess etch. The dielectric material structure 234 is not located laterally adjacent to the second nanosheet stack of the vertical nanosheet stacked structure.

Figure 43B:
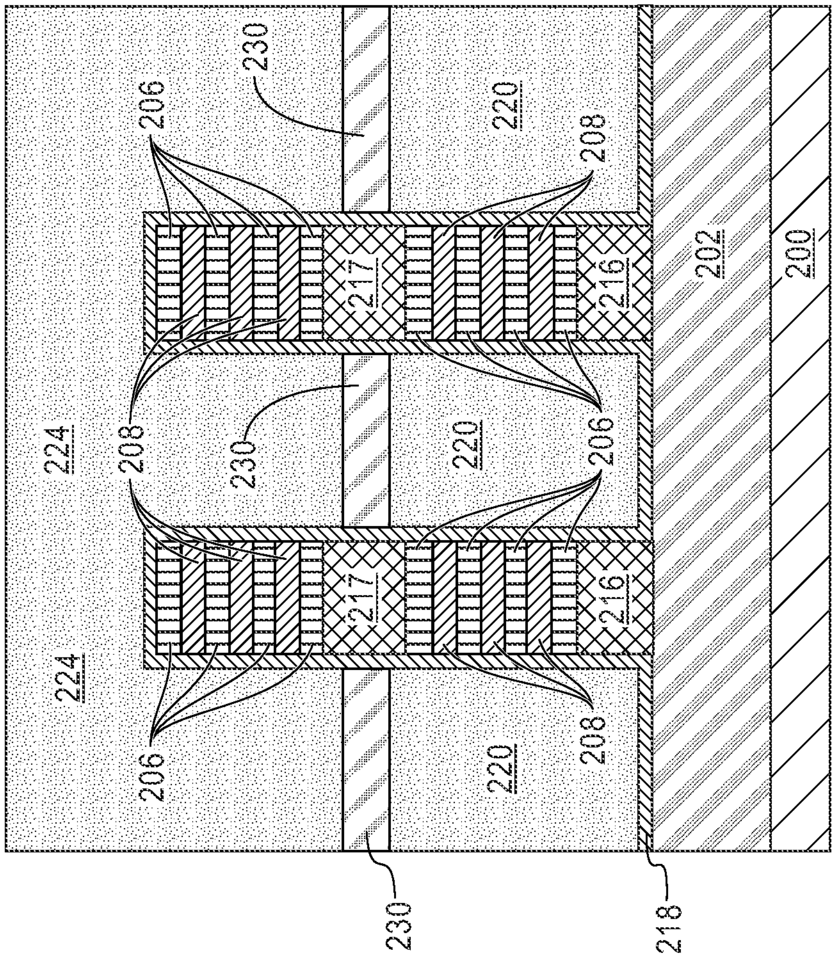
FIGS. 43A, 43B and 43C are cross sectional views of the exemplary structure shown in FIGS. 42A, 42B and 42C, respectively, after removing an upper portion of inner spacer dielectric material that is present along the sidewalls of the second nanosheet stack, forming a second source/drain region on the dielectric material structure and adjacent to the second nanosheet stack, and forming a second ILD material layer on the second source/drain region.
Figure 43A:
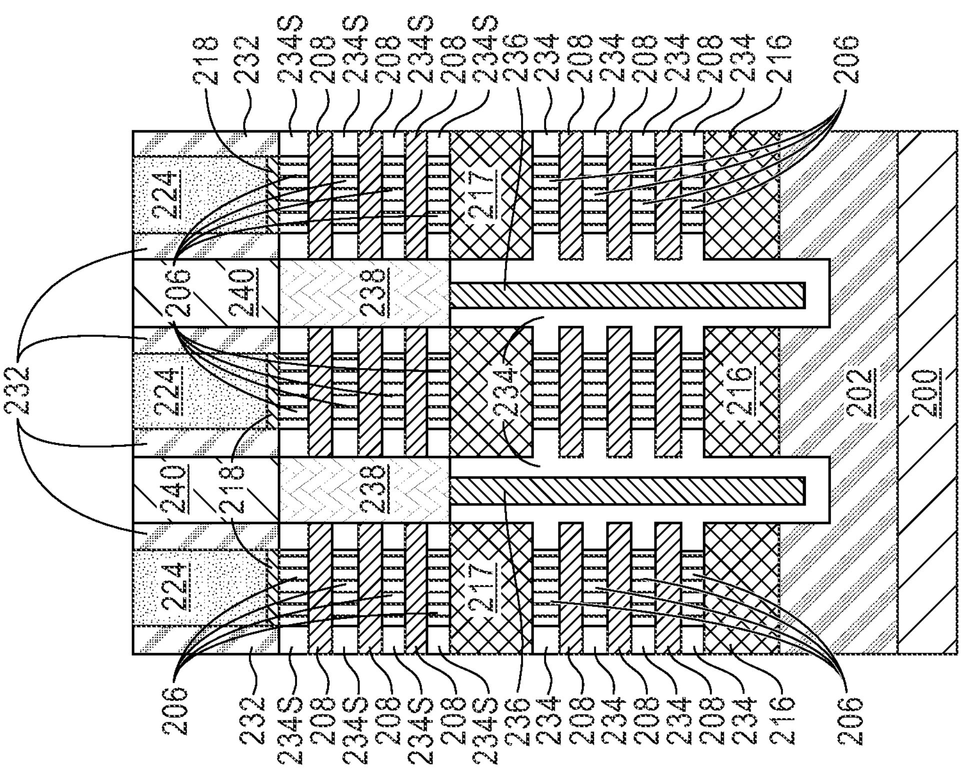
Figure 43C:
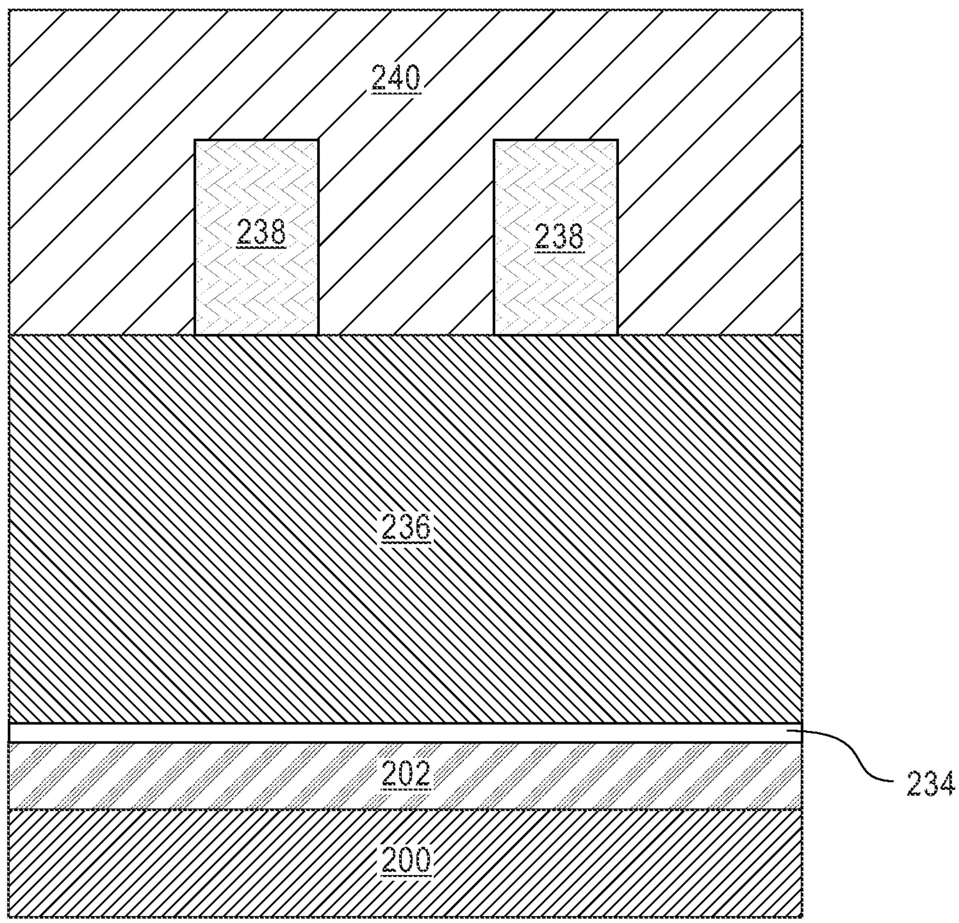

Referring now to FIGS. 43A, 43B and 43C, there are illustrated the exemplary structure shown in FIGS. 42A, 42B and 42C, respectively, after removing an upper portion of inner spacer dielectric material 234 that is present along the sidewalls of the second nanosheet stack (inner spacer dielectric material 234 remains in each gap located at the ends of the recessed sacrificial semiconductor material nanosheets forming inner spacers 234S), forming a second source/drain region 238 on the dielectric material structure 236 and adjacent to the second nanosheet stack, and forming a second ILD material layer 240 on the second source/drain region 238.

The removal of the upper portion of inner spacer dielectric material 234 that is present along the sidewalls of the second nanosheet stack can be performed utilizing an isotropic etch back process. The removal of the upper portion of inner spacer dielectric material 234 reveals sidewalls of each semiconductor channel material nanosheet 208 of the second nanosheet stack. The entirely of the first nanosheet stack is protected by a remaining portion of the inner dielectric spacer material 234 and the dielectric material structure 236.

The second source/drain region 238 is then epitaxially grown outward from the physically exposed sidewalls of each semiconductor channel material nanosheet 208 of the second nanosheet stack. The second source/drain region 238 is equivalent to the second source/drains regions 128 mentioned above in the previous illustrated embodiment of the present application. The second source/drain region 238 can be composed of a semiconductor material and a dopant that is the same or opposite in conductivity as compared to the dopant present in a subsequently formed first source/drain region.

The second ILD material layer 240 is then formed. The second ILD material layer 240 includes one of the dielectric materials mentioned above for the first ILD material layer 118 mentioned above in the previously illustrated embodiment of the present application. The second ILD material layer 240 is formed utilizing one of the deposition processes mentioned above in forming the first ILD material layer 118 mentioned above in the previously illustrated embodiment of the present application. A planarization process can follow the deposition process. It is noted that this planarization process removes the hard mask layer 226 that is present on the second sacrificial gate material 224.

Figure 44B:
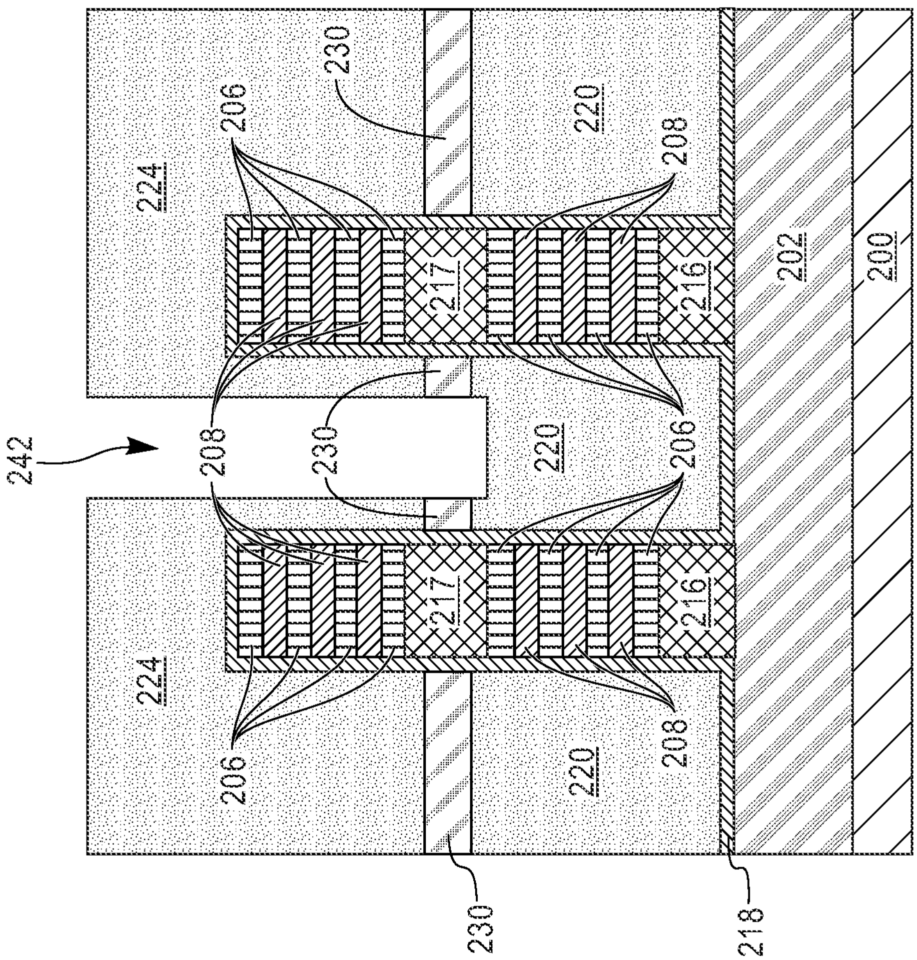
FIGS. 44A, 44B and 44C are cross sectional views of the exemplary structure shown in FIGS. 43A, 43B and 43C, respectively, after forming an opening entirely through the remaining portion of the second sacrificial gate material and the layer of spacer dielectric material and into a portion of the remaining first sacrificial gate material.
Figure 44A:
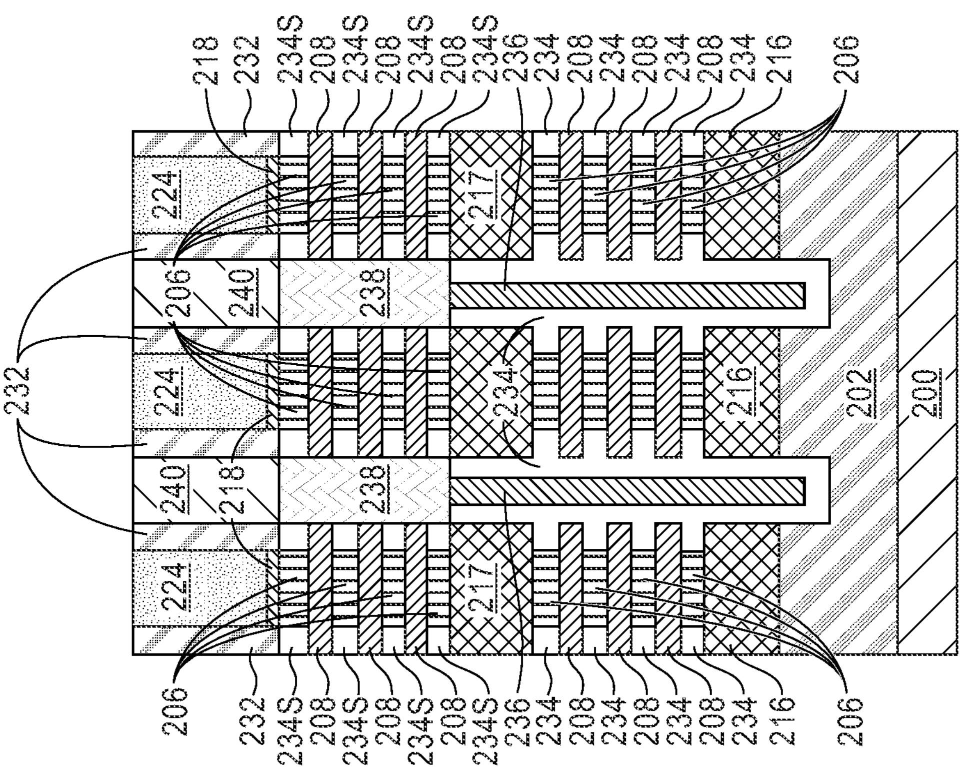
Figure 44C:
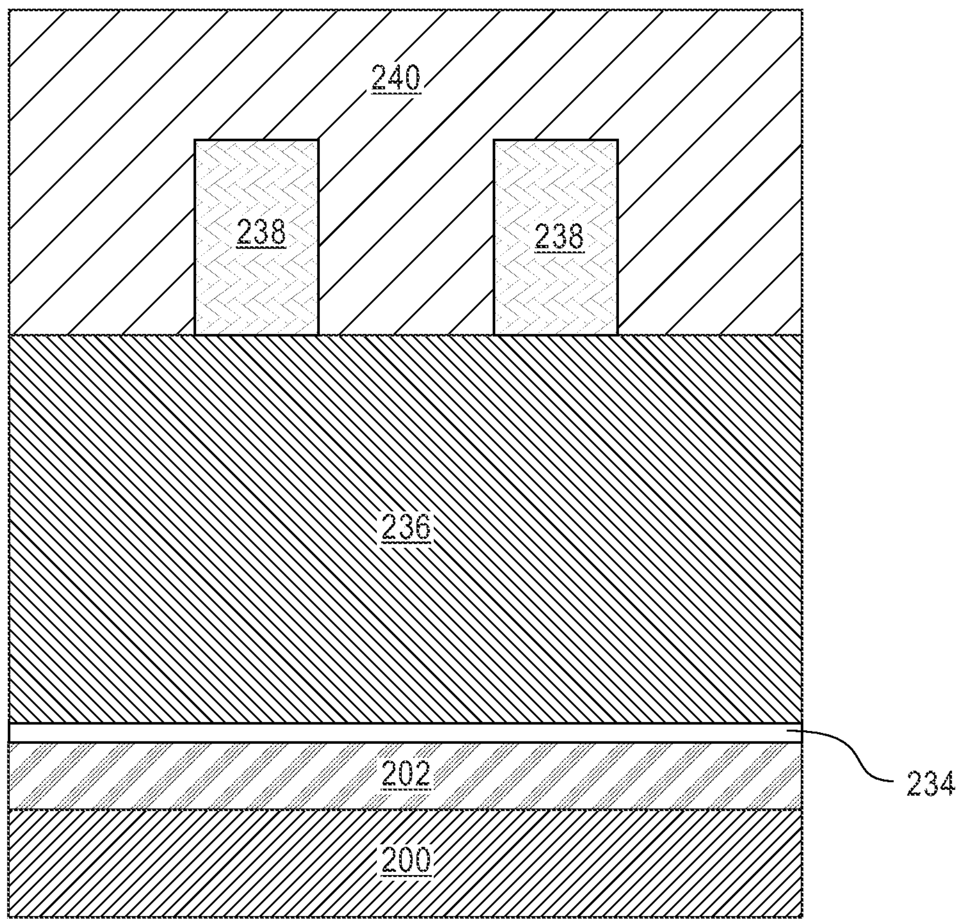

Referring now to FIGS. 44A, 44B and 44C, there are illustrated the exemplary structure shown in FIGS. 43A, 43B and 43C, respectively, after forming an opening 242 entirely through the remaining portion the second sacrificial gate material 234 and the layer of spacer dielectric material 230 and into a portion of the remaining first sacrificial gate material 220. Opening 242 is formed by lithography and etching. Opening 242 define the location in which a gate cut trench will be subsequently formed. Opening 242 has a critical dimension that is larger than a gate critical dimension.

Figure 45B:
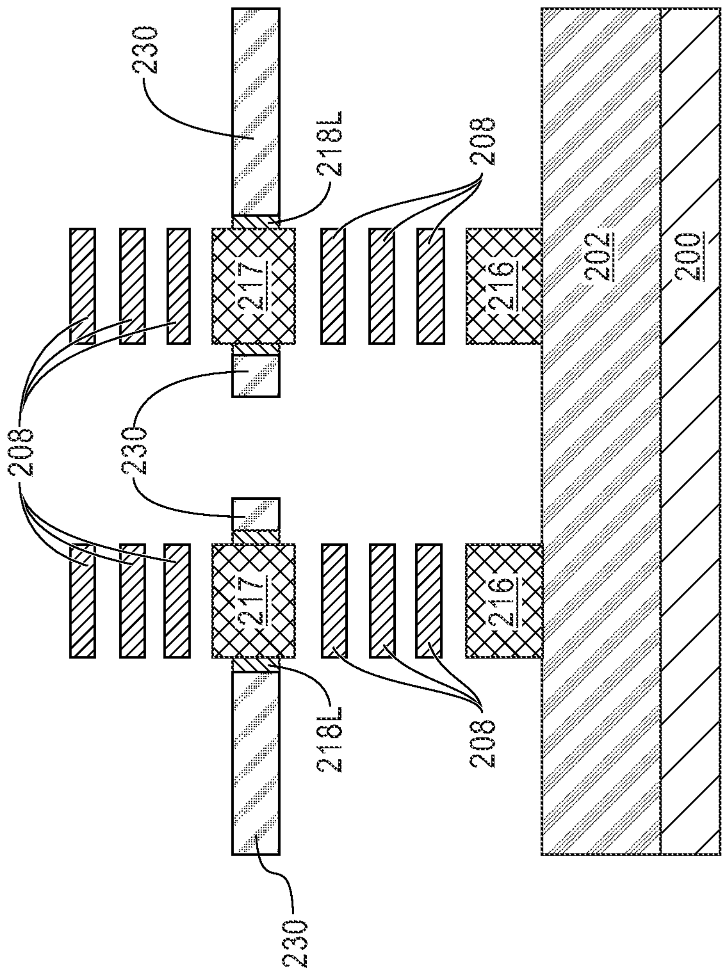
FIGS. 45A, 45B and 45C are cross sectional views of the exemplary structure shown in FIGS. 44A, 44B and 44C, respectively, after removing the remaining portions of the first and second sacrificial gate materials, physically exposed portions of the sacrificial dielectric liner, and each recessed sacrificial semiconductor nanosheet of the first and second nanosheet stacks to provide suspended semiconductor channel material nanosheets within the first and second nanosheet stacks.
Figure 45A:
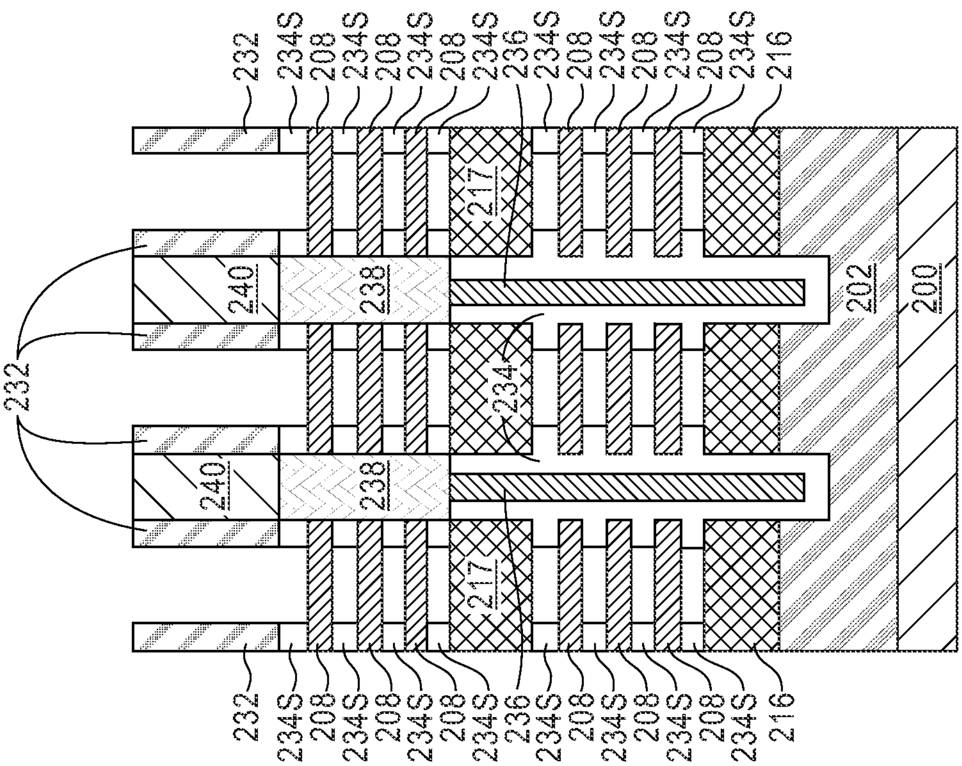
Figure 45C:
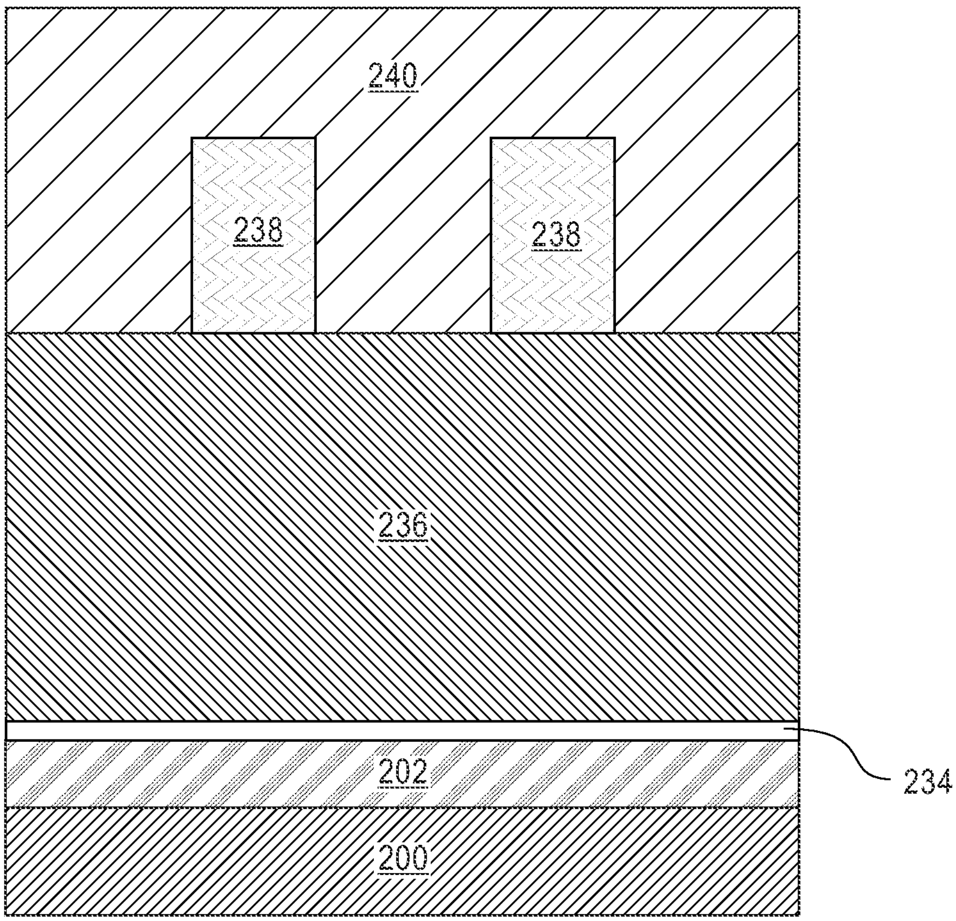

Referring now to FIGS. 45A, 45B and 45C, there are illustrated the exemplary structure shown in FIGS. 44A, 44B and 44C, respectively, after removing the remaining portions of the first and second sacrificial gate materials 220 and 224, respectively, physical exposed portions of the sacrificial dielectric liner 218, and each recessed sacrificial semiconductor nanosheet 206 of the first and second nano sheet stacks to provide suspended semiconductor channel material nanosheets 208 within the first and second nanosheet stacks. The removal of the remaining portions of the first and second sacrificial gate materials 220 and 224, respectively, can be formed utilizing an etching process that is selective in removing the first and second sacrificial gate materials 220 and 224, respectively. This etch reveals portions of the sacrificial dielectric liner 218. The revealed portions of the sacrificial dielectric liner 218 are removed utilizing an etch that is selective in removing the sacrificial dielectric liner 218; note that a portion of the sacrificial dielectric liner 218 remains along the sidewalls of the spacer dielectric material 230, as is shown, for example in FIG. 45B. This remaining portion of the sacrificial dielectric liner can be referred to as sacrificial dielectric liner portion 218L. Each recessed sacrificial semiconductor nanosheet 206 of the first and second nanosheet stacks is removed utilizing an etch that is selective in removing the sacrificial semiconductor material relative to the semiconductor channel material.

As was previously mentioned above, the spacer dielectric material 230 serves as a stacked device separating dielectric material layer having opening 242 formed therein. In this embodiment, the spacer dielectric material 230 which serves as the stacked device separating dielectric material layer is located laterally adjacent to the second dielectric isolation layer 217. The second dielectric isolation layer 217 is spaced apart from the spacer dielectric material 230 by the a portion of the sacrificial dielectric liner 218. Also, in this embodiment, the first dielectric isolation layer 216 will be subsequently positioned above the first FET device. These aspect of the present application will become more apparent in the subsequently described processing steps.

Figure 46B:
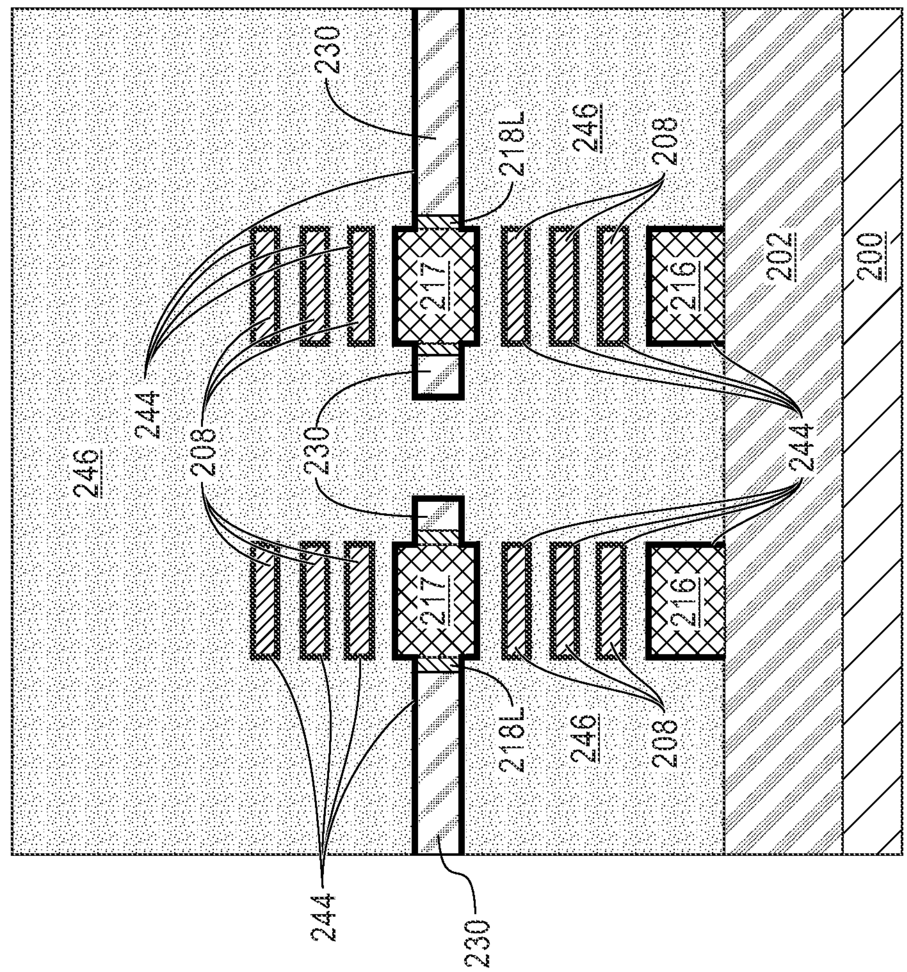
FIGS. 46A, 46B and 46C are cross sectional views of the exemplary structure shown in FIGS. 45A, 45B and 45C, respectively, after forming a high-k gate dielectric material and an a-Si layer.
Figure 46A:
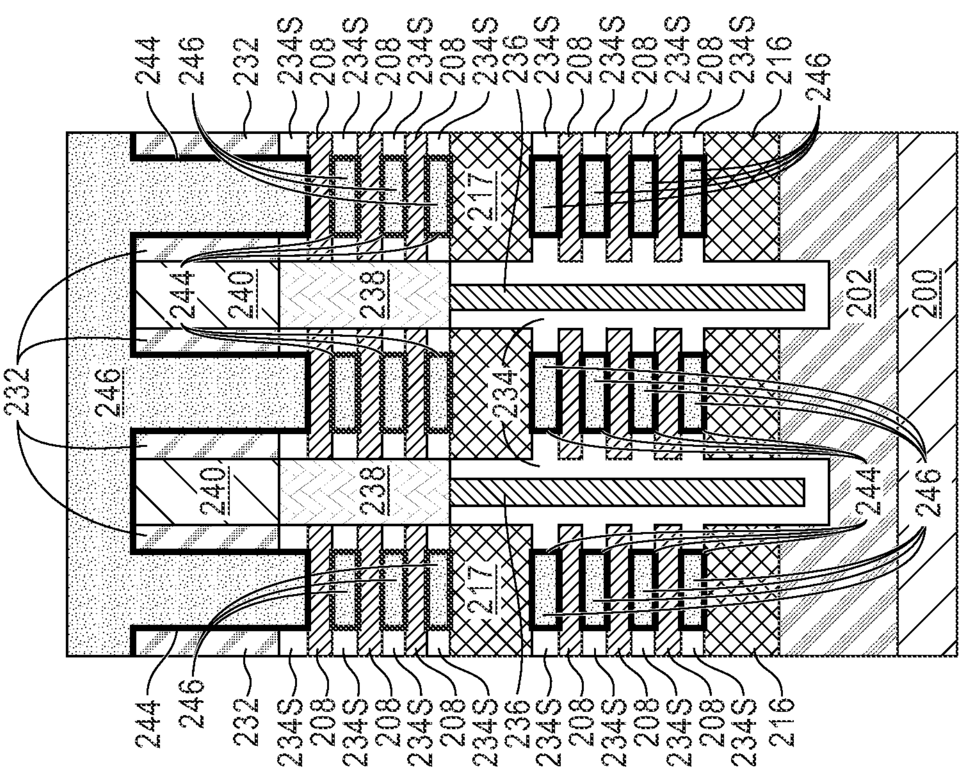
Figure 46C:
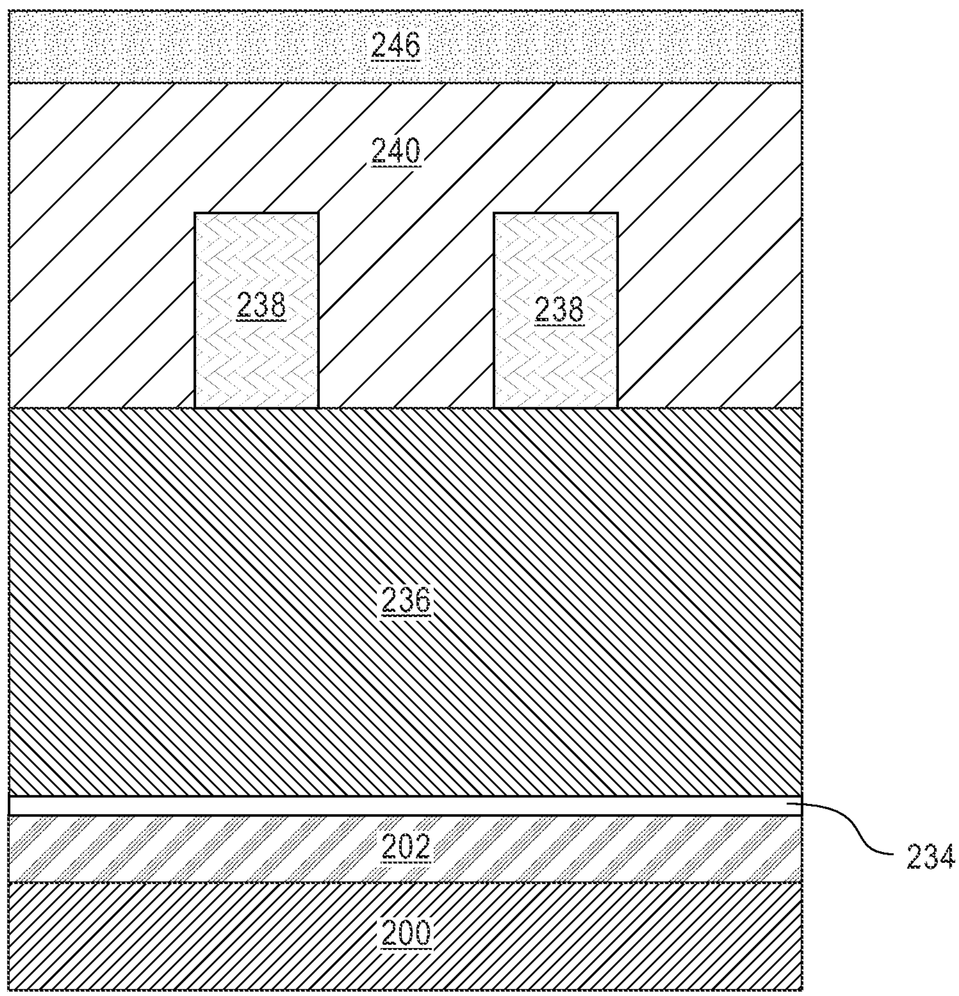

Referring now to FIGS. 46A, 46B and 46C, there are illustrated the exemplary structure shown in FIGS. 45A, 45B and 45C, respectively, after forming a high-k gate dielectric material 244 and an a-Si layer 246. The high-k gate dielectric material 244 is equivalent to the high-k gate dielectric material 134 mentioned in the previously embodiment of the present application. The high-k gate dielectric material 244 can include one of the dielectric materials mentioned above for high-k gate dielectric material 134, can have a thickness in the range mentioned above for high-k gate dielectric material 134 and can be formed utilizing one of the deposition processes mentioned above for high-k gate dielectric material 134. The high-k gate dielectric material 244 is formed on all physically exposed surfaces of the suspended semiconductor channel material nanosheets 208, the spacer dielectric material 230, the sacrificial dielectric liner portion 218L, and the second dielectric isolation layer 217. An oxygen-scavenging layer, as mentioned above in the previous illustrated embodiment can be formed on the surface of the high-k gate dielectric material 244 prior to forming the a-Si layer 246. A-Si layer 246 is equivalent to a-Si layer 136 of the previous illustrated embodiment of the present application. Thus, a-Si layer 246 can be formed utilizing the same technique as mentioned above for forming the a-Si layer 136 of the previous illustrated embodiment of the present application.

Figure 47B:
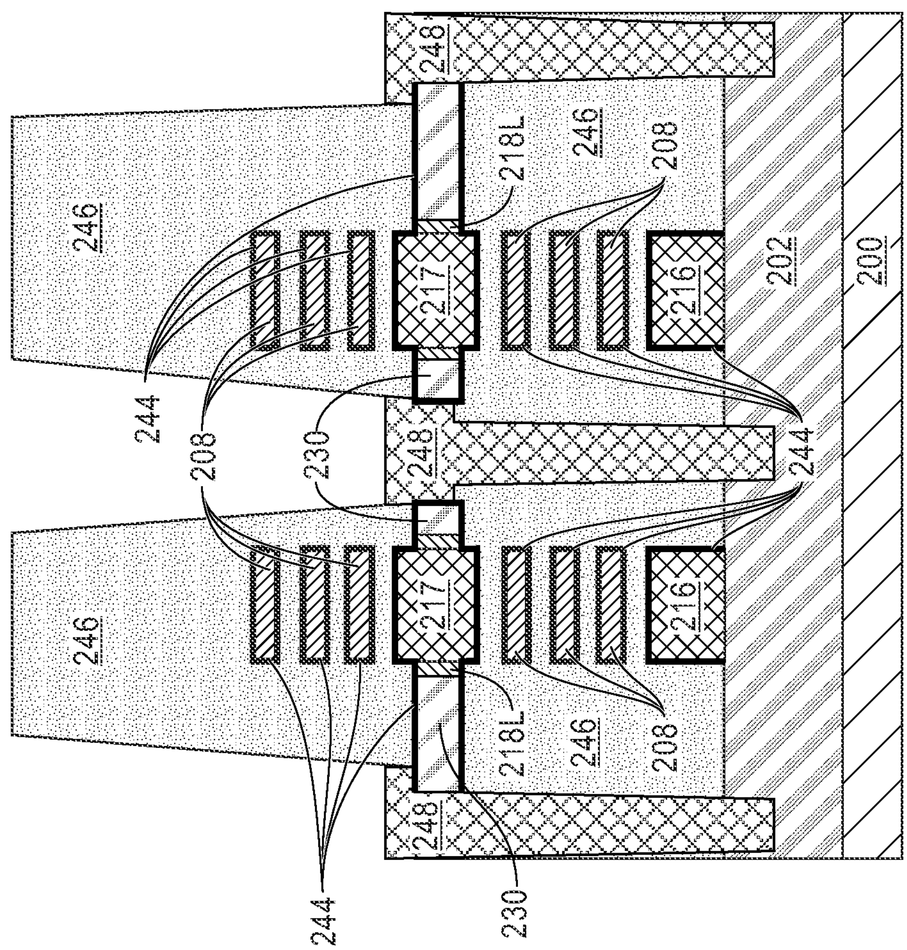
FIGS. 47A, 47B and 47C are cross sectional views of the exemplary structure shown in FIGS. 46A, 46B and 46C, respectively, after forming a first gate cut dielectric structure in a first portion of a modified gate cut trench and partially into the second portion of the modified gate cut trench.
Figure 47A:
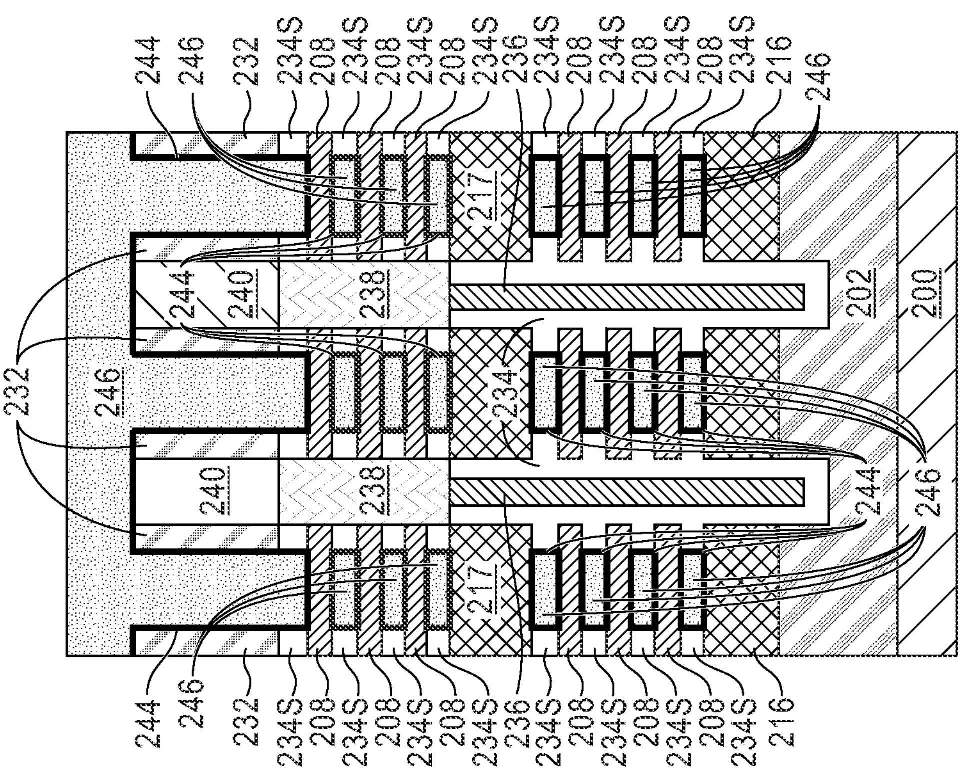
Figure 47C:
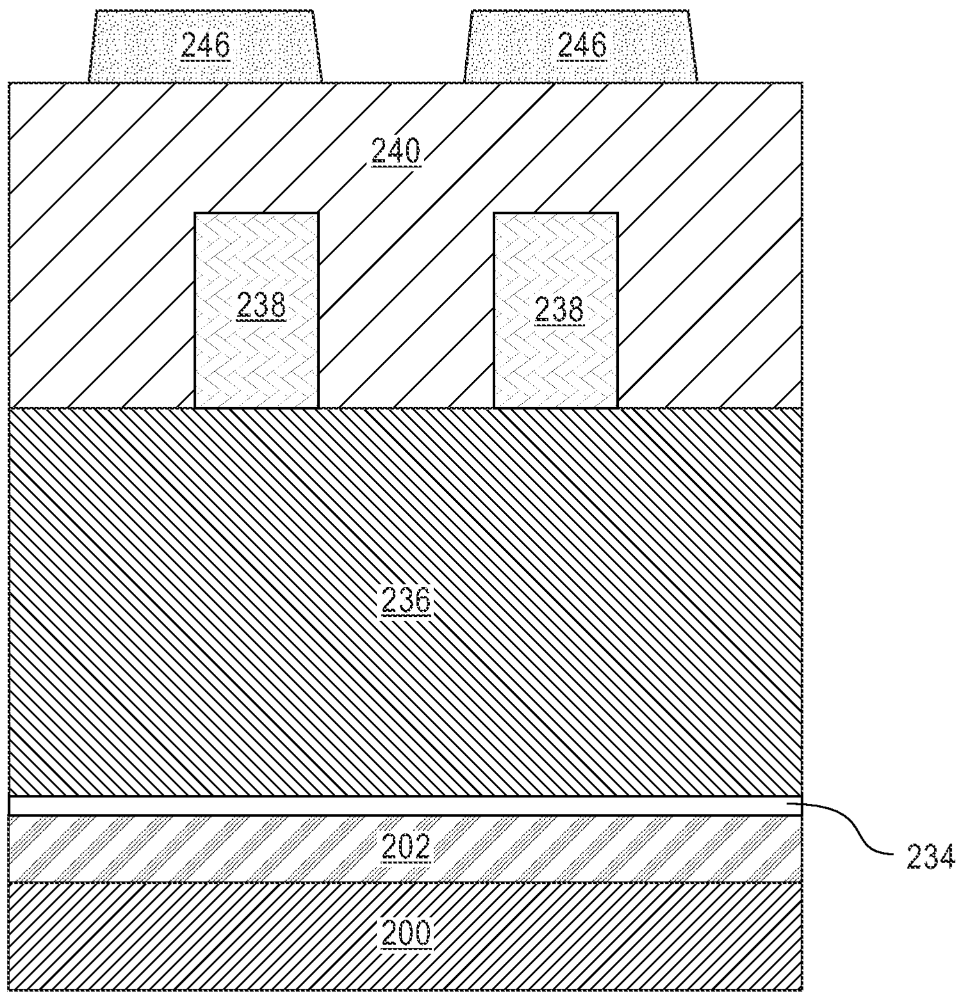

Referring now to FIGS. 47A, 47B and 47C, there are illustrated the exemplary structure shown in FIGS. 46A, 46B and 46C, respectively, after forming a first gate cut dielectric structure 248 in a first portion of a modified gate cut trench and partially into the second portion of the modified gate cut trench. The modified gate cut trench of this embodiment is the same as the modified gate cut trench mentioned in the previously embodiment of the present application. Thus, the processing steps mentioned above in forming the modified gate cut trench are also employed here for this embodiment. Notably, the processing steps illustrated in FIGS. 10A-13C and described above are employed here in providing the modified gate cut trench. As is illustrated, the first gate cut dielectric structure 248 is formed into a portion of the dielectric material layer 202.

The first gate cut dielectric structure 248 is equivalent to the first gate cut dielectric structure 142 mentioned above for the previously illustrated embodiment of the present application. Thus, the first gate cut dielectric structure 248 includes one of the dielectric materials mentioned above for the first gate cut dielectric structure 142, and the first gate cut dielectric structure 248 can be formed utilizing the technique mentioned above for forming the first gate cut dielectric structure 142. Note that first gate cut dielectric structure 248 goes through the opening present in the spacer dielectric material 230 (i.e., the stacked device separating dielectric layer). The first gate cut dielectric structure 248 has an enlarged portion (similar to the enlarged portion mentioned for first gate cut dielectric structure 142) that passes through the opening present in the spacer dielectric material 230.

Figure 48B:
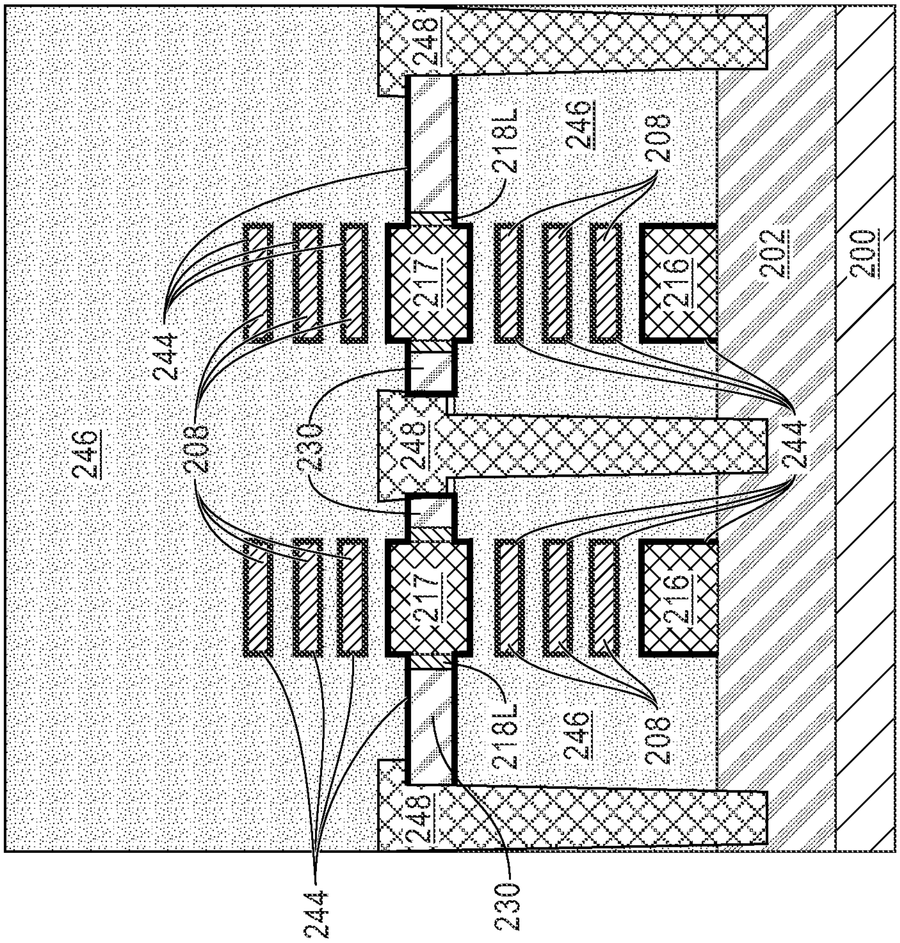
FIGS. 48A, 48B and 48C are cross sectional views of the exemplary structure shown in FIGS. 47A, 47B and 47C, respectively, after forming additional a-Si above the first gate cut dielectric structure filling in the remaining volume of the modified gate cut trench.
Figure 48A:
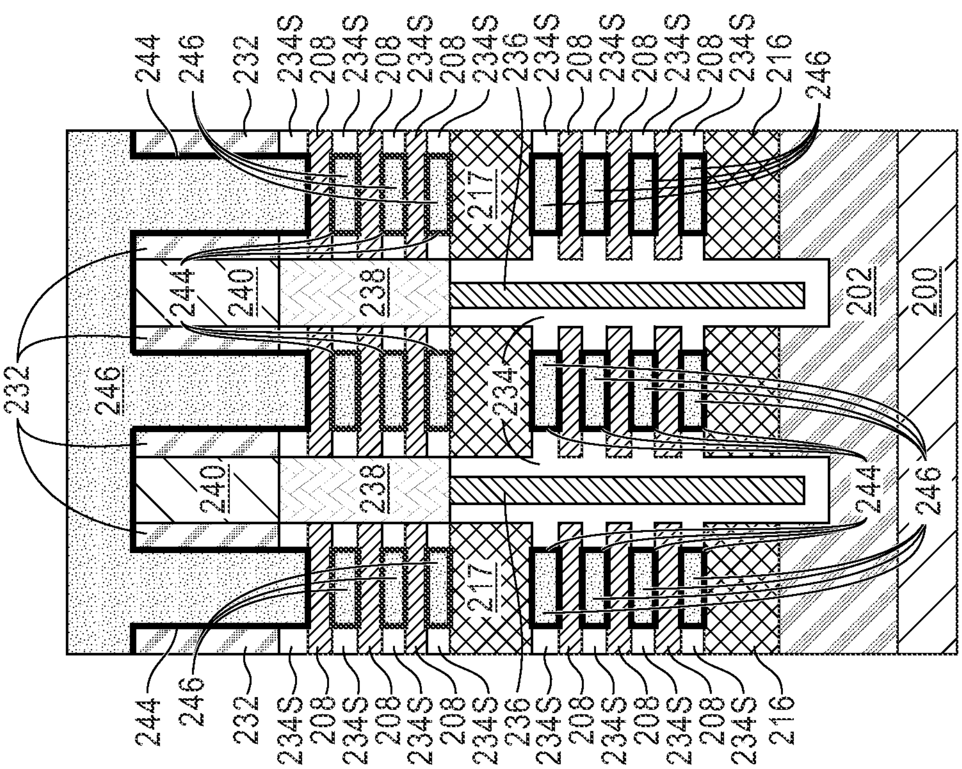
Figure 48C:
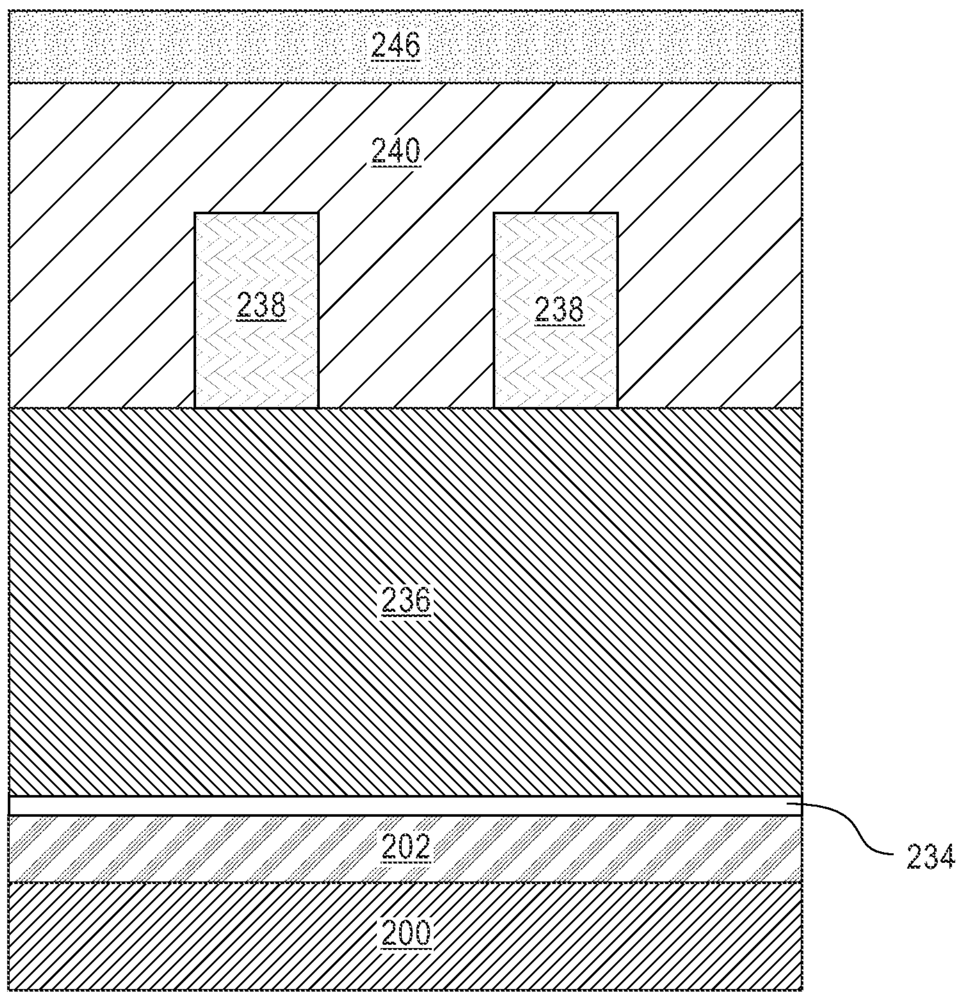

Referring now to FIGS. 48A, 48B and 48C, there are illustrated the exemplary structure shown in FIGS. 47A, 47B and 47C, respectively, after forming additional a-Si above the first gate cut dielectric structure 248 filling in the remaining volume of the second modified gate cut. The additional a-Si can be formed by deposition. In the present application, the additional a-Si re-establishes the integrity of the original a-Si layer 246. The additional a-Si is not separately labeled in the drawings.

Figure 49B:
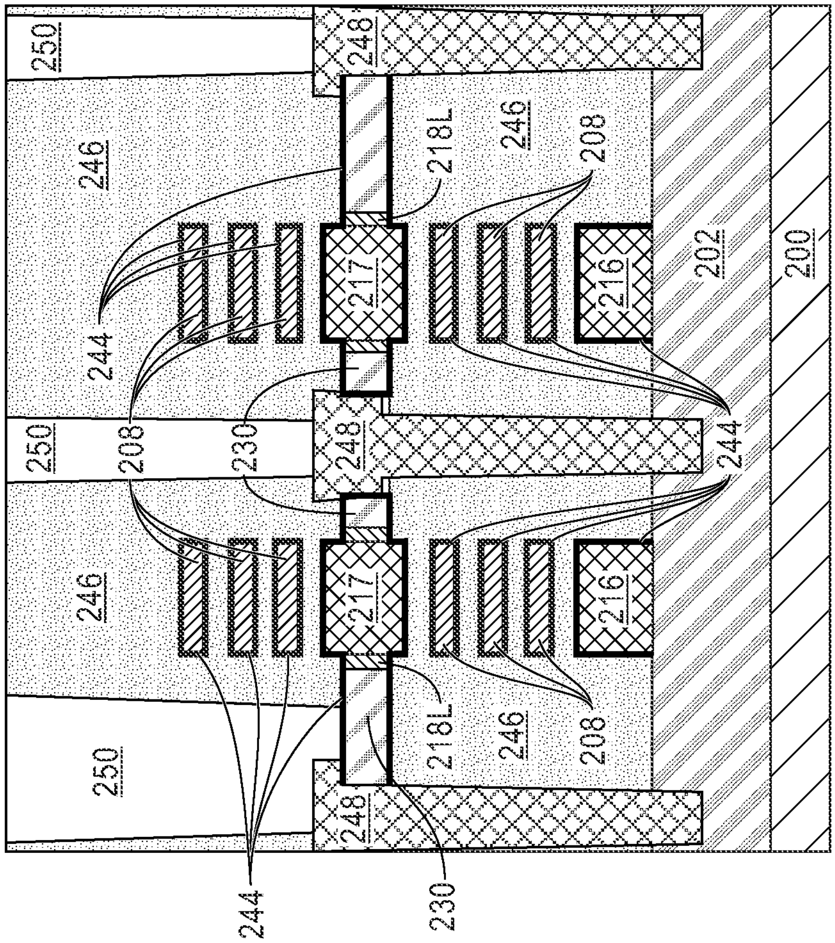
FIGS. 49A, 49B and 49C are cross sectional views of the exemplary structure shown in FIGS. 48A, 48B and 48C, respectively, after forming a second gate cut dielectric structure on the first gate cut dielectric structure.
Figure 49A:
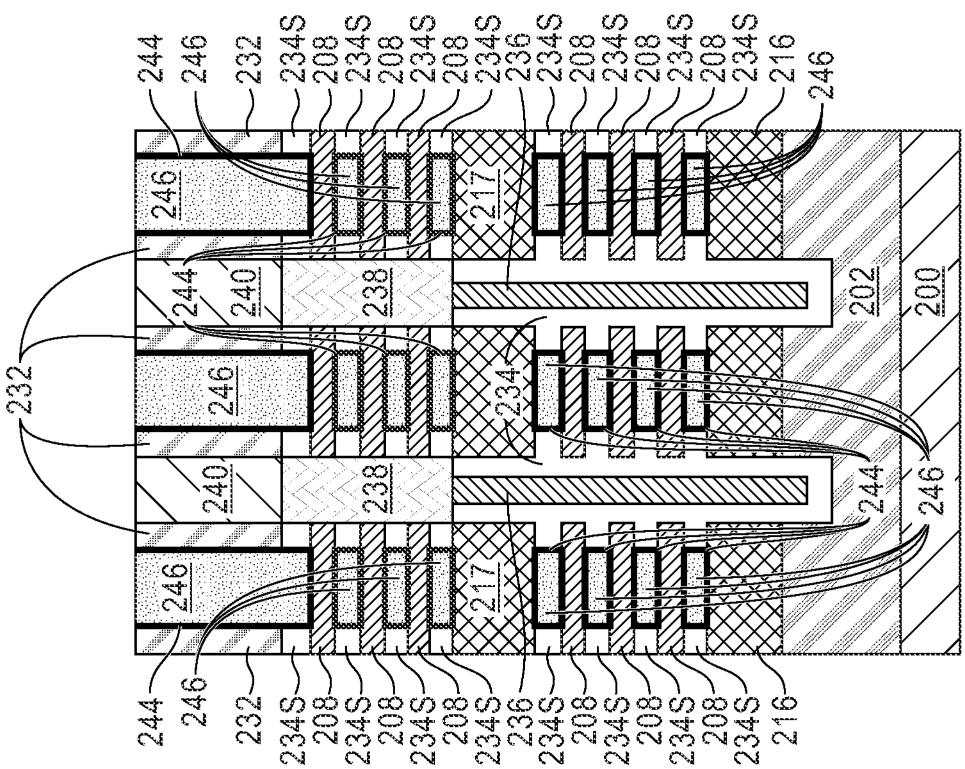
Figure 49C:
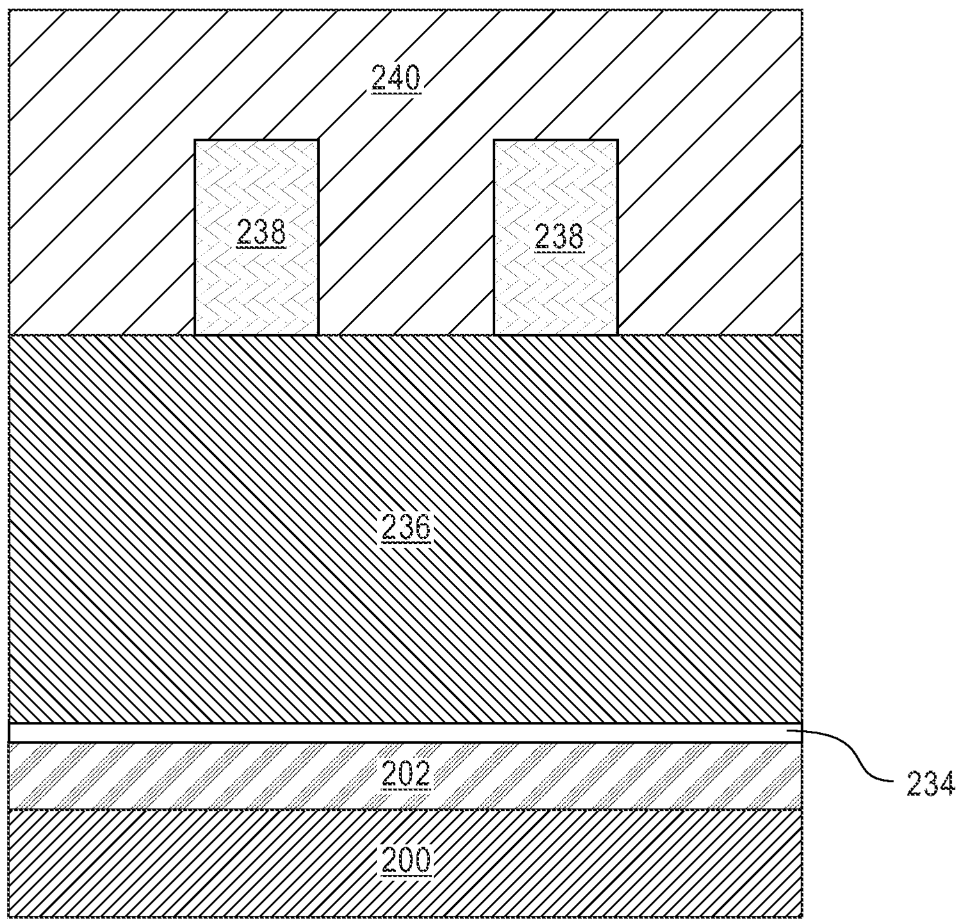

Referring now to FIGS. 49A, 49B and 49C, there are illustrated the exemplary structure shown in FIGS. 48A, 48B and 48C, respectively, after forming a second gate cut dielectric structure 250 on the first gate cut dielectric structure 248. The second gate cut dielectric structure 250 is equivalent to the second gate cut dielectric structure 144 mentioned above in the previously illustrated embodiment of the present application. Thus, the second gate cut dielectric structure 250 includes one of the dielectric material mentioned above for the second gate cut dielectric structure 144 in the previous illustrated embodiment of the present application. The second gate cut dielectric structure 250 can be formed utilizing the same technique (e.g., lithographically patterning the a-Si layer 236 to include an opening and filling the opening with a dielectric material) as mentioned above in forming the second gate cut dielectric structure 144. In this embodiment, and after the fill process, a planarization process is used which physically exposes the topmost surface of the second ILD material layer 230 as is shown in FIGS. 49A and 52C. Note that the second gate cut dielectric structure 250 has a topmost surface that is coplanar with at least the second ILD material layer 240.

Figure 50B:
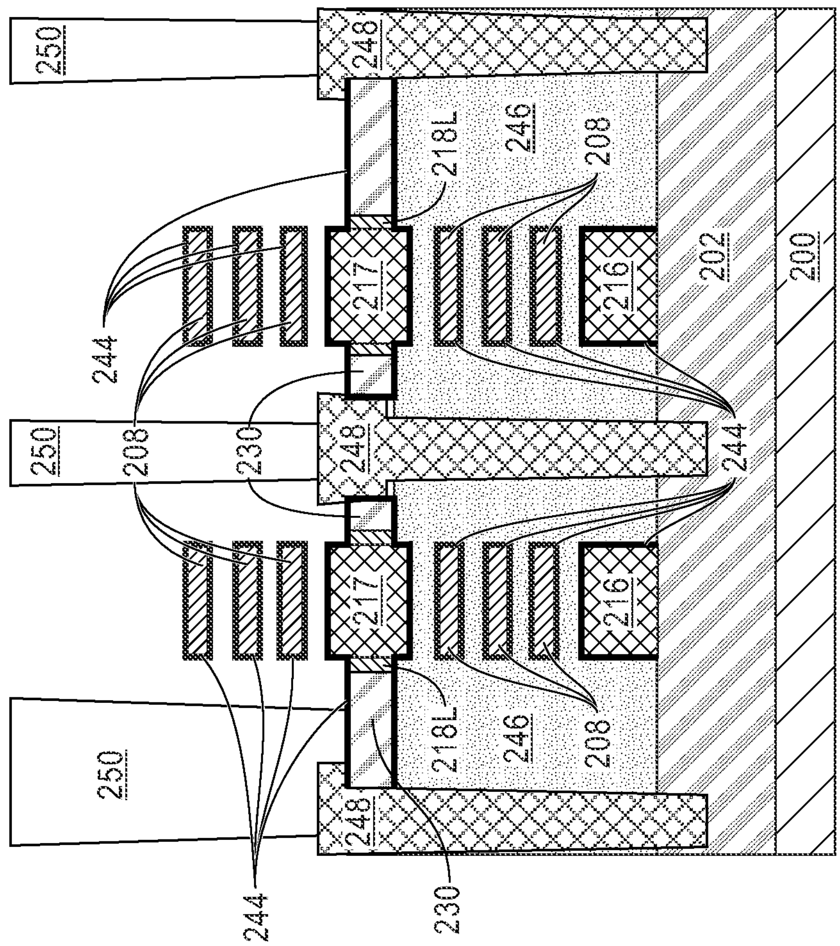
FIGS. 50A, 50B and 50C are cross sectional views of the exemplary structure shown in FIGS. 49A, 49B and 49C, respectively, after removing an upper portion of the a-Si layer that is located above the spacer dielectric material layer to provide a gate cavity.
Figure 50A:
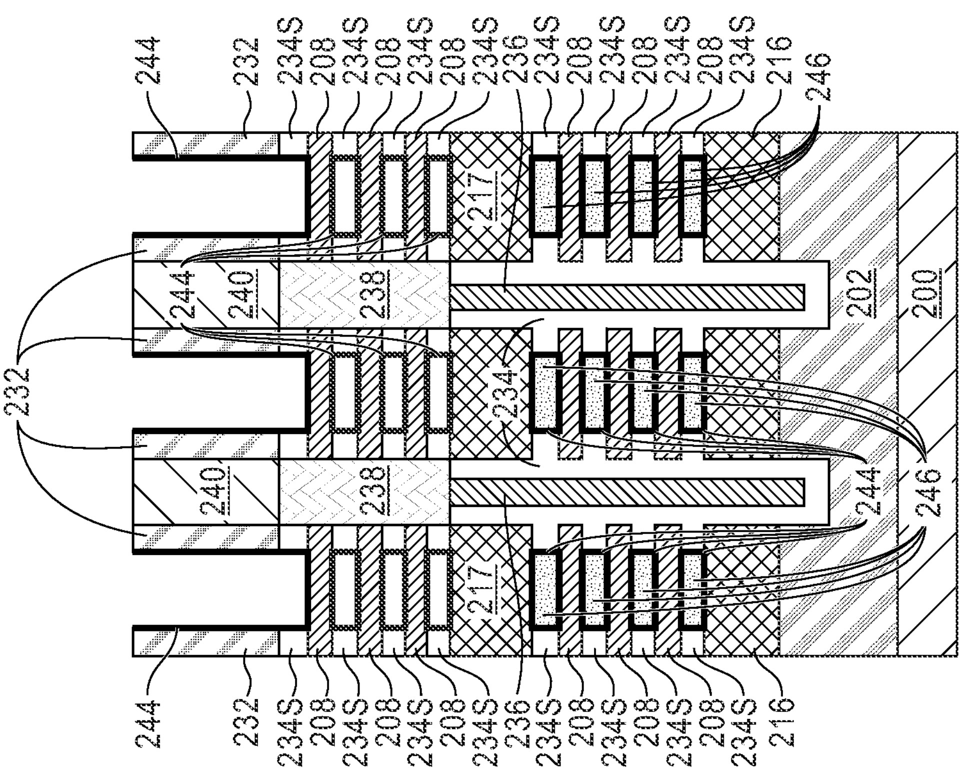
Figure 50C:
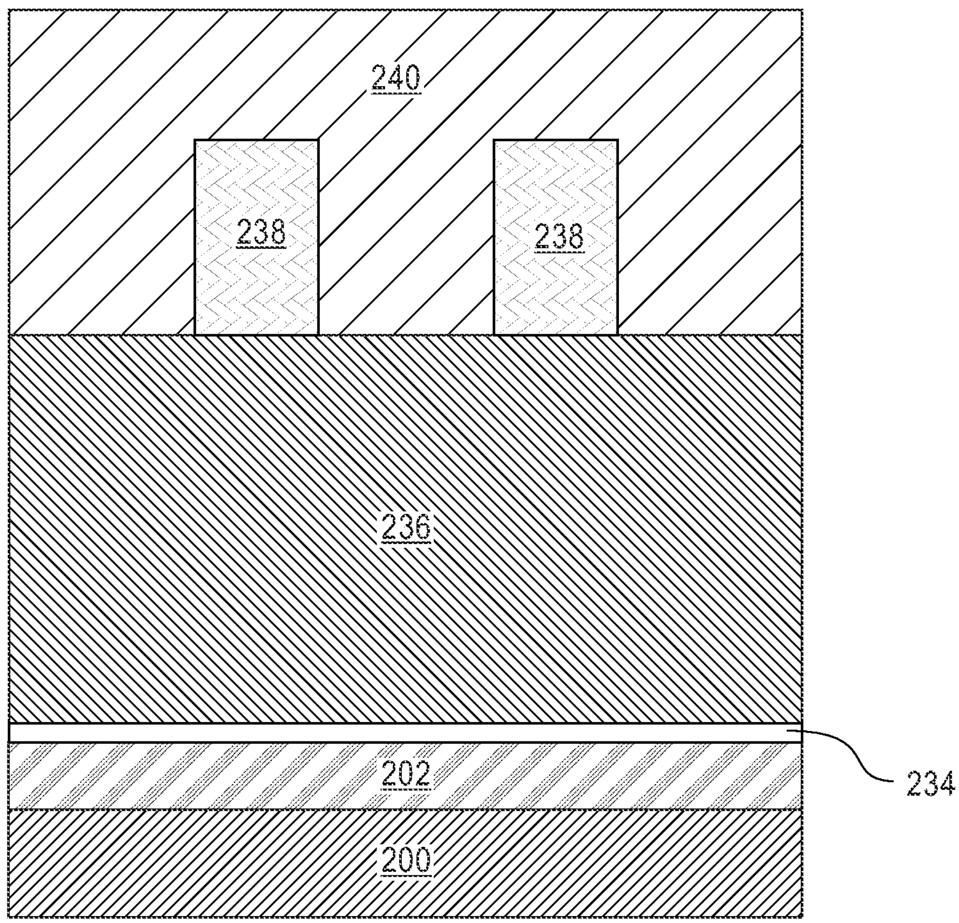

Referring now to FIGS. 50A, 50B and 50C, there are illustrated the exemplary structure shown in FIGS. 49A, 49B and 49C, respectively, after removing the a-Si layer 246 that is located above the spacer dielectric material 230 to provide a gate cavity. The removal of the a-Si layer 246 that is located above the spacer dielectric material 230 includes an etch that is selective in removing a-Si. At this point of the present application, the oxygen-scavenging layer can also be removed by a selective etch stopping on a surface of the high-k gate dielectric material layer 244.

Figure 51B:
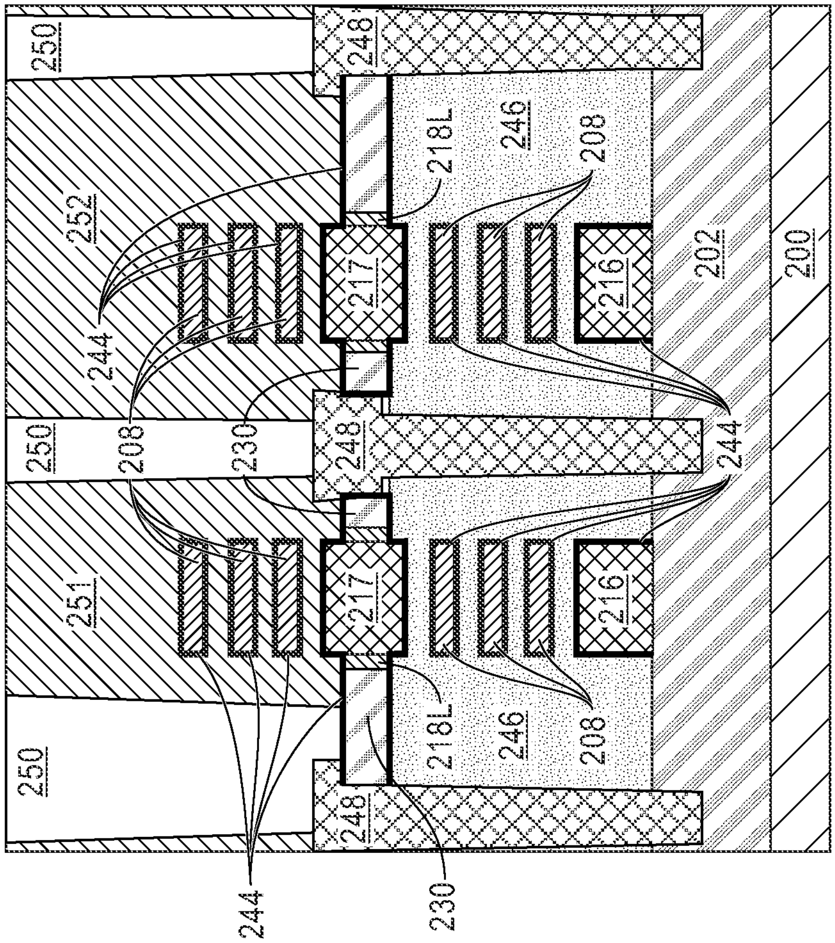
FIGS. 51A, 51B and 51C are cross sectional views of the exemplary structure shown in FIGS. 50A, 50B and 50C, respectively, after forming a second gate electrode on a physically exposed surface of the high-k gate dielectric material layer that is located on a first set of suspended semiconductor channel material nanosheets of the second nanosheet stack, and another second gate electrode on a physically exposed surface of the high-k gate dielectric material layer that is located on a second set of suspended semiconductor channel material nanosheets of another second nanosheet stack, wherein these device regions are separated by the second gate cut dielectric structure and an enlarged portion of the first gate cut dielectric structure that passes through the opening in the spacer dielectric material.
Figure 51A:
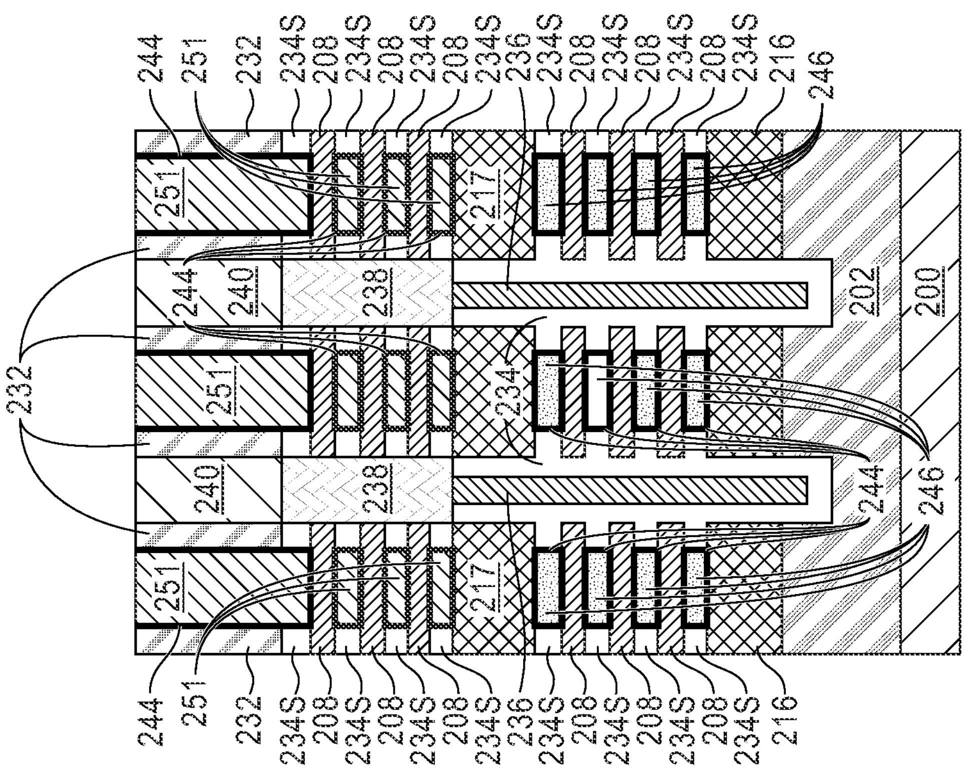
Figure 51C:
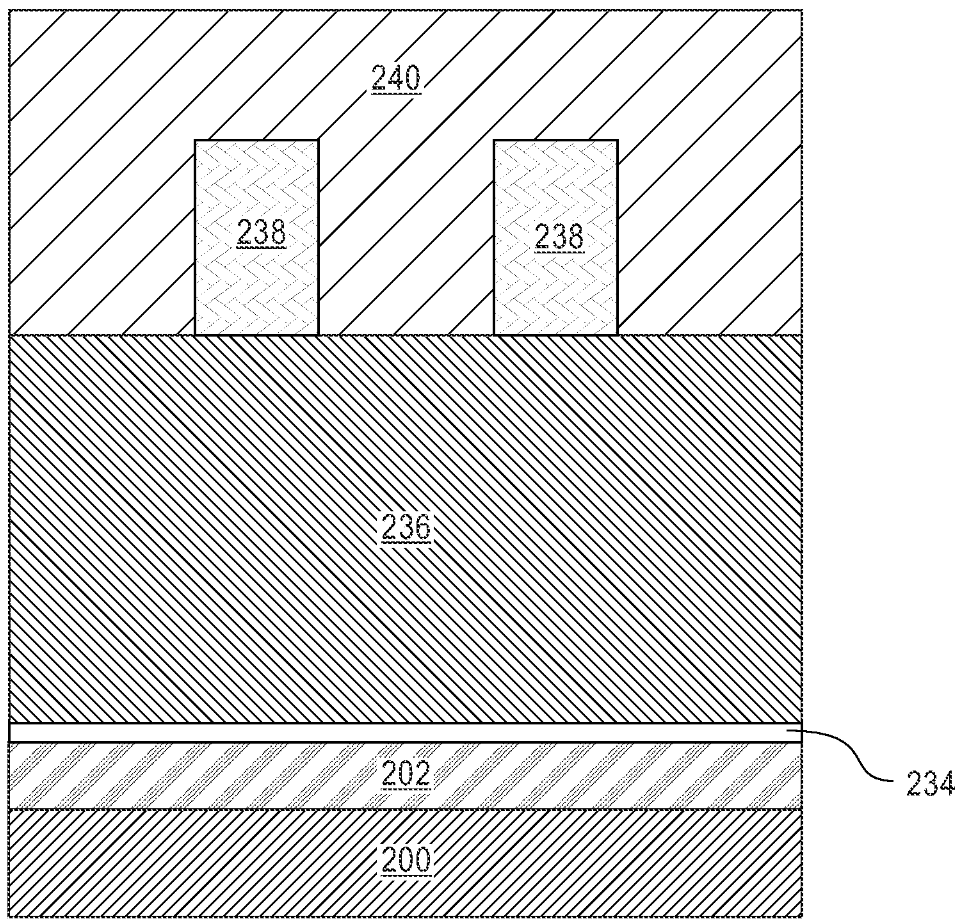

Referring now to FIGS. 51A, 51B and 51C, there are illustrated the exemplary structure shown in FIGS. 50A, 50B and 50C, respectively, after forming a second gate electrode 251 on a physically exposed surface of the high-k gate dielectric material layer 244 that is located on a first set of suspended semiconductor channel material nanosheets 208 of the second nanosheet stack (left hand side of FIG. 51B), and another second gate electrode 252 on a physically exposed surface of the high-k gate dielectric material layer 244 that is located on a second set of suspended semiconductor channel material nanosheets 208 of another second nanosheet stack (right hand side of FIG. 51B), wherein these device regions are separated by the second gate cut dielectric structure 250 and an enlarged portion of the first gate cut dielectric structure 248 that passes through the opening in the spacer dielectric material 230.

Second gate electrode 251 is equivalent to the second gate electrode 145 mentioned above for the previously illustrated embodiment of the present application, while the another second gate electrode 252 is equivalent to the another second gate electrode 146 mentioned above for the previously illustrated embodiment of the present application. Thus, all WFMs and optional gate electrode materials mentioned above for the second gate electrode 145 and the another second gate electrode 146 are applicable here for the second gate electrode 251 and the another second gate electrode 252, respectively. Depending on the technique used to form the second gate electrode 251 and the another second gate electrode 252, the second gate electrode 251 and the another second gate electrode 252 can include WFMs that are compositionally the same, or WFMs that are compositionally different. In embodiments, the second gate electrode 251 and the another second gate electrode 252, can include gate electrode materials that are compositionally the same, or gate electrode materials that are compositionally different. When the optional gate electrode material is present, the WFM is located between the gate electrode material and the high-k gate dielectric material layer. The second gate electrode 251 and the another second gate electrode 252 can be formed utilizing one of the techniques mentioned above for forming for forming the second gate electrode 145 and the another second gate electrode 146 in the previously illustrated embodiment of the present application.

Figure 52B:
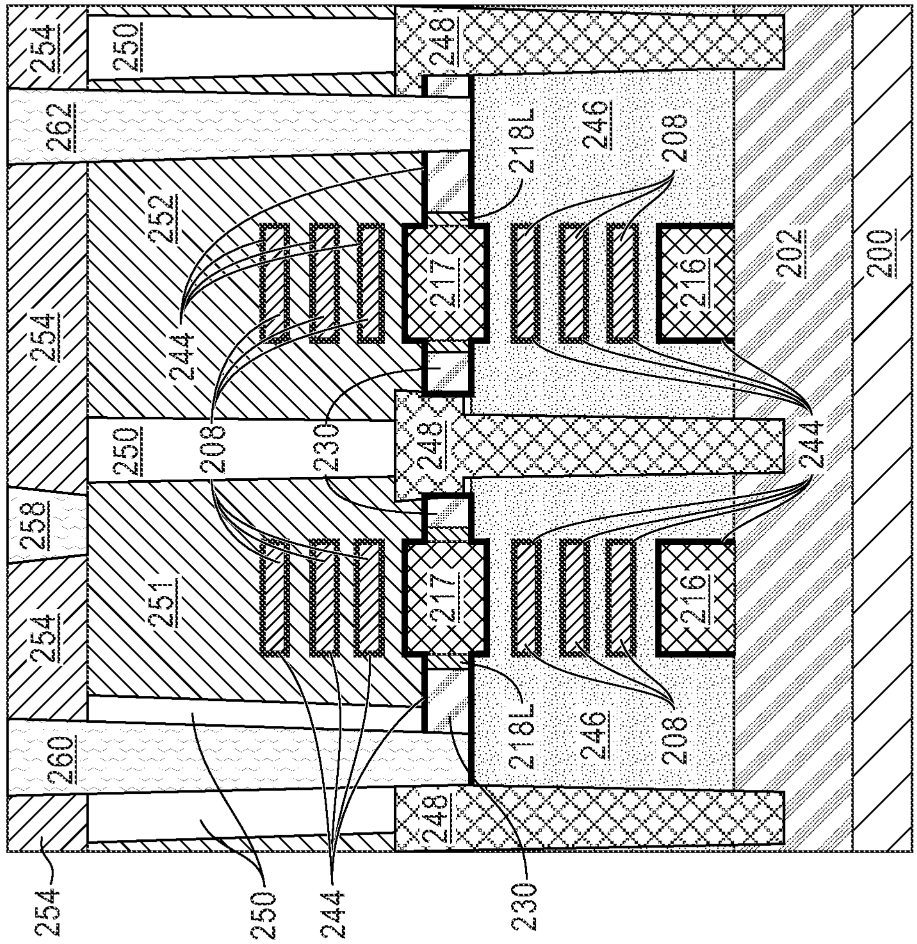
FIGS. 52A, 52B and 52C are cross sectional views of the exemplary structure shown in FIGS. 51A, 51B and 51C, respectively, after forming a second conductive contact-containing ILD material layer, wherein the second conductive contact containing ILD material layer includes a second source/drain contact structure contacting the second source/drain region, a second gate contact structure contacting the second gate electrode, a first gate contact structure, and a shared gate contact structure embedded therein.
Figure 52A:
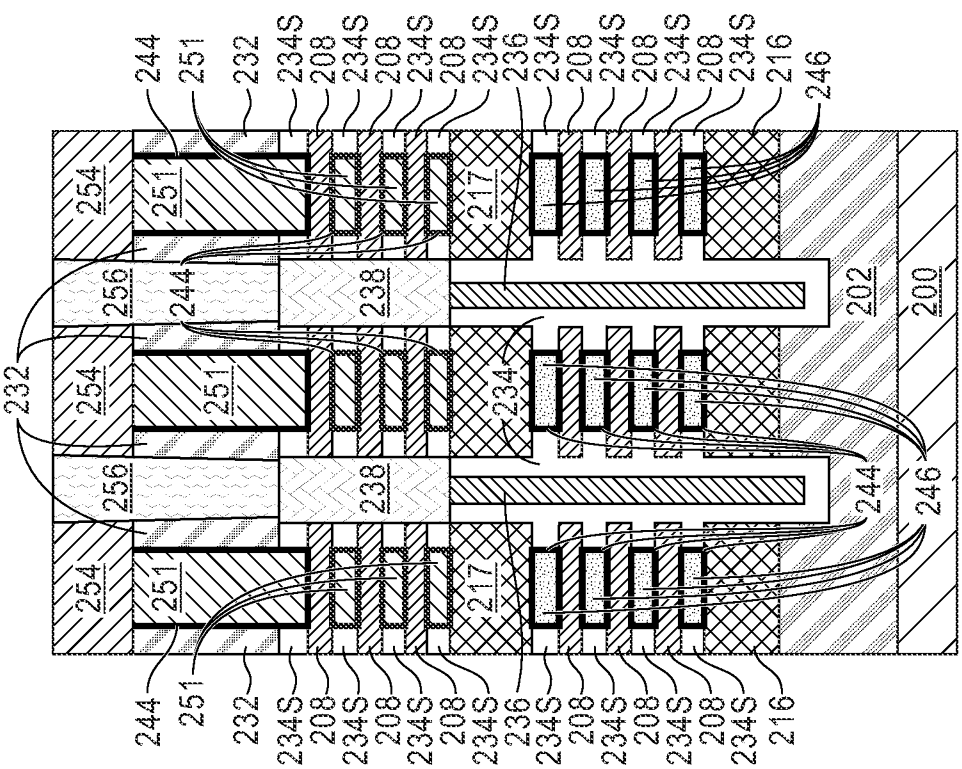
Figure 52C:
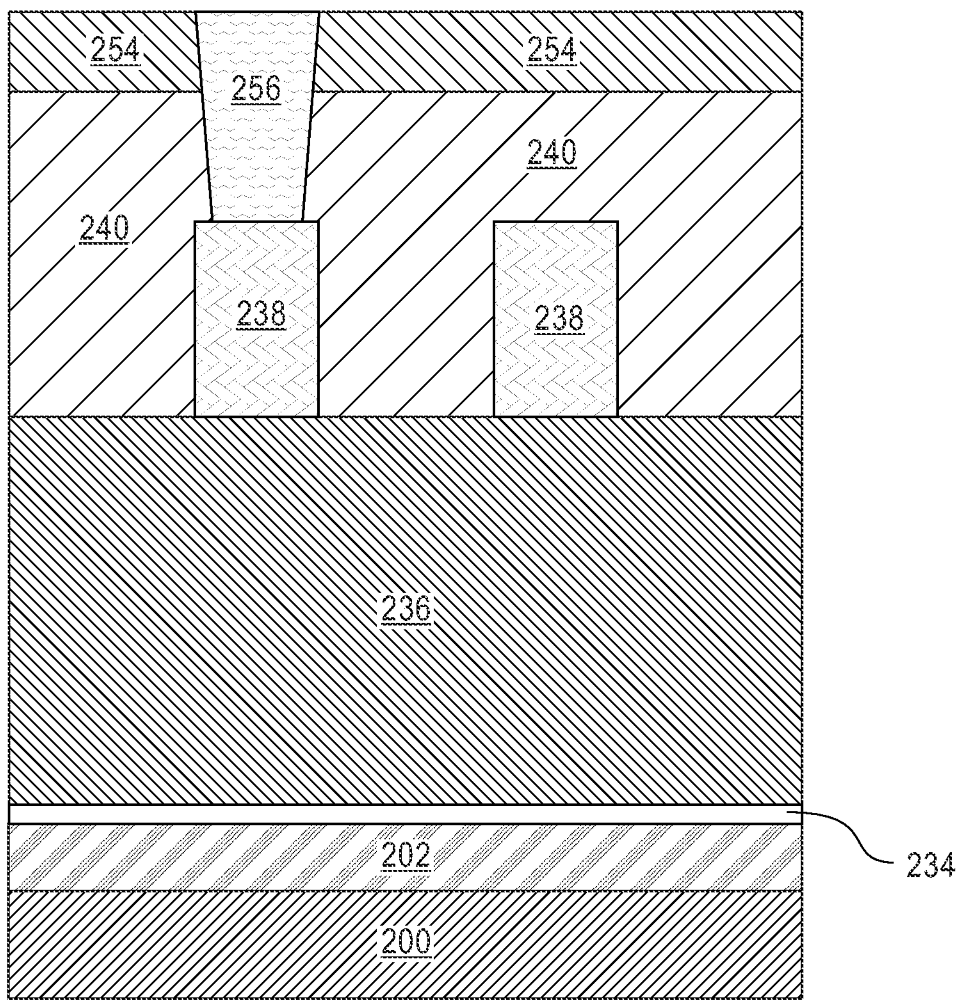

Referring now to FIGS. 52A, 52B and 52C, there are illustrated the exemplary structure shown in FIGS. 51A, 51B and 51C, respectively, after forming a second conductive contact-containing ILD material layer 254, wherein the second conductive contact containing ILD material layer 254 includes a second source/drain contact structure 256 contacting the second source/drain region 238, a second gate contact structure 258 contacting the second gate electrode 251, a first gate contact structure 262, and a shared gate contact structure 260 embedded therein.

The second conductive contact-containing ILD material layer 254 is the same as the second conductive contact-containing ILD material layer 148 mentioned above in the previous illustrated embodiment of the present application. Thus, the second conductive contact-containing ILD material layer 254 is composed of one of the dielectric materials mentioned above for second conductive contact-containing ILD material layer 148, and the second conductive contact-containing ILD material layer 254 can be formed utilizing one of the deposition techniques mentioned above in forming the second conductive contact-containing ILD material layer 148.

Each contact structure, i.e., the second source/drain contact structure 256, the second gate contact structure 258, the first gate contact structure 262, and the shared gate contact structure 260 can be formed by utilizing the techniques and materials mentioned above for the various contact structure into the second conductive contact-containing ILD material layer 148.

Figure 53B:
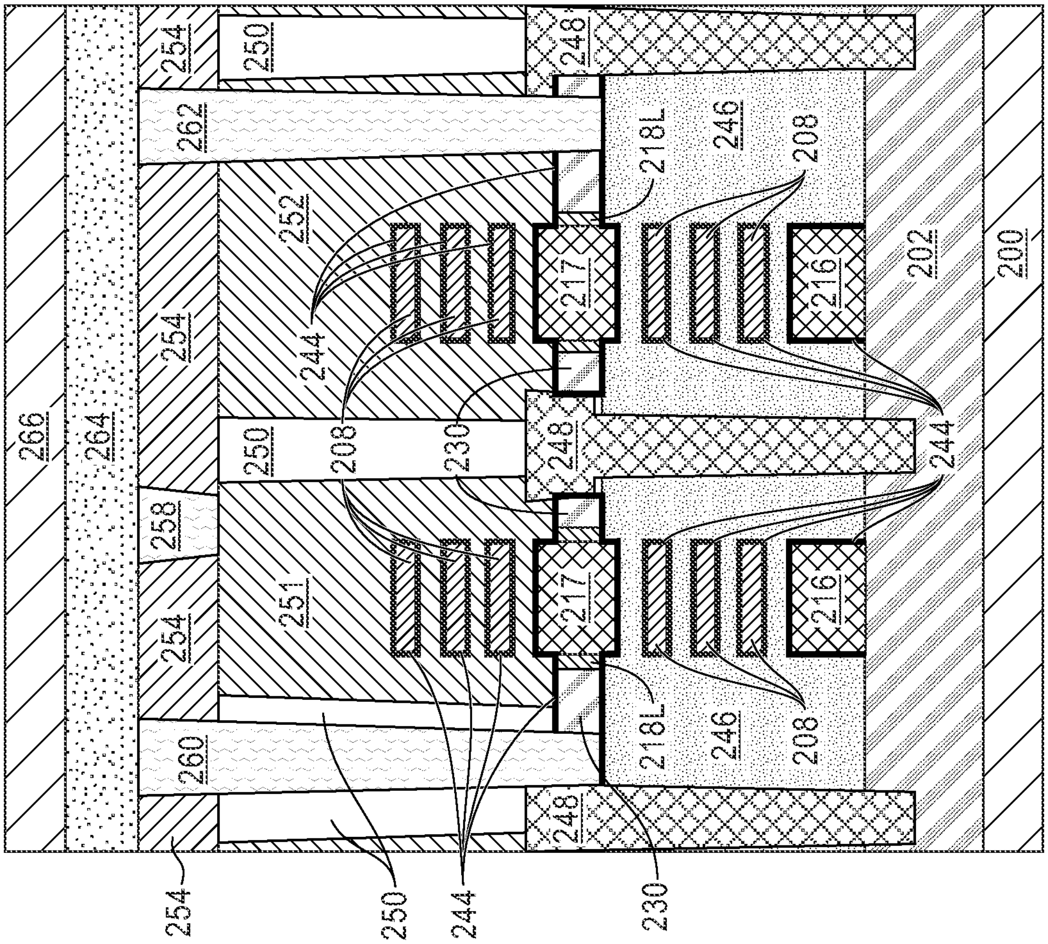
FIGS. 53A, 53B and 53C are cross sectional views of the exemplary structure shown in FIGS. 52A, 52B and 52C, respectively, after forming a back-end-of-line (BEOL) structure and a carrier wafer on the second conductive contact containing ILD material layer.
Figure 53A:
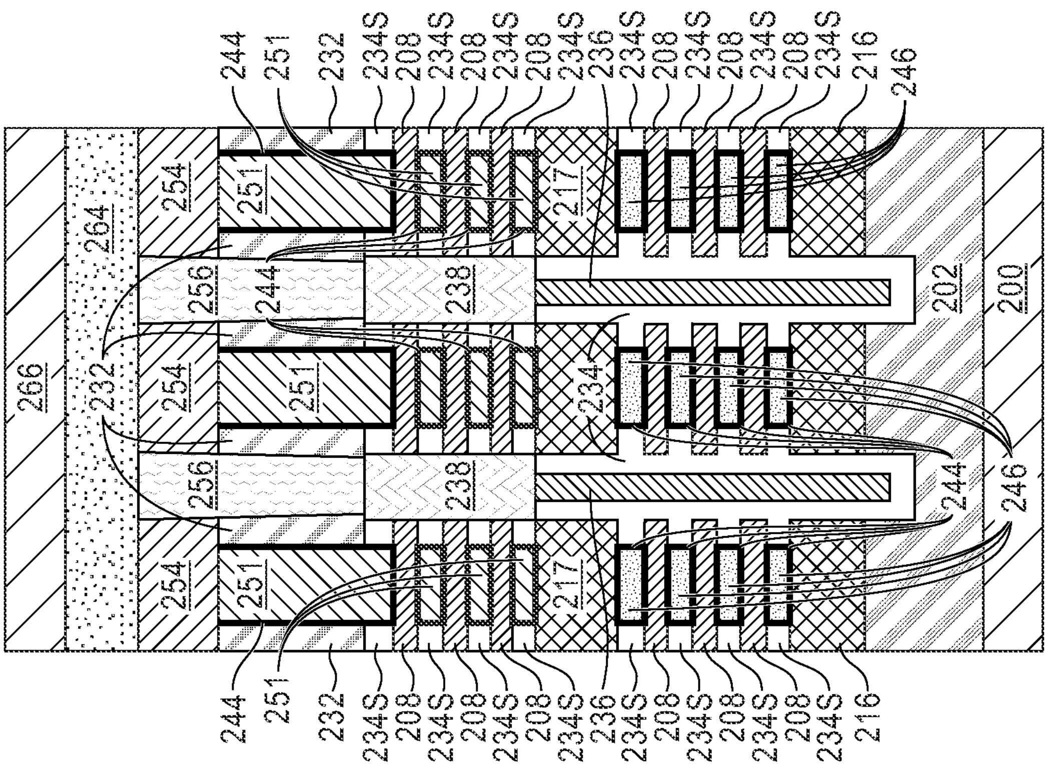
Figure 53C:
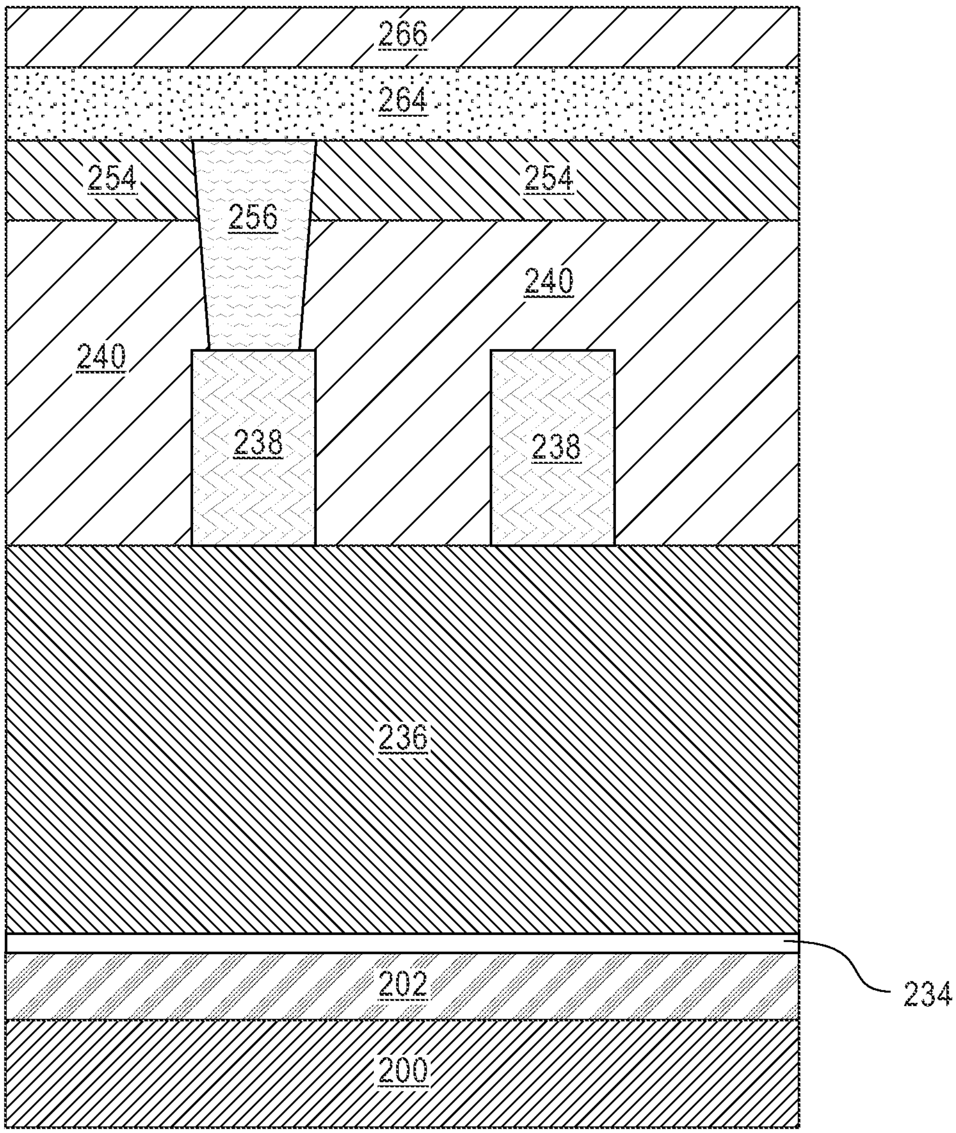

Referring now to FIGS. 53A, 53B and 53C, there are illustrated the exemplary structure shown in FIGS. 52A, 52B and 52C, respectively, after forming a back-end-of-line (BEOL) structure 264 and a carrier wafer 266 on the second conductive contact containing ILD material layer 254. The BEOL structure 264 is the same as the BEOL structure 162 mentioned above in the previously illustrated embodiment of the present application. The carrier wafer 266 is the same as the carrier wafer 164 mentioned in the previously illustrated embodiment of the present application.

Figure 54B:
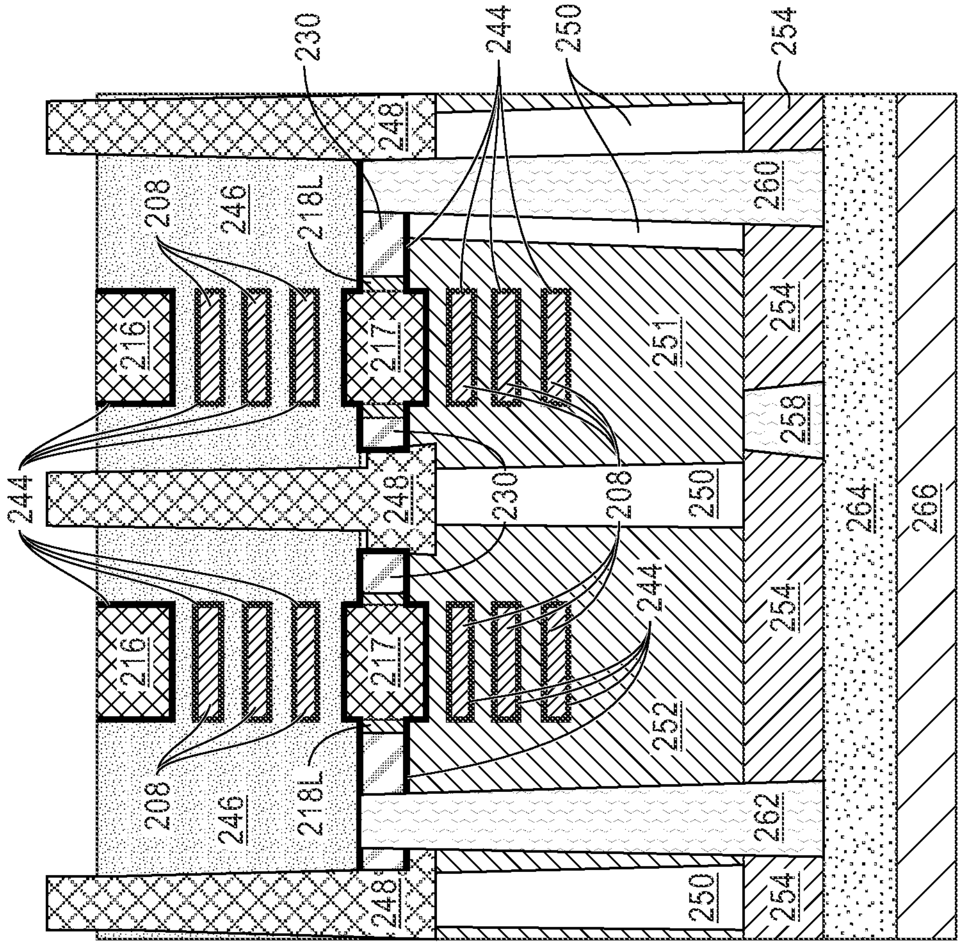
FIGS. 54A, 54B and 54C are cross sectional views of the exemplary structure shown in FIGS. 53A, 53B and 53C, respectively, after flipping the exemplary structure 180°, removing the semiconductor substrate, removing the dielectric material layer, and removing physically exposed portion of the high-k dielectric material layer that are located on a remaining portion of the a-Si layer.
Figure 54A:
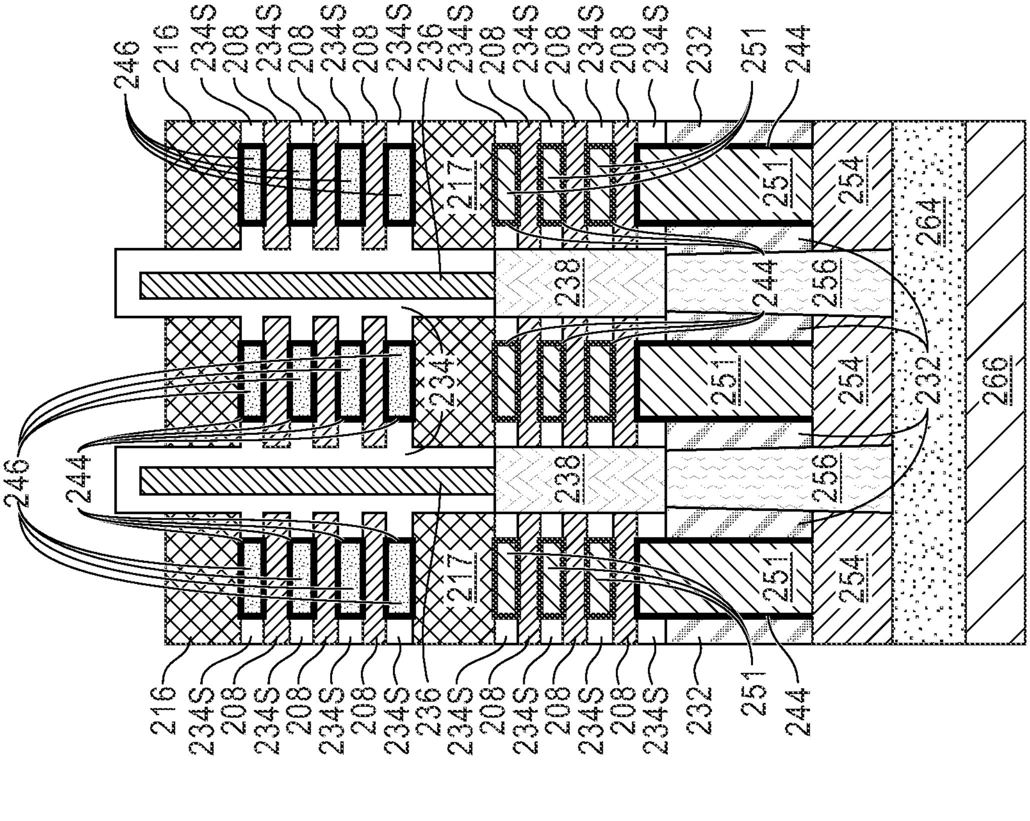
Figure 54C:
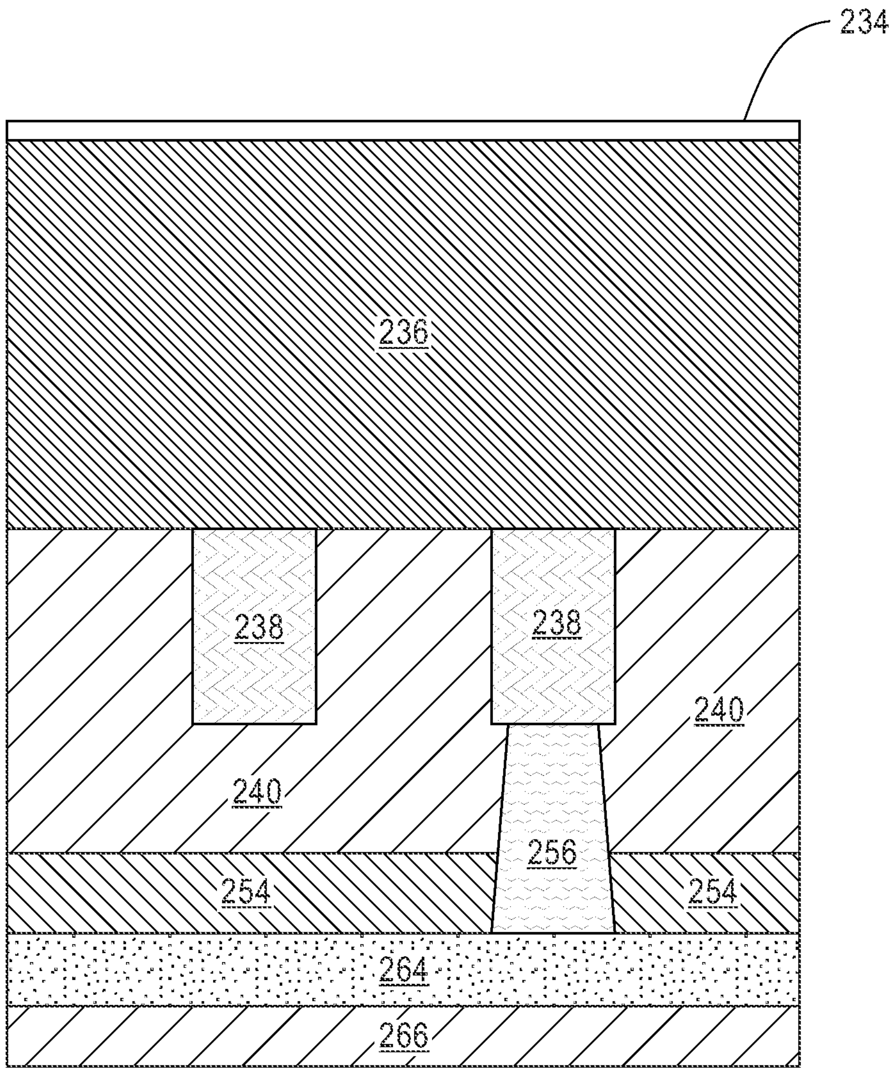

Referring now to FIGS. 54A, 54B and 54C, there are illustrated the exemplary structure shown in FIGS. 53A, 53B and 53C, respectively, after flipping the exemplary structure 180°, removing the semiconductor substrate 200, removing the dielectric material layer 202, and removing physically exposed portion of the high-k dielectric material layer 244 that are located on a remaining portion of the a-Si layer 246. Flipping can be performed by hand or be mechanical means such, for example, a robot arm, This flipping now physically exposes a surface of semiconductor substrate 10 for further processing. The semiconductor substrate 200 can be removed utilizing one of the techniques mentioned above for removing semiconductor substrate 100 from the previously illustrated embodiment of the present application. The removal of semiconductor substrate 200 physically exposes a surface of dielectric material layer 202 for further processing. The dielectric material layer 202 can be removed utilizing one of the techniques mentioned above for removing dielectric material layer 102 from the previously illustrated embodiment of the present application. The removal of semiconductor substrate dielectric material layer 202 physically exposes a portion of the high-k gate dielectric material layer 244 for further processing, Note that an etch can follow the removal of the dielectric material layer 202 to remove the adhesion layer from the high-k gate dielectric material layer 244. The removal of the dielectric material layer 202 also physically exposed portions of inner spacer dielectric material 234 and the dielectric material structure 236 that were formed into the dielectric material layer 202. Also, a portion of the first gate cut dielectric structure 248 that was previously embedded in dielectric material layer 202 is now physically exposed. The physically exposed portion of the high-k dielectric material layer 244 can be removed utilizing any etching process that is selective in removing the physically exposed portion of the high-k dielectric material layer 244.

Figure 55B:
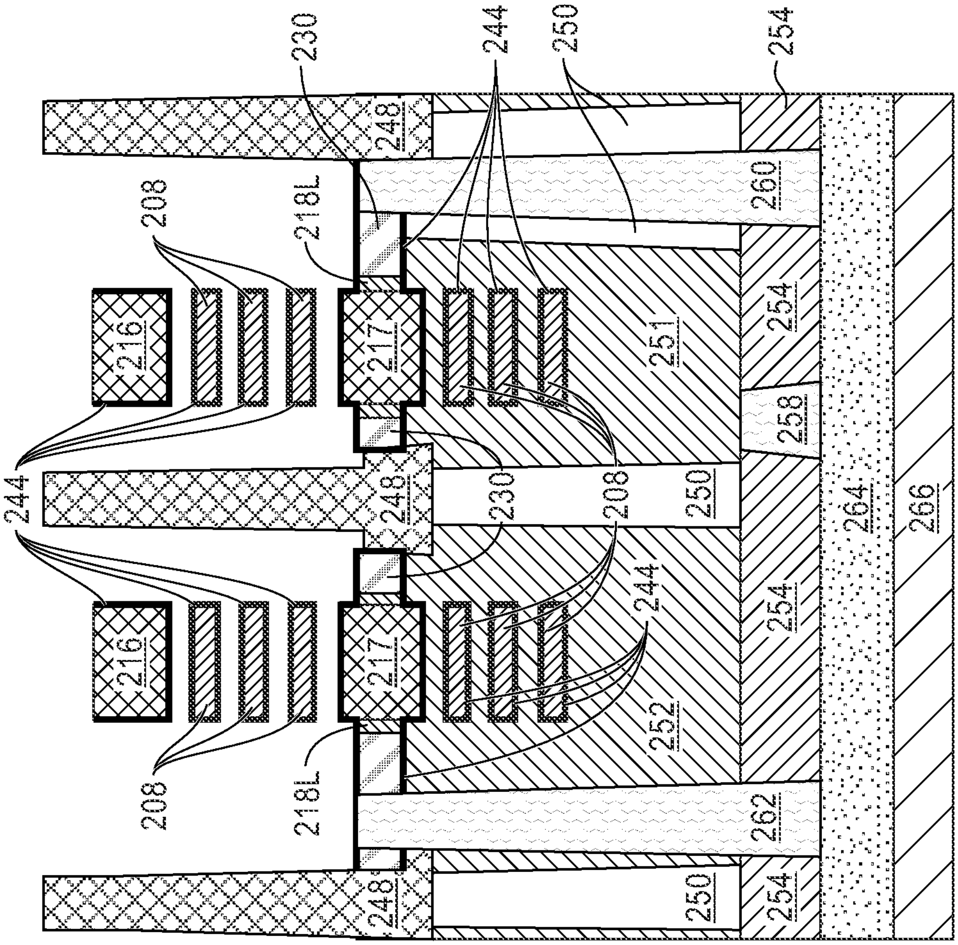
FIGS. 55A, 55B and 55C are cross sectional views of the exemplary structure shown in FIGS. 54A, 54B and 54C, respectively, after removing the a-Si layer.
Figure 55A:
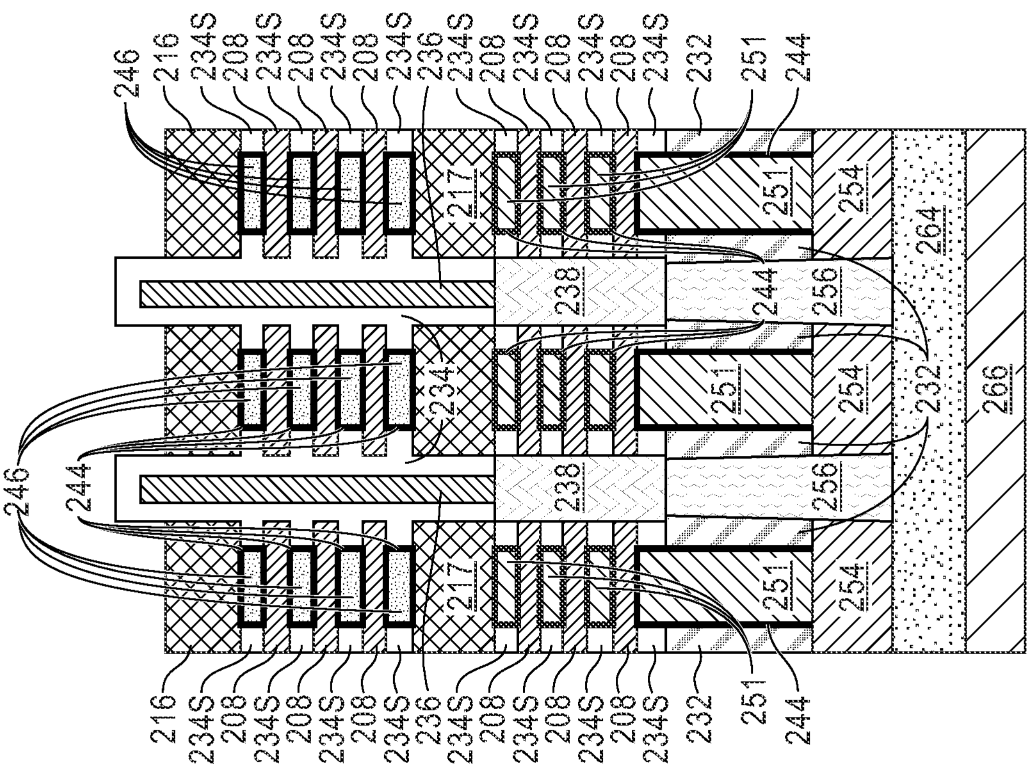
Figure 55C:
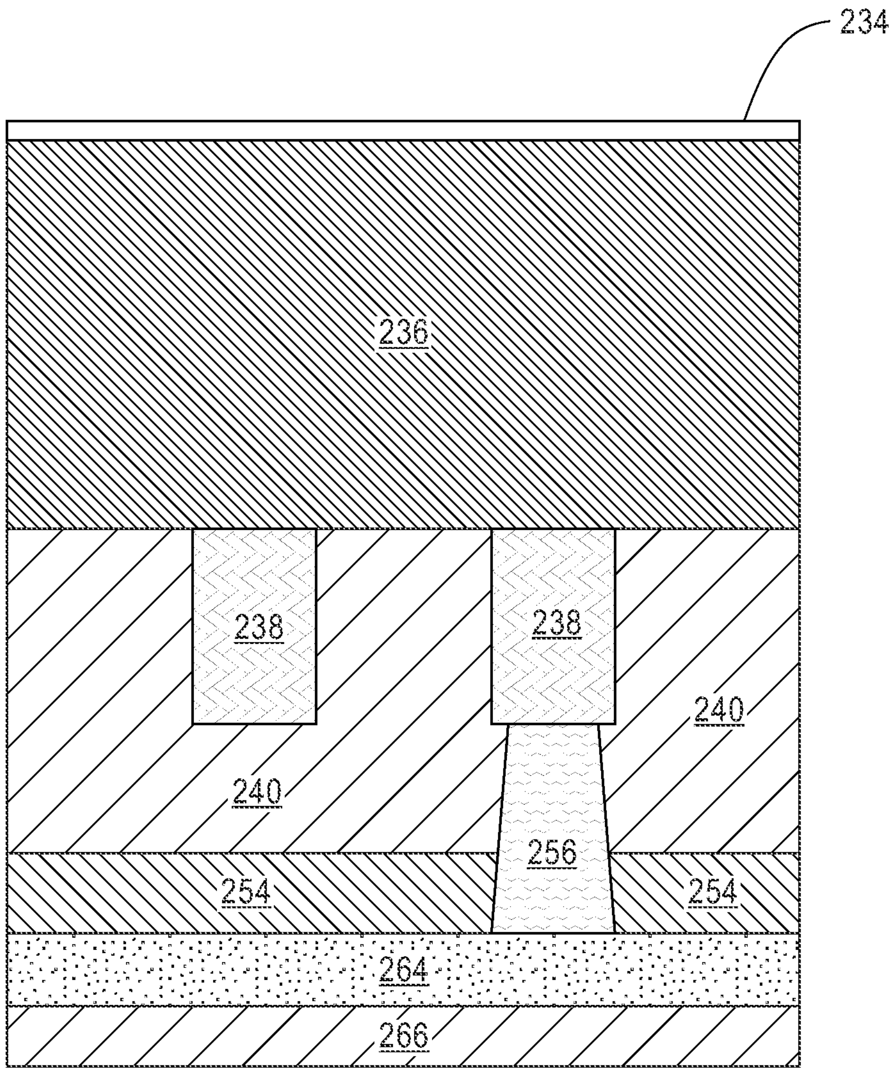

Referring now to FIGS. 55A, 55B and 55C, there are illustrated the exemplary structure shown in FIGS. 54A, 54B and 54C, respectively, after removing the a-Si layer 246. The a-Si layer 246 can be removed utilizing an etch that is selective in removing a-Si. At this point of the present application, another etch can be used to selectively remove the oxygen-scavenging layer from the surface of the high-k gate dielectric material layer 244 such that the high-k gate dielectric material layer 244 is now exposed.

Figure 56B:
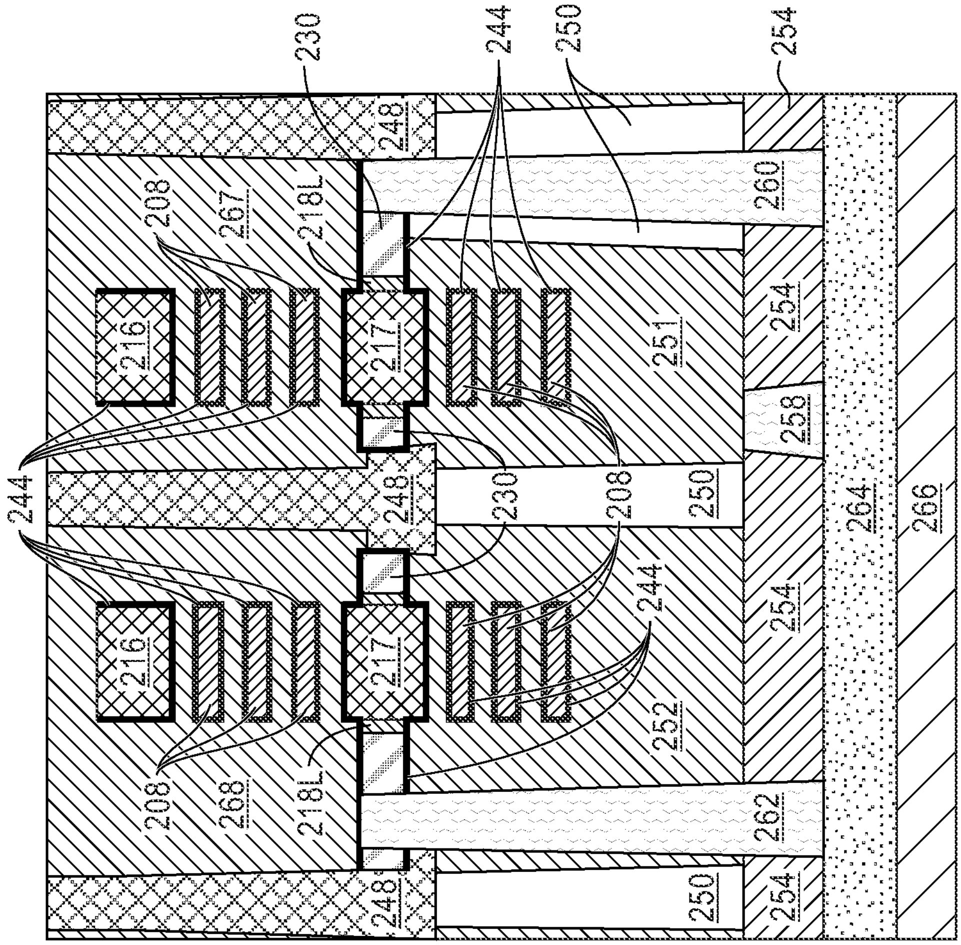
FIGS. 56A, 56B and 56C are cross sectional views of the exemplary structure shown in FIGS. 55A, 55B and 55C, respectively, after forming a first gate electrode on a physically exposed surface of the high-k gate dielectric material layer that is located on a first set of suspended semiconductor channel material nanosheets of the first nanosheet stack, and another first gate electrode on a physically exposed surface of the high-k gate dielectric material layer that is located on a second set of suspended semiconductor channel material nanosheets of another first nanosheet stack, wherein these device regions are separated by the first gate cut dielectric structure.
Figure 56A:
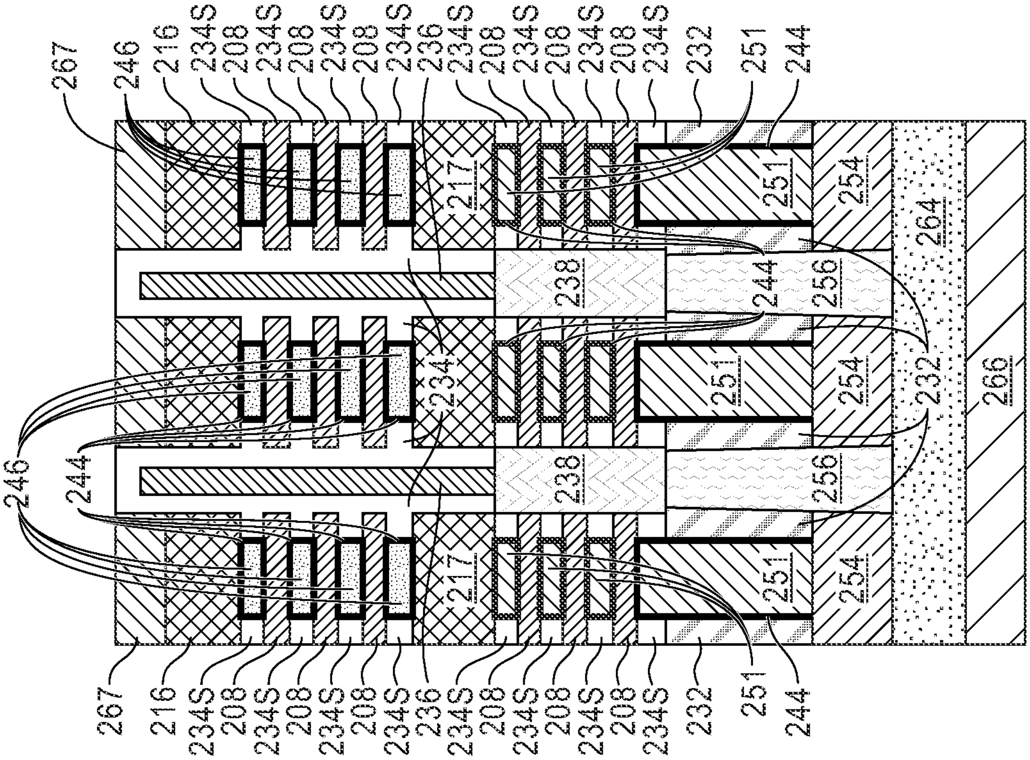
Figure 56C:
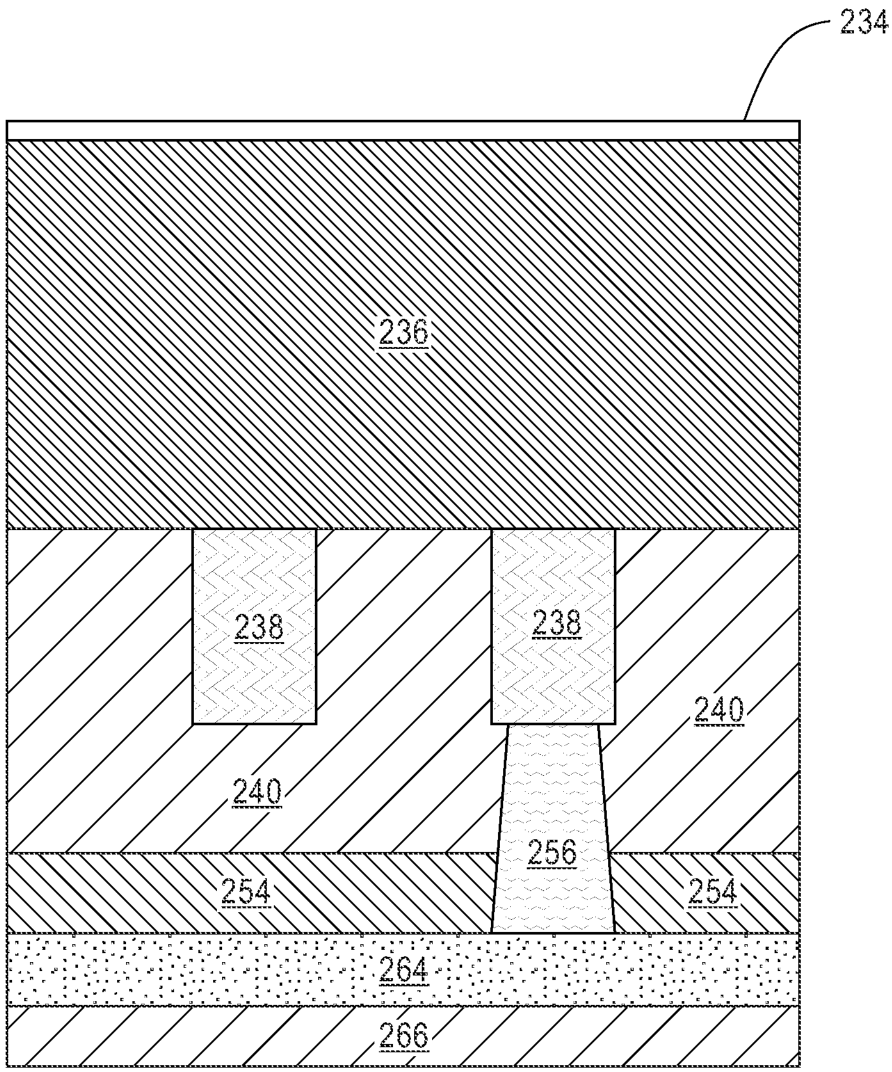

Referring now to FIGS. 56A, 56B and 56C, there are illustrated the exemplary structure shown in FIGS. 55A, 55B and 55C, respectively, after forming a first gate electrode 267 on a physically exposed surface of the high-k gate dielectric material layer 244 that is located on a first set of suspended semiconductor channel material nanosheets 208 of the first nanosheet stack, and another first gate electrode 268 on a physically exposed surface of the high-k gate dielectric material layer 244 that is located on a second set of suspended semiconductor channel material nanosheets 208 of another first nanosheet stack, wherein these device regions are separated by the first gate cut dielectric structure 248.

First gate electrode 267 is equivalent to the first gate electrode 165 mentioned above for the previously illustrated embodiment of the present application, while the another first gate electrode 268 is equivalent to the another first gate electrode 166 mentioned above for the previously illustrated embodiment of the present application. Thus, all WFMs and optional gate electrode materials mentioned above for the first gate electrode 165 and the another first gate electrode 166 are applicable here for the first gate electrode 267 and the another first gate electrode 268, respectively. Depending on the technique used to form the first gate electrode 267 and the another first gate electrode 268, the first gate electrode 267 and the another first gate electrode 268 can include WFMs that are compositionally the same, or WFMs that are compositionally different. In embodiments, the first gate electrode 267 and the another first gate electrode 268, can include gate electrode materials that are compositionally the same, or gate electrode materials that are compositionally different. When the optional gate electrode material is present, the WFM is located between the gate electrode material and the high-k gate dielectric material layer. The first gate electrode 267 and the another first gate electrode 268 can be formed utilizing one of the techniques mentioned above for forming for forming the first gate electrode 165 and the another first gate electrode 166 in the previously illustrated embodiment of the present application. It is again noted that due to the first gate cut dielectric structure 248 having an enlarged portion that extends through the opening in the spacer dielectric material 230 (i.e., the stacked device separating dielectric material layer), no WFM metal is shared between the various stacked device regions.

Figure 57B:
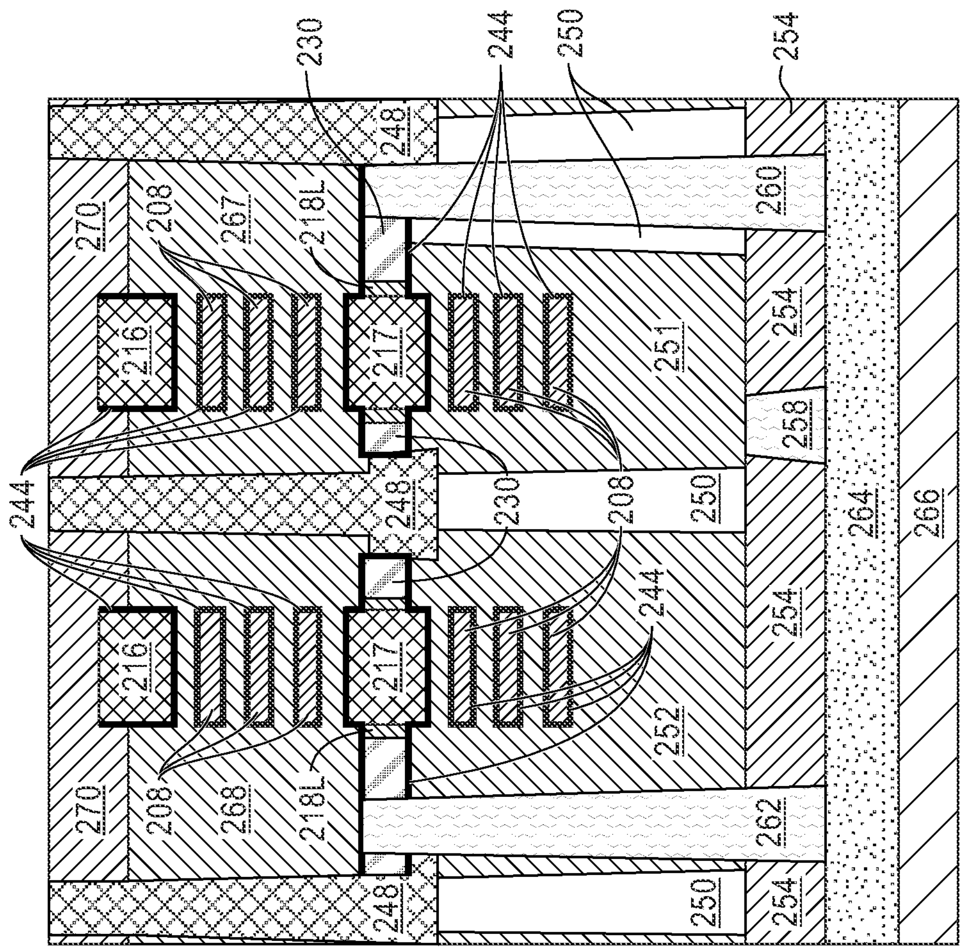
FIGS. 57A, 57B and 57C are cross sectional views of the exemplary structure shown in FIGS. 56A, 56B and 56C, respectively, after forming a backside gate dielectric cap layer.
Figure 57A:
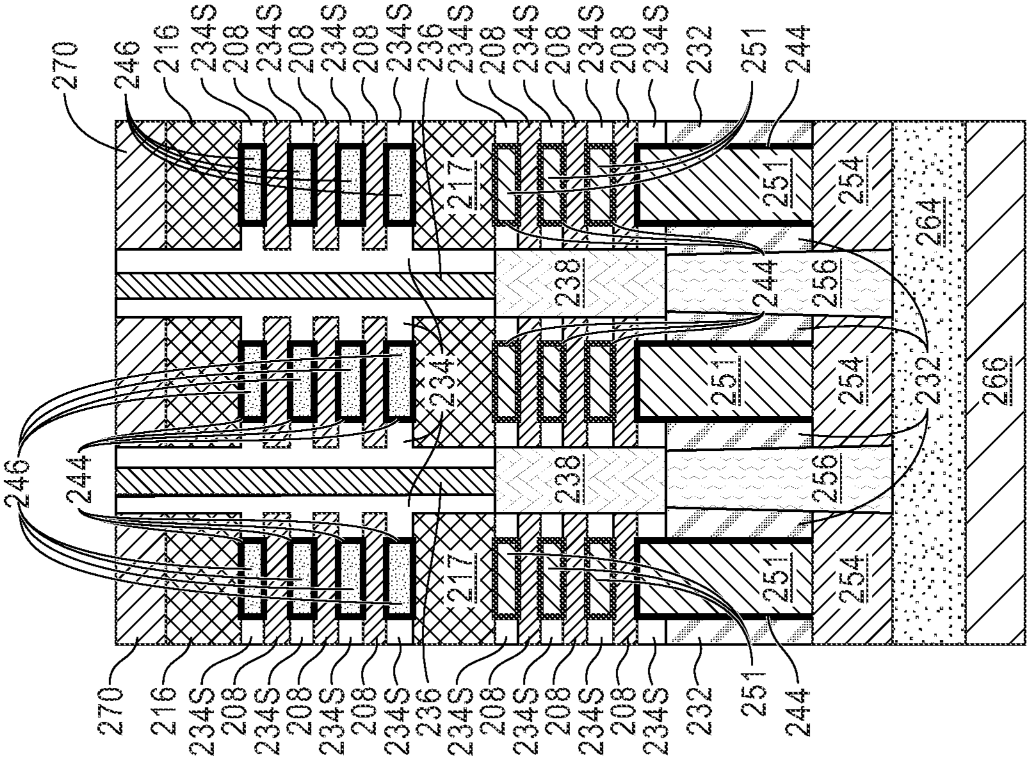
Figure 57C:
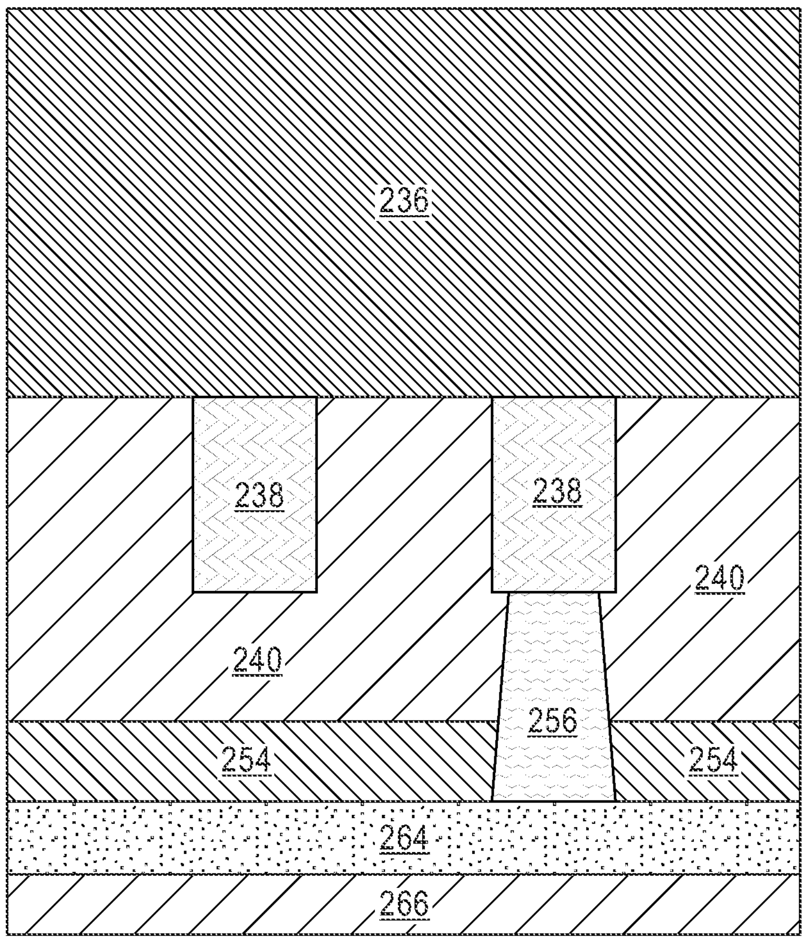

Referring now to FIGS. 57A, 57B and 57C, there are illustrated the exemplary structure shown in FIGS. 56A, 56B and 56C, respectively, after forming a backside gate dielectric cap layer 270. The backside gate dielectric cap layer 270 is formed firstly by recessing the high-k metal gate 268 and 244 from backside of the wafer, followed by dielectric deposition and planarization.

Figure 58B:
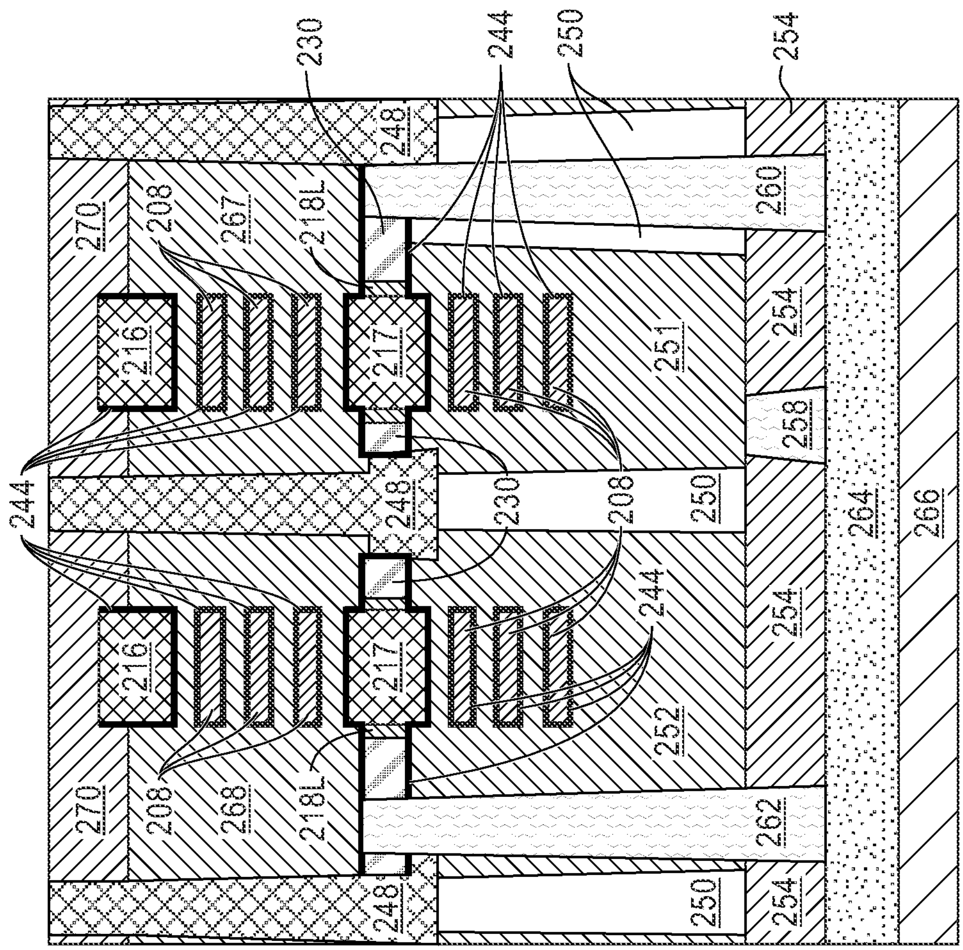
FIGS. 58A, 58B and 58C are cross sectional views of the exemplary structure shown in FIGS. 57A, 57B and 57C, respectively, after recessing the dielectric material structure.
Figure 58A:
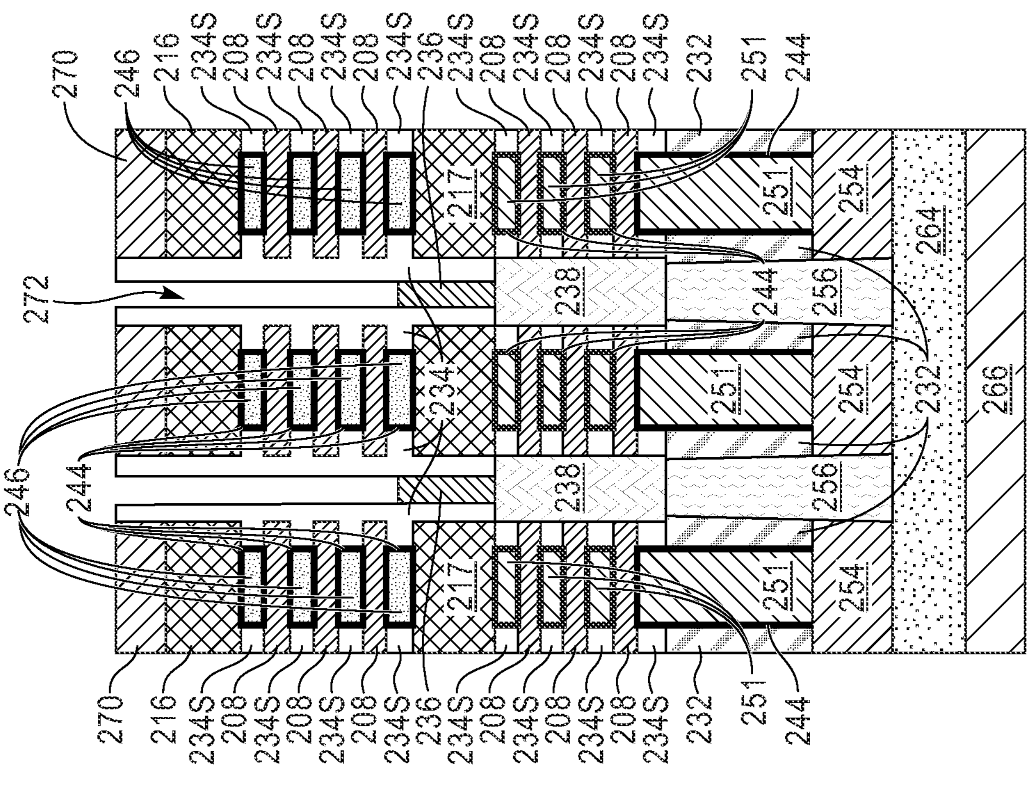
Figure 58C:
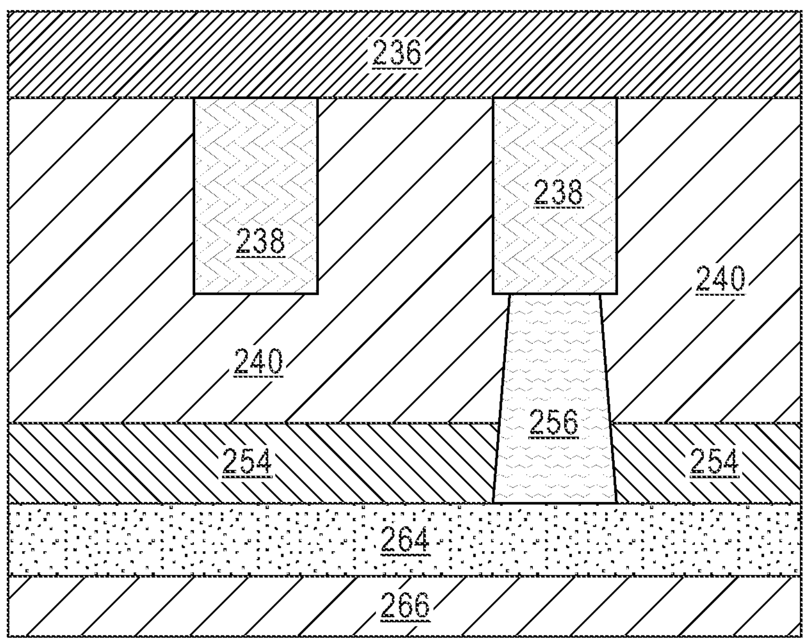

Referring now to FIGS. 58A, 58B and 58C, there are illustrated the exemplary structure shown in FIGS. 57A, 57B and 57C, respectively, after recessing the dielectric material structure 236. The dielectric material structure 236 can be recessed utilizing a recess etching process that is selective on removing the dielectric material structure 236. The recessed dielectric material structure 236 has a topmost surface that is below the bottommost surface of a bottommost semiconductor channel material nanosheet 208 of the first nanosheet stack.

Figure 59B:
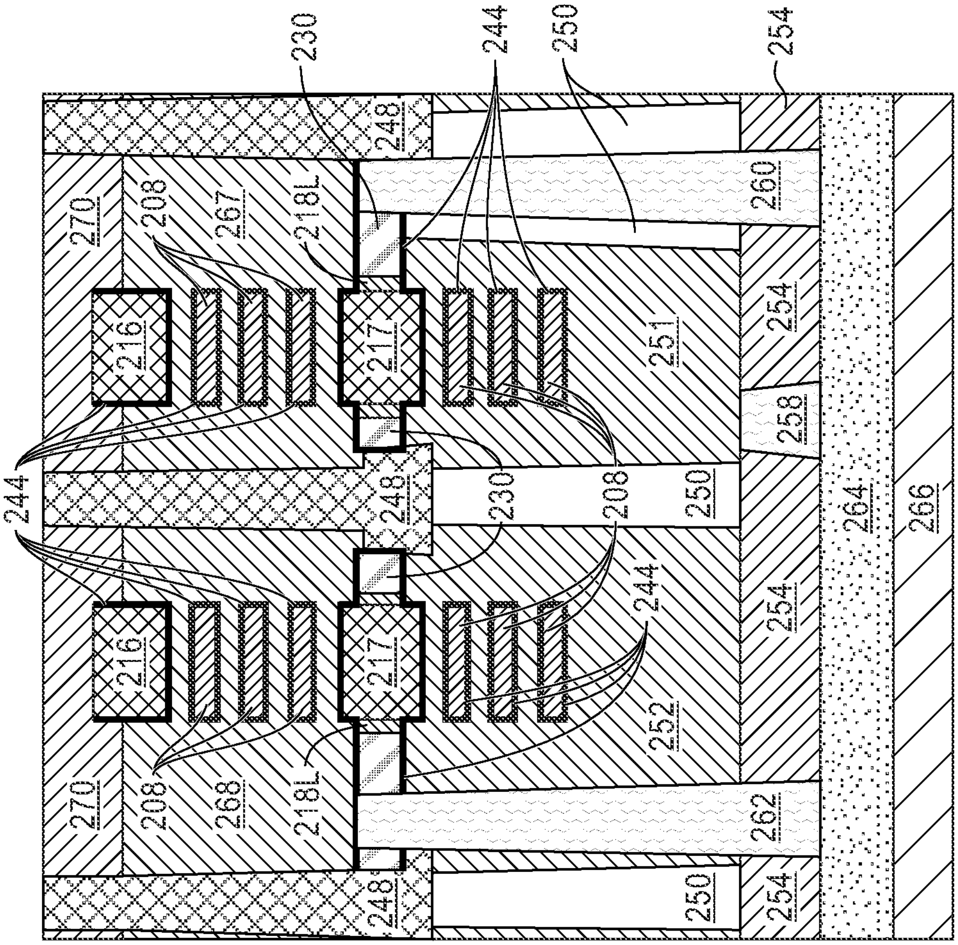
FIGS. 59A, 59B and 59C are cross sectional views of the exemplary structure shown in FIGS. 58A, 58B and 58C, respectively, after forming a first source/drain region.
Figure 59A:
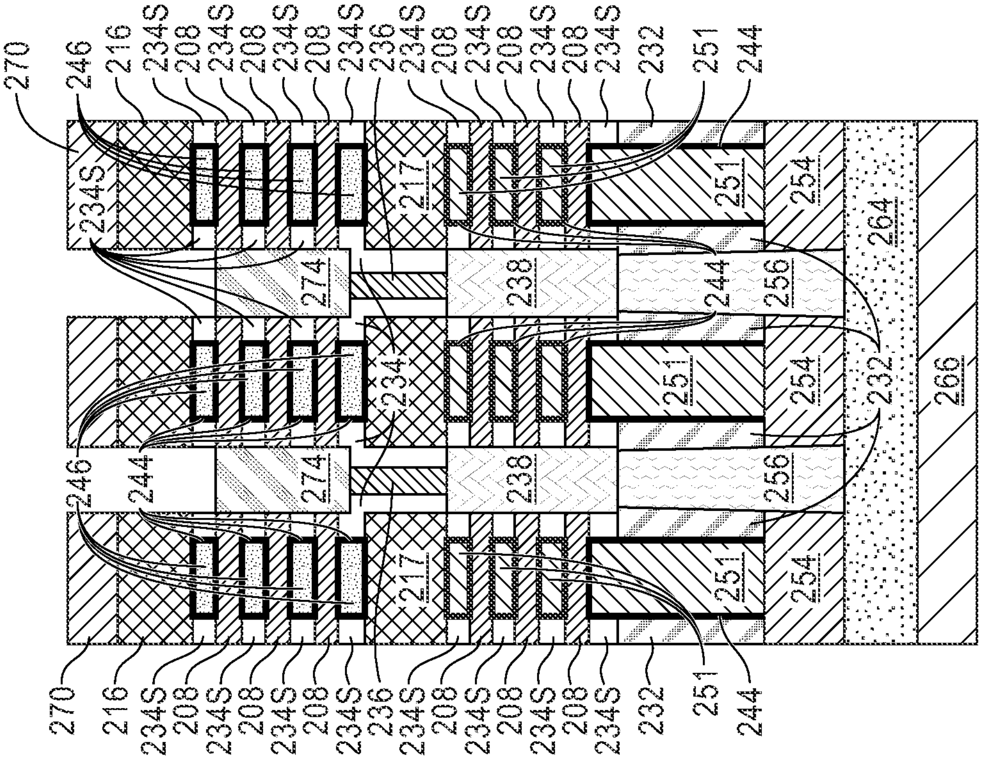
Figure 59C:
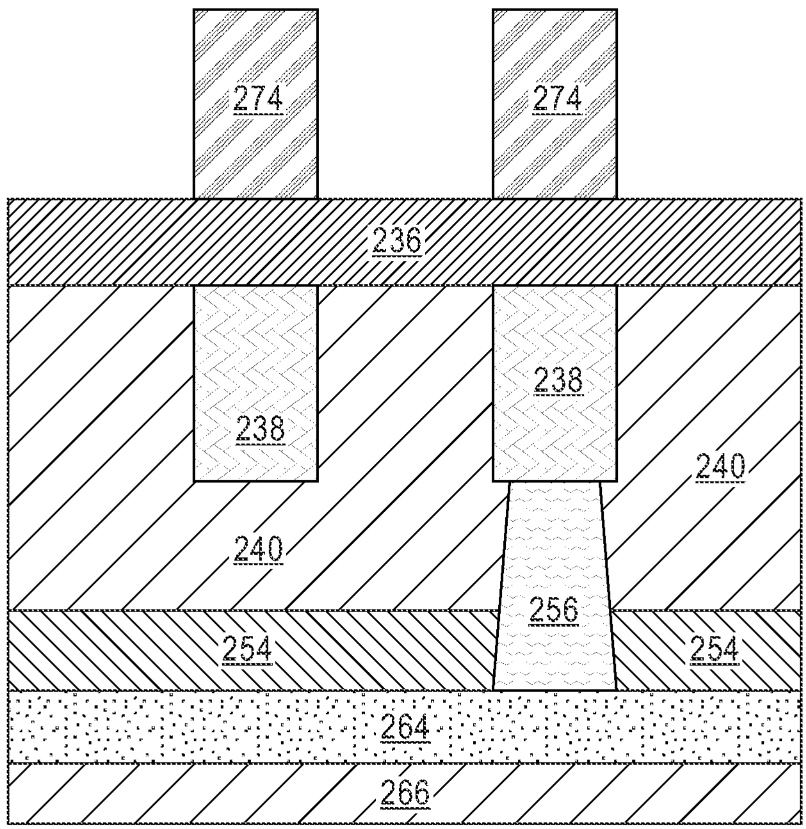

Referring now to FIGS. 59A, 59B and 59C, there are illustrated the exemplary structure shown in FIGS. 58A, 58B and 58C, respectively, after forming a first source/drain region 274. Prior to forming the first source/drain region 274, the inner spacer dielectric material 234 that is present along the sidewalls of the first nanosheet stack (inner spacer dielectric material remains and forms inner spacers 234S). The removal of the inner spacer dielectric material 234 that is present along the sidewalls of the first nanosheet stack can be performed utilizing an isotropic etch back process. The removal of the inner spacer dielectric material 234 reveals sidewalls of each semiconductor channel material nanosheet 208 of the first nanosheet stack. The first source/drain region 274 is then epitaxially grown outward from the physically exposed sidewalls of each semiconductor channel material nanosheet 208 of the first nanosheet stack. The first source/drain region 274 is equivalent to the first source/drain region 116 mentioned above in the previous illustrated embodiment of the present application. The first source/drain region 247 can be composed of a semiconductor material and a dopant that is opposite (or the same) in conductivity as compared to the dopant present in the previously formed second source/drain region 238. In this embodiment, the first source/drain region 274 is spaced apart from the second source/drain region 238 by a remaining portion of the inner spacer dielectric material 234 and remaining portion of the dielectric material structure 236; See, for example, FIG. 59A.

Figure 60B:
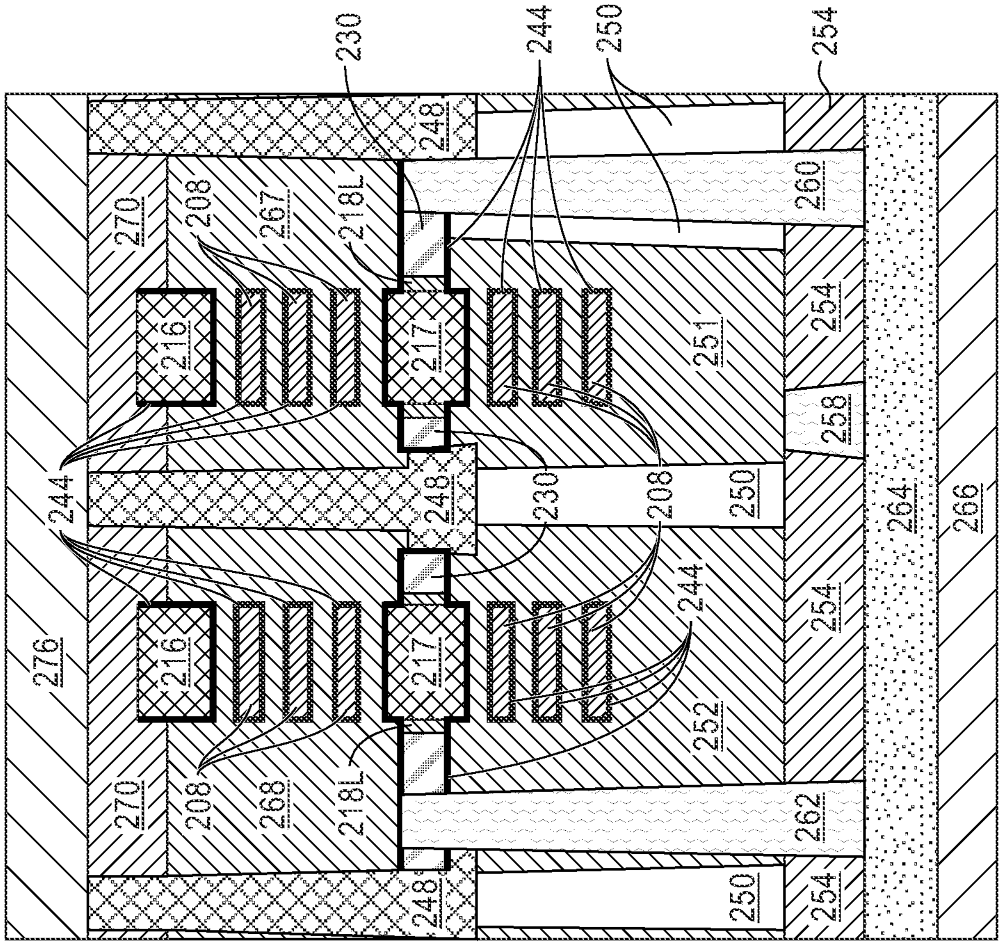
FIGS. 60A, 60B and 60C are cross sectional views of the exemplary structure shown in FIGS. 59A, 59B and 59C, respectively, after forming a first conductive contact-containing ILD material layer, wherein the first conductive contact containing ILD material layer includes a first source/drain contact structure contacting the first source/drain region.
Figure 60A:
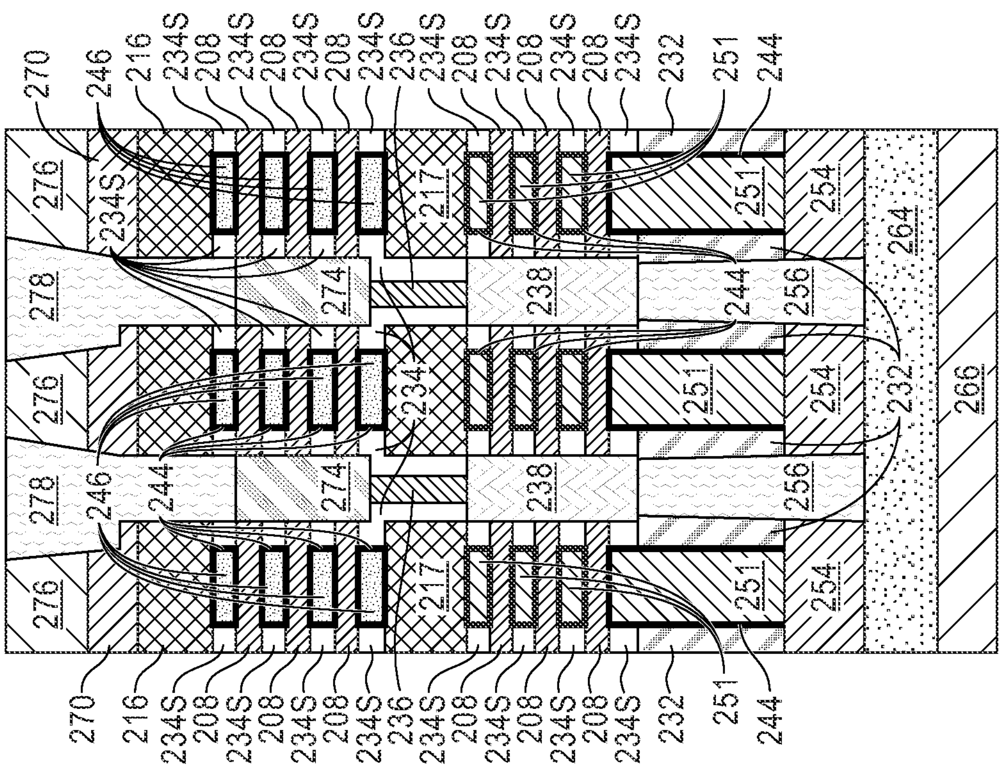
Figure 60C:
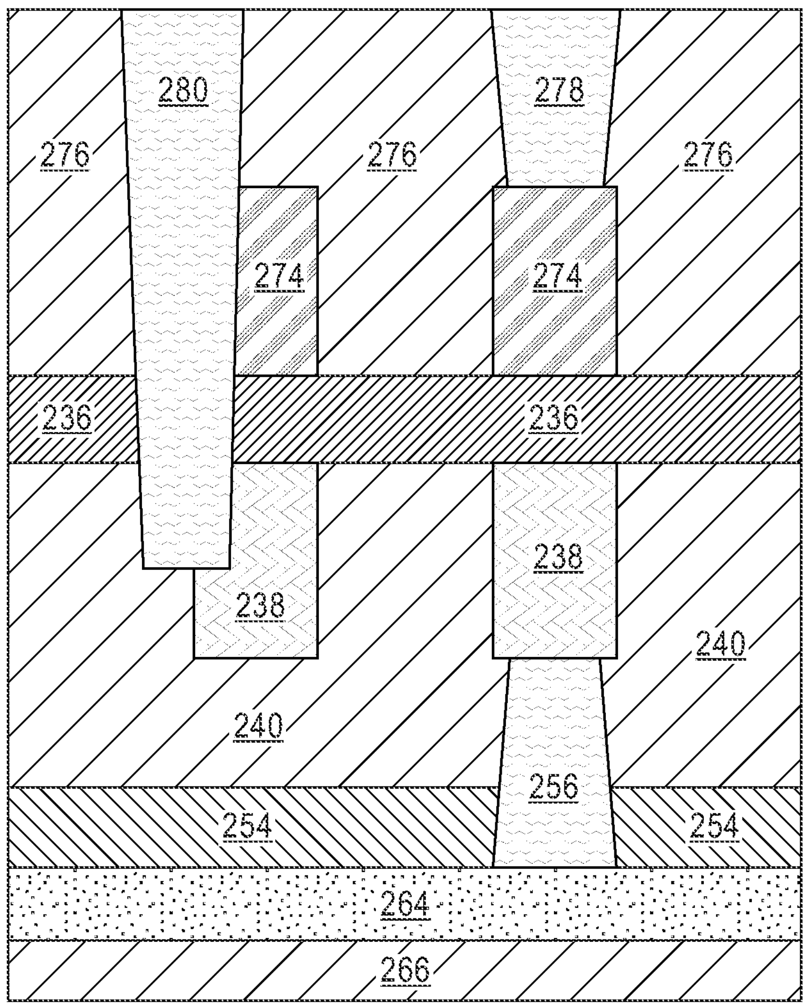

Referring now to FIGS. 60A, 60B and 60C, there are illustrated the exemplary structure shown in FIGS. 59A, 59B and 59C, respectively, after forming a first conductive contact-containing ILD material layer 276, wherein the first conductive contact containing ILD material layer includes a first source/drain contact structure 278 contacting the first source/drain region 274. A shared source/drain contact structure 280 is also present that contacts a first source/drain region 274 of the first FET device with a second source/drain region 238 of a second FET device. The first conductive contact-containing ILD material layer 276 is the same as the first conductive contact-containing ILD material layer 168 mentioned above in the previous illustrated embodiment of the present application. Thus, the first conductive contact-containing ILD material layer 276 is composed of one of the dielectric materials mentioned above for first conductive contact-containing ILD material layer 168, and the first conductive contact-containing ILD material layer 276 can be formed utilizing one of the deposition techniques mentioned above in forming the first conductive contact-containing ILD material layer 168. Each contact structure, i.e., first source/drain contact structure 278 and the source/drain contact structure 280 can be formed by utilizing the techniques and materials mentioned above for the various contact structures into other conductive contact-containing ILD material layers.

Figure 61B:
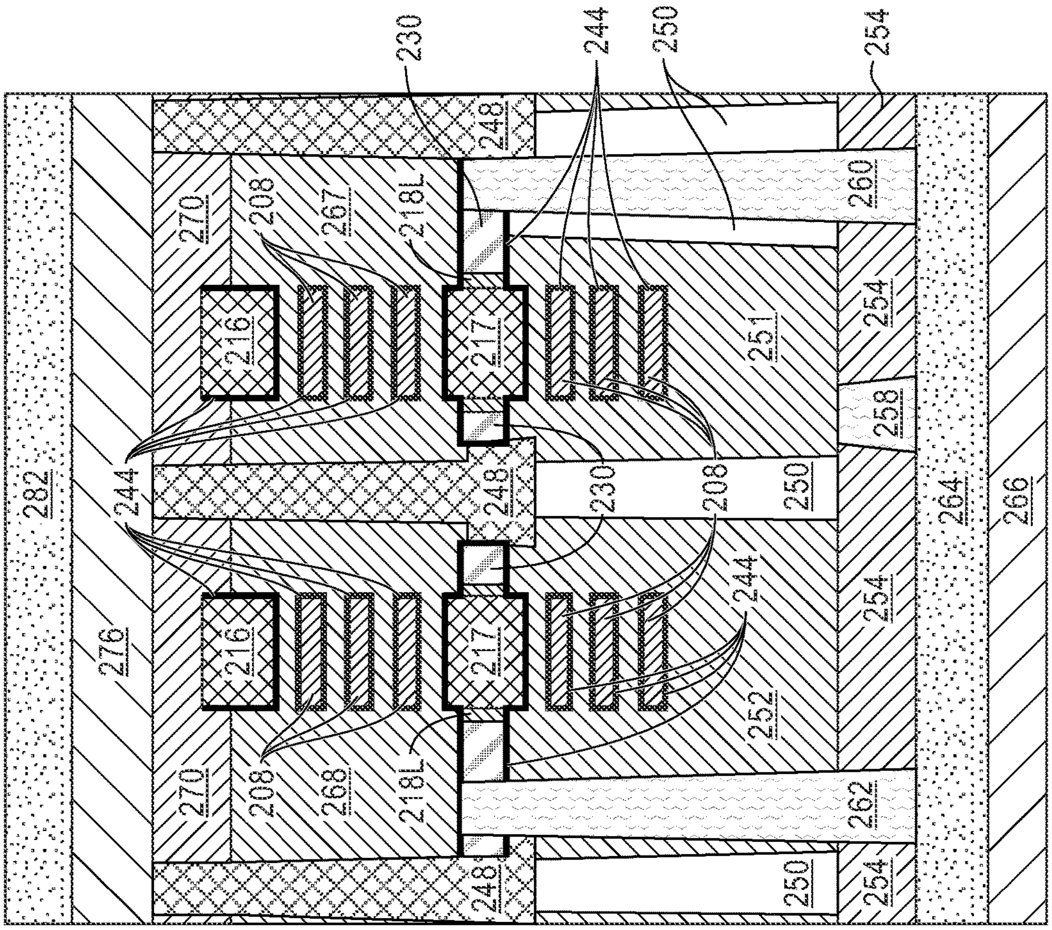
FIGS. 61A, 61B and 61C are cross sectional views of the exemplary structure shown in FIGS. 60A, 60B and 60C, respectively, after forming a backside interconnect and a backside power delivery network (BSPDN) structure on the first conductive contact containing ILD material layer.
Figure 61A:
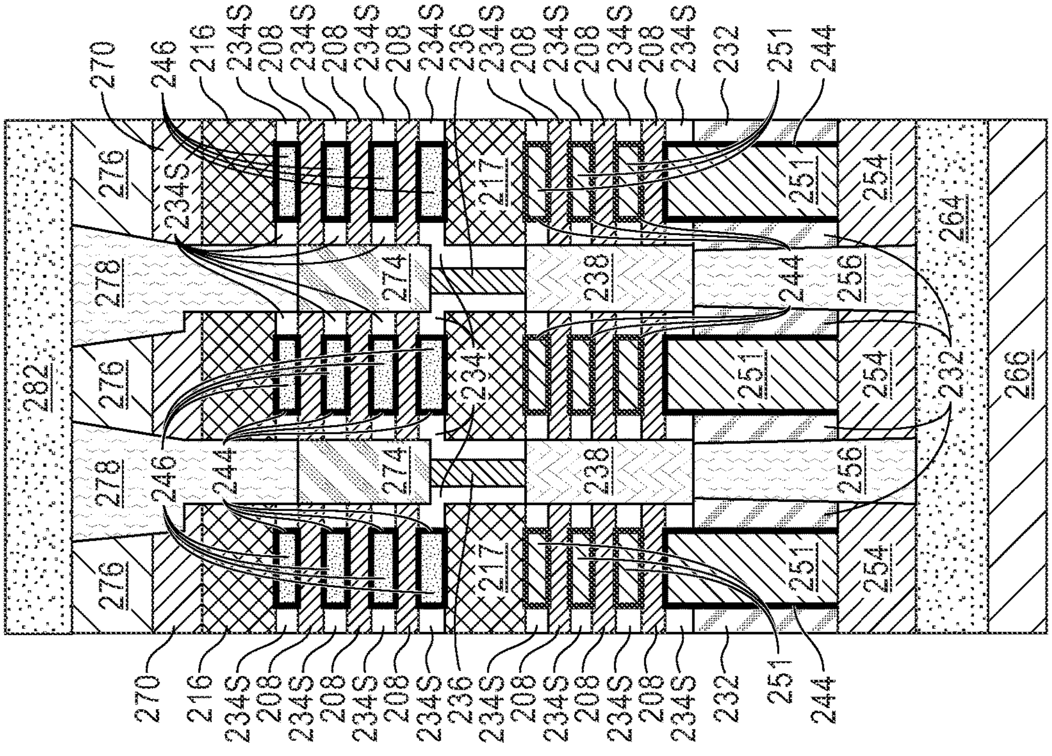
Figure 61C:
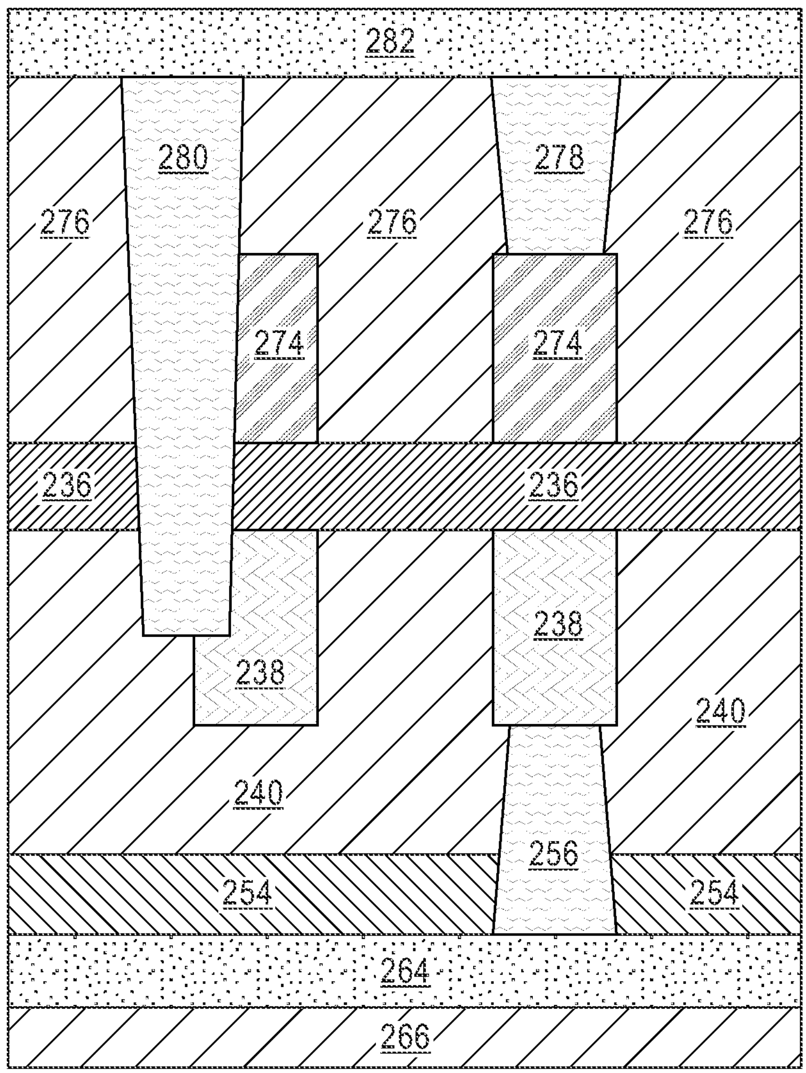

Referring now to FIGS. 61A, 61B and 61C, there are illustrated the exemplary structure shown in FIGS. 60A, 60B and 60C, respectively, after forming a backside interconnect and BSPDN structure 282 on the first conductive contact containing ILD material layer 276. backside interconnect and BSPDN structure 282 can be the same as BSPDN structure 172 mentioned above in the previously illustrated embodiment of the present application, and it may include additional signal lines beside metal lines for power delivery While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a first field effect transistor (FET) device stacked over a second FET device, wherein the first FET device comprises a first functional gate structure containing a first work function metal and the second FET device comprises a second functional gate structure containing a second work function metal;

a stacked device separating dielectric material layer located between the first FET device and the second FET device;

a first gate cut dielectric structure located laterally adjacent to the first FET device; and a second gate cut dielectric structure located laterally adjacent to the second FET device, wherein a portion of the first gate cut dielectric structure passes through an opening in the stacked device separating dielectric material layer and is present laterally adjacent to the second FET device, and wherein the portion of the first gate cut dielectric structure that passes through the opening has an enlarged width as compared to a width of a portion of the first gate cut dielectric structure that does not pass through the opening.

2. The semiconductor structure of claim 1, wherein the enlarged width prevents the first work function metal from being present in the second FET device and the second work function metal from being present in the first FET device.

3. The semiconductor structure of claim 1, wherein the portion of the first gate cut dielectric structure that passes through the opening directly contacts a surface of the second gate cut dielectric structure.

4. The semiconductor structure of claim 1, wherein the first FET device comprises at least one semiconductor nanosheet, and the second FET device comprises at least one semiconductor fin.

5. The semiconductor structure of claim 1, wherein the first FET device comprises at least one semiconductor nanosheet, and the second FET device comprises at least one semiconductor nanosheet.

6. The semiconductor structure of claim 1, further comprising another first FET device located laterally adjacent to the first FET device and separated by the first gate cut dielectric structure, wherein the another first FET device comprises a third functional gate structure having a third work function metal.

7. The semiconductor structure of claim 6, further comprising another second FET device located laterally adjacent to the second FET device and separated by the second gate cut dielectric structure and the portion of the first gate cut dielectric structure that passes through the opening, wherein the another second FET device comprises a fourth functional gate structure having a fourth work function metal.

8. The semiconductor structure of claim 1, wherein the first gate cut dielectric structure contacts a first surface of a first conductive contact containing interlayer dielectric (ILD) material layer, wherein the first conductive contact containing ILD material layer contains a first source/drain contact structure contacting a source/drain region of the first FET device.

9. The semiconductor structure of claim 8, further comprising a backside power delivery network located on a second surface of the first conductive contact containing ILD material layer that is opposite the first surface of the conductive contact containing ILD material layer.

10. The semiconductor structure of claim 1, wherein the second gate cut dielectric structure contacts a first surface of a second conductive contact containing ILD material layer, wherein the second conductive contact containing ILD material layer contains a second source/drain contact structure contacting a source/drain region of the second FET device, a second gate contact structure contacting the second functional gate structure, a shared gate contact structure contacting both the first functional gate structure and the second functional gate structure, and a second gate contact structure contacting the first functional gate structure, but not the second functional gate structure.

11. The semiconductor structure of claim 10, further comprising a back-end-of-the-line structure located on a second surface of the second conductive contact containing ILD material layer that is opposite the first surface of the second conductive contact containing ILD material layer.

12. The semiconductor structure of claim 1, wherein the first functional gate structure and the second functional gate structure further include a high-k gate dielectric material layer, wherein the high-k gate dielectric material layer contacts surfaces of the stacked device separating dielectric material layer.

13. The semiconductor structure of claim 1, wherein the stacked device separating dielectric material layer is located laterally adjacent to a dielectric isolation layer that is located between the first FET device and the second FET device.

14. The semiconductor structure of claim 13, wherein the dielectric isolation layer is spaced apart from the spacer dielectric material by a sacrificial dielectric liner portion.

15. The semiconductor structure of claim 14, wherein another dielectric isolation layer is positioned above the first FET device.

16. The semiconductor structure of claim 15, further comprising a high-k gate dielectric material located on surfaces of the dielectric isolation layer and the another dielectric layer.

17. The semiconductor structure of claim 13, wherein the first FET device further comprises a first source/drain region that is spaced apart from a second source/drain region of the second FET device by an inner spacer dielectric material and a dielectric material structure.

18. The semiconductor structure of claim 12, wherein the first FET device is a first nanosheet FET device and the second FET device is a second nanosheet device.

19. The semiconductor structure of claim 12, further comprising another first FET device located laterally adjacent to the first FET device and separated by the first gate cut dielectric structure, wherein the another first FET device comprises a third functional gate structure having a third work function metal.

20. The semiconductor structure of claim 19, further comprising another second FET device located laterally adjacent to the second FET device and separated by the second gate cut dielectric structure and the portion of the first gate cut dielectric structure that passes through the opening, wherein the another second FET device comprises a fourth functional gate structure having a fourth work function metal.

21. The semiconductor structure of claim 12, wherein the first gate cut dielectric structure contacts a first surface of a first conductive contact containing interlayer dielectric (ILD) material layer, wherein the first conductive contact containing ILD material layer contains a first source/drain contact structure contacting a source/drain region of the first FET device.

22. The semiconductor structure of claim 21, further comprising a backside power delivery network located on a second surface of the first conductive contact containing ILD material layer that is opposite the first surface of the conductive contact containing ILD material layer.

23. The semiconductor structure of claim 12, wherein the second gate cut dielectric structure contacts a first surface of a second conductive contact containing ILD material layer, wherein the second conductive contact containing ILD material layer contains a second source/drain contact structure contacting a source/drain region of the second FET device, a second gate contact structure contacting the second functional gate structure, a shared gate contact structure contacting both the first functional gate structure and the second functional gate structure, and a second gate contact structure contacting the first functional gate structure, but not the second functional gate structure.

24. The semiconductor structure of claim 23, further comprising a back-end-of-the-line structure located on a second surface of the second conductive contact containing ILD material layer that is opposite the first surface of the second conductive contact containing ILD material layer.

* * * * *